US011218170B2

(12) United States Patent
Shinohara et al.

(10) Patent No.: US 11,218,170 B2
(45) Date of Patent: *Jan. 4, 2022

(54) DATA PROCESSING APPARATUS AND DATA PROCESSING METHOD

(71) Applicant: Saturn Licensing LLC, New York, NY (US)

(72) Inventors: Yuji Shinohara, Kanagawa (JP); Makiko Yamamoto, Tokyo (JP)

(73) Assignee: Saturn Licensing LLC, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/012,598

(22) Filed: Sep. 4, 2020

(65) Prior Publication Data

US 2020/0403637 A1 Dec. 24, 2020

Related U.S. Application Data

(63) Continuation of application No. 15/962,992, filed on Apr. 25, 2018, now Pat. No. 10,804,934, which is a (Continued)

(30) Foreign Application Priority Data

Feb. 8, 2013 (JP) ................................ 2013-023883

(51) Int. Cl.
*H03M 13/11* (2006.01)
*H03M 13/27* (2006.01)
(Continued)

(52) U.S. Cl.
CPC ..... *H03M 13/1177* (2013.01); *H03M 13/036* (2013.01); *H03M 13/1165* (2013.01);
(Continued)

(58) Field of Classification Search
CPC ............ H03M 13/255; H03M 13/271; H03M 13/118; H03M 13/1157; H03M 13/1177;
(Continued)

(56) References Cited

U.S. PATENT DOCUMENTS 8,707,128 B2 4/2014 Myung et al.
8,949,691 B2 2/2015 Shinohara et al.
(Continued)

FOREIGN PATENT DOCUMENTS

CN 1976238 A 6/2007
CN 101036301 A 9/2007
(Continued)

OTHER PUBLICATIONS

International Search Report dated Apr. 15, 2014 in PCT/JP2014/051624.
(Continued)

*Primary Examiner* — April Y Blair
*Assistant Examiner* — Sazzad Hossain
(74) *Attorney, Agent, or Firm* — Oblon, McClelland, Maier & Neustadt, L.L.P.

(57) ABSTRACT

The present technology relates to a data processing apparatus and a data processing method which enable provision of an LDPC code that achieves good error-rate performance. An LDPC encoding unit performs encoding using an LDPC code having a code length of 64800 bits and a code rate of 24/30, 25/30, 26/30, 27/30, 28/30, or 29/30. The LDPC code includes information bits and parity bits, and a parity check matrix H is composed of an information matrix portion corresponding to the information bits of the LDPC code, and a parity matrix portion corresponding to the parity bits. The information matrix portion of the parity check matrix H is represented by a parity check matrix initial value table that shows positions of elements of 1 in the information matrix
(Continued)

portion in units of 360 columns. The present technology may be applied to LDPC encoding and LDPC decoding.

18 Claims, 123 Drawing Sheets

Related U.S. Application Data continuation of application No. 14/386,830, filed as application No. PCT/JP2014/051624 on Jan. 27, 2014, now abandoned.

(51) Int. Cl.

| | |
|---|---|
| ***H04L 1/00*** | (2006.01) |
| ***H03M 13/03*** | (2006.01) |
| ***H03M 13/25*** | (2006.01) |
| ***H03M 13/29*** | (2006.01) |
| ***H03M 13/35*** | (2006.01) |
| *H03M 13/15* | (2006.01) |

(52) U.S. Cl.
CPC ....... *H03M 13/255* (2013.01); *H03M 13/271* (2013.01); *H03M 13/2707* (2013.01); *H03M 13/2906* (2013.01); *H03M 13/356* (2013.01); *H04L 1/0057* (2013.01); *H04L 1/0071* (2013.01); *H03M 13/152* (2013.01)

(58) Field of Classification Search
CPC ........... H03M 13/036; H03M 13/1165; H03M 13/152; H03M 13/2906; H03M 13/356; H04L 1/0057; H04L 1/0071
See application file for complete search history.

(56) References Cited

U.S. PATENT DOCUMENTS

| | | | |
|---|---|---|---|
| 10,164,661 | B2 | 12/2018 | Ikegaya |
| 10,193,571 | B2 | 1/2019 | Ikegaya |
| 2005/0091565 | A1 | 4/2005 | Eroz et al. |
| 2006/0109821 | A1 | 5/2006 | Xia |
| 2006/0187815 | A1 | 8/2006 | Wallace et al. |
| 2007/0226578 | A1 | 9/2007 | Eroz et al. |
| 2008/0184084 | A1 | 7/2008 | Matsumoto |
| 2009/0125780 | A1 * | 5/2009 | Taylor .................. H04L 1/0071 714/752 |
| 2010/0257426 | A1 | 10/2010 | Yokokawa et al. |
| 2010/0269019 | A1 | 10/2010 | Yokokawa et al. |
| 2010/0275100 | A1 | 10/2010 | Yokokawa et al. |
| 2010/0275101 | A1 | 10/2010 | Yokokawa et al. |
| 2010/0281329 | A1 | 11/2010 | Yokokawa et al. |
| 2010/0287453 | A1 | 11/2010 | Balachandran et al. |
| 2010/0325512 | A1 | 12/2010 | Yokokawa et al. |
| 2011/0243651 | A1 | 10/2011 | Yoon |
| 2012/0179947 | A1 | 7/2012 | Kato |
| 2013/0166992 | A1 | 6/2013 | Shinohara et al. |
| 2013/0227378 | A1 | 8/2013 | Yamamoto et al. |
| 2013/0254617 | A1 | 9/2013 | Shinohara et al. |
| 2013/0290816 | A1 | 10/2013 | Shinohara et al. |
| 2013/0297992 | A1 | 11/2013 | Yamamoto et al. |
| 2013/0305113 | A1 | 11/2013 | Shinohara et al. |
| 2014/0040707 | A1 | 2/2014 | Shinohara et al. |
| 2014/0047295 | A1 | 2/2014 | Shinohara et al. |
| 2016/0043737 | A1 | 2/2016 | Shinohara et al. |
| 2019/0149172 | A1 | 5/2019 | Ikegaya |

FOREIGN PATENT DOCUMENTS

| | | | |
|---|---|---|---|
| CN | 101874350 | A | 10/2010 |
| EP | 2 214 319 | A1 | 8/2010 |
| EP | 2 955 852 | A1 | 12/2015 |
| JP | 2005-136990 | A | 5/2005 |
| JP | 2012-517138 | A | 7/2012 |
| JP | 2012-147197 | A | 8/2012 |
| KR | 10-1031873 | | 5/2011 |
| WO | WO 2009/069628 | A1 | 6/2009 |
| WO | WO 2009/104898 | A2 | 8/2009 |
| WO | WO 2011/105287 | A1 | 9/2011 |

OTHER PUBLICATIONS

"Digital Video Broadcasting (DVB); Frame structure channel coding and modulation for a second generation digital terrestrial television broadcasting system (DVB-T2)", ETSI EN 302 755. V1.3.1., (Apr. 2012). pp. 1, 40-45, 130-138.

Digital Video Broadcasting (DVB), "TM-S2 Call for technologies (CfT) for Evolutionary subsystems of the S2 system", TM-S2-0122, (Aug. 2009), 10 pages.

Digital Video Broadcasting (DVB); Second generation framing structure, channel coding and modulation systems for Broadcasting, Interactive Services, News Gathering and other broadband satellite applications (DVB-S2). ETSI EN 302 307, V1.2.1, (Aug. 2009), 78 pages.

Extended European Search Report dated Jul. 20, 2016 in Patent Application No. 14749367.0 citing references AC-AD, AO-AP, and AY-AZ therein, 15 pages.

Combined Office Action and Search Report dated Mar. 13, 2018 in Chinese Patent Application No. 201480000958.9 (with English language translation) citing references AA, AC, and AQ-AT therein, 32 pages.

Mignone, V., "TM-S20337: Draft Specification", Digital Video Broadcasting, XP017845125, Dec. 17, 2013, pp. 1-101.

Sony, "TM-S20145: CfT_Sony_LDPC_64_Annex", Digital Video Broadcasting, XP017840337, Feb. 12, 2013, pp. 1-127.

Korean Office Action dated Dec. 18, 2019, in Patent Application No. 10-2014-7027155, 3 pages.

* cited by examiner

FIG. 3

$$H=\begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

FIG. 13

NUMBER OF COLUMNS FOR EACH COLUMN WEIGHT

| | N=64800 | | | | N=16200 | | | |
|---|---|---|---|---|---|---|---|---|
| Nominal CODE RATE | X | KX | K3 | M | X | KX | K3 | M |
| 1/4 | 12 | 5400 | 10800 | 48600 | 12 | 1440 | 1800 | 12960 |
| 1/3 | 12 | 7200 | 14400 | 43200 | 12 | 1800 | 3600 | 10800 |
| 2/5 | 12 | 8640 | 17280 | 38880 | 12 | 2160 | 4320 | 9720 |
| 1/2 | 8 | 12960 | 19440 | 32400 | 8 | 1800 | 5400 | 9000 |
| 3/5 | 12 | 12960 | 25920 | 25920 | 12 | 3240 | 6480 | 6480 |
| 2/3 | 13 | 4320 | 38880 | 21600 | 13 | 1080 | 9720 | 5400 |
| 3/4 | 12 | 5400 | 43200 | 16200 | 12 | 360 | 11520 | 4320 |
| 4/5 | 11 | 6480 | 45360 | 12960 | - | 0 | 12600 | 3600 |
| 5/6 | 13 | 5400 | 48600 | 10800 | 13 | 360 | 12960 | 2880 |
| 8/9 | 4 | 7200 | 50400 | 7200 | 4 | 1800 | 12600 | 1800 |
| 9/10 | 4 | 6480 | 51840 | 6480 | --- | --- | --- | --- |

A

B

| Code rate | Modulation/coding spectral efficiency | γ |
|---|---|---|
| 2/3 | 2, 66 | 3, 15 |
| 3/4 | 2, 99 | 2, 85 |
| 4/5 | 3, 19 | 2, 75 |
| 5/6 | 3, 32 | 2, 70 |
| 8/9 | 3, 55 | 2, 60 |
| 9/10 | 3, 59 | 2, 57 |

A

B

| Code rate | Modulation/coding spectral efficiency | $\gamma_1$ | $\gamma_2$ |
|---|---|---|---|
| 3/4 | 3, 74 | 2, 84 | 5, 27 |
| 4/5 | 3, 99 | 2, 72 | 4, 87 |
| 5/6 | 4, 15 | 2, 64 | 4, 64 |
| 8/9 | 4, 43 | 2, 54 | 4, 33 |
| 9/10 | 4, 49 | 2, 53 | 4, 30 |

FIG. 25
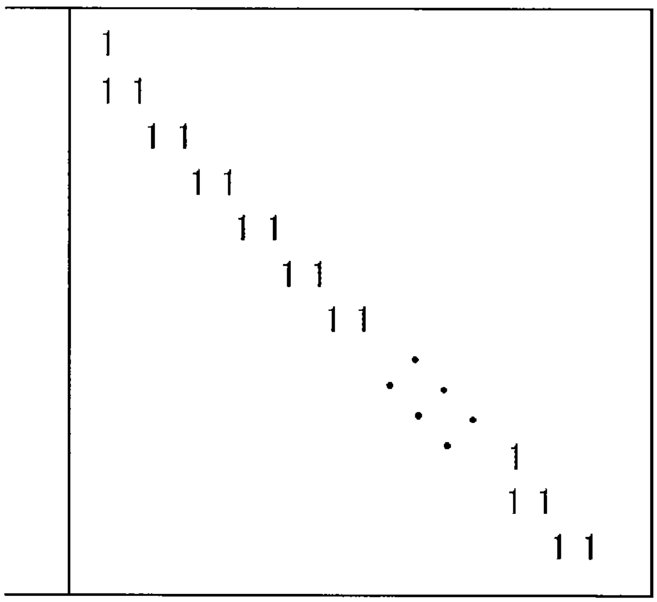
STEPWISE STRUCTURE OF PARITY MATRIX
A
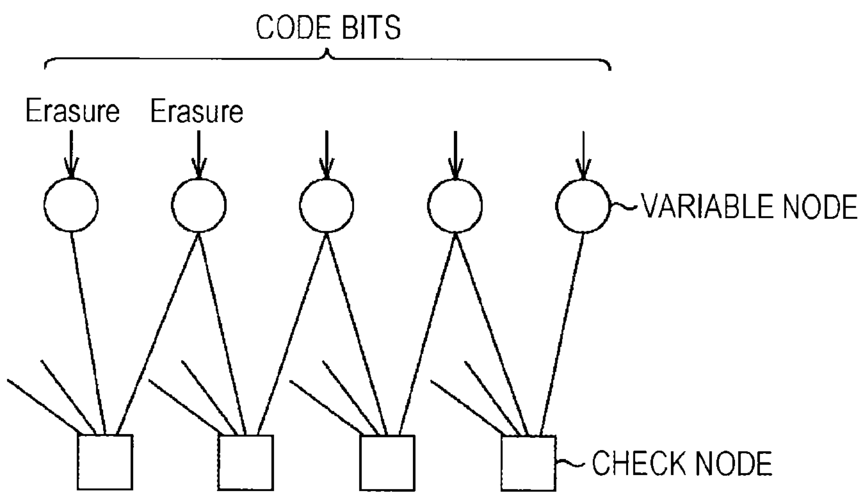
STEPWISE STRUCTURE PORTION OF TANNER GRAPH
B

FIG. 29

| NUMBER OF NECESSARY COLUMNS OF MEMORY mb | b=1 (FIRST TO THIRD PERMUTATION METHODS) | b=2 (FOURTH PERMUTATION METHOD) | RESPECTIVE WRITE START POSITIONS IN mb COLUMNS | | | | | | | | | | | | | | | | | | | | | | | |
|---|---|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 2 | | | | | | | | | | | | | | | | | | | | | | |
| 4 | 16QAM | QPSK | 0 | 2 | 4 | 7 | | | | | | | | | | | | | | | | | | | | |
| 6 | 64QAM | | 0 | 2 | 5 | 9 | 10 | 13 | | | | | | | | | | | | | | | | | | |
| 8 | 256QAM | 16QAM | 0 | 0 | 2 | 4 | 4 | 5 | 7 | 7 | | | | | | | | | | | | | | | | |
| 10 | 1024QAM | | 0 | 3 | 6 | 8 | 11 | 13 | 15 | 17 | 18 | 20 | | | | | | | | | | | | | | |
| 12 | 4096QAM | 64QAM | 0 | 0 | 2 | 2 | 3 | 4 | 4 | 5 | 5 | 7 | 8 | 9 | | | | | | | | | | | | |
| 16 | | 256QAM | 0 | 2 | 2 | 2 | 2 | 3 | 7 | 15 | 16 | 20 | 22 | 22 | 27 | 27 | 28 | 32 | | | | | | | | |
| 20 | | 1024QAM | 0 | 1 | 3 | 4 | 5 | 6 | 6 | 9 | 13 | 14 | 14 | 16 | 21 | 21 | 23 | 25 | 25 | 26 | 28 | 30 | | | | |
| 24 | | 4096QAM | 0 | 5 | 8 | 8 | 8 | 8 | 10 | 10 | 10 | 12 | 13 | 16 | 17 | 19 | 21 | 22 | 23 | 26 | 37 | 39 | 40 | 41 | 41 | 41 |

FIG. 30

| NUMBER OF NECESSARY COLUMNS OF MEMORY mb | b = 1 (FIRST TO THIRD PERMUTATION METHODS) | b = 2 (FOURTH PERMUTATION METHOD) | RESPECTIVE WRITE START POSITIONS IN mb COLUMNS | | | | | | | | | | | | | | | | | | | | | | | |
|---|---|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 0 | | | | | | | | | | | | | | | | | | | | | | |
| 4 | 16QAM | QPSK | 0 | 2 | 3 | 3 | | | | | | | | | | | | | | | | | | | | |
| 6 | 64QAM | | 0 | 0 | 2 | 3 | 7 | 7 | | | | | | | | | | | | | | | | | | |
| 8 | 256QAM | 16QAM | 0 | 0 | 0 | 1 | 7 | 20 | 20 | 21 | | | | | | | | | | | | | | | | |
| 10 | 1024QAM | | 0 | 1 | 2 | 2 | 3 | 3 | 4 | 4 | 5 | 7 | | | | | | | | | | | | | | |
| 12 | 4096QAM | 64QAM | 0 | 0 | 0 | 2 | 2 | 2 | 3 | 3 | 3 | 6 | 7 | 7 | | | | | | | | | | | | |
| 20 | | 1024QAM | 0 | 0 | 0 | 2 | 2 | 2 | 2 | 2 | 5 | 5 | 5 | 5 | 5 | 7 | 7 | 7 | 7 | 8 | 8 | 10 | | | | |
| 24 | | 4096QAM | 0 | 0 | 0 | 0 | 0 | 0 | 0 | 1 | 1 | 1 | 2 | 2 | 2 | 3 | 7 | 9 | 9 | 9 | 10 | 10 | 10 | 10 | 10 | 11 |

FIG. 32

EQUIVALENT REDUCED MODEL OF FLUTTER

A

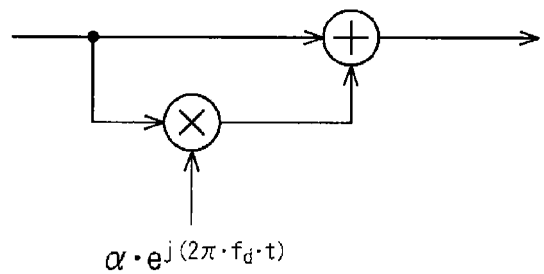

$1/\alpha^2 = D/U$
$f_d$: doppler freq.
t: time

SIMULATIONS WERE PERFORMED USING MODEL OBTAINED BY EXTRACTION OF ONE CARRIER ON RECEIVING SIDE AFTER FFT WAS PERFORMED ON OFDM SYMBOL THAT WAS TRANSMITTED ON THIS CHANNEL.

B

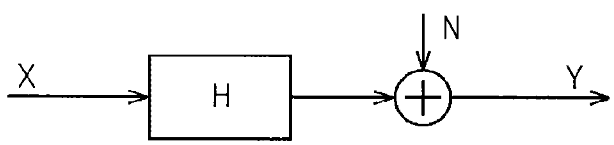

$$Y = \underbrace{\left[1 + \alpha \cdot \exp\left(j2\pi \cdot m \cdot f_d \cdot Ts + j2\pi \cdot \frac{(Nu-1) \cdot f_d \cdot Tu}{Nu}\right) \cdot \frac{\mathrm{sinc}(\pi \cdot f_d \cdot Tu)}{\mathrm{sinc}(\pi \cdot f_d \cdot Tu/Nu)}\right]}_{H} \cdot X + N$$

$$E\left[N^2\right] = \underbrace{\alpha^2 \cdot \left(1 - \left|\frac{\mathrm{sinc}(\pi \cdot f_d \cdot Tu)}{\mathrm{sinc}(\pi \cdot f_d \cdot Tu/Nu)}\right|^2\right)}_{\text{POWER OF } |C| \text{: APPROXIMATED BY AWGN}}$$

POWER OF |C| : APPROXIMATED BY AWGN m: symbol number
Ts: symbol length (sec)
Tu: effective symbol length (sec)
Nu: number of OFDM carriers r1/4 16 k 6295 9626 304 7695 4839 4936 1660 144 11203 5567 6347 12557
10691 4988 3859 3734 3071 3494 7687 10313 5964 8069 8296 11090
10774 3613 5208 11177 7676 3549 8746 6583 7239 12265 2674 4292
11869 3708 5981 8718 4908 10650 6805 3334 2627 10461 9285 11120
7844 3079 10773
3385 10854 5747
1360 12010 12202
6189 4241 2343
9840 12726 4977

FIG. 40

N=64800, rate=2/30

N=64800, rate=3/30

N=64800, rate=4/30

N=64800, rate=5/30

N=64800, rate=6/30

N=64800, rate=7/30

N=64800, rate=8/30

| | | |
|---|---|---|
| 17989 | 31811 | 47215 |
| 5624 | 25501 | 33016 |
| 5024 | 9037 | 33642 |
| 93 | 7329 | 46908 |
| 20303 | 42578 | 46780 |
| 16137 | 26869 | 42360 |
| 112 | 3049 | 46527 |
| 23615 | 29931 | 47360 |
| 23050 | 24267 | 44687 |
| 60 | 40754 | 47114 |
| 30217 | 36283 | 37445 |
| 127 | 27308 | 38345 |

FIG. 48

N=64800, rate=9/30

N=64800, rate=10/30

N=64800, rate=11/30

N=64800, rate=12/30

N=64800, rate=13/30

N=64800, rate=14/30

N=64800, rate=15/30

N=64800, rate=16/30

N=64800, rate=17/30

N=64800, rate=18/30

N=64800, rate=19/30

N=64800, rate=20/30

N=64800, rate=21/30

N=64800, rate=22/30

N=64800, rate=23/30

N=64800, rate=24/30

N=64800, rate=25/30

N=64800, rate=26/30

N=64800, rate=27/30

N=64800, rate=28/30

Figure 102:
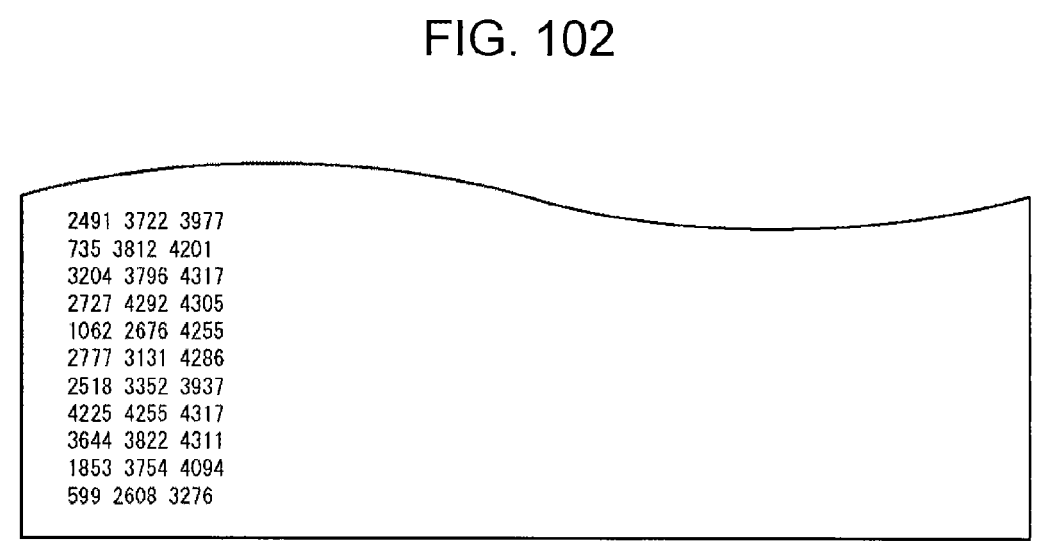

| | | |
|---|---|---|
| 2491 | 3722 | 3977 |
| 735 | 3812 | 4201 |
| 3204 | 3796 | 4317 |
| 2727 | 4292 | 4305 |
| 1062 | 2676 | 4255 |
| 2777 | 3131 | 4286 |
| 2518 | 3352 | 3937 |
| 4225 | 4255 | 4317 |
| 3644 | 3822 | 4311 |
| 1853 | 3754 | 4094 |
| 599 | 2608 | 3276 |

FIG. 103

N=64800, rate=29/30

| Rate | PERFORMANCE THRESHOLD (Es/NO) | MINIMUM CYCLE LENGTH |
|---|---|---|
| 2/30 | -9. 523519 | 14 |
| 3/30 | -7. 758979 | 14 |
| 4/30 | -6. 428797 | 6 |
| 5/30 | -5. 490092 | 10 |
| 6/30 | -4. 589849 | 10 |
| 7/30 | -3. 760281 | 12 |
| 8/30 | -3. 191565 | 8 |
| 9/30 | -2. 550214 | 10 |
| 10/30 | -1. 878597 | 8 |
| 11/30 | -1. 378961 | 8 |
| 12/30 | -0. 947792 | 6 |
| 13/30 | -0. 494134 | 6 |
| 14/30 | -0. 045119 | 8 |
| 15/30 | 0. 428446 | 8 |
| 16/30 | 0. 829080 | 8 |
| 17/30 | 1. 248503 | 8 |
| 18/30 | 1. 658523 | 8 |
| 19/30 | 2. 078240 | 8 |
| 20/30 | 2. 489205 | 6 |
| 21/30 | 2. 918982 | 6 |
| 22/30 | 3. 351930 | 6 |
| 23/30 | 3. 788323 | 6 |
| 24/30 | 4. 252169 | 6 |
| 25/30 | 4. 761537 | 6 |
| 26/30 | 5. 301749 | 6 |
| 27/30 | 5. 921125 | 6 |
| 28/30 | 6. 675945 | 6 |
| 29/30 | 7. 881048 | 6 |

FIG. 111

| Rate | X | KX | Y1 | KY1 | Y2 | KY2 | M |
|---|---|---|---|---|---|---|---|
| 2/30 | 34 | 1440 | 4 | 2880 | 3 | 0 | 60480 |
| 3/30 | 20 | 2160 | 4 | 2160 | 3 | 2160 | 58320 |
| 4/30 | 35 | 2520 | 4 | 6120 | 3 | 0 | 56160 |
| 5/30 | 23 | 3600 | 4 | 3600 | 3 | 3600 | 54000 |
| 6/30 | 17 | 4680 | 4 | 1440 | 3 | 6840 | 51840 |
| 7/30 | 13 | 5760 | 4 | 0 | 3 | 9360 | 49680 |
| 8/30 | 19 | 5400 | 4 | 4680 | 3 | 7200 | 47520 |
| 9/30 | 15 | 6840 | 4 | 360 | 3 | 12240 | 45360 |
| 10/30 | 22 | 5760 | 4 | 0 | 3 | 15840 | 43200 |
| 11/30 | 34 | 3600 | 4 | 20160 | 3 | 0 | 41040 |
| 12/30 | 30 | 4320 | 4 | 12600 | 3 | 9000 | 38880 |
| 13/30 | 25 | 5400 | 4 | 6840 | 3 | 15840 | 36720 |
| 14/30 | 21 | 6840 | 4 | 0 | 3 | 23400 | 34560 |
| 15/30 | 23 | 5400 | 4 | 12240 | 3 | 14760 | 32400 |
| 16/30 | 19 | 6480 | 4 | 5400 | 3 | 22680 | 30240 |
| 17/30 | 18 | 7560 | 4 | 1080 | 3 | 28080 | 28080 |
| 18/30 | 19 | 6840 | 4 | 6840 | 3 | 25200 | 25920 |
| 19/30 | 17 | 7920 | 4 | 1800 | 3 | 31320 | 23760 |
| 20/30 | 16 | 8280 | 4 | 720 | 3 | 34200 | 21600 |
| 21/30 | 15 | 8640 | 4 | 0 | 3 | 36720 | 19440 |
| 22/30 | 15 | 8280 | 4 | 2520 | 3 | 36720 | 17280 |
| 23/30 | 15 | 8640 | 4 | 2160 | 3 | 38880 | 15120 |
| 24/30 | 14 | 9360 | 4 | 0 | 3 | 42480 | 12960 |
| 25/30 | 13 | 9720 | 4 | 0 | 3 | 44280 | 10800 |
| 26/30 | 13 | 9360 | 4 | 360 | 3 | 46440 | 8640 |
| 27/30 | 12 | 10440 | 4 | 0 | 3 | 47880 | 6480 |
| 28/30 | 11 | 11160 | 4 | 0 | 3 | 49320 | 4320 |
| 29/30 | 5 | 2160 | 4 | 360 | 3 | 60120 | 2160 |

| LDPD code | BCH Uncoded Block $K_{bch}$ | BCH coded block $K_{bch}$ LDPC Uncoded Block $K_{ldpc}$ | BCH t-error correction | LDPC Coded Block $n_{ldpc}$ |
|---|---|---|---|---|
| 1/4 | 16 008 | 16 200 | 12 | 64 800 |
| 1/3 | 21 408 | 21 600 | 12 | 64 800 |
| 2/5 | 25 728 | 25 920 | 12 | 64 800 |
| 1/2 | 32 208 | 32 400 | 12 | 64 800 |
| 3/5 | 38 688 | 38 880 | 12 | 64 800 |
| 2/3 | 43 040 | 43 200 | 10 | 64 800 |
| 3/4 | 48 408 | 48 600 | 12 | 64 800 |
| 4/5 | 51 648 | 51 840 | 12 | 64 800 |
| 5/6 | 53 840 | 54 000 | 10 | 64 800 |
| 8/9 | 57 472 | 57 600 | 8 | 64 800 |
| 9/10 | 58 192 | 58 320 | 8 | 64 800 |

B

| LDPC code rate | NUMBER OF BCH CODE INFORMATION BITS | NUMBER OF BCH CODE BITS (NUMBER OF LDPC CODE INFORMATION BITS) | NUMBER OF BCH CORRECTION BITS | NUMBER OF LDPC CODE BITS |
|---|---|---|---|---|
| 2/30 | 4128 | 4320 | 12 | 64800 |
| 3/30 | 6288 | 6480 | 12 | 64800 |
| 4/30 | 8448 | 8640 | 12 | 64800 |
| 5/30 | 10608 | 10800 | 12 | 64800 |
| 6/30 | 12768 | 12960 | 12 | 64800 |
| 7/30 | 14928 | 15120 | 12 | 64800 |
| 8/30 | 17088 | 17280 | 12 | 64800 |
| 9/30 | 19248 | 19440 | 12 | 64800 |
| 10/30 | 21408 | 21600 | 12 | 64800 |
| 11/30 | 23568 | 23760 | 12 | 64800 |
| 12/30 | 25728 | 25920 | 12 | 64800 |
| 13/30 | 27888 | 28080 | 12 | 64800 |
| 14/30 | 30048 | 30240 | 12 | 64800 |
| 15/30 | 32208 | 32400 | 12 | 64800 |
| 16/30 | 34368 | 34560 | 12 | 64800 |
| 17/30 | 36528 | 36720 | 12 | 64800 |
| 18/30 | 38688 | 38880 | 12 | 64800 |
| 19/30 | 40848 | 41040 | 12 | 64800 |
| 20/30 | 43040 | 43200 | 10 | 64800 |
| 21/30 | 45168 | 45360 | 12 | 64800 |
| 22/30 | 47328 | 47520 | 12 | 64800 |
| 23/30 | 49488 | 49680 | 12 | 64800 |
| 24/30 | 51648 | 51840 | 12 | 64800 |
| 25/30 | 53840 | 54000 | 10 | 64800 |
| 26/30 | 56032 | 56160 | 8 | 64800 |
| 27/30 | 58192 | 58320 | 8 | 64800 |
| 28/30 | 60352 | 60480 | 8 | 64800 |
| 29/30 | 62512 | 62640 | 8 | 64800 |

H'=

H'=

DATA PROCESSING APPARATUS AND DATA PROCESSING METHOD

CROSS-REFERENCE TO RELATED APPLICATIONS

This application is a continuation of U.S. application Ser. No. 15/962,992, filed Apr. 25, 2018, which is a continuation of U.S. application Ser. No. 14/386,830, filed Sep. 22, 2014, which is a National Stage of PCT/JP14/51624, filed Jan. 27, 2014, which claims priority to Japanese Application No. 2013-023883, filed Feb. 8, 2013. The entire contents of each of the above-identified documents are incorporated herein by reference.

TECHNICAL FIELD

The present technology relates to data processing apparatuses and data processing methods, and more specifically to data processing apparatuses and data processing methods which enable provision of, for example, LDPC codes that achieve good error-rate performance.

BACKGROUND ART

In recent years, LDPC (Low Density Parity Check) codes, which have a high error-correcting capability, have been widely employed in transmission schemes including satellite digital broadcasting technologies, such as DVB (Digital Video Broadcasting)—S.2, which is used in Europe (see, for example, NPL 1). LDPC codes are also employed in next-generation terrestrial digital broadcasting technologies, such as DVB-T.2.

Recent studies have found that, like turbo codes, LDPC codes have a performance closer to the Shannon limit for larger code lengths. In addition, because of their characteristic of having minimum distance proportional to code lengths, LDPC codes have the feature of high block error probability performance, and have a further advantage in showing substantially no error floor phenomena, which is observed in the decoding characteristics of turbo codes and the like.

LDPC codes will now be described in more detail. LDPC codes are linear codes, and may or may not be binary. The following description will be given in the context of binary LDPC codes.

An LDPC code has the most striking feature that it is defined by a sparse parity check matrix. Here, the term "sparse matrix" refers to a matrix having a very small number of elements of 1 (or a matrix whose elements are almost zeros).

FIG. 1 illustrates an example of a parity check matrix H of an LDPC code.

In the parity check matrix H illustrated in FIG. 1, the weight of each column (column weight) (i.e., the number of 1s) is 3 and the weight of each row (row weight) is 6.

In an encoding operation using an LDPC code (LDPC encoding), for example, a generator matrix G is generated on the basis of a parity check matrix H. By multiplying the generator matrix G by binary information bits, a code word (i.e., an LDPC code) is generated.

Specifically, an encoding device that performs LDPC encoding first calculates a generator matrix G, where the equation $GE^T=0$ is established between the transpose $H^T$ of the parity check matrix H and the generator matrix G. Here, if the generator matrix G is a K×N matrix, the encoding device multiplies the generator matrix G by a bit sequence (i.e., a vector u) of K information bits to generate a code word c (=uG) having N bits. The code word (or LDPC code) generated by the encoding device is received on the receiver side via a certain communication path.

An LDPC code can be decoded using the message passing algorithm, which is an algorithm called probabilistic decoding proposed by Gallager and which is based on belief propagation on a so-called Tanner graph with variable nodes (also referred to as "message nodes") and check nodes. Here, the variable nodes and the check nodes will also be hereinafter referred to simply as "nodes" as appropriate.

FIG. 2 illustrates an LDPC code decoding procedure.

Note that, in the following description, a real-number value representing the likelihood of the value "0" of the i-th bit of an LDPC code (i.e., a code word) received on the receiver side, which is expressed in log likelihood ratio (i.e., a reception LLR), is also referred to as a "reception value $u_{01}$" as appropriate. Further, a message output from a check node is represented by $u_j$, and a message output from a variable node is represented by $v_i$.

In an LDPC code decoding process, first, as illustrated in FIG. 2, in step S11, an LDPC code is received, and a message (check node message) $u_j$ is initialized to "0". In addition, a variable k of a counter for repetitive processing, which takes an integer value, is initialized to "0". Then, the process proceeds to step S12. In step S12, a message (variable node message) $v_i$ is determined by performing computation given by Expression (1) (variable node computation) on the basis of a reception value $u_{0i}$ obtained through the reception of the LDPC code. A message $u_j$ is further determined by performing computation given by Expression (2) (check node computation) on the basis of the message $v_i$.

[Math. 1]

$$v_i = u_{0i} + \sum_{j=1}^{d_v-1} u_j \tag{1}$$

[Math. 2]

$$\tanh\left(\frac{u_j}{2}\right) = \prod_{i=1}^{d_c-1} \tanh\left(\frac{v_i}{2}\right) \tag{2}$$

Here, $d_v$ and $d_c$ in Expressions (1) and (2) are arbitrarily selectable parameters indicating the number of 1s in the vertical direction (columns) and the horizontal direction (rows) of the parity check matrix H, respectively. For example, for an LDPC code in a parity check matrix H with a column weight of 3 and a row weight of 6 (i.e., a (3,6) LDPC code) illustrated in FIG. 1, $d_v=3$ and $d_c=6$.

Note that, in each of the variable node computation of Expression (1) and the check node computation of Expression (2), a message input from an edge (or a line connecting between a variable node and a check node) from which a message is output is not the target of the computation. Thus, the range of computation is 1 to $d_v$—1 or 1 to $d_c$−1. Furthermore, the check node computation of Expression (2) is actually performed by creating in advance a table of a function $R(v_1, v_2)$ given by Expression (3), which is defined by one output for two inputs $v_1$ and $v_2$, and sequentially (or recursively) using the table in the manner given by Expression (4).

[Math. 3]

$$x=2\tan h^{-1}\{\tan h(v_1/2)\tan h(v_2/2)\}=R(v_1,v_2) \quad (3)$$

[Math. 4]

$$u_j=R(v_1,R(v_2,R(v_3,\ \ldots\ R(v_{d_c-2},v_{d_c-1})))) \quad (4)$$

In step S12, furthermore, the variable k is incremented by "1". Then, the process proceeds to step S13. In step S13, it is determined whether the variable k is larger than a certain number of times of repetitive decoding C. If it is determined in step S13 that the variable k is not larger than C, the process returns to step S12, and subsequently, similar processing is repeatedly performed.

If it is determined in step S13 that the variable k is larger than C, the process proceeds to step S14. In step S14, a message $v_i$ as a final output result of decoding is determined by performing computation given by Expression (5), and is output. Then, the LDPC code decoding process ends.

[Math. 5]

$$v_i = u_{0i} + \sum_{j=1}^{d_v} u_j. \quad (5)$$

Here, the computation of Expression (5) is performed using, unlike the variable node computation of Expression (1), the messages $u_j$ from all the edges connected to a variable node.

FIG. 3 illustrates an example of a parity check matrix H of a (3,6) LDPC code (with a code rate of 1/2 and a code length of 12).

In the parity check matrix H illustrated in FIG. 3, similarly to FIG. 1, the column weight is 3 and the row weight is 6.

FIG. 4 illustrates a Tanner graph of the parity check matrix H illustrated in FIG. 3.

Here, in FIG. 4, a check node is represented by a plus "+" sign, and a variable node is represented by an equal "=" sign. A check node and a variable node correspond to each row and column of the parity check matrix H, respectively. A connection between a check node and a variable node is an edge, and corresponds to an element of "1" in the parity check matrix.

More specifically, in a case where the element in the j-th row and the i-th column of the parity check matrix is 1, in FIG. 4, the i-th variable node ("=" node) from the top and the j-th check node ("+" node) from the top are connected by an edge. An edge indicates that a code bit corresponding to a variable node has a constraint corresponding to a check node.

In the sum product algorithm, which is an LDPC code decoding method, variable node computation and check node computation are repeatedly performed.

FIG. 5 illustrates variable node computation to be performed at a variable node.

At a variable node, a message $v_i$ corresponding to an edge for which calculation is to be performed is determined through the variable node computation of Expression (1) using messages $u_1$ and $u_2$ from the remaining edges connected to the variable node and also using a reception value $u_{0i}$. The messages corresponding to the other edges are also determined in a similar way.

FIG. 6 illustrates check node computation to be performed at a check node.

Here, the check node computation of Expression (2) can be rewritten as Expression (6) by using the relationship of the equation $a\times b=\exp\{\ln(|a|)+\ln(|b|)\}\times\mathrm{sign}(a)\times\mathrm{sign}(b)$, where sign(x) is 1 for $x\geq 0$ and $-1$ for $x<0$.

[Math. 6]

$$\begin{aligned} u_j &= 2\tanh^{-1}\left(\prod_{i=1}^{d_c-1}\tanh\left(\frac{v_i}{2}\right)\right) \\ &= 2\tanh^{-1}\left[\exp\left\{\sum_{i=1}^{d_c-1}\ln\left(\left|\tanh\left(\frac{v_i}{2}\right)\right|\right)\right\}\times\prod_{i=1}^{d_c-1}\mathrm{sign}\left(\tanh\left(\frac{v_i}{2}\right)\right)\right] \\ &= 2\tanh^{-1}\left[\exp\left\{-\left(\sum_{i=1}^{d_c-1}-\ln\left(\tanh\left(\frac{|v_i|}{2}\right)\right)\right)\right\}\right]\times\prod_{i=1}^{d_c-1}\mathrm{sign}(v_i) \end{aligned} \quad (6)$$

If the function $\phi(x)$ is defined as the equation $\phi(x)=\ln(\tan h(x/2))$ for $x\geq 0$, the equation $\phi^{-1}(x)=2\tan h^{-1}(e^{-x})$ is established. Thus, Expression (6) can be transformed into Expression (7).

[Math. 7]

$$u_j = \phi^{-1}\left(\sum_{i=1}^{d_c-1}\phi(|v_i|)\right)\times\prod_{i=1}^{d_c-1}\mathrm{sign}(v_i) \quad (7)$$

At a check node, the check node computation of Expression (2) is performed in accordance with Expression (7).

More specifically, at a check node, as illustrated in FIG. 6, a message $u_3$ corresponding to an edge for which calculation is to be performed is determined through the check node computation of Expression (7) using messages $v_1$, $v_2$, $v_3$, $v_4$, and $v_5$ from the remaining edges connected to the check node. The messages corresponding to the other edges are also determined in a similar way.

Note that the function $\phi(x)$ in Expression (7) can be represented by the equation $\phi(x)=\ln((e^x+1)/(e^x-1))$, where $\phi(x)=\phi^{-1}(x)$ for $x>0$. The functions $\phi(x)$ and $\phi^{-1}(x)$ may be implemented in hardware by using an LUT (Look Up Table), where the same LUT is used for both functions.

CITATION LIST

Non Patent Literature

NPL 1: DVB-S.2: ETSI EN 302307 V1.2.1 (2009-08)

SUMMARY OF INVENTION

Technical Problem

In the standards that employ LDPC codes, such as DVB-S.2, DVB-T.2, and DVB-C.2, an LDPC code is mapped to symbols (or is symbolized) of orthogonal modulation (digital modulation) such as QPSK (Quadrature Phase Shift Keying). The symbols are mapped to constellation points and are transmitted.

Meanwhile, there has recently been a demand for efficient transmission of a large amount of data such as a three-dimensional (3D) image or a 4 k image. A 4 k image has a resolution of 3840 pixels horizontally and 2160 pixels vertically, providing approximately four times the pixel resolution of full high definition.

However, prioritizing the efficiency of data transmission would increase an error rate.

On the contrary, there may also be a demand that the efficiency of data transmission can be somewhat sacrificed for data transmission with good error-rate performance.

In the future, demands for data transmission with various efficiency levels are expected to increase. For example, a plurality of LDPC codes having different code rates allow data transmission with various efficiency levels.

In data transmission, therefore, it is desirable that LDPC codes having code rates which are easily set to a somewhat large number of code rates, the number of which is greater than or equal to, for example, the number of code rates demanded for data transmission, be employed.

It is also desirable that LDPC codes have high resistance to errors (i.e., high robustness), that is, good error-rate performance, no matter which code rate of LDPC code is to be employed.

The present technology has been made in view of the foregoing situation, and is intended to provide LDPC codes having good error-rate performance.

Solution to Problem

A first data processing apparatus or data processing method of the present technology includes an encoding unit configured to encode or an encoding step of encoding information bits into an LDPC (Low Density Parity Check) code having a code length of 64800 bits and a code rate of 24/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including

| | | | | | | | | | | | | | |
|---|---|---|---|---|---|---|---|---|---|---|---|---|---|
| 1504 | 2103 | 2621 | 2840 | 3869 | 4594 | 5246 | 6314 | 7327 | 7364 | 10425 | 11934 | 12898 | 12954 |
| 27 | 1903 | 3923 | 4513 | 7812 | 8098 | 8428 | 9789 | 10519 | 11345 | 12032 | 12157 | 12573 | 12930 |
| 17 | 191 | 660 | 2451 | 2475 | 2976 | 3398 | 3616 | 5769 | 6724 | 8641 | 10046 | 11552 | 12842 |
| 13 | 1366 | 4993 | 6468 | 7689 | 8563 | 9131 | 10012 | 10914 | 11574 | 11837 | 12203 | 12715 | 12946 |
| 432 | 872 | 2603 | 3286 | 3306 | 3385 | 4137 | 5563 | 7540 | 9339 | 9948 | 12315 | 12656 | 12929 |
| 1113 | 1394 | 4104 | 4186 | 7290 | 8827 | 11522 | 11833 | 12359 | 12363 | 12629 | 12821 | 12904 | 12946 |
| 14 | 441 | 1432 | 1677 | 2432 | 8981 | 11478 | 11507 | 12599 | 12783 | 12793 | 12912 | 12922 | 12943 |
| 1579 | 1806 | 7971 | 8586 | 9845 | 10357 | 11600 | 12007 | 12020 | 12339 | 12576 | 12817 | 12830 | 12904 |
| 20 | 546 | 3672 | 5538 | 6944 | 8052 | 8781 | 9743 | 12269 | 12393 | 12418 | 12549 | 12555 | 12718 |
| 1 | 3540 | 4397 | 5011 | 6626 | 8617 | 9587 | 10360 | 10602 | 11402 | 11983 | 12068 | 12495 | 12838 |
| 30 | 1572 | 4908 | 7421 | 8041 | 8910 | 8963 | 11005 | 11930 | 12240 | 12340 | 12467 | 12892 | 12933 |
| 33 | 2060 | 3907 | 4215 | 5545 | 8306 | 8655 | 8743 | 8806 | 9315 | 9364 | 10685 | 11954 | 12959 |
| 1338 | 2596 | 4876 | 5207 | 9555 | 10421 | 10929 | 11648 | 11739 | 12375 | 12416 | 12643 | 12742 | 12754 |
| 9469 | 10544 | 10932 | 11250 | 11426 | 11582 | 11846 | 12139 | 12202 | 12210 | 12356 | 12378 | 12873 | 12929 |
| 2681 | 3337 | 3616 | 6113 | 7078 | 8167 | 8624 | 9697 | 10908 | 11781 | 11855 | 12095 | 12475 | 12659 |
| 28 | 4086 | 5432 | 6555 | 6848 | 7368 | 8794 | 11483 | 11572 | 12414 | 12816 | 12894 | 12936 | 12957 |
| 5 | 5044 | 5512 | 9023 | 9192 | 9589 | 9979 | 10009 | 10855 | 10991 | 11715 | 12314 | 12610 | 12945 |
| 17 | 272 | 602 | 5681 | 6530 | 9572 | 9886 | 11061 | 11495 | 12238 | 12265 | 12483 | 12885 | 12955 |
| 22 | 2245 | 4282 | 4469 | 5007 | 6650 | 6733 | 10151 | 10401 | 11571 | 12004 | 12261 | 12805 | 12844 |
| 23 | 3270 | 4468 | 8621 | 9662 | 11240 | 11934 | 12091 | 12444 | 12691 | 12717 | 12858 | 12888 | 12917 |
| 740 | 1519 | 4923 | 6191 | 7878 | 8350 | 9293 | 10779 | 11020 | 11287 | 11630 | 12792 | 12862 | 12920 |
| 12 | 28 | 3584 | 6072 | 7079 | 8075 | 10477 | 11130 | 11383 | 11780 | 12341 | 12667 | 12818 | 12927 |
| 14 | 118 | 5283 | 5382 | 8301 | 9097 | 9413 | 9664 | 10437 | 10701 | 11124 | 12685 | 12730 | 12734 |
| 32 | 1426 | 3078 | 4325 | 5353 | 7780 | 9042 | 9928 | 10077 | 10377 | 10679 | 11191 | 11750 | 12611 |
| 1 | 669 | 3831 | 3980 | 5381 | 5412 | 6552 | 8453 | 9435 | 10243 | 11546 | 11821 | 11987 | 12807 |
| 232 | 483 | 919 | 1232 | 2156 | 2396 | 2990 | 3774 | 8539 | 8704 | 8819 | 10810 | 11868 | 12634 |

| | | |
|---|---|---|
| 2381 | 7309 | 9334 |
| 348 | 6494 | 12623 |
| 4872 | 6257 | 11090 |
| 7 | 11970 | 11985 |
| 6615 | 12788 | 12855 |
| 1173 | 5269 | 12647 |
| 1944 | 7738 | 8116 |
| 17 | 4828 | 9175 |
| 2329 | 6034 | 12642 |
| 1254 | 2366 | 5013 |
| 2984 | 5078 | 5664 |
| 7423 | 10265 | 11528 |
| 1656 | 8526 | 8716 |
| 22 | 287 | 2837 |
| 18 | 100 | 3079 |
| 299 | 3171 | 12169 |
| 33 | 5920 | 11144 |
| 1286 | 3650 | 9309 |
| 2283 | 8809 | 12588 |
| 3199 | 8242 | 9081 |
| 2507 | 6846 | 8113 |
| 5211 | 8722 | 12689 |
| 1064 | 2592 | 8659 |
| 6136 | 6925 | 12958 |
| 1256 | 12789 | 12932 |
| 4274 | 8045 | 8788 |
| 1824 | 3209 | 6926 |
| 11 | 8899 | 12669 |
| 6249 | 6338 | 8730 |

-continued

| | | |
|---|---|---|
| 641 | 9679 | 12831 |
| 3459 | 9876 | 11185 |
| 3226 | 6148 | 8173 |
| 9078 | 12126 | 12771 |
| 10907 | 11278 | 12731 |
| 3392 | 4020 | 12838 |
| 2814 | 11588 | 12909 |
| 6063 | 9214 | 11519 |
| 6064 | 6827 | 12683 |
| 1610 | 2452 | 6582 |
| 903 | 6289 | 8074 |
| 4592 | 8138 | 12952 |
| 2587 | 6271 | 9945 |
| 2733 | 11844 | 11893 |
| 581 | 4601 | 10020 |
| 14 | 5597 | 6049 |
| 343 | 3582 | 5931 |
| 5263 | 6521 | 12846 |
| 1394 | 2457 | 5251 |
| 11 | 4627 | 12747 |
| 2650 | 10366 | 12390 |
| 6285 | 11893 | 12062 |
| 10143 | 12892 | 12956 |
| 8448 | 11917 | 12330 |
| 4209 | 11693 | 12356 |
| 1529 | 2360 | 9086 |
| 5389 | 8148 | 10224 |
| 64 | 4876 | 12862 |
| 9483 | 12659 | 12887 |
| 3587 | 6767 | 12478 |
| 3122 | 5245 | 9049 |
| 3267 | 10118 | 11466 |
| 1347 | 3857 | 6705 |
| 9384 | 9576 | 11971 |
| 1366 | 8708 | 10758 |
| 412 | 4249 | 12863 |
| 1676 | 10488 | 11850 |
| 17 | 1605 | 2455 |
| 14 | 111 | 6045 |
| 11368 | 12919 | 12953 |
| 10588 | 11530 | 12937 |
| 4549 | 5143 | 12218 |
| 3088 | 4185 | 11674 |
| 23 | 2554 | 7823 |
| 6615 | 9291 | 9863 |
| 2229 | 3629 | 10855 |
| 3818 | 5509 | 12764 |
| 2740 | 11525 | 12914 |
| 8297 | 8611 | 12948 |
| 3606 | 11104 | 12920 |
| 5097 | 10412 | 12759 |
| 6502 | 7266 | 12072 |
| 5425 | 5490 | 10728 |
| 22 | 73 | 8462 |
| 32 | 12439 | 12657 |
| 8483 | 9540 | 10430 |
| 7275 | 7377 | 7420 |
| 5748 | 9726 | 12356 |
| 5672 | 6150 | 9156 |
| 28 | 3527 | 5857 |
| 520 | 7099 | 11335 |
| 405 | 6173 | 12865 |
| 5847 | 12843 | 12934 |
| 4289 | 7679 | 10386 |
| 2950 | 8021 | 12938 |
| 8844 | 11214 | 12955 |
| 2130 | 10760 | 12665 |
| 734 | 4790 | 12940 |
| 8 | 6991 | 12772 |
| 19 | 8205 | 11289 |
| 12 | 1440 | 9077 |
| 8670 | 8837 | 12951 |
| 3531 | 9166 | 12937 |
| 15 | 8901 | 8929 |
| 838 | 10114 | 11740 |
| 2648 | 9959 | 10934 |
| 323 | 7499 | 12877 |
| 5505 | 5659 | 11395 |
| 6627 | 12709 | 12933 |

-continued

| | | |
|---|---|---|
| 364 | 1976 | 12888 |
| 8213 | 9124 | 12793 |
| 9588 | 10088 | 11108 |
| 299 | 890 | 11634 |
| 7368 | 7598 | 11602 |
| 28 | 4669 | 12585 |
| 15 | 27 | 12474 |
| 1426 | 3614 | 4205 |
| 30 | 2087 | 11147 |
| 6226 | 6259 | 12941. |

A second data processing apparatus or data processing method of the present technology includes a decoding unit configured to decode or a decoding step of decoding an LDPC (Low Density Parity Check) code having a code length of 64800 bits and a code rate of 24/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including

| | | | | | | | | | | | | | |
|---|---|---|---|---|---|---|---|---|---|---|---|---|---|
| 1504 | 2103 | 2621 | 2840 | 3869 | 4594 | 5246 | 6314 | 7327 | 7364 | 10425 | 11934 | 12898 | 12954 |
| 27 | 1903 | 3923 | 4513 | 7812 | 8098 | 8428 | 9789 | 10519 | 11345 | 12032 | 12157 | 12573 | 12930 |
| 17 | 191 | 660 | 2451 | 2475 | 2976 | 3398 | 3616 | 5769 | 6724 | 8641 | 10046 | 11552 | 12842 |
| 13 | 1366 | 4993 | 6468 | 7689 | 8563 | 9131 | 10012 | 10914 | 11574 | 11837 | 12203 | 12715 | 12946 |
| 432 | 872 | 2603 | 3286 | 3306 | 3385 | 4137 | 5563 | 7540 | 9339 | 9948 | 12315 | 12656 | 12929 |
| 1113 | 1394 | 4104 | 4186 | 7240 | 8827 | 11522 | 11833 | 12359 | 12363 | 12629 | 12821 | 12904 | 12946 |
| 14 | 441 | 1432 | 1677 | 2432 | 8981 | 11478 | 11507 | 12599 | 12783 | 12793 | 12912 | 12922 | 12943 |
| 1579 | 1806 | 7971 | 8586 | 9845 | 10357 | 11600 | 12007 | 12020 | 12339 | 12576 | 12817 | 12830 | 12904 |
| 20 | 546 | 3672 | 5538 | 6944 | 8052 | 8781 | 9743 | 12269 | 12393 | 12418 | 12549 | 12555 | 12718 |
| 1 | 3540 | 4397 | 5011 | 6626 | 8617 | 9587 | 10360 | 10602 | 11402 | 11983 | 12068 | 12495 | 12838 |
| 30 | 1572 | 4908 | 7421 | 8041 | 8910 | 8963 | 11005 | 11930 | 12240 | 12340 | 12467 | 12892 | 12933 |
| 33 | 2060 | 3907 | 4215 | 5545 | 8306 | 8655 | 8743 | 8806 | 9315 | 9364 | 10685 | 11954 | 12959 |
| 1338 | 2596 | 4876 | 5207 | 9555 | 10421 | 10929 | 11648 | 11739 | 12375 | 12416 | 12643 | 12742 | 12754 |
| 9469 | 10544 | 10932 | 11250 | 11426 | 11582 | 11846 | 12139 | 12202 | 12210 | 12356 | 12378 | 12873 | 12929 |
| 2681 | 3337 | 3616 | 6113 | 7078 | 8167 | 8624 | 9697 | 10908 | 11781 | 11855 | 12095 | 12475 | 12659 |
| 28 | 4086 | 5432 | 6555 | 6848 | 7368 | 8794 | 11483 | 11572 | 12414 | 12816 | 12894 | 12936 | 12957 |
| 5 | 5044 | 5572 | 9023 | 9192 | 9589 | 9979 | 10009 | 10855 | 10991 | 11715 | 12314 | 12610 | 12945 |
| 17 | 272 | 602 | 5681 | 6530 | 9572 | 9886 | 11061 | 11495 | 12238 | 12265 | 12483 | 12885 | 12955 |
| 22 | 2245 | 4282 | 4469 | 5007 | 6650 | 6733 | 10151 | 10401 | 11571 | 12004 | 12261 | 12805 | 12844 |
| 23 | 3270 | 4468 | 8621 | 9662 | 11240 | 11934 | 12091 | 12444 | 12691 | 12717 | 12858 | 12888 | 12917 |
| 740 | 1519 | 4923 | 6191 | 7878 | 8350 | 9293 | 10779 | 11020 | 11287 | 11630 | 12792 | 12862 | 12920 |
| 12 | 28 | 3584 | 6072 | 7079 | 8075 | 10477 | 11130 | 11383 | 11780 | 12341 | 12667 | 12818 | 12927 |
| 14 | 118 | 5283 | 5382 | 8301 | 9097 | 9413 | 9664 | 10437 | 10701 | 11124 | 12685 | 12730 | 12734 |
| 32 | 1426 | 3078 | 4325 | 5353 | 7780 | 9042 | 9928 | 10077 | 10377 | 10679 | 11191 | 11750 | 12611 |
| 1 | 669 | 3831 | 3980 | 5381 | 5412 | 6552 | 8453 | 9435 | 10243 | 11546 | 11821 | 11987 | 12807 |
| 232 | 483 | 919 | 1232 | 2156 | 2396 | 2990 | 3774 | 8539 | 8704 | 8819 | 10810 | 11868 | 12634 |

| | | |
|---|---|---|
| 2381 | 7309 | 9334 |
| 348 | 6494 | 12623 |
| 4872 | 6257 | 11090 |
| 7 | 11970 | 11985 |
| 6615 | 12788 | 12855 |
| 1173 | 5269 | 12647 |
| 1944 | 7738 | 8116 |
| 17 | 4828 | 9175 |
| 2329 | 6034 | 12642 |
| 1254 | 2366 | 5013 |
| 2984 | 5078 | 5664 |
| 7423 | 10265 | 11528 |
| 1656 | 8526 | 8716 |
| 22 | 287 | 2837 |
| 18 | 100 | 3079 |
| 299 | 3171 | 12169 |
| 33 | 5920 | 11144 |
| 1286 | 3650 | 9309 |
| 2283 | 8809 | 12588 |
| 3199 | 8242 | 9081 |
| 2507 | 6846 | 8113 |
| 5211 | 8722 | 12689 |
| 1064 | 2592 | 8659 |
| 6136 | 6925 | 12958 |
| 1256 | 12789 | 12932 |
| 4274 | 8045 | 8788 |
| 1824 | 3209 | 6926 |
| 11 | 8899 | 12669 |
| 6249 | 6338 | 8730 |

-continued

| | | |
|---|---|---|
| 641 | 9679 | 12831 |
| 3459 | 9876 | 11185 |
| 3226 | 6148 | 8173 |
| 9078 | 12126 | 12771 |
| 10907 | 11278 | 12731 |
| 3392 | 4020 | 12838 |
| 2814 | 11588 | 12909 |
| 6063 | 9214 | 11519 |
| 6064 | 6827 | 12683 |
| 1610 | 2452 | 6582 |
| 903 | 6289 | 8074 |
| 4592 | 8138 | 12952 |
| 2587 | 6271 | 9945 |
| 2733 | 11844 | 11893 |
| 581 | 4601 | 10020 |
| 14 | 5597 | 6049 |
| 343 | 3582 | 5931 |
| 5263 | 6521 | 12846 |
| 1394 | 2457 | 5251 |
| 11 | 4627 | 12747 |
| 2650 | 10366 | 12390 |
| 6285 | 11893 | 12062 |
| 10143 | 12892 | 12956 |
| 8448 | 11917 | 12330 |
| 4209 | 11693 | 12356 |
| 1529 | 2360 | 9086 |
| 5389 | 8148 | 10224 |
| 64 | 4876 | 12862 |
| 9483 | 12659 | 12887 |
| 3587 | 6767 | 12978 |
| 3122 | 5245 | 9044 |
| 3267 | 10118 | 11466 |
| 1347 | 3857 | 6705 |
| 9384 | 9576 | 11971 |
| 1366 | 8708 | 10758 |
| 412 | 4249 | 12863 |
| 1676 | 10488 | 11850 |
| 17 | 1605 | 2455 |
| 14 | 111 | 6045 |
| 11368 | 12919 | 12953 |
| 10588 | 11530 | 12937 |
| 4549 | 5143 | 12218 |
| 3088 | 4185 | 11674 |
| 23 | 2554 | 7823 |
| 6615 | 9291 | 9863 |
| 2229 | 3629 | 10855 |
| 3818 | 5509 | 12764 |
| 2740 | 11525 | 12914 |
| 8297 | 8611 | 12948 |
| 3606 | 11104 | 12920 |
| 5097 | 10412 | 12759 |
| 6502 | 7266 | 12072 |
| 5425 | 5490 | 10728 |
| 22 | 73 | 8462 |
| 32 | 12439 | 12657 |
| 8483 | 9540 | 10430 |
| 7275 | 7377 | 7420 |
| 5748 | 9726 | 12356 |
| 5672 | 6150 | 9156 |
| 28 | 3527 | 5857 |
| 520 | 7099 | 11335 |
| 405 | 6173 | 12865 |
| 5847 | 12843 | 12934 |
| 4289 | 7679 | 10386 |
| 2950 | 8021 | 12938 |
| 8844 | 11214 | 12955 |
| 2130 | 10760 | 12665 |
| 734 | 4790 | 12940 |
| 8 | 6991 | 12772 |
| 19 | 8205 | 11289 |
| 12 | 1440 | 9077 |
| 8670 | 8837 | 12951 |
| 3531 | 9166 | 12937 |
| 15 | 8901 | 8929 |
| 838 | 10114 | 11740 |
| 2648 | 9959 | 10934 |
| 323 | 7499 | 12877 |
| 5505 | 5659 | 11395 |
| 6627 | 12709 | 12933 |

-continued

| | | |
|---|---|---|
| 364 | 1976 | 12888 |
| 8213 | 9124 | 12793 |
| 9588 | 10088 | 11108 |
| 299 | 890 | 11634 |
| 7368 | 7598 | 11602 |
| 28 | 4669 | 12585 |
| 15 | 27 | 12474 |
| 1426 | 3614 | 4205 |
| 30 | 2087 | 11147 |
| 6226 | 6259 | 12941. |

A third data processing apparatus or data processing method of the present technology includes an encoding unit configured to encode or an encoding step of encoding information bits into an LDPC (Low Density Parity Check) code having a code length of 64800 bits and a code rate of 25/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including

| | | | | | | | | | | | | |
|---|---|---|---|---|---|---|---|---|---|---|---|---|
| 1860 | 2354 | 3967 | 4292 | 4488 | 5243 | 5373 | 5766 | 8378 | 9111 | 10468 | 10505 | 10774 |
| 24 | 2266 | 2380 | 3282 | 4255 | 4779 | 8729 | 9140 | 9566 | 10102 | 10661 | 10711 | 10797 |
| 605 | 650 | 1108 | 1669 | 2251 | 3133 | 5847 | 6197 | 6902 | 7545 | 10521 | 10600 | 10773 |
| 1016 | 1428 | 1612 | 2335 | 3102 | 3810 | 4926 | 5953 | 9964 | 10246 | 10569 | 10734 | 10784 |
| 3195 | 6308 | 8029 | 9030 | 9397 | 9461 | 9833 | 10239 | 10499 | 10675 | 10736 | 10757 | 10773 |
| 2 | 27 | 3691 | 4566 | 7332 | 9318 | 9323 | 9916 | 10365 | 10438 | 10561 | 10581 | 10750 |
| 2405 | 2458 | 4820 | 6232 | 6254 | 6347 | 7139 | 7474 | 8623 | 8779 | 8798 | 10747 | 10794 |
| 3164 | 4736 | 6474 | 7162 | 7420 | 7517 | 7835 | 8238 | 8412 | 8489 | 9006 | 10113 | 10440 |
| 20 | 2372 | 5561 | 5649 | 6907 | 8393 | 8505 | 9181 | 9567 | 9595 | 10388 | 10483 | 10714 |
| 1071 | 2899 | 5135 | 5780 | 6616 | 7111 | 7773 | 8582 | 9015 | 9912 | 10139 | 10387 | 10768 |
| 292 | 2833 | 5490 | 6011 | 6136 | 6713 | 7517 | 9096 | 10128 | 10328 | 10407 | 10525 | 10736 |
| 1044 | 3711 | 4421 | 5140 | 5207 | 8118 | 8749 | 8884 | 9205 | 10359 | 10372 | 10746 | 10784 |
| 3241 | 5696 | 6440 | 7240 | 7419 | 8613 | 8878 | 9593 | 9959 | 9997 | 10401 | 10404 | 10754 |
| 3133 | 4647 | 5912 | 6065 | 6694 | 7208 | 7346 | 8227 | 9465 | 9739 | 10452 | 10516 | 10770 |
| 2254 | 6444 | 7449 | 8095 | 8120 | 8710 | 9030 | 9162 | 9643 | 9968 | 10101 | 10571 | 10678 |
| 918 | 1445 | 2217 | 4262 | 4623 | 5401 | 5749 | 7446 | 7907 | 9539 | 10125 | 10514 | 10726 |
| 6 | 1341 | 1788 | 3105 | 4359 | 5263 | 5470 | 7552 | 8249 | 8644 | 10609 | 10674 | 10733 |
| 1994 | 3000 | 3151 | 3173 | 7742 | 8335 | 8438 | 8741 | 9232 | 9296 | 9817 | 10023 | 10257 |
| 467 | 1674 | 3016 | 3950 | 4055 | 5399 | 6688 | 7113 | 7273 | 8658 | 8702 | 9642 | 10545 |
| 2007 | 2541 | 3125 | 7380 | 7550 | 8122 | 8501 | 8665 | 9882 | 10403 | 10519 | 10594 | 10696 |
| 334 | 587 | 709 | 1540 | 2023 | 2876 | 6216 | 8768 | 9328 | 9481 | 10424 | 10507 | 10779 |
| 2165 | 4185 | 4306 | 5019 | 6961 | 7386 | 8447 | 9082 | 9837 | 10091 | 10461 | 10559 | 10570 |
| 7 | 903 | 2948 | 6312 | 6654 | 7738 | 7980 | 8312 | 9104 | 9743 | 10070 | 10278 | 10406 |
| 3047 | 3154 | 4160 | 4378 | 5461 | 8711 | 8809 | 9040 | 9173 | 9252 | 9537 | 9995 | 10735 |
| 2018 | 2355 | 3828 | 3854 | 6201 | 6696 | 8313 | 8459 | 8550 | 8833 | 9586 | 10202 | 10224 |
| 1402 | 1908 | 4286 | 4660 | 6029 | 6115 | 6737 | 7538 | 9495 | 9517 | 10055 | 10509 | 10644 |
| 3442 | 3589 | 3868 | 5051 | 5322 | 5580 | 8725 | 9046 | 9170 | 10041 | 10613 | 10681 | 10689 |

| | | |
|---|---|---|
| 2733 | 7826 | 10622 |
| 3597 | 4753 | 7086 |
| 1394 | 7297 | 10264 |
| 2848 | 7502 | 10304 |
| 1649 | 2405 | 10783 |
| 647 | 2911 | 9069 |
| 2572 | 4006 | 7508 |
| 1361 | 8887 | 10103 |
| 3681 | 4023 | 9090 |
| 1496 | 4962 | 6325 |
| 2016 | 5120 | 9747 |
| 3954 | 5260 | 8568 |
| 3364 | 8719 | 10035 |
| 4208 | 4806 | 9973 |
| 29 | 3361 | 3490 |
| 1835 | 2317 | 10436 |
| 7312 | 8177 | 9041 |
| 7728 | 8097 | 10761 |
| 2109 | 7902 | 9685 |
| 5424 | 8943 | 9436 |
| 4369 | 7643 | 9152 |
| 2240 | 10140 | 10528 |
| 3435 | 6124 | 10604 |
| 8962 | 9357 | 10040 |
| 26 | 1931 | 8629 |
| 8275 | 10455 | 10643 |
| 8 | 24 | 4952 |

-continued

| | | |
|---|---|---|
| 3995 | 6456 | 10633 |
| 28 | 10300 | 10337 |
| 4894 | 9286 | 9429 |
| 5587 | 6721 | 9120 |
| 1859 | 9198 | 9762 |
| 6374 | 6453 | 7011 |
| 1319 | 4530 | 5442 |
| 1507 | 10711 | 10798 |
| 2115 | 3445 | 3641 |
| 6668 | 9139 | 10163 |
| 4038 | 8117 | 10295 |
| 1479 | 3403 | 8247 |
| 2522 | 2934 | 3562 |
| 1526 | 5073 | 9650 |
| 2136 | 9820 | 10636 |
| 4214 | 8464 | 9891 |
| 8018 | 10330 | 10610 |
| 8984 | 10209 | 10647 |
| 3414 | 7272 | 8599 |
| 4883 | 9077 | 9525 |
| 22 | 8173 | 8425 |
| 2941 | 6536 | 10126 |
| 29 | 6540 | 7361 |
| 5 | 3787 | 10468 |
| 4264 | 4818 | 6906 |
| 3903 | 7041 | 10412 |
| 6078 | 7661 | 10619 |
| 6922 | 9723 | 9890 |
| 5112 | 5416 | 6253 |
| 5925 | 9961 | 10447 |
| 9 | 10311 | 10598 |
| 8790 | 8814 | 10793 |
| 4768 | 5466 | 10664 |
| 10 | 10675 | 10766 |
| 6814 | 8705 | 10737 |
| 17 | 769 | 6692 |
| 1503 | 10696 | 10742 |
| 1285 | 4632 | 8976 |
| 4279 | 4973 | 7907 |
| 4650 | 4775 | 10785 |
| 28 | 729 | 10331 |
| 1914 | 5240 | 10723 |
| 3569 | 4921 | 9561 |
| 4 | 9442 | 10796 |
| 494 | 2328 | 9507 |
| 1717 | 8768 | 10750 |
| 9540 | 10599 | 10774 |
| 11 | 10075 | 10644 |
| 10246 | 10607 | 10753 |
| 5510 | 7088 | 9053 |
| 1347 | 3584 | 5523 |
| 7872 | 10596 | 10736 |
| 628 | 10592 | 10695 |
| 5632 | 5688 | 10627 |
| 2375 | 10009 | 10561 |
| 4169 | 4630 | 8871 |
| 2896 | 10038 | 10521 |
| 89 | 9695 | 9799 |
| 20 | 7563 | 9069 |
| 4534 | 10321 | 10697 |
| 8212 | 9868 | 10716 |
| 7485 | 9312 | 10327 |
| 234 | 536 | 6293 |
| 5515 | 7350 | 9251 |
| 283 | 3182 | 7167 |
| 2444 | 5378 | 6130 |
| 6183 | 8315 | 10726 |
| 43 | 4871 | 8347 |
| 2427 | 10219 | 10728 |
| 10 | 21 | 9448 |
| 1067 | 8312 | 8420 |
| 4793 | 9522 | 10105 |
| 4688 | 10536 | 10724 |
| 3825 | 7496 | 10709 |
| 682 | 8544 | 10449 |
| 2794 | 7110 | 10741 |
| 9279 | 10741 | 10767 |
| 2897 | 5442 | 8771 |
| 33 | 7957 | 10460 |

-continued

| | | |
|---|---|---|
| 5 | 10393 | 10792 |
| 6225 | 10224 | 10798 |
| 23 | 9014 | 10786 |
| 7836 | 8339 | 8642 |
| 3476 | 5455 | 9788 |
| 1939 | 10251 | 10384 |
| 4008 | 7890 | 10450 |
| 926 | 2090 | 3804 |
| 1038 | 2497 | 10701 |
| 22 | 6220 | 8405 |
| 5153 | 5944 | 10367 |
| 7260 | 7726 | 9529 |
| 3039 | 8397 | 10665 |
| 7262 | 9644 | 10083 |
| 5531 | 6248 | 10795 |
| 7926 | 8248 | 8413 |
| 4649 | 8971 | 10182. |

A fourth data processing apparatus or data processing method of the present technology includes a decoding unit configured to decode or a decoding step of decoding an LDPC (Low Density Parity Check) code having a code length of 64800 bits and a code rate of 25/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including

| |
|---|
| 1860 2354 3967 4292 4488 5243 5373 5766 8378 9111 10468 10505 10774 |
| 24 2266 2380 3282 4255 4779 8729 9140 9566 10102 10661 10711 10797 |
| 605 650 1108 1669 2251 3133 5847 6197 6902 7545 10521 10600 10773 |
| 1016 1428 1612 2335 3102 3810 4926 5953 9964 10246 10569 10734 10784 |
| 3195 6308 8029 9030 9397 9461 9833 10239 10499 10675 10736 10757 10773 |
| 2 27 3641 4566 7332 9318 9323 9916 10365 10438 10561 10581 10750 |
| 2405 2458 4820 6232 6254 6347 7139 7474 8623 8779 8798 10747 10794 |
| 3164 4736 6474 7162 7420 7517 7835 8238 8412 8489 9006 10113 10440 |
| 20 2372 5561 5649 6907 8393 8505 9181 9567 9595 10388 10483 10714 |
| 1071 2899 5135 5780 6616 7111 7773 8582 9015 9912 10139 10387 10768 |
| 292 2833 5490 6011 6136 6713 7517 9096 10128 10328 10407 10525 10736 |
| 1044 3711 4421 5140 5207 8118 8749 8884 9205 10359 10372 10746 10784 |
| 3241 5696 6440 7240 7419 8613 8878 9593 9959 9997 10401 10404 10754 |
| 3133 4647 5912 6065 6694 7208 7346 8227 9465 9739 10452 10516 10770 |
| 2254 6444 7449 8095 8120 8710 9030 9162 9643 9968 10101 10571 10678 |
| 918 1445 2217 4262 4623 5401 5749 7446 7907 9539 10125 10514 10726 |
| 6 1341 1788 3105 4359 5263 5470 7552 8249 8644 10609 10674 10733 |
| 1994 3000 3151 3173 7742 8335 8438 8741 9232 9296 9817 10023 10257 |
| 467 1674 3016 3950 4055 5399 6688 7113 7273 8658 8702 9642 10545 |
| 2007 2541 3125 7380 7550 8122 8501 8665 9882 10403 10519 10594 10696 |
| 334 587 709 1540 2023 2876 6216 8768 9328 9481 10424 10507 10779 |
| 2165 4185 4306 5019 6961 7386 8447 9082 9837 10091 10461 10559 10570 |
| 7 903 2948 6312 6654 7738 7980 8312 9104 9743 10070 10278 10406 |
| 3047 3154 4160 4378 5461 8711 8809 9040 9173 9252 9537 9995 10735 |
| 2018 2355 3828 3854 6201 6696 8313 8459 8550 8833 9586 10202 10224 |
| 1402 1908 4286 4660 6029 6115 6737 7538 9495 9517 10055 10509 10644 |
| 3442 3589 3868 5051 5322 5580 8725 9046 9170 10041 10613 10681 10689 |
| 2733 7826 10622 |
| 3597 4753 7086 |
| 1394 7297 10264 |
| 2848 7502 10304 |
| 1649 2405 10783 |
| 647 2911 9069 |
| 2572 4006 7508 |
| 1361 8887 10103 |
| 3681 4023 9090 |
| 1496 4962 6325 |
| 2016 5120 9747 |
| 3954 5260 8568 |
| 3364 8719 10035 |
| 4208 4806 9973 |
| 29 3361 3490 |
| 1835 2317 10436 |
| 7312 8177 9041 |
| 7728 8097 10761 |
| 2109 7902 9685 |
| 5424 8943 9436 |
| 4369 7643 9152 |
| 2240 10140 10528 |

-continued

| |
|---|
| 3435 6124 10604 |
| 8962 9357 10040 |
| 26 1931 8629 |
| 8275 10455 10643 |
| 8 24 4952 |
| 3995 6456 10633 |
| 28 10300 10337 |
| 4894 9286 9429 |
| 5587 6721 9120 |
| 1859 9198 9762 |
| 6374 6453 7011 |
| 1319 4530 5442 |
| 1507 10711 10798 |
| 2115 3445 3641 |
| 6668 9139 10163 |
| 4038 8117 10295 |
| 1479 3403 8247 |
| 2522 2934 3562 |
| 1526 5073 9650 |
| 2136 9820 10636 |
| 4214 8464 9891 |
| 8018 10330 10610 |
| 8984 10209 10647 |
| 3414 7272 8599 |
| 4883 9077 9325 |
| 22 8173 8425 |
| 2941 6536 10126 |
| 29 6540 7361 |
| 5 3787 10468 |
| 4264 4818 6906 |
| 3903 7041 10412 |
| 6078 7661 10619 |
| 6922 9723 9890 |
| 5112 5416 6253 |
| 5925 9961 10447 |
| 9 10311 10598 |
| 8790 8814 10793 |
| 4768 5466 10664 |
| 10 10675 10766 |
| 6814 8705 10737 |
| 17 769 6692 |
| 1503 10696 10742 |
| 1285 4632 8976 |
| 4279 4973 7907 |
| 4650 4775 10785 |
| 28 729 10331 |
| 1914 5240 10723 |
| 3569 4921 9561 |
| 4 9442 10796 |
| 494 2328 9507 |
| 1717 8768 10750 |
| 9540 10599 10774 |
| 11 10075 10644 |
| 10246 10607 10753 |
| 5510 7088 9053 |
| 1347 3584 5523 |
| 7872 10596 10736 |
| 628 10592 10695 |
| 5632 5688 10627 |
| 2375 10009 10561 |
| 4169 4630 8871 |
| 2896 10038 10521 |
| 89 9695 9799 |
| 20 7563 9069 |
| 4534 10321 10697 |
| 8212 9868 10716 |
| 7485 9312 10327 |
| 234 536 6293 |
| 5515 7350 9251 |
| 283 3182 7167 |
| 2444 5378 6130 |
| 6183 8315 10726 |
| 43 4871 8347 |
| 2427 10219 10728 |
| 10 21 9448 |
| 1067 8312 8420 |
| 4793 9522 10105 |
| 4688 10536 10724 |
| 3825 7496 10709 |

-continued

| |
|---|
| 682 8544 10449 |
| 2794 7110 10741 |
| 9279 10741 10767 |
| 2897 5442 8771 |
| 33 7957 10460 |
| 5 10393 10792 |
| 6225 10224 10798 |
| 23 9014 10786 |
| 7836 8339 8642 |
| 3476 5455 9788 |
| 1939 10251 10384 |
| 4008 7890 10450 |
| 926 2090 3804 |
| 1038 2497 10701 |
| 22 6220 8405 |
| 5153 5944 10367 |
| 7260 7726 9529 |
| 3039 8397 10665 |
| 7262 9644 10083 |
| 5531 6248 10795 |
| 7926 8248 8913 |
| 4649 8971 10182. |

A fifth data processing apparatus or data processing method of the present technology includes an encoding unit configured to encode or an encoding step of encoding information bits into an LDPC (Low Density Parity Check) code having a code length of 64800 bits and a code rate of 26/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including

| |
|---|
| 142 2307 2598 2650 4028 4434 5781 5881 6016 6323 6681 6698 8125 |
| 2932 4928 5248 5256 5983 6773 6828 7789 8426 8494 8534 8539 8583 |
| 899 3295 3833 5399 6820 7400 7753 7890 8109 8451 8529 8564 8602 |
| 21 3060 4720 5429 5636 5927 6966 8110 8170 8247 8355 8365 8616 |
| 20 1745 2838 3799 4380 4418 4646 5059 7343 8161 8302 8456 8631 |
| 9 6274 6725 6792 7195 7333 8027 8186 8209 8273 8442 8548 8632 |
| 494 1365 2405 3799 5188 5291 7644 7926 8139 8458 8504 8594 8625 |
| 192 574 1179 4387 4695 5089 5831 7673 7789 8298 8301 8612 8632 |
| 11 20 1406 6111 6176 6256 6708 6834 7828 8232 8457 8495 8602 |
| 6 2654 3554 4483 4966 5866 6795 8069 8249 8301 8497 8509 8623 |
| 21 1144 2355 3124 6773 6805 6887 7742 7994 8358 8374 8580 8611 |
| 335 4473 4883 5528 6096 7543 7586 7921 8197 8319 8394 8489 8636 |
| 2919 4331 4419 4735 6366 6393 6844 7193 8165 8205 8544 8586 8617 |
| 12 19 742 930 3009 4330 6213 6224 7292 7430 7792 7922 8137 |
| 710 1439 1588 2434 3516 5239 6248 6827 8230 8448 8515 8581 8619 |
| 200 1075 1868 5581 7349 7642 7698 8037 8201 8210 8320 8391 8526 |
| 3 2501 4252 5256 5292 5567 6136 6321 6430 6486 7571 8521 8636 |
| 3062 4599 5885 6529 6616 7314 7319 7567 8024 8153 8302 8372 8598 |
| 105 381 1574 4351 5452 5603 5943 7467 7788 7933 8362 8513 8587 |
| 787 1857 3386 3659 6550 7131 7965 8015 8040 8312 8484 8525 8537 |
| 15 1118 4226 5197 5575 5761 6762 7038 8260 8338 8444 8512 8568 |
| 36 5216 5368 5616 6029 6591 8038 8067 8299 8351 8565 8578 8585 |
| 1 23 4300 4530 5426 5532 5817 6967 7124 7979 8022 8270 8437 |
| 629 2133 4828 5475 5875 5890 7194 8042 8345 8385 8518 8598 8612 |
| 11 1065 3782 4237 4993 7104 7863 7904 8104 8228 8321 8383 8565 |
| 2131 2274 3168 3215 3220 5597 6347 7812 8238 8354 8527 8557 8614 |
| 5600 6591 7491 7696 |
| 1766 8281 8626 |
| 1725 2280 5120 |
| 1650 3445 7652 |
| 4312 6911 8626 |
| 15 1013 5892 |
| 2263 2546 2979 |

-continued

| |
|---|
| 1545 5873 7406 |
| 67 726 3697 |
| 2860 6443 8542 |
| 17 911 2820 |
| 1561 4580 6052 |
| 79 5269 7134 |
| 22 2410 2424 |
| 3501 5642 8627 |
| 808 6950 8571 |
| 4099 6389 7482 |
| 4023 5000 7833 |
| 5476 5765 7917 |
| 1008 3194 7207 |
| 20 495 5411 |
| 1703 8388 8635 |
| 6 4395 4921 |
| 200 2053 8206 |
| 1089 5126 5562 |
| 10 4193 7720 |
| 1967 2151 4608 |
| 22 738 3513 |
| 3385 5066 8152 |
| 440 1118 8537 |
| 3429 6058 7716 |
| 5213 7519 8382 |
| 5564 8365 8620 |
| 43 3219 8603 |
| 4 5409 5815 |
| 5 6376 7654 |
| 4091 5724 5953 |
| 5348 6754 8613 |
| 1634 6398 6632 |
| 72 2058 8605 |
| 3497 5811 7579 |
| 3846 6743 8559 |
| 15 5933 8629 |
| 2133 5859 7068 |
| 4151 4617 8566 |
| 2960 8270 8410 |
| 2059 3617 8210 |
| 544 1441 6895 |
| 4043 7482 8592 |
| 294 2180 8524 |
| 3058 8227 8373 |
| 364 5756 8617 |
| 5383 8555 8619 |
| 1704 2480 4181 |
| 7338 7929 7990 |
| 2615 3905 7981 |
| 4298 4548 8296 |
| 8262 8319 8630 |
| 892 1893 8028 |

-continued

| |
|---|
| 5694 7237 8595 |
| 1487 5012 5810 |
| 4335 8593 8624 |
| 3509 4531 5273 |
| 10 22 830 |
| 4161 5208 6280 |
| 275 7063 8634 |
| 4 2725 3113 |
| 2279 7403 8174 |
| 1637 3328 3930 |
| 2810 4939 5624 |
| 3 1234 7687 |
| 2799 7740 8616 |
| 22 7701 8636 |
| 4302 7857 7993 |
| 7477 7794 8592 |
| 9 6111 8591 |
| 5 8606 8628 |
| 347 3497 4033 |
| 1747 2613 8636 |
| 1827 5600 7042 |
| 580 1822 6842 |
| 232 7134 7783 |
| 4629 5000 7231 |
| 951 2806 4947 |
| 571 3474 8577 |
| 2437 2496 7945 |
| 23 5873 8162 |
| 12 1168 7686 |
| 8315 8540 8596 |
| 1766 2506 4733 |
| 929 1516 3338 |
| 21 1216 6555 |
| 782 1452 8617 |
| 8 6083 6087 |
| 667 3240 4583 |
| 4030 4661 5790 |
| 559 7122 8553 |
| 3202 4388 4909 |
| 2533 3673 8594 |
| 1991 3954 6206 |
| 6835 7900 7980 |
| 189 5722 8573 |
| 2680 4928 4998 |
| 243 2579 7735 |
| 4281 8132 8566 |
| 7656 7671 8609 |
| 1116 2291 4166 |
| 21 388 8021 |
| 6 1123 8369 |
| 311 4918 8511 |
| 0 3248 6290 |
| 13 6762 7172 |
| 4209 5632 7563 |
| 49 127 8074 |
| 581 1735 4075 |
| 0 2235 5470 |
| 2178 5820 6179 |
| 16 3575 6054 |
| 1095 4564 6458 |
| 9 1581 5953 |
| 2537 6469 8552 |
| 14 3874 4844 |
| 0 3269 3551 |
| 2114 7372 7926 |
| 1875 2388 4057 |
| 3232 4042 6663 |
| 9 401 583 |
| 13 4100 6584 |
| 2299 4190 4410 |
| 21 3670 4979. |

A sixth data processing apparatus or data processing method of the present technology includes a decoding unit configured to decode or a decoding step of decoding an LDPC (Low Density Parity Check) code having a code length of 64800 bits and a code rate of 26/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including

| |
|---|
| 142 2307 2598 2650 4028 4434 5781 5881 6016 6323 6681 6698 8125 |
| 2932 4928 5248 5256 5983 6773 6828 7789 8426 8494 8534 8539 8583 |
| 899 3295 3833 5399 6820 7400 7753 7890 8109 8451 8529 8564 8602 |
| 21 3060 4720 5429 5636 5927 6966 8110 8170 8247 8355 8365 8616 |
| 20 1745 2838 3799 4380 4418 4646 5059 7343 8161 8302 8456 8631 |
| 9 6274 6725 6792 7195 7333 8027 8186 8209 8273 8442 8548 8632 |
| 494 1365 2405 3799 5188 5291 7644 7926 8139 8458 8504 8594 8625 |
| 192 574 1179 4387 4695 5089 5831 7673 7789 8298 8301 8612 8632 |
| 11 20 1406 6111 6176 6256 6708 6834 7828 8232 8457 8495 8602 |
| 6 2654 3554 4483 4966 5866 6795 8069 8249 8301 8497 8509 8623 |
| 21 1144 2355 3124 6773 6805 6887 7742 7994 8358 8374 8580 8611 |
| 335 4473 4883 5528 6096 7543 7586 7921 8197 8319 8394 8489 8636 |
| 2919 4331 4419 4735 6366 6393 6844 7193 8165 8205 8544 8586 8617 |
| 12 19 742 930 3009 4330 6213 6224 7292 7430 7792 7922 8137 |
| 710 1439 1588 2434 3516 5239 6248 6827 8230 8448 8515 8581 8619 |
| 200 1075 1868 5581 7349 7642 7698 8037 8201 8210 8320 8391 8526 |
| 3 2501 4252 5256 5292 5567 6136 6321 6430 6486 7571 8521 8636 |
| 3062 4599 5885 6529 6616 7314 7319 7567 8024 8153 8302 8372 8598 |
| 105 381 1574 4351 5452 5603 5943 7467 7788 7933 8362 8513 8587 |
| 787 1857 3386 3659 6550 7131 7965 8015 8040 8312 8484 8525 8537 |
| 15 1118 4226 5197 5575 5761 6762 7038 8260 8338 8444 8512 8568 |
| 36 5216 5368 5616 6029 6591 8038 8067 8299 8351 8565 8578 8585 |
| 1 23 4300 4530 5426 5532 5817 6967 7124 7979 8022 8270 8437 |
| 629 2133 4828 5475 5875 5890 7194 8042 8345 8385 8518 8598 8612 |
| 11 1065 3782 4237 4993 7104 7863 7904 8104 8228 8321 8383 8565 |
| 2131 2274 3168 3215 3220 5597 6347 7812 8238 8354 8527 8557 8614 |
| 5600 6591 7491 7696 |
| 1766 8281 8626 |
| 1725 2280 5120 |
| 1650 3445 7652 |
| 4312 6911 8626 |
| 15 1013 5892 |
| 2263 2546 2979 |
| 1545 5873 7406 |
| 67 726 3697 |
| 2860 6443 8542 |
| 17 911 2820 |
| 1561 4580 6052 |
| 79 5269 7134 |
| 22 2410 2424 |
| 3501 5642 8627 |
| 808 6950 8571 |
| 4099 6389 7482 |
| 4023 5000 7833 |
| 5476 5765 7917 |
| 1008 3194 7207 |
| 20 495 5411 |
| 1703 8388 8635 |
| 6 4395 4921 |
| 200 2053 8206 |
| 1089 5126 5562 |
| 10 4193 7720 |
| 1967 2151 4608 |
| 22 738 3513 |
| 3385 5066 8152 |
| 440 1118 8537 |
| 3429 6058 7716 |
| 5213 7519 8382 |
| 5564 8365 8620 |
| 43 3219 8603 |
| 4 5409 5815 |
| 5 6376 7654 |
| 4091 5724 5953 |
| 5348 6754 8613 |
| 1634 6398 6632 |
| 72 2058 8605 |
| 3497 5811 7579 |
| 3846 6743 8559 |
| 15 5933 8629 |
| 2133 5859 7068 |
| 4151 4617 8566 |

-continued 2960 8270 8410
2059 3617 8210
544 1441 6895
4043 7482 8592
294 2180 8524
3058 8227 8373
364 5756 8617
5383 8555 8619
1704 2480 4181
7338 7929 7990
2615 3905 7981
4298 4548 8296
8262 8319 8630
892 1893 8028
5694 7237 8595
1487 5012 5810
4335 8593 8624
3509 4531 5273
10 22 830
4161 5208 6280
275 7063 8634
4 2725 3113
2279 7403 8174
1637 3328 3930
2810 4939 5624
3 1234 7687
2799 7740 8616
22 7701 8636
4302 7857 7993
7477 7794 8592
9 6111 8591
5 8606 8628
347 3497 4033
1747 2613 8636
1827 5600 7042
580 1822 6842
232 7134 7783
4629 5000 7231
951 2806 4947
571 3474 8577
2437 2496 7945
23 5873 8162
12 1168 7686
8315 8540 8596
1766 2506 4733
929 1516 3338
21 1216 6555
782 1452 8617
8 6083 6087
667 3240 4583
4030 4661 5790
559 7122 8553

-continued 3202 4388 4909
2533 3673 8594
1991 3954 6206
6835 7900 7980
189 5722 8573
2680 4928 4998
243 2579 7735
4281 8132 8566
7656 7671 8609
1116 2291 4166
21 388 8021
6 1123 8369
311 4918 8511
0 3248 6290
13 6762 7172
4209 5632 7563
49 127 8074
581 1735 4075
0 2235 5470
2178 5820 6179
16 3575 6054
1095 4564 6458
9 1581 5953
2537 6469 8552
14 3874 4844
0 3269 3551
2114 7372 7926
1875 2388 4057
3232 4042 6663
9 401 583
13 4100 6584
2299 4190 4410
21 3670 4979.

A seventh data processing apparatus or data processing method of the present technology includes an encoding unit configured to encode or an encoding step of encoding information bits into an LDPC (Low Density Parity Check) code having a code length of 64800 bits and a code rate of 27/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including

| | | | | | | | | | | | |
|---|---|---|---|---|---|---|---|---|---|---|---|
| 658 | 706 | 898 | 1149 | 2577 | 2622 | 2772 | 3266 | 3329 | 5243 | 6079 | 6271 |
| 289 | 784 | 1682 | 3584 | 3995 | 4821 | 4856 | 5063 | 5974 | 6168 | 6437 | 6453 |
| 658 | 1426 | 2043 | 2065 | 2986 | 4118 | 4284 | 5394 | 5444 | 5477 | 5727 | 6018 |
| 641 | 928 | 1225 | 2841 | 4052 | 4840 | 4992 | 5268 | 5533 | 6249 | 6461 | 6475 |
| 2312 | 2917 | 3713 | 3849 | 4059 | 4241 | 4610 | 5440 | 5727 | 6101 | 6397 | 6444 |
| 1165 | 1592 | 1891 | 2154 | 3981 | 4817 | 5181 | 5748 | 5788 | 6012 | 6266 | 6350 |
| 13 | 2758 | 3069 | 4233 | 4697 | 5100 | 5279 | 5677 | 5919 | 5969 | 6280 | 6422 |
| 818 | 1500 | 2125 | 2340 | 3774 | 4707 | 4901 | 5170 | 5744 | 6008 | 6316 | 6353 |
| 857 | 3054 | 3409 | 3496 | 3704 | 4868 | 5326 | 6211 | 6292 | 6356 | 6367 | 6381 |
| 0 | 7 | 12 | 1709 | 2166 | 3418 | 3723 | 4887 | 5770 | 6043 | 6069 | 6431 |
| 2481 | 3379 | 4650 | 4900 | 4919 | 5060 | 5410 | 5425 | 6056 | 6173 | 6283 | 6386 |
| 15 | 814 | 854 | 1871 | 2934 | 3387 | 3915 | 5180 | 5303 | 5442 | 5581 | 5665 |
| 146 | 1882 | 3076 | 4458 | 4848 | 5252 | 5602 | 5778 | 5821 | 6213 | 6251 | 6401 |
| 2 | 947 | 1419 | 1566 | 3437 | 3646 | 4615 | 4634 | 4735 | 5819 | 5943 | 6280 |
| 1231 | 2309 | 2920 | 4158 | 4185 | 4298 | 4711 | 5082 | 5757 | 5762 | 6204 | 6209 |
| 257 | 297 | 337 | 2783 | 3230 | 4134 | 4480 | 4749 | 5295 | 5689 | 5921 | 6202 |
| 1436 | 2151 | 2629 | 3217 | 3930 | 4078 | 5386 | 5799 | 5906 | 6146 | 6226 | 6366 |
| 133 | 530 | 2448 | 4745 | 5000 | 5020 | 5224 | 5273 | 6211 | 6266 | 6431 | 6453 |
| 13 | 2644 | 3895 | 3898 | 4485 | 4722 | 5142 | 5462 | 5951 | 6031 | 6084 | 6351 |
| 6 | 3000 | 3873 | 3995 | 4680 | 5158 | 5504 | 5692 | 5755 | 6255 | 6338 | 6359 |
| 166 | 465 | 1658 | 2549 | 2941 | 4244 | 5071 | 5149 | 5452 | 5874 | 5939 | 6038 |
| 2309 | 2937 | 4282 | 4628 | 5113 | 5454 | 5731 | 5825 | 6021 | 6171 | 6402 | 6472 |
| 3 | 1077 | 2116 | 2426 | 2830 | 4853 | 5066 | 5571 | 5850 | 5916 | 6389 | 6421 |
| 817 | 1608 | 2229 | 2925 | 3281 | 4393 | 5042 | 5058 | 5377 | 5464 | 5588 | 6448 |

-continued

| | | | | | | | | | | | |
|---|---|---|---|---|---|---|---|---|---|---|---|
| 1848 | 3871 | 4381 | 4776 | 5366 | 5578 | 5648 | 6143 | 6389 | 6434 | 6465 | 6473 |
| 1263 | 1616 | 3150 | 3497 | 3759 | 4078 | 5530 | 5665 | 5694 | 5913 | 6397 | 6420 |
| 11 | 813 | 2185 | 2795 | 3349 | 4652 | 4678 | 5078 | 5504 | 6011 | 6286 | 6387 |
| 3060 | 3161 | 4584 | 4996 | 5143 | 5542 | 5697 | 5937 | 6141 | 6155 | 6342 | 6445 |
| 1638 | 2333 | 2632 | 3450 | 3505 | 3911 | 4399 | 4454 | 5499 | 5860 | 6044 | 6360 |

| | | |
|---|---|---|
| 650 | 1744 | 4517 |
| 5772 | 6071 | 6471 |
| 3582 | 3622 | 5776 |
| 6153 | 6380 | 6446 |
| 3977 | 5932 | 6447 |
| 2071 | 4597 | 4891 |
| 11 | 1428 | 3776 |
| 1111 | 3874 | 5048 |
| 1410 | 2144 | 4445 |
| 4681 | 5481 | 6462 |
| 4044 | 5037 | 5497 |
| 2716 | 2891 | 6411 |
| 3299 | 4384 | 6224 |
| 1843 | 6087 | 6400 |
| 4664 | 5009 | 5856 |
| 1548 | 4383 | 5055 |
| 3172 | 4190 | 6373 |
| 5899 | 6443 | 6470 |
| 2572 | 3647 | 6240 |
| 1295 | 2158 | 6466 |
| 5604 | 6269 | 6368 |
| 3 | 5551 | 6454 |
| 3325 | 5797 | 6261 |
| 666 | 1397 | 5538 |
| 3069 | 4274 | 6410 |
| 4042 | 5992 | 6437 |
| 743 | 3075 | 3447 |
| 1344 | 2725 | 6386 |
| 283 | 2808 | 6303 |
| 2 | 4627 | 4632 |
| 26 | 1565 | 4000 |
| 4012 | 4946 | 6472 |
| 1629 | 6158 | 6467 |
| 6300 | 6351 | 6376 |
| 2969 | 4344 | 4440 |
| 2317 | 3115 | 4832 |
| 2099 | 5263 | 6285 |
| 2409 | 5868 | 5997 |
| 3752 | 4200 | 6350 |
| 3125 | 5841 | 6142 |
| 1 | 2249 | 6328 |
| 16 | 2525 | 6379 |
| 3198 | 5269 | 5960 |
| 4 | 1705 | 2069 |
| 990 | 4948 | 5520 |
| 1664 | 3836 | 4521 |
| 1765 | 4110 | 6454 |
| 9 | 1373 | 6387 |
| 1969 | 2405 | 6368 |
| 623 | 1428 | 3946 |
| 3111 | 6380 | 6436 |
| 1861 | 5611 | 5934 |
| 9 | 2444 | 3081 |
| 5 | 5508 | 6317 |
| 3184 | 4988 | 5995 |
| 1060 | 4803 | 6400 |
| 5021 | 5826 | 6289 |
| 1608 | 4754 | 5648 |
| 4702 | 6391 | 6421 |
| 3899 | 4811 | 6128 |
| 927 | 2286 | 5313 |
| 4123 | 6181 | 6453 |
| 2893 | 4150 | 5261 |
| 605 | 4332 | 5094 |
| 17 | 3518 | 6358 |
| 2858 | 6126 | 6478 |
| 15 | 1316 | 6465 |
| 2 | 2032 | 2983 |
| 5249 | 6340 | 6427 |
| 5 | 6003 | 6200 |
| 4478 | 6315 | 6420 |
| 5158 | 6390 | 6447 |
| 2598 | 3229 | 5399 |

-continued

| | | |
|---|---|---|
| 3747 | 6424 | 6446 |
| 1412 | 2453 | 6332 |
| 5256 | 5715 | 6455 |
| 2137 | 3421 | 4368 |
| 15 | 3880 | 5245 |
| 17 | 3156 | 5638 |
| 3227 | 3798 | 6230 |
| 2094 | 3129 | 6458 |
| 1412 | 5573 | 5932 |
| 175 | 1182 | 6304 |
| 3555 | 6407 | 6463 |
| 583 | 1654 | 6339 |
| 14 | 6261 | 6449 |
| 3553 | 5383 | 5679 |
| 2092 | 2744 | 4153 |
| 0 | 4466 | 6472 |
| 11 | 3840 | 4354 |
| 17 | 5457 | 6222 |
| 1467 | 6083 | 6220 |
| 3449 | 3858 | 6337 |
| 3782 | 5318 | 6426 |
| 417 | 5038 | 5790 |
| 3571 | 5638 | 5873 |
| 6117 | 6241 | 6476 |
| 1898 | 5680 | 6219 |
| 3235 | 3817 | 6429 |
| 2095 | 4194 | 6224 |
| 2 | 4092 | 6448 |
| 5 | 6330 | 6383 |
| 285 | 5075 | 6334 |
| 10 | 505 | 2867 |
| 1183 | 5956 | 6466 |
| 839 | 4716 | 6471 |
| 984 | 3254 | 6432 |
| 1501 | 4790 | 6465 |
| 8 | 1457 | 1707 |
| 1660 | 1969 | 6438 |
| 4349 | 6182 | 6305 |
| 1423 | 3848 | 5490 |
| 1651 | 2969 | 6345 |
| 344 | 4164 | 6298 |
| 2397 | 6027 | 6274 |
| 2233 | 2778 | 6161 |
| 13 | 1778 | 2977 |
| 9 | 1916 | 3377 |
| 0 | 3 | 6190 |
| 395 | 4893 | 6394 |
| 3512 | 4098 | 6400 |
| 3490 | 6281 | 6473 |
| 12 | 1359 | 6465 |
| 4202 | 5179 | 6412 |
| 3007 | 3542 | 4271 |
| 2400 | 3350 | 6351 |
| 7 | 5490 | 5716 |
| 4695 | 5231 | 6266 |
| 777 | 6292 | 6402 |
| 919 | 4851 | 6367 |
| 6 | 644 | 3893 |
| 5386 | 6190 | 6434 |
| 17 | 169 | 4896. |

An eighth data processing apparatus or data processing method of the present technology includes a decoding unit configured to decode or a decoding step of decoding an LDPC (Low Density Parity Check) code having a code length of 64800 bits and a code rate of 27/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including

| | | | | | | | | | | | |
|---|---|---|---|---|---|---|---|---|---|---|---|
| 658 | 706 | 898 | 1149 | 2577 | 2622 | 2772 | 3266 | 3329 | 5243 | 6079 | 6271 |
| 289 | 784 | 1682 | 3584 | 3995 | 4821 | 4856 | 5063 | 5974 | 6168 | 6437 | 6453 |
| 658 | 1426 | 2043 | 2065 | 2986 | 4118 | 4284 | 5394 | 5444 | 5477 | 5727 | 6018 |
| 641 | 928 | 1225 | 2841 | 4052 | 4840 | 4992 | 5268 | 5533 | 6249 | 6461 | 6475 |
| 2312 | 2917 | 3713 | 3849 | 4059 | 4241 | 4610 | 5440 | 5727 | 6101 | 6397 | 6444 |
| 1165 | 1592 | 1891 | 2154 | 3981 | 4817 | 5181 | 5748 | 5788 | 6012 | 6266 | 6350 |

-continued

| | | | | | | | | | | | |
|---|---|---|---|---|---|---|---|---|---|---|---|
| 13 | 2758 | 3069 | 4233 | 4697 | 5100 | 5279 | 5677 | 5919 | 5969 | 6280 | 6422 |
| 818 | 1500 | 2125 | 2340 | 3774 | 4707 | 4901 | 5170 | 5744 | 6008 | 6316 | 6353 |
| 857 | 3054 | 3409 | 3496 | 3704 | 4868 | 5326 | 6211 | 6292 | 6356 | 6367 | 6381 |
| 0 | 7 | 12 | 1709 | 2166 | 3418 | 3723 | 4887 | 5770 | 6043 | 6069 | 6431 |
| 2481 | 3379 | 4650 | 4900 | 4919 | 5060 | 5410 | 5425 | 6056 | 6173 | 6283 | 6386 |
| 15 | 814 | 854 | 1871 | 2934 | 3387 | 3915 | 5180 | 5303 | 5442 | 5581 | 5665 |
| 146 | 1882 | 3076 | 4458 | 4848 | 5252 | 5602 | 5778 | 5821 | 6213 | 6251 | 6401 |
| 2 | 947 | 1419 | 1566 | 3437 | 3646 | 4615 | 4634 | 4735 | 5819 | 5943 | 6280 |
| 1231 | 2309 | 2920 | 4158 | 4185 | 4298 | 4711 | 5082 | 5757 | 5762 | 6204 | 6209 |
| 257 | 297 | 337 | 2783 | 3230 | 4134 | 4480 | 4749 | 5295 | 5689 | 5921 | 6202 |
| 1436 | 2151 | 2629 | 3217 | 3930 | 4078 | 5386 | 5799 | 5906 | 6146 | 6226 | 6366 |
| 133 | 530 | 2448 | 4745 | 5000 | 5020 | 5224 | 5273 | 6211 | 6266 | 6431 | 6453 |
| 13 | 2644 | 3895 | 3898 | 4485 | 4722 | 5142 | 5462 | 5951 | 6031 | 6084 | 6351 |
| 6 | 3000 | 3873 | 3995 | 4680 | 5158 | 5504 | 5692 | 5755 | 6255 | 6338 | 6359 |
| 166 | 465 | 1658 | 2549 | 2941 | 4244 | 5071 | 5149 | 5452 | 5874 | 5939 | 6038 |
| 2309 | 2937 | 4282 | 4628 | 5113 | 5454 | 5731 | 5825 | 6021 | 6171 | 6402 | 6472 |
| 3 | 1077 | 2116 | 2426 | 2830 | 4853 | 5066 | 5571 | 5850 | 5916 | 6389 | 6421 |
| 817 | 1608 | 2229 | 2925 | 3281 | 4393 | 5042 | 5058 | 5377 | 5464 | 5588 | 6448 |
| 1848 | 3871 | 4381 | 4776 | 5366 | 5578 | 5648 | 6143 | 6389 | 6434 | 6465 | 6473 |
| 1263 | 1616 | 3150 | 3497 | 3759 | 4078 | 5530 | 5665 | 5694 | 5913 | 6397 | 6420 |
| 11 | 813 | 2185 | 2795 | 3349 | 4652 | 4678 | 5078 | 5504 | 6011 | 6286 | 6387 |
| 3060 | 3161 | 4584 | 4996 | 5143 | 5542 | 5697 | 5937 | 6141 | 6155 | 6342 | 6445 |
| 1638 | 2333 | 2632 | 3450 | 3505 | 3911 | 4399 | 4454 | 5499 | 5860 | 6044 | 6360 |

| | | |
|---|---|---|
| 650 | 1744 | 4517 |
| 5772 | 6071 | 6471 |
| 3582 | 3622 | 5776 |
| 6153 | 6380 | 6446 |
| 3977 | 5932 | 6447 |
| 2071 | 4597 | 4891 |
| 11 | 1428 | 3776 |
| 1111 | 3874 | 5048 |
| 1410 | 2144 | 4445 |
| 4681 | 5481 | 6462 |
| 4044 | 5037 | 5497 |
| 2716 | 2891 | 6411 |
| 3299 | 4384 | 6224 |
| 1843 | 6087 | 6400 |
| 4664 | 5009 | 5856 |
| 1548 | 4383 | 5055 |
| 3172 | 4190 | 6373 |
| 5899 | 6443 | 6470 |
| 2572 | 3647 | 6240 |
| 1295 | 2158 | 6466 |
| 5604 | 6269 | 6368 |
| 3 | 5551 | 6454 |
| 3325 | 5797 | 6261 |
| 666 | 1397 | 5538 |
| 3069 | 4274 | 6410 |
| 4042 | 5992 | 6437 |
| 743 | 3075 | 3447 |
| 1344 | 2725 | 6386 |
| 283 | 2808 | 6303 |
| 2 | 4627 | 4632 |
| 26 | 1565 | 4000 |
| 4012 | 4946 | 6472 |
| 1629 | 6158 | 6467 |
| 6300 | 6351 | 6376 |
| 2969 | 4344 | 4440 |
| 2317 | 3115 | 4832 |
| 2099 | 5263 | 6285 |
| 2409 | 5868 | 5997 |
| 3752 | 4200 | 6350 |
| 3125 | 5841 | 6142 |
| 1 | 2249 | 6328 |
| 16 | 2525 | 6379 |
| 3198 | 5269 | 5960 |
| 4 | 1705 | 2069 |
| 990 | 4948 | 5520 |
| 1664 | 3836 | 4521 |
| 1765 | 4110 | 6454 |
| 9 | 1373 | 6387 |
| 1969 | 2405 | 6368 |
| 623 | 1428 | 3946 |
| 3111 | 6380 | 6436 |
| 1861 | 5611 | 5934 |
| 9 | 2444 | 3081 |
| 5 | 5508 | 6317 |
| 3184 | 4988 | 5995 |

-continued

| | | |
|---|---|---|
| 1060 | 4803 | 6400 |
| 5021 | 5826 | 6289 |
| 1608 | 4754 | 5648 |
| 4702 | 6391 | 6421 |
| 3899 | 4811 | 6128 |
| 927 | 2286 | 5313 |
| 4123 | 6181 | 6453 |
| 2893 | 4150 | 5261 |
| 605 | 4332 | 5094 |
| 17 | 3518 | 6358 |
| 2858 | 6126 | 6478 |
| 15 | 1316 | 6465 |
| 2 | 2032 | 2983 |
| 5249 | 6340 | 6427 |
| 5 | 6003 | 6200 |
| 4478 | 6315 | 6420 |
| 5158 | 6390 | 6447 |
| 2598 | 3229 | 5399 |
| 3747 | 6424 | 6446 |
| 1412 | 2453 | 6332 |
| 5256 | 5715 | 6455 |
| 2137 | 3421 | 4368 |
| 15 | 3880 | 5245 |
| 17 | 3156 | 5638 |
| 3227 | 3798 | 6230 |
| 2094 | 3129 | 6458 |
| 1412 | 5573 | 5932 |
| 175 | 1182 | 6304 |
| 3555 | 6407 | 6463 |
| 583 | 1654 | 6339 |
| 14 | 6261 | 6449 |
| 3553 | 5383 | 5679 |
| 2092 | 2744 | 4153 |
| 0 | 4466 | 6472 |
| 11 | 3840 | 4354 |
| 17 | 5457 | 6222 |
| 1467 | 6083 | 6220 |
| 3449 | 3858 | 6337 |
| 3782 | 5318 | 6426 |
| 417 | 5038 | 5790 |
| 3571 | 5638 | 5873 |
| 6117 | 6241 | 6476 |
| 1898 | 5680 | 6219 |
| 3235 | 3817 | 6429 |
| 2095 | 4194 | 6224 |
| 2 | 4092 | 6448 |
| 5 | 6330 | 6383 |
| 285 | 5075 | 6334 |
| 10 | 505 | 2867 |
| 1183 | 5956 | 6466 |
| 839 | 4716 | 6471 |
| 984 | 3254 | 6432 |
| 1501 | 4790 | 6465 |
| 8 | 1457 | 1707 |
| 1660 | 1969 | 6438 |
| 4349 | 6182 | 6305 |
| 1423 | 3848 | 5490 |
| 1651 | 2969 | 6345 |
| 344 | 4164 | 6298 |
| 2397 | 6027 | 6274 |
| 2233 | 2778 | 6161 |
| 13 | 1778 | 2977 |
| 9 | 1916 | 3377 |
| 0 | 3 | 6190 |
| 395 | 4893 | 6394 |
| 3512 | 4098 | 6400 |
| 3490 | 6281 | 6473 |
| 12 | 1359 | 6465 |
| 4202 | 5179 | 6412 |
| 3007 | 3592 | 4271 |
| 2400 | 3350 | 6351 |
| 7 | 5490 | 5716 |
| 4695 | 5231 | 6266 |
| 777 | 6292 | 6402 |
| 919 | 4851 | 6367 |
| 6 | 644 | 3893 |
| 5386 | 6190 | 6434 |
| 17 | 169 | 4896. |

A ninth data processing apparatus or data processing method of the present technology includes an encoding unit configured to encode or an encoding step of encoding information bits into an LDPC (Low Density Parity Check) code having a code length of 64800 bits and a code rate of 28/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including

| | | | | | | | | | | |
|---|---|---|---|---|---|---|---|---|---|---|
| 85 | 314 | 1602 | 1728 | 1929 | 2295 | 2729 | 2924 | 3779 | 4054 | 4276 |
| 918 | 1378 | 1838 | 1903 | 2399 | 2524 | 2937 | 3615 | 3740 | 4140 | 4213 |
| 1361 | 1430 | 2639 | 2648 | 2910 | 3418 | 3511 | 3543 | 4177 | 4209 | 4248 |
| 472 | 1143 | 1318 | 1545 | 1830 | 2228 | 2249 | 2256 | 3626 | 3839 | 3991 |
| 226 | 1401 | 2154 | 2318 | 2851 | 3317 | 3468 | 3944 | 3983 | 4047 | 4093 |
| 490 | 1145 | 1247 | 1851 | 2671 | 2776 | 3152 | 3229 | 3345 | 3758 | 3786 |
| 522 | 1393 | 1473 | 2196 | 2707 | 3052 | 3398 | 3814 | 3827 | 4148 | 4301 |
| 417 | 1982 | 2176 | 2336 | 2459 | 2806 | 3005 | 3771 | 3870 | 4080 | 4243 |
| 112 | 1040 | 1596 | 1621 | 1685 | 2118 | 2571 | 3359 | 3945 | 4034 | 4171 |
| 646 | 1705 | 2181 | 2439 | 2808 | 2851 | 2987 | 3044 | 3494 | 4049 | 4312 |
| 6 | 11 | 115 | 245 | 663 | 1773 | 2624 | 3444 | 3601 | 3952 | 4246 |
| 11 | 541 | 1020 | 1326 | 2259 | 2347 | 2750 | 2861 | 3328 | 3428 | 4126 |
| 515 | 941 | 1233 | 1804 | 2295 | 2528 | 3265 | 3826 | 4002 | 4022 | 4224 |
| 46 | 484 | 679 | 1949 | 2342 | 2929 | 3555 | 3860 | 3918 | 4068 | 4113 |
| 1832 | 2023 | 2279 | 2376 | 2965 | 3278 | 3318 | 3549 | 3640 | 3843 | 3910 |
| 241 | 943 | 1222 | 1583 | 1637 | 2745 | 3338 | 4080 | 4086 | 4203 | 4300 |
| 11 | 1419 | 1841 | 2398 | 2920 | 3409 | 3703 | 3768 | 3878 | 4052 | 4254 |
| 878 | 2049 | 2123 | 2431 | 2657 | 2704 | 3135 | 3342 | 3728 | 4141 | 4162 |
| 16 | 837 | 1267 | 1410 | 2100 | 3026 | 3099 | 3107 | 4042 | 4129 | 4157 |
| 133 | 646 | 1367 | 1394 | 2118 | 2311 | 2676 | 2956 | 3195 | 3536 | 3657 |
| 698 | 1444 | 2129 | 2432 | 2494 | 2793 | 2947 | 3852 | 3985 | 4254 | 4319 |
| 11 | 1076 | 1618 | 1995 | 2332 | 2743 | 2934 | 3009 | 3565 | 4169 | 4188 |
| 14 | 20 | 808 | 2629 | 2681 | 3090 | 3491 | 3835 | 4017 | 4068 | 4083 |
| 433 | 1386 | 2416 | 2570 | 2950 | 3611 | 3869 | 3969 | 4248 | 4251 | 4316 |
| 384 | 1292 | 1534 | 2610 | 2617 | 3559 | 3638 | 3964 | 4131 | 4293 | 4313 |
| 271 | 564 | 1719 | 2288 | 2597 | 2674 | 3429 | 3455 | 3793 | 4074 | 4286 |
| 133 | 190 | 815 | 955 | 1485 | 2000 | 2860 | 3000 | 3734 | 4013 | 4287 |
| 559 | 771 | 1762 | 2537 | 2764 | 2816 | 3186 | 3806 | 3933 | 4224 | 4271 |
| 11 | 733 | 1198 | 1735 | 1856 | 2668 | 2754 | 3216 | 4070 | 4113 | 4311 |
| 4 | 806 | 1832 | 2047 | 2058 | 2724 | 3387 | 3793 | 3833 | 4005 | 4319 |
| 506 | 1456 | 2339 | 3069 | 3343 | 3442 | 3889 | 3939 | 4013 | 4212 | 4278 |

| | | |
|---|---|---|
| 2038 | 3980 | 4313 |
| 64 | 2373 | 4080 |
| 800 | 1535 | 4166 |
| 1030 | 3759 | 4002 |
| 1687 | 3269 | 4225 |
| 1219 | 2632 | 3878 |
| 719 | 2916 | 4277 |
| 1261 | 1930 | 3459 |
| 777 | 1568 | 1914 |
| 4 | 397 | 3290 |
| 10 | 3451 | 4115 |
| 3629 | 3885 | 4155 |
| 2652 | 3668 | 4026 |
| 135 | 3172 | 4319 |
| 1426 | 1970 | 3657 |
| 199 | 1268 | 2064 |
| 570 | 845 | 2761 |
| 41 | 1067 | 3498 |
| 1588 | 2482 | 2750 |
| 1615 | 2013 | 2715 |
| 121 | 1812 | 2588 |
| 10 | 992 | 1082 |
| 1929 | 4225 | 4279 |
| 6 | 1967 | 3760 |
| 593 | 1812 | 4107 |
| 891 | 2146 | 4158 |
| 924 | 2282 | 3585 |
| 592 | 2971 | 4235 |
| 260 | 3493 | 4313 |
| 2423 | 3180 | 3449 |
| 2042 | 3118 | 3625 |
| 2877 | 3064 | 3882 |
| 7 | 2139 | 4316 |
| 4 | 7 | 2954 |
| 1398 | 3947 | 4272 |
| 3675 | 4253 | 4318 |
| 1561 | 1977 | 2432 |
| 2531 | 4192 | 4209 |

-continued

| | | |
|---|---|---|
| 1032 | 1102 | 4268 |
| 75 | 1718 | 3438 |
| 925 | 1073 | 4171 |
| 2124 | 2762 | 4148 |
| 4 | 3455 | 4069 |
| 3 | 1279 | 3382 |
| 1277 | 1746 | 3969 |
| 2727 | 3127 | 4230 |
| 584 | 1108 | 3454 |
| 9 | 2057 | 3061 |
| 1608 | 4103 | 4310 |
| 2673 | 3164 | 3713 |
| 1379 | 4072 | 4318 |
| 950 | 3447 | 4146 |
| 2509 | 4255 | 4296 |
| 819 | 1352 | 3371 |
| 3562 | 3865 | 4041 |
| 940 | 1217 | 3607 |
| 114 | 2544 | 4310 |
| 4 | 2178 | 4213 |
| 2035 | 4246 | 4251 |
| 272 | 1236 | 2733 |
| 953 | 2762 | 4115 |
| 1853 | 3496 | 4309 |
| 1119 | 3740 | 4318 |
| 2051 | 4058 | 4317 |
| 0 | 3162 | 4207 |
| 2389 | 4034 | 4111 |
| 4 | 3395 | 4301 |
| 3716 | 4089 | 4198 |
| 6 | 4272 | 4311 |
| 1 | 4 | 1854 |
| 4238 | 4299 | 4305 |
| 7 | 10 | 3737 |
| 11 | 3764 | 4296 |
| 297 | 1912 | 4117 |
| 1087 | 1796 | 4056 |
| 2153 | 3882 | 4030 |
| 962 | 4043 | 4203 |
| 243 | 3841 | 4308 |
| 2183 | 3886 | 4216 |
| 943 | 1974 | 2897 |
| 278 | 3224 | 3933 |
| 3 | 4196 | 4245 |
| 3409 | 4301 | 4315 |
| 2 | 2176 | 3214 |
| 462 | 3203 | 4008 |
| 478 | 2178 | 4202 |
| 3593 | 3825 | 4216 |
| 115 | 2796 | 4225 |
| 3827 | 4196 | 4251 |
| 1375 | 4301 | 4306 |
| 296 | 407 | 2055 |
| 688 | 3913 | 4281 |
| 3446 | 3840 | 4314 |
| 1073 | 3444 | 4146 |
| 1556 | 2761 | 3391 |
| 2 | 3543 | 4264 |
| 1378 | 3347 | 4305 |
| 847 | 1952 | 2745 |
| 1 | 1743 | 4042 |
| 2087 | 3048 | 4254 |
| 1010 | 4073 | 4132 |
| 2610 | 4129 | 4152 |
| 4106 | 4120 | 4313 |
| 7 | 4282 | 4304 |
| 3885 | 4227 | 4319 |
| 1235 | 4105 | 4195 |
| 1700 | 2332 | 4224 |
| 9 | 3750 | 4282 |
| 1539 | 4013 | 4310 |
| 3734 | 3834 | 4011 |
| 1397 | 2758 | 3645 |
| 7 | 1000 | 2984 |
| 11 | 3433 | 4068 |
| 1139 | 1800 | 3352 |
| 8 | 546 | 2561 |
| 1 | 4209 | 4239 |
| 2366 | 4063 | 4282 |

-continued

| | | |
|---|---|---|
| 279 | 2524 | 2533 |
| 657 | 1913 | 4006 |
| 2322 | 2623 | 2960 |
| 758 | 803 | 2304 |
| 9 | 13 | 4241 |
| 3887 | 4299 | 4318 |
| 2612 | 3830 | 4230 |
| 1300 | 1596 | 2155 |
| 3622 | 3671 | 4230 |
| 2491 | 3722 | 3977 |
| 735 | 3812 | 4201 |
| 3204 | 3796 | 4317 |
| 2727 | 4292 | 4305 |
| 1062 | 2676 | 4255 |
| 2777 | 3131 | 4286 |
| 2518 | 3352 | 3937 |
| 4225 | 4255 | 4317 |
| 3644 | 3822 | 4311 |
| 1853 | 3754 | 4094 |
| 599 | 2608 | 3276. |

A tenth data processing apparatus or data processing method of the present technology includes a decoding unit configured to decode or a decoding step of decoding an LDFC (Low Density Parity Check) code having a code length of 64800 bits and a code rate of 28/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 85 314 1602 1728 1929 2295 2729 2924 3779 4054 4276
918 1378 1838 1903 2399 2524 2937 3615 3740 4140 4213
1361 1430 2639 2648 2910 3418 3511 3543 4177 4209 4248
472 1143 1318 1545 1830 2228 2249 2256 3626 3839 3991
226 1401 2154 2318 2851 3317 3468 3944 3983 4047 4093
490 1145 1247 1851 2671 2776 3152 3229 3345 3758 3786
522 1393 1473 2196 2707 3052 3398 3814 3827 4148 4301
417 1982 2176 2336 2459 2806 3005 3771 3870 4080 4243
112 1040 1596 1621 1685 2118 2571 3359 3945 4034 4171
646 1705 2181 2439 2808 2851 2987 3044 3494 4049 4312
6 11 115 245 663 1773 2624 3444 3601 3952 4246
11 541 1020 1326 2259 2347 2750 2861 3328 3428 4126
515 941 1233 1804 2295 2528 3265 3826 4002 4022 4224
46 484 679 1949 2342 2929 3555 3860 3918 4068 4113
1832 2023 2279 2376 2965 3278 3318 3549 3640 3843 3910
241 943 1222 1583 1637 2745 3338 4080 4086 4203 4300
11 1419 1841 2398 2920 3409 3703 3768 3878 4052 4254
878 2049 2123 2431 2657 2704 3135 3342 3728 4141 4162
16 837 1267 1910 2100 3026 3099 3107 4042 4129 4157
133 646 1367 1394 2118 2311 2676 2956 3195 3536 3657
698 1444 2129 2432 2494 2793 2947 3852 3985 4254 4319
11 1076 1618 1995 2332 2743 2934 3009 3565 4169 4188
14 20 808 2629 2681 3090 3491 3835 4017 4068 4083
433 1386 2416 2570 2950 3611 3869 3969 4248 4251 4316
384 1292 1534 2610 2617 3559 3638 3964 4131 4293 4313
271 564 1719 2288 2597 2674 3429 3455 3793 4074 4286
133 190 815 955 1485 2000 2860 3000 3734 4013 4287
559 771 1762 2537 2764 2816 3186 3806 3933 4224 4271
11 733 1198 1735 1856 2668 2754 3216 4070 4113 4311
4 806 1832 2047 2058 2724 3387 3793 3833 4005 4319
506 1456 2339 3069 3343 3442 3889 3939 4013 4212 4278
2038 3980 4313
64 2373 4080
800 1535 4166
1030 3759 4002
1687 3269 4225
1219 2632 3878

-continued 719 2916 4277
1261 1930 3459
777 1568 1914
4 397 3290
10 3451 4115
3629 3885 4155
2652 3668 4026
135 3172 4319
1426 1970 3657
199 1268 2064
570 845 2761
41 1067 3498
1588 2482 2750
1615 2013 2715
121 1812 2588
10 992 1082
1929 4225 4279
6 1967 3760
593 1812 4107
891 2146 4158
924 2282 3585
592 2971 4235
260 3493 4313
2423 3180 3449
2042 3118 3625
2877 3064 3882
7 2139 4316
4 7 2954
1398 3947 4272
3675 4253 4318
1561 1977 2432
2531 4192 4209
1032 1102 4268
75 1718 3438
925 1073 4171
2124 2762 4148
4 3455 4069
3 1279 3382
1277 1746 3969
2727 3127 4230
584 1108 3454
9 2057 3061
1608 4103 4310
2673 3164 3713
1379 4072 4318
950 3447 4146
2509 4255 4296
819 1352 3371
3562 3865 4041
940 1217 3607
114 2544 4310
4 2178 4213
2035 4246 4251
272 1236 2733

-continued 953 2762 4115
1853 3496 4309
1119 3740 4318
2051 4058 4317
0 3162 4207
2389 4034 4111
4 3395 4301
3716 4089 4198
6 4272 4311
1 4 1854
4238 4299 4305
7 10 3737
11 3764 4296
297 1912 4117
1087 1796 4056
2153 3882 4030
962 4043 4203
243 3841 4308
2183 3886 4216
943 1974 2897
278 3224 3933
3 4196 4245
3409 4301 9315
2 2176 3214
462 3203 4008
478 2178 4202
3593 3825 4216
115 2796 4225
3827 4196 4251
1375 4301 4306
296 407 2055
688 3913 4281
3446 3840 4314
1073 3444 4146
1556 2761 3391
2 3543 4264
1378 3347 4305
847 1952 2745
1 1793 4042
2087 3048 4254
1010 4073 4132
2610 4129 4152
4106 4120 4313
7 4282 4304
3885 4227 4319
1235 4105 4195
1700 2332 4224
9 3750 4282
1539 4013 4310
3734 3834 4011
1397 2758 3645
7 1000 2984
11 3433 4068
1139 1800 3352
8 546 2561
1 4209 4239
2366 4063 4282
279 2524 2.533
657 1913 4006
2322 2623 2960
758 803 2304
9 13 4241
3887 4299 4318
2612 3830 4230
1300 1596 2155
3622 3671 4230
2491 3722 3977
735 3812 4201
3204 3796 4317
2727 4292 4305
1062 2676 4255
2777 3131 4286
2518 3352 3937
4225 4255 4317
3644 3822 4311
1853 3754 4094
599 2608 3276.

An eleventh data processing apparatus or data processing method of the present technology includes an encoding unit configured to encode or an encoding step of encoding information bits into an LDPC (Low Density Parity Check) code having a code length of 64800 bits and a code rate of 29/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 212 499 911 940 1392
316 563 1527 2006 2077
2 1906 2043 2112 2123
537 901 1582 1812 1955
5 978 1280 1933 2145
5 2035 2044 2108 2121
5 939 1874 1974
4 1069 1758
694 2096 2106
1129 1511 1659
1564 2089 2159
2 1605 2004
474 1341 2003
103 2128 2150
1656 1993 2153
1881 2122 2138
1088 1968 2141
1 298 2073
1042 1724 2137
1253 1758 2145
1209 1566 2123
1466 2116 2155
43 2006 2049
592 1806 1865
3 143 2149
1158 1448 2002
1422 2152 2157
485 2119 2150
371 1831 2086
204 2042 2151
174 544 974
1469 1795 1995
13 708 1683
5 1144 2030
486 1309 1576
165 2030 2147
504 2073 2126
263 565 1798
239 861 1861
862 1610 1716
1346 1971 2128
5 804 1399
2139 2144 2155
4 2136 2159
1485 2059 2158
50 1091 1332
373 1730 2092
59 1086 1401
1166 1781 2065
213 2080 2154
492 1905 2110
1 1517 2126
722 1427 2146
885 991 1842
3 278 1806
967 1354 1907
1697 2047 2156
684 1924 2151
2077 2122 2157
978 2054 2135
435 2034 2150
136 1997 2125
1504 1850 2153

| |
|---|
| 1404 1989 2119 |
| 109 1001 2152 |
| 780 1473 2150 |
| 198 1723 2062 |
| 927 2087 2138 |
| 1 666 2018 |
| 1293 1960 2141 |
| 1648 2033 2144 |
| 681 1578 1999 |
| 1342 2022 2157 |
| 949 1907 1994 |
| 138 1261 2135 |
| 3 608 982 |
| 1211 1501 2150 |
| 201 228 1186 |
| 1295 2089 2132 |
| 267 556 2142 |
| 801 2052 2122 |
| 1382 2135 2155 |
| 572 1503 1704 |
| 346 1183 2129 |
| 1926 2090 2149 |
| 1337 2133 2140 |
| 5 1806 2125 |
| 1383 1628 2068 |
| 1193 1626 2138 |
| 1999 2115 2146 |
| 217 274 2021 |
| 3 816 2024 |
| 1380 2138 2157 |
| 607 1385 2110 |
| 184 1195 2063 |
| 0 1767 2108 |
| 0 2081 2097 |
| 1135 2036 2128 |
| 1748 2001 2125 |
| 797 1552 1926 |
| 1046 1890 2128 |
| 291 1859 2131 |
| 1075 1214 1762 |
| 60 549 1943 |
| 581 1197 1232 |
| 1009 2026 2136 |
| 884 2002 2117 |
| 1 576 1449 |
| 519 1968 2114 |
| 5 1489 1630 |
| 1926 2037 2158 |
| 2 1249 2159 |
| 0 811 2114 |
| 2055 2152 2159 |
| 802 1911 2120 |
| 204 1033 2033 |
| 1840 2012 2037 |
| 1746 2111 2155 |
| 1098 1835 2157 |
| 2 1492 1831 |
| 353 1537 1830 |
| 375 1264 2036 |
| 2 1638 2035 |
| 1096 1971 2021 |
| 950 1809 1884 |
| 253 467 1600 |
| 5 379 1833 |
| 4 1698 1970 |
| 37 1637 2136 |
| 1174 1460 2157 |
| 612 1827 2134 |
| 1783 1802 1949 |
| 2029 2118 2151 |
| 1984 2030 2141 |
| 2 347 462 |
| 862 1693 2121 |
| 2 895 1401 |
| 4 1901 2100 |
| 1183 1674 2069 |
| 1575 1940 2158 |
| 5 1904 2097 |
| 1044 2029 2092 |

| |
|---|
| 1441 1943 2150 |
| 0 3 1300 |
| 2 516 1735 |
| 503 1342 2019 |
| 1421 1914 2131 |
| 28 986 1467 |
| 1270 1851 1988 |
| 481 1265 2016 |
| 530 546 909 |
| 653 1909 2158 |
| 1805 2002 2149 |
| 2 1359 1518 |
| 1640 2104 2129 |
| 1656 2109 2155 |
| 1307 1762 2114 |
| 565 1647 2118 |
| 1690 2081 2156 |
| 1 300 1995 |
| 5 1681 2151 |
| 1602 2050 2156 |
| 1 1960 2153 |
| 2061 2070 2138 |
| 1581 1673 2142 |
| 1048 1142 2101 |
| 1867 1991 2055 |
| 856 1640 1878 |
| 251 561 966 |
| 343 1816 2114 |
| 3 966 2045 |
| 1885 1922 2158 |
| 57 556 2059 |
| 732 1724 2147. |

A twelfth data processing apparatus or data processing method of the present technology includes a decoding unit configured to decode or a decoding step of decoding an LDPC (Low Density Parity Check) code having a code length of 64800 bits and a code rate of 29/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including

| |
|---|
| 212 499 911 940 1392 |
| 316 563 1527 2006 2077 |
| 2 1906 2043 2112 2123 |
| 537 901 1582 1812 1955 |
| 5 978 1280 1933 2145 |
| 5 2035 2044 2108 2121 |
| 5 939 1874 1974 |
| 4 1069 1758 |
| 694 2096 2106 |
| 1129 1511 1659 |
| 1564 2089 2159 |
| 2 1605 2004 |
| 474 1341 2003 |
| 103 2128 2150 |
| 1656 1993 2153 |
| 1881 2122 2138 |
| 1088 1968 2141 |
| 1 298 2073 |
| 1042 1724 2137 |
| 1253 1758 2145 |
| 1209 1566 2123 |
| 1466 2116 2155 |
| 43 2006 2049 |
| 592 1806 1865 |
| 3 143 2149 |
| 1158 1448 2002 |

-continued

| |
|---|
| 1422 2152 2157 |
| 485 2119 2150 |
| 371 1831 2086 |
| 204 2042 2151 |
| 174 544 974 |
| 1469 1795 1995 |
| 13 708 1683 |
| 5 1144 2030 |
| 486 1309 1576 |
| 165 2030 2147 |
| 504 2073 2126 |
| 263 565 1798 |
| 239 861 1861 |
| 862 1610 1716 |
| 1346 1971 2128 |
| 5 804 1399 |
| 2139 2144 2155 |
| 4 2136 2159 |
| 1485 2059 2158 |
| 50 1091 1332 |
| 373 1730 2092 |
| 59 1086 1401 |
| 1166 1781 2065 |
| 213 2080 2154 |
| 492 1905 2110 |
| 1 1517 2126 |
| 722 1427 2146 |
| 885 991 1842 |
| 3 278 1806 |
| 967 1354 1907 |
| 1697 2047 2156 |
| 684 1924 2151 |
| 2077 2122 2157 |
| 978 2054 2135 |
| 435 2034 2150 |
| 136 1997 2125 |
| 1504 1850 2153 |
| 1404 1989 2119 |
| 109 1001 2152 |
| 780 1473 2150 |
| 198 1723 2062 |
| 927 2087 2138 |
| 1 666 2018 |
| 1293 1960 2141 |
| 1648 2033 2144 |
| 681 1578 1999 |
| 1342 2022 2157 |
| 949 1907 1994 |
| 138 1261 2135 |
| 3 608 982 |
| 1211 1501 2150 |
| 201 228 1186 |
| 1295 2089 2132 |
| 267 556 2142 |
| 801 2052 2122 |
| 1382 2135 2155 |
| 572 1503 1704 |
| 346 1183 2129 |
| 1926 2090 2149 |
| 1337 2133 2140 |
| 5 1806 2125 |
| 1383 1628 2068 |
| 1193 1626 2138 |
| 1999 2115 2146 |
| 217 274 2021 |
| 3 816 2024 |
| 1380 2138 2157 |
| 607 1385 2110 |
| 184 1195 2063 |
| 0 1767 2108 |
| 0 2081 2097 |
| 1135 2036 2128 |
| 1748 2001 2125 |
| 797 1552 1926 |
| 1046 1890 2128 |
| 291 1859 2131 |
| 1075 1214 1762 |
| 60 549 1943 |
| 581 1197 1232 |

-continued

| |
|---|
| 1009 2026 2136 |
| 884 2002 2117 |
| 1 576 1449 |
| 519 1968 2114 |
| 5 1489 1630 |
| 1926 2037 2158 |
| 2 1249 2159 |
| 0 811 2114 |
| 2055 2152 2159 |
| 802 1911 2120 |
| 204 1033 2033 |
| 1840 2012 2037 |
| 1746 2111 2155 |
| 1098 1835 2157 |
| 2 1492 1831 |
| 353 1537 1830 |
| 375 1264 2036 |
| 2 1638 2035 |
| 1096 1971 2021 |
| 950 1809 1884 |
| 253 467 1600 |
| 5 379 1833 |
| 4 1698 1970 |
| 37 1637 2136 |
| 1174 1460 2157 |
| 612 1827 2134 |
| 1783 1802 1949 |
| 2029 2118 2151 |
| 1984 2030 2141 |
| 2 347 462 |
| 862 1693 2121 |
| 2 895 1401 |
| 4 1901 2100 |
| 1183 1674 2069 |
| 1575 1940 2158 |
| 5 1904 2097 |
| 1044 2029 2092 |
| 1441 1943 2150 |
| 0 3 1300 |
| 2 516 1735 |
| 503 1342 2019 |
| 1421 1914 2131 |
| 28 986 1467 |
| 1270 1851 1988 |
| 481 1265 2016 |
| 530 546 909 |
| 653 1909 2158 |
| 1805 2002 2149 |
| 2 1359 1518 |
| 1640 2104 2129 |
| 1656 2109 2155 |
| 1307 1762 2114 |
| 565 1647 2118 |
| 1690 2081 2156 |
| 1 300 1995 |
| 5 1681 2151 |
| 1602 2050 2156 |
| 1 1960 2153 |
| 2061 2070 2138 |
| 1581 1673 2142 |
| 1048 1142 2101 |
| 1867 1991 2055 |
| 856 1640 1878 |
| 251 561 966 |
| 343 1816 2114 |
| 3 966 2045 |
| 1885 1922 2158 |
| 57 556 2059 |
| 732 1724 2147. |

In the present technology, information bits are encoded into an LDPC (Low Density Parity Check) code having a code length of 64800 bits and a code rate of 24/30, 25/30, 26/30, 27/30, 28/30, or 29/30 on the basis of a parity check matrix of the LDPC code.

In the present technology, furthermore, an LDPC (Low Density Parity Check) code having a code length of 64800 bits and a code rate of 24/30, 25/30, 26/30, 27/30, 28/30, or 29/30 is decoded on the basis of the parity check matrix of an LDPC code.

The LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns.

A parity check matrix initial value table with a code rate of 24/30 includes 1504 2103 2621 2840 3869 4594 5246 6314 7327 7364 10425 11934 12898 12954
27 1903 3923 4513 7812 8098 8428 9789 10519 11345 12032 12157 12573 12930
17 191 660 2451 2475 2976 3398 3616 5769 6724 8641 10046 11552 12842
13 1366 4993 6468 7689 8563 9131 10012 10914 11574 11837 12203 12715 12946
432 872 2603 3286 3306 3385 4137 5563 7540 9339 9948 12315 12656 12929
1113 1394 4104 4186 7240 8827 11522 11833 12359 12363 12629 12821 12904 12946
14 441 1432 1677 2432 8981 11478 11507 12599 12783 12793 12912 12922 12943
1579 1806 7971 8586 9845 10357 11600 12007 12020 12339 12576 12817 12830 12904
20 546 3672 5538 6944 8052 8781 9743 12269 12393 12418 12549 12555 12718
1 3540 4397 5011 6626 8617 9587 10360 10602 11402 11983 12068 12495 12838
30 1572 4908 7421 8041 8910 8963 11005 11930 12240 12340 12467 12892 12933
33 2060 3907 4215 5545 8306 8655 8743 8806 9315 9364 10685 11954 12959
1338 2596 4876 5207 9555 10421 10929 11648 11739 12375 12416 12643 12742 12754
9469 10544 10932 11250 11426 11582 11846 12139 12202 12210 12356 12378 12873 12929
2681 3337 3616 6113 7078 8167 8624 9697 10908 11781 11855 12095 12475 12659
28 4086 5432 6555 6848 7368 8794 11483 11572 12414 12816 12894 12936 12957
5 5044 5572 9023 9192 9589 9979 10009 10855 10991 11715 12314 12610 12945
17 272 602 5681 6530 9572 9886 11061 11495 12238 12265 12483 12885 12955
22 2245 4282 4469 5007 6650 6733 10151 10401 11571 12004 12261 12805 12844
23 3270 4468 8621 9662 11240 11934 12091 12444 12691 12717 12858 12888 12917
740 1519 4923 6191 7878 8350 9293 10779 11020 11287 11630 12792 12862 12920
12 28 3584 6072 7079 8075 10477 11130 11383 11780 12341 12667 12818 12927
14 118 5283 5382 8301 9097 9413 9664 10437 10701 11124 12685 12730 12734
32 1426 3078 4325 5353 7780 9042 9928 10077 10377 10679 11191 11750 12611
1 669 3831 3980 5381 5412 6552 8453 9435 10243 11546 11821 11987 12807
232 483 919 1232 2156 2396 2990 3774 8539 8704 8819 10810 11868 12634
2381 7309 9334
348 6494 12623
4872 6257 11090
7 11970 11985
6615 12788 12855
1173 5269 12647
1944 7738 8116
17 4828 9175
2329 6034 12642
1254 2366 5013
2984 5078 5664

-continued 7423 10265 11528
1656 8526 8716
22 287 2837
18 100 3079
299 3171 12169
33 5920 11144
1286 3650 9309
2283 8809 12588
3199 8242 9081
2507 6846 8113
5211 8722 12689
1064 2592 8659
6136 6925 12958
1256 12789 12932
4274 8045 8788
1824 3209 6926
11 8899 12669
6249 6338 8730
641 9679 12831
3459 9876 11185
3226 6148 8173
9078 12126 12771
10907 11278 12731
3392 4020 12838
2814 11588 12909
6063 9214 11519
6064 6827 12683
1610 2452 6582
903 6289 8074
4592 8138 12952
2587 6271 9945
2733 11844 11893
581 4601 10020
14 5597 6049
343 3582 5931
5263 6521 12846
1394 2457 5251
11 4627 12747
2650 10366 12390
6285 11893 12062
10143 12892 12956
8948 11917 12330
4209 11693 12356
1529 2360 9086
5389 8148 10224
64 4876 12862
9483 12659 12887
3587 6767 12478
3122 5295 9044
3267 10118 11466
1347 3857 6705
9384 9576 11971
1366 8708 10758
412 4249 12863
1676 10488 11850
17 1605 2455
14 111 6045
11368 12919 12953
10588 11530 12937
4549 5143 12218
3088 4185 11674
23 2554 7823
6615 9291 9863
2229 3629 10855
3818 5509 12764
2740 11525 12914
8297 8611 12948
3606 11104 12920
5097 10412 12759
6502 7266 12072
5425 5490 10728
22 73 8462
32 12439 12657
8483 9540 10430
7275 7377 7420
5748 9726 12356
5672 6150 9156
28 3527 5857
520 7099 11335

405 6173 12865
5847 12843 12934
4289 7679 10386
2950 8021 12938
8844 11214 12955
2130 10760 12665
734 4790 12940
8 6991 12772
19 8205 11289
12 1440 9077
8670 8837 12951
3531 9166 12937
15 8901 8929
838 10114 11740
2648 9959 10934
323 7499 12877
5505 5659 11395
6627 12709 12933
364 1976 12888
8213 9124 12793
9588 10088 11108
299 890 11634
7368 7598 11602
28 4669 12585
15 27 12474
1426 3619 4205
30 2087 11197
6226 6259 12941.

A parity check matrix initial value table with a code rate of 25/30 includes 1860 2354 3967 4292 4488 5243 5373 5766 8378 9111 10468 10505 10774
24 2266 2380 3282 4255 9779 8729 9140 9566 10102 10661 10711 10797
605 650 1108 1669 2251 3133 5847 6197 6902 7545 10521 10600 10773
1016 1428 1612 2335 3102 3810 4926 5953 9964 10246 10569 10734 10784
3195 6308 8029 9030 9397 9461 9833 10239 10499 10675 10736 10757 10773
2 27 3641 4566 7332 9318 9323 9916 10365 10438 10561 10581 10750
2405 2458 4820 6232 6254 6347 7139 7474 8623 8779 8798 10747 10794
3164 4736 6474 7162 7420 7517 7835 8238 8412 8489 9006 10113 10440
20 2372 5561 5649 6907 8393 8505 9181 9567 9595 10388 10483 10714
1071 2899 5135 5780 6616 7111 7773 8582 9015 9912 10139 10387 10768
292 2833 5990 6011 6136 6713 7517 9096 10128 10328 10407 10525 10736
1044 3711 4421 5140 5207 8118 8749 8884 9205 10359 10372 10746 10784
3241 5696 6940 7240 7419 8613 8878 9593 9959 9997 10401 10404 10754
3133 4647 5912 6065 6694 7208 7346 8227 9465 9739 10452 10516 10770
2254 6444 7449 8095 8120 8710 9030 9162 9643 9968 10101 10571 10678
918 1445 2217 4262 4623 5401 5749 7446 7907 9539 10125 10514 10726
6 1341 1788 3105 4359 5263 5470 7552 8249 8644 10609 10674 10733
1994 3000 3151 3173 7742 8335 8438 8741 9232 9296 9817 10023 10257
467 1674 3016 3950 4055 5399 6688 7113 7273 8658 8702 9642 10545
2007 2541 3125 7380 7550 8122 8501 8665 9882 10403 10519 10594 10696
334 587 709 1540 2023 2876 6216 8768 9328 9481 10424 10507 10779
2165 4185 4306 5019 6961 7386 8447 9082 9837 10091 10461 10559 10570

7 903 2948 6312 6654 7738 7980 8312 9104 9743 10070 10278 10406
3047 3154 4160 4378 5461 8711 8809 9040 9173 9252 9537 9995 10735
2018 2355 3828 3854 6201 6696 8313 8459 8550 8833 9586 10202 10224
1402 1908 4286 4660 6029 6115 6737 7538 9495 9517 10055 10509 10644
3442 3589 3868 5051 5322 5580 8725 9046 9170 10041 10613 10681 10689
2733 7826 10622
3597 4753 7086
1394 7297 10264
2848 7502 10304
1649 2405 10783
647 2911 9069
2572 4006 7508
1361 8887 10103
3681 4023 9090
1496 4962 6325
2016 5120 9747
3954 5260 8568
3364 8719 10035
4208 4806 9973
29 3361 3490
1835 2317 10436
7312 8177 9041
7728 8097 10761
2109 7902 9685
5424 8943 9436
4369 7643 9152
2240 10140 10528
3435 6124 10604
8962 9357 10040
26 1931 8629
8275 10455 10643
8 24 4952
3995 6456 10633
28 10300 10337
4894 9286 9429
5587 6721 9120
1859 9198 9762
6374 6453 7011
1319 4530 5442
1507 10711 10798
2115 3445 3641
6668 9139 10163
4038 8117 10295
1479 3403 8247
2522 2934 3562
1526 5073 9650
2136 9820 10636
4214 8464 9891
8018 10330 10610
8984 10209 10647
3414 7272 8599
4883 9077 9525
22 8173 8425
2941 6536 10126
29 6540 7361
5 3787 10468
4264 4818 6906
3903 7041 10412
6078 7661 10619
6922 9723 9890
5112 5416 6253
5925 9961 10447
9 10311 10598
8790 8814 10793
4768 5466 10664
10 10675 10766
6814 8705 10737
17 769 6692
1503 10696 10742
1285 4632 8976
4279 4973 7907
4650 4775 10785
28 729 10331
1914 5240 10723

-continued 3569 4921 9561
4 9442 10796
494 2328 9507
1717 8768 10750
9540 10599 10774
11 10075 10644
10246 10607 10753
5510 7088 9053
1347 3584 5523
7872 10596 10736
628 10592 10695
5632 5688 10627
2375 10009 10561
4169 4630 8871
2896 10038 10521
89 9695 9799
20 7563 9069
4534 10321 10697
8212 9868 10716
7485 9312 10327
234 536 6293
5515 7350 9251
283 3182 7167
2444 5378 6130
6183 8315 10726
43 4871 8347
2427 10219 10728
10 21 9448
1067 8312 8420
4793 9522 10105
4688 10536 10724
3825 7496 10709
682 8544 10449
2794 7110 10741
9279 10741 10767
2897 5442 8771
33 7957 10460
5 10393 10792
6225 10224 10798
23 9014 10786
7836 8339 8642
3476 5455 9788
1939 10251 10384
4008 7890 10450
926 2090 3804
1038 2497 10701
22 6220 8405
5153 5944 10367
7260 7726 9529
3039 8397 10665
7262 9644 10083
5531 6248 10795
7926 8248 8413
4649 8971 10182.

A parity check matrix initial value table with a code rate of 26/30 includes 142 2307 2598 2650 4028 4434 5781 5881 6016 6323 6681 6698 8125
2932 4928 5248 5256 5983 6773 6828 7789 8426 8494 8534 8539 8583
899 3295 3833 5399 6820 7400 7753 7890 8109 8451 8529 8564 8602
21 3060 4720 5429 5636 5927 6966 8110 8170 8247 8355 8365 8616
20 1745 2838 3799 4380 4418 4646 5059 7343 8161 8302 8456 8631
9 6274 6725 6792 7195 7333 8027 8186 8209 8273 8442 8548 8632
494 1365 2405 3799 5188 5291 7644 7926 8139 8458 8504 8594 8625
192 574 1179 4387 4695 5089 5831 7673 7789 8298 8301 8612 8632
11 20 1406 6111 6176 6256 6708 6834 7828 8232 8457 8495 8602

-continued 6 2654 3554 4483 4966 5866 6795 8069 8249 8301 8497 8509 8623
21 1144 2355 3124 6773 6805 6887 7742 7994 8358 8374 8580 8611
335 4473 4883 5528 6096 7543 7586 7921 8197 8319 8394 8489 8636
2919 4331 4419 4735 6366 6393 6844 7193 8165 8205 8544 8586 8617
12 19 742 930 3009 4330 6213 6224 7292 7430 7792 7922 8137
710 1439 1588 2434 3516 5239 6248 6827 8230 8448 8515 8581 8619
200 1075 1868 5581 7349 7642 7698 8037 8201 8210 8320 8391 8526
3 2501 4252 5256 5292 5567 6136 6321 6430 6486 7571 8521 8636
3062 4599 5885 6529 6616 7314 7319 7567 8024 8153 8302 8372 8598
105 381 1574 4351 5452 5603 5943 7467 7788 7933 8362 8513 8587
787 1857 3386 3659 6550 7131 7965 8015 8090 8312 8484 8525 8537
15 1118 4226 5197 5575 5761 6762 7038 8260 8338 8444 8512 8568
36 5216 5368 5616 6029 6591 8038 8067 8299 8351 8565 8578 8585
1 23 4300 4530 5926 5532 5817 6967 7124 7979 8022 8270 8437
629 2133 4828 5475 5875 5890 7194 8042 8345 8385 8518 8598 8612
11 1065 3782 4237 4993 7104 7863 7904 8109 8228 8321 8383 8565
2131 2274 3168 3215 3220 5597 6347 7812 8238 8354 8527 8557 8614
5600 6591 7491 7696
1766 8281 8626
1725 2280 5120
1650 3445 7652
4312 6911 8626
15 1013 5892
2263 2546 2979
1545 5873 7406
67 726 3697
2860 6443 8542
17 911 2820
1561 4580 6052
79 5269 7134
22 2410 2424
3501 5642 8627
808 6950 8571
4099 6389 7482
4023 5000 7833
5476 5765 7917
1008 3194 7207
20 495 5411
1703 8388 8635
6 4395 4921
200 2053 8206
1089 5126 5562
10 4193 7720
1967 2151 4608
22 738 3513
3385 5066 8152
440 1118 8537
3429 6058 7716
5213 7519 8382
5564 8365 8620
43 3219 8603
4 5409 5815
5 6376 7654
4091 5724 5953
5348 6754 8613
1634 6398 6632
72 2058 8605
3497 5811 7579
3846 6743 8559
15 5933 8629
2133 5859 7068
4151 4617 8566

-continued

| |
|---|
| 2960 8270 8410 |
| 2059 3617 8210 |
| 544 1441 6895 |
| 4043 7482 8592 |
| 294 2180 8524 |
| 3058 8227 8373 |
| 364 5756 8617 |
| 5383 8555 8619 |
| 1704 2480 4181 |
| 7338 7929 7990 |
| 2615 3905 7981 |
| 4298 4548 8296 |
| 8262 8319 8630 |
| 892 1893 8028 |
| 5694 7237 8595 |
| 1487 5012 5810 |
| 4335 8593 8624 |
| 3509 4531 5273 |
| 10 22 830 |
| 4161 5208 6280 |
| 275 7063 8634 |
| 4 2725 3113 |
| 2279 7403 8174 |
| 1637 3328 3930 |
| 2810 4939 5624 |
| 3 1234 7687 |
| 2799 7740 8616 |
| 22 7701 8636 |
| 4302 7857 7993 |
| 7477 7794 8592 |
| 9 6111 8591 |
| 5 8606 8628 |
| 347 3497 4033 |
| 1747 2613 8636 |
| 1827 5600 7042 |
| 580 1822 6842 |
| 232 7134 7783 |
| 4629 5000 7231 |
| 951 2806 4947 |
| 571 3474 8577 |
| 2437 2496 7945 |
| 23 5873 8162 |
| 12 1168 7686 |
| 8315 8540 8596 |
| 1766 2506 4733 |
| 929 1516 3338 |
| 21 1216 6555 |
| 782 1452 8617 |
| 8 6083 6087 |
| 667 3240 4583 |
| 4030 4661 5790 |
| 559 7122 8553 |
| 3202 4388 4909 |
| 2533 3673 8594 |
| 1991 3954 6206 |
| 6835 7900 7980 |
| 189 5722 8573 |
| 2680 4928 9998 |
| 243 2579 7735 |
| 9281 8132 8566 |
| 7656 7671 8609 |
| 1116 2291 4166 |
| 21 388 8021 |
| 6 1123 8369 |
| 311 4918 8511 |
| 0 3248 6290 |
| 13 6762 7172 |
| 4209 5632 7563 |
| 49 127 8074 |
| 581 1735 4075 |
| 0 2235 5470 |
| 2178 5820 6179 |
| 16 3575 6054 |
| 1095 4564 6458 |
| 9 1581 5953 |
| 2537 6469 8552 |
| 14 3874 4844 |
| 0 3269 3551 |
| 2114 7372 7926 |

-continued

| |
|---|
| 1875 2388 4057 |
| 3232 4042 6663 |
| 9 401 583 |
| 13 4100 6584 |
| 2299 4190 4410 |
| 21 3670 4979. |

A parity check matrix initial value table with a code rate of 27/30 includes

| |
|---|
| 658 706 898 1149 2577 2622 2772 3266 3329 5243 6079 6271 |
| 289 784 1682 3584 3995 4821 4856 5063 5974 6168 6437 6453 |
| 658 1426 2043 2065 2986 4118 9284 5394 5444 5477 5727 6018 |
| 641 928 1225 2841 4052 4840 4992 5268 5533 6249 6461 6475 |
| 2312 2917 3713 3849 4059 4241 4610 5440 5727 6101 6397 6444 |
| 1165 1592 1891 2154 3981 4817 5181 5748 5788 6012 6266 6350 |
| 13 2758 3069 4233 4697 5100 5279 5677 5919 5969 6280 6422 |
| 818 1500 2125 2340 3774 9707 4901 5170 5744 6008 6316 6353 |
| 857 3054 3409 3496 3704 4868 5326 6211 6292 6356 6367 6381 |
| 0 7 12 1709 2166 3418 3723 4887 5770 6043 6069 6431 |
| 2481 3379 4650 4900 4919 5060 5410 5425 6056 6173 6283 6386 |
| 15 814 854 1871 2934 3387 3915 5180 5303 5442 5581 5665 |
| 146 1882 3076 4458 4848 5252 5602 5778 5821 6213 6251 6401 |
| 2 947 1419 1566 3437 3646 9615 4634 4735 5819 5943 6280 |
| 1231 2309 2920 4158 4185 4298 4711 5082 5757 5762 6204 6209 |
| 257 297 337 2783 3230 4134 4480 4749 5295 5689 5921 6202 |
| 1436 2151 2629 3217 3930 4078 5386 5799 5906 6146 6226 6366 |
| 133 530 2448 4745 5000 5020 5224 5273 6211 6266 6431 6453 |
| 13 2644 3895 3898 4485 4722 5142 5462 5951 6031 6084 6351 |
| 6 3000 3873 3995 4680 5158 5504 5692 5755 6255 6338 6359 |
| 166 465 1658 2549 2941 4244 5071 5149 5452 5874 5939 6038 |
| 2309 2937 4282 4628 5113 5454 5731 5825 6021 6171 6402 6472 |
| 3 1077 2116 2426 2830 4853 5066 5571 5850 5916 6389 6421 |
| 817 1608 2229 2925 3281 4393 5042 5058 5377 5464 5588 6448 |
| 1848 3871 4381 4776 5366 5578 5648 6143 6389 6434 6465 6473 |
| 1263 1616 3150 3497 3759 4078 5530 5665 5694 5913 6397 6420 |
| 11 813 2185 2795 3349 4652 4678 5078 5504 6011 6286 6387 |
| 3060 3161 4584 4996 5143 5542 5697 5937 6141 6155 6342 6445 |
| 1638 2333 2632 3450 3505 3911 4399 9454 5499 5860 6044 6360 |
| 650 1744 4517 |
| 5772 6071 6471 |
| 3582 3622 5776 |
| 6153 6380 6446 |
| 3977 5932 6447 |
| 2071 4597 4891 |
| 11 1428 3776 |
| 1111 3874 5048 |
| 1410 2144 4445 |
| 4681 5481 6462 |
| 4044 5037 5497 |
| 2716 2891 6411 |

-continued 3299 4384 6224
1843 6087 6400
4664 5009 5856
1548 4383 5055
3172 4190 6373
5899 6443 6470
2572 3647 6240
1295 2158 6466
5604 6269 6368
3 5551 6454
3325 5797 6261
666 1397 5538
3069 4274 6410
4042 5992 6437
743 3075 3447
1344 2725 6386
283 2808 6303
2 4627 4632
26 1565 4000
4012 4946 6472
1629 6158 6467
6300 6351 6376
2969 4344 4440
2317 3115 4832
2099 5263 6285
2409 5868 5997
3752 4200 6350
3125 5841 6142
1 2249 6328
16 2525 6379
3198 5269 5960
4 1705 2069
990 4948 5520
1664 3836 4521
1765 4110 6454
9 1373 6387
1969 2405 6368
623 1428 3946
3111 6380 6436
1861 5611 5934
9 2444 3081
5 5508 6317
3184 4988 5995
1060 4803 6400
5021 5826 6289
1608 4754 5648
4702 6391 6421
3899 4811 6128
927 2286 5313
4123 6181 6453
2893 4150 5261
605 4332 5094
17 3518 6358
2858 6126 6478
15 1316 6465
2 2032 2983
5249 6340 6427
5 6003 6200
4478 6315 6920
5158 6390 6447
2598 3229 5399
3747 6424 6446
1412 2453 6332
5256 5715 6455
2137 3421 4368
15 3880 5245
17 3156 5638
3227 3798 6230
2094 3129 6458
1412 5573 5932
175 1182 6304
3555 6407 6463
583 1654 6339
14 6261 6449
3553 5383 5679
2092 2744 4153
0 4466 6472
11 3840 4354
17 5457 6222

-continued 1467 6083 6220
3449 3858 6337
3782 5318 6426
417 5038 5790
3571 5638 5873
6117 6241 6476
1898 5680 6219
3235 3817 6429
2095 4194 6224
2 4092 6448
5 6330 6383
285 5075 6334
10 505 2867
1183 5956 6466
839 4716 6471
984 3254 6432
1501 4790 6465
8 1457 1707
1660 1969 6438
4349 6182 6305
1423 3848 5490
1651 2969 6345
344 4164 6298
2397 6027 6274
2233 2778 6161
13 1778 2977
9 1916 3377
0 3 6190
395 4893 6394
3512 4098 6400
3490 6281 6473
12 1359 6465
4202 5179 6412
3007 3542 4271
2400 3350 6351
7 5490 5716
4695 5231 6266
777 6292 6402
919 4851 6367
6 644 3893
5386 6190 6434
17 169 4896.

A parity check matrix initial value table with a code rate of 28/30 includes 85 314 1602 1728 1929 2295 2729 2924 3779 4054 4276
918 1378 1838 1903 2399 2524 2937 3615 3740 4140 4213
1361 1430 2639 2648 2910 3418 3511 3543 4177 4209 4248
472 1143 1318 1545 1830 2228 2249 2256 3626 3839 3991
226 1401 2154 2318 2851 3317 3468 3944 3983 4047 4093
490 1145 1297 1851 2671 2776 3152 3229 3345 3758 3786
522 1393 1473 2196 2707 3052 3398 3814 3827 4148 4301
417 1982 2176 2336 2459 2806 3005 3771 3870 4080 4243
112 1040 1596 1621 1685 2118 2571 3359 3945 4034 4171
646 1705 2181 2439 2808 2851 2987 3044 3494 4049 4312
6 11 115 245 663 1773 2624 3444 3601 3952 4246
11 541 1020 1326 2259 2347 2750 2861 3328 3428 4126
515 941 1233 1804 2295 2528 3265 3826 4002 4022 4224
46 484 679 1949 2342 2929 3555 3860 3918 4068 4113
1832 2023 2279 2376 2965 3278 3318 3549 3640 3843 3910
241 943 1222 1583 1637 2745 3338 4080 4086 4203 4300
11 1419 1841 2398 2920 3409 3703 3768 3878 4052 4254
878 2049 2123 2431 2657 2704 3135 3342 3728 4141 4162
16 837 1267 1410 2100 3026 3099 3107 4042 4129 4157
133 646 1367 1394 2118 2311 2676 2956 3195 3536 3657
698 1444 2129 2432 2494 2793 2947 3852 3985 4254 4319
11 1076 1618 1995 2332 2743 2934 3009 3565 4169 4188
14 20 808 2629 2681 3090 3491 3835 4017 4068 4083
433 1386 2416 2570 2950 3611 3869 3969 4248 4251 4316
384 1292 1534 2610 2617 3559 3638 3964 4131 4293 4313
271 564 1719 2288 2597 2674 3429 3455 3793 4074 4286
133 190 815 955 1485 2000 2860 3000 3734 4013 4287
559 771 1762 2537 2764 2816 3186 3806 3933 4224 4271
11 733 1198 1735 1856 2668 2754 3216 4070 4113 4311
4 806 1832 2047 2058 2724 3387 3793 3833 4005 4319
506 1456 2339 3069 3343 3442 3889 3939 4013 4212 4278

-continued

| |
|---|
| 2038 3980 4313 |
| 64 2373 4080 |
| 800 1535 4166 |
| 1030 3759 4002 |
| 1687 3269 4225 |
| 1219 2632 3878 |
| 719 2916 4277 |
| 1261 1930 3459 |
| 777 1568 1914 |
| 4 397 3290 |
| 10 3451 4115 |
| 3629 3885 4155 |
| 2652 3668 4026 |
| 135 3172 4319 |
| 1426 1970 3657 |
| 199 1268 2064 |
| 570 845 2761 |
| 41 1067 3498 |
| 1588 2482 2750 |
| 1615 2013 2715 |
| 121 1812 2588 |
| 10 992 1082 |
| 1929 4225 4279 |
| 6 1967 3760 |
| 593 1812 4107 |
| 891 2146 4158 |
| 924 2282 3585 |
| 592 2971 4235 |
| 260 3493 4313 |
| 2423 3180 3449 |
| 2042 3118 3625 |
| 2877 3064 3882 |
| 7 2139 4316 |
| 4 7 2954 |
| 1398 3947 4272 |
| 3675 4253 4318 |
| 1561 1977 2432 |
| 2531 4192 4209 |
| 1032 1102 4268 |
| 75 1718 3438 |
| 925 1073 4171 |
| 2124 2762 4148 |
| 4 3455 4069 |
| 3 1279 3382 |
| 1277 1746 3969 |
| 2727 3127 4230 |
| 584 1108 3454 |
| 9 2057 3061 |
| 1608 4103 4310 |
| 2673 3164 3713 |
| 1379 4072 4318 |
| 950 3447 4146 |
| 2509 4255 9296 |
| 819 1352 3371 |
| 3562 3865 4041 |
| 940 1217 3607 |
| 114 2544 4310 |
| 4 2178 4213 |
| 2035 4246 4251 |
| 272 1236 2733 |
| 953 2762 4115 |
| 1853 3496 4309 |
| 1119 3740 4318 |
| 2051 4058 4317 |
| 0 3162 4207 |
| 2389 4034 4111 |
| 4 3395 4301 |
| 3716 4089 4198 |
| 6 4272 4311 |
| 1 4 1854 |
| 4238 4299 4305 |
| 7 10 3737 |
| 11 3764 4296 |
| 297 1912 4117 |
| 1087 1796 4056 |
| 2153 3882 4030 |
| 962 4043 4203 |
| 243 3841 4308 |
| 2183 3886 4216 |

-continued

| |
|---|
| 943 1974 2897 |
| 278 3224 3933 |
| 3 4196 4245 |
| 3409 4301 4315 |
| 2 2176 3214 |
| 462 3203 4008 |
| 478 2178 4202 |
| 3593 3825 4216 |
| 115 2796 4225 |
| 3827 4196 4251 |
| 1375 4301 4306 |
| 296 407 2055 |
| 688 3913 4281 |
| 3446 3840 4314 |
| 1073 3444 4146 |
| 1556 2761 3391 |
| 2 3543 4264 |
| 1378 3347 4305 |
| 847 1952 2745 |
| 1 1743 4042 |
| 2087 3048 4254 |
| 1010 4073 4132 |
| 2610 4129 4152 |
| 4106 4120 4313 |
| 7 4282 4304 |
| 3885 4227 4319 |
| 1235 4105 4195 |
| 1700 2332 4224 |
| 9 3750 4282 |
| 1539 4013 4310 |
| 3734 3834 4011 |
| 1397 2758 3645 |
| 7 1000 2984 |
| 11 3433 4068 |
| 1139 1800 3352 |
| 8 546 2561 |
| 1 4209 4239 |
| 2366 4063 4282 |
| 279 2524 2533 |
| 657 1913 4006 |
| 2322 2623 2960 |
| 758 803 2304 |
| 9 13 4241 |
| 3887 4299 4318 |
| 2612 3830 4230 |
| 1300 1596 2155 |
| 3622 3671 4230 |
| 2491 3722 3977 |
| 735 3812 4201 |
| 3204 3796 4317 |
| 2727 4292 4305 |
| 1062 2676 4255 |
| 2777 3131 4286 |
| 2518 3352 3937 |
| 4225 4255 4317 |
| 3644 3822 9311 |
| 1853 3754 9094 |
| 599 2608 3276. |

A parity check matrix initial value table with a code rate of 29/30 includes

| |
|---|
| 212 499 911 940 1392 |
| 316 563 1527 2006 2077 |
| 2 1906 2043 2112 2123 |
| 537 901 1582 1812 1955 |
| 5 978 1280 1933 2145 |
| 5 2035 2044 2108 2121 |
| 5 939 1874 1974 |
| 4 1069 1758 |
| 694 2096 2106 |
| 1129 1511 1659 |
| 1564 2089 2159 |
| 2 1605 2004 |
| 474 1341 2003 |
| 103 2128 2150 |
| 1656 1993 2153 |

-continued

| |
|---|
| 1881 2122 2138 |
| 1088 1968 2141 |
| 1 298 2073 |
| 1042 1724 2137 |
| 1253 1758 2145 |
| 1209 1566 2123 |
| 1466 2116 2155 |
| 43 2006 2049 |
| 592 1806 1865 |
| 3 143 2149 |
| 1158 1448 2002 |
| 1422 2152 2157 |
| 485 2119 2150 |
| 371 1831 2086 |
| 204 2042 2151 |
| 174 544 974 |
| 1469 1795 1995 |
| 13 708 1683 |
| 5 1144 2030 |
| 486 1309 1576 |
| 165 2030 2147 |
| 504 2073 2126 |
| 263 565 1798 |
| 239 861 1861 |
| 862 1610 1716 |
| 1346 1971 2128 |
| 5 804 1399 |
| 2139 2144 2155 |
| 4 2136 2159 |
| 1485 2059 2158 |
| 50 1091 1332 |
| 373 1730 2092 |
| 59 1086 1401 |
| 1166 1781 2065 |
| 213 2080 2154 |
| 492 1905 2110 |
| 1 1517 2126 |
| 722 1427 2146 |
| 885 991 1842 |
| 3 278 1806 |
| 967 1354 1907 |
| 1697 2047 2156 |
| 684 1924 2151 |
| 2077 2122 2157 |
| 978 2054 2135 |
| 435 2034 2150 |
| 136 1997 2125 |
| 1504 1850 2153 |
| 1404 1989 2119 |
| 109 1001 2152 |
| 780 1473 2150 |
| 198 1723 2062 |
| 927 2087 2138 |
| 1 666 2018 |
| 1293 1960 2141 |
| 1648 2033 2144 |
| 681 1578 1999 |
| 1342 2022 2157 |
| 949 1907 1994 |
| 138 1261 2135 |
| 3 608 982 |
| 1211 1501 2150 |
| 201 228 1186 |
| 1295 2089 2132 |
| 267 556 2142 |
| 801 2052 2122 |
| 1382 2135 2155 |
| 572 1503 1704 |
| 346 1183 2129 |
| 1926 2090 2149 |
| 1337 2133 2140 |
| 5 1806 2125 |
| 1383 1628 2068 |
| 1193 1626 2138 |
| 1999 2115 2146 |
| 217 274 2021 |
| 3 816 2024 |
| 1380 2138 2157 |
| 607 1385 2110 |

-continued

| |
|---|
| 184 1195 2063 |
| 0 1767 2108 |
| 0 2081 2097 |
| 1135 2036 2128 |
| 1748 2001 2125 |
| 797 1552 1926 |
| 1046 1890 2128 |
| 291 1859 2131 |
| 1075 1214 1762 |
| 60 549 1943 |
| 581 1197 1232 |
| 1009 2026 2136 |
| 884 2002 2117 |
| 1 576 1449 |
| 519 1968 2114 |
| 5 1489 1630 |
| 1926 2037 2158 |
| 2 1249 2159 |
| 0 811 2114 |
| 2055 2152 2159 |
| 802 1911 2120 |
| 204 1033 2033 |
| 1840 2012 2037 |
| 1746 2111 2155 |
| 1098 1835 2157 |
| 2 1492 1831 |
| 353 1537 1830 |
| 375 1264 2036 |
| 2 1638 2035 |
| 1096 1971 2021 |
| 950 1809 1884 |
| 253 467 1600 |
| 5 379 1833 |
| 4 1698 1970 |
| 37 1637 2136 |
| 1174 1460 2157 |
| 612 1827 2134 |
| 1783 1802 1949 |
| 2029 2118 2151 |
| 1984 2030 2141 |
| 2 347 462 |
| 862 1693 2121 |
| 2 895 1401 |
| 4 1901 2100 |
| 1183 1674 2069 |
| 1575 1940 2158 |
| 5 1904 2097 |
| 1044 2029 2092 |
| 1441 1943 2150 |
| 0 3 1300 |
| 2 516 1735 |
| 503 1342 2019 |
| 1421 1914 2131 |
| 28 986 1467 |
| 1270 1851 1988 |
| 481 1265 2016 |
| 530 546 909 |
| 653 1909 2158 |
| 1805 2002 2149 |
| 2 1359 1518 |
| 1640 2104 2129 |
| 1656 2109 2155 |
| 1307 1762 2114 |
| 565 1647 2118 |
| 1690 2081 2156 |
| 1 300 1995 |
| 5 1681 2151 |
| 1602 2050 2156 |
| 1 1960 2153 |
| 2061 2070 2138 |
| 1581 1673 2142 |
| 1048 1142 2101 |
| 1867 1991 2055 |
| 856 1640 1878 |
| 251 561 966 |
| 343 1816 2114 |
| 3 966 2045 |

-continued

| |
|---|
| 1885 1922 2158 |
| 57 556 2059 |
| 732 1724 2147. |

Note that each data processing apparatus may be an independent apparatus, or may be an internal block in a single apparatus.

Advantageous Effects of Invention

According to the present technology, it is possible to provide LDPC codes having good error-rate performance.

BRIEF DESCRIPTION OF DRAWINGS

FIG. 3 is a diagram illustrating an example of a parity check matrix of an LDPC code.

FIG. 13 is a diagram depicting a parity check matrix of an LDPC code defined in the DVB-S.2 standard.

FIG. 25 includes diagrams illustrating a parity matrix $H_T$ having a stepwise structure, and a Tanner graph corresponding to the parity matrix $H_T$.

FIG. 29 is a diagram illustrating the numbers of columns of a memory 31 which are necessary for column twist interleaving, and the addresses of write start positions.

FIG. 30 is a diagram illustrating the numbers of columns of the memory 31 which are necessary for column twist interleaving, and the addresses of write start positions.

FIG. 32 includes diagrams illustrating a model of a communication path used in simulations.

FIG. 40 is a diagram illustrating an example of a parity check matrix initial value table with the code rate 2/30 and the code length 64800.

FIG. 41 is a diagram illustrating an example of a parity check matrix initial value table with the code rate 3/30 and the code length 64800.

FIG. 42 is a diagram illustrating an example of a parity check matrix initial value table with the code rate 4/30 and the code length 64800.

FIG. 43 is a diagram illustrating an example of a parity check matrix initial value table with the code rate 5/30 and the code length 64800.

FIG. 44 is a diagram illustrating an example of a parity check matrix initial value table with the code rate 6/30 and the code length 64800.

FIG. 45 is a diagram illustrating an example of a parity check matrix initial value table with the code rate 7/30 and the code length 64800.

FIG. 46 is a diagram illustrating an example of a parity check matrix initial value table with the code rate 8/30 and the code length 64800.

FIG. 47 is a diagram illustrating the example of the parity check matrix initial value table with the code rate 8/30 and the code length 64800.

FIG. 48 is a diagram illustrating an example of a parity check matrix initial value table with the code rate 9/30 and the code length 64800.

FIG. 49 is a diagram illustrating the example of the parity check matrix initial value table with the code rate 9/30 and the code length 64800.

FIG. 50 is a diagram illustrating an example of a parity check matrix initial value table with the code rate 10/30 and the code length 64800.

FIG. 51 is a diagram illustrating the example of the parity check matrix initial value table with the code rate 10/30 and the code length 64800.

FIG. 52 is a diagram illustrating an example of a parity check matrix initial value table with the code rate 11/30 and the code length 64800.

FIG. 53 is a diagram illustrating the example of the parity check matrix initial value table with the code rate 11/30 and the code length 64800.

FIG. 54 is a diagram illustrating an example of a parity check matrix initial value table with the code rate 12/30 and the code length 64800.

FIG. 55 is a diagram illustrating the example of the parity check matrix initial value table with the code rate 12/30 and the code length 64800.

FIG. 56 is a diagram illustrating an example of a parity check matrix initial value table with the code rate 13/30 and the code length 64800.

FIG. 57 is a diagram illustrating the example of the parity check matrix initial value table with the code rate 13/30 and the code length 64800.

FIG. 58 is a diagram illustrating an example of a parity check matrix initial value table with the code rate 14/30 and the code length 64800.

FIG. 59 is a diagram illustrating the example of the parity check matrix initial value table with the code rate 14/30 and the code length 64800.

FIG. 60 is a diagram illustrating an example of a parity check matrix initial value table with the code rate 15/30 and the code length 64800.

FIG. 61 is a diagram illustrating the example of the parity check matrix initial value table with the code rate 15/30 and the code length 64800.

FIG. 62 is a diagram illustrating an example of a parity check matrix initial value table with the code rate 16/30 and the code length 64800.

FIG. 63 is a diagram illustrating the example of the parity check matrix initial value table with the code rate 16/30 and the code length 64800.

FIG. 64 is a diagram illustrating the example of the parity check matrix initial value table with the code rate 16/30 and the code length 64800.

FIG. 65 is a diagram illustrating an example of a parity check matrix initial value table with the code rate 17/30 and the code length 64800.

FIG. 66 is a diagram illustrating the example of the parity check matrix initial value table with the code rate 17/30 and the code length 64800.

FIG. 67 is a diagram illustrating the example of the parity check matrix initial value table with the code rate 17/30 and the code length 64800.

FIG. 68 is a diagram illustrating an example of a parity check matrix initial value table with the code rate 18/30 and the code length 64800.

FIG. 69 is a diagram illustrating the example of the parity check matrix initial value table with the code rate 18/30 and the code length 64800.

FIG. 70 is a diagram illustrating the example of the parity check matrix initial value table with the code rate 18/30 and the code length 64800.

FIG. 71 is a diagram illustrating an example of a parity check matrix initial value table with the code rate 19/30 and the code length 64800.

FIG. 72 is a diagram illustrating the example of the parity check matrix initial value table with the code rate 19/30 and the code length 64800.

FIG. 73 is a diagram illustrating the example of the parity check matrix initial value table with the code rate 19/30 and the code length 64800.

FIG. 74 is a diagram illustrating an example of a parity check matrix initial value table with the code rate 20/30 and the code length 64800.

FIG. 75 is a diagram illustrating the example of the parity check matrix initial value table with the code rate 20/30 and the code length 64800.

FIG. 76 is a diagram illustrating the example of the parity check matrix initial value table with the code rate 20/30 and the code length 64800.

FIG. 77 is a diagram illustrating an example of a parity check matrix initial value table with the code rate 21/30 and the code length 64800.

FIG. 78 is a diagram illustrating the example of the parity check matrix initial value table with the code rate 21/30 and the code length 64800.

FIG. 79 is a diagram illustrating the example of the parity check matrix initial value table with the code rate 21/30 and the code length 64800.

FIG. 80 is a diagram illustrating an example of a parity check matrix initial value table with the code rate 22/30 and the code length 64800.

FIG. 81 is a diagram illustrating the example of the parity check matrix initial value table with the code rate 22/30 and the code length 64800.

FIG. 82 is a diagram illustrating the example of the parity check matrix initial value table with the code rate 22/30 and the code length 64800.

FIG. 83 is a diagram illustrating an example of a parity check matrix initial value table with the code rate 23/30 and the code length 64800.

FIG. 84 is a diagram illustrating the example of the parity check matrix initial value table with the code rate 23/30 and the code length 64800.

FIG. 85 is a diagram illustrating the example of the parity check matrix initial value table with the code rate 23/30 and the code length 64800.

FIG. 86 is a diagram illustrating an example of a parity check matrix initial value table with the code rate 24/30 and the code length 64800.

FIG. 87 is a diagram illustrating the example of the parity check matrix initial value table with the code rate 24/30 and the code length 64800.

FIG. 88 is a diagram illustrating the example of the parity check matrix initial value table with the code rate 24/30 and the code length 64800.

FIG. 89 is a diagram illustrating an example of a parity check matrix initial value table with the code rate 25/30 and the code length 64800.

FIG. 90 is a diagram illustrating the example of the parity check matrix initial value table with the code rate 25/30 and the code length 64800.

FIG. 91 is a diagram illustrating the example of the parity check matrix initial value table with the code rate 25/30 and the code length 64800.

FIG. 92 is a diagram illustrating an example of a parity check matrix initial value table with the code rate 26/30 and the code length 64800.

FIG. 93 is a diagram illustrating the example of the parity check matrix initial value table with the code rate 26/30 and the code length 64800.

FIG. 94 is a diagram illustrating the example of the parity check matrix initial value table with the code rate 26/30 and the code length 64800.

FIG. 95 is a diagram illustrating an example of a parity check matrix initial value table with the code rate 27/30 and the code length 64800.

FIG. 96 is a diagram illustrating the example of the parity check matrix initial value table with the code rate 27/30 and the code length 64800.

FIG. 97 is a diagram illustrating the example of the parity check matrix initial value table with the code rate 27/30 and the code length 64800.

FIG. 98 is a diagram illustrating the example of the parity check matrix initial value table with the code rate 27/30 and the code length 64800.

FIG. 99 is a diagram illustrating an example of a parity check matrix initial value table with the code rate 28/30 and the code length 64800.

FIG. 100 is a diagram illustrating the example of the parity check matrix initial value table with the code rate 28/30 and the code length 64800.

FIG. 101 is a diagram illustrating the example of the parity check matrix initial value table with the code rate 28/30 and the code length 64800.

FIG. 102 is a diagram illustrating the example of the parity check matrix initial value table with the code rate 28/30 and the code length 64800.

FIG. 103 is a diagram illustrating an example of a parity check matrix initial value table with the code rate 29/30 and the code length 64800.

FIG. 104 is a diagram illustrating the example of the parity check matrix initial value table with the code rate 29/30 and the code length 64800.

FIG. 105 is a diagram illustrating the example of the parity check matrix initial value table with the code rate 29/30 and the code length 64800.

FIG. 106 is a diagram illustrating the example of the parity check matrix initial value table with the code rate 29/30 and the code length 64800.

FIG. 109 is a diagram illustrating minimum cycle lengths and performance thresholds for parity check matrices of LDPC codes with the code length 64800.

FIG. 111 is a diagram depicting parity check matrices of LDPC codes with the code length 64800.

FIG. 115 includes diagrams illustrating BCH codes used in simulations of BERs/FERs of LDPC codes with the code length 64800.

FIG. 120 is a diagram illustrating a matrix (transformed parity check matrix) obtained by performing row permutation and column permutation on a parity check matrix.

FIG. 121 is a diagram illustrating a transformed parity check matrix that is divided into 5×5 units.

FIG. 122 is a block diagram illustrating an example configuration of a decoding device that collectively performs node computation for P nodes.

FIG. 123 is a block diagram illustrating an example configuration of the LDPC decoder 166.

Figure 124:
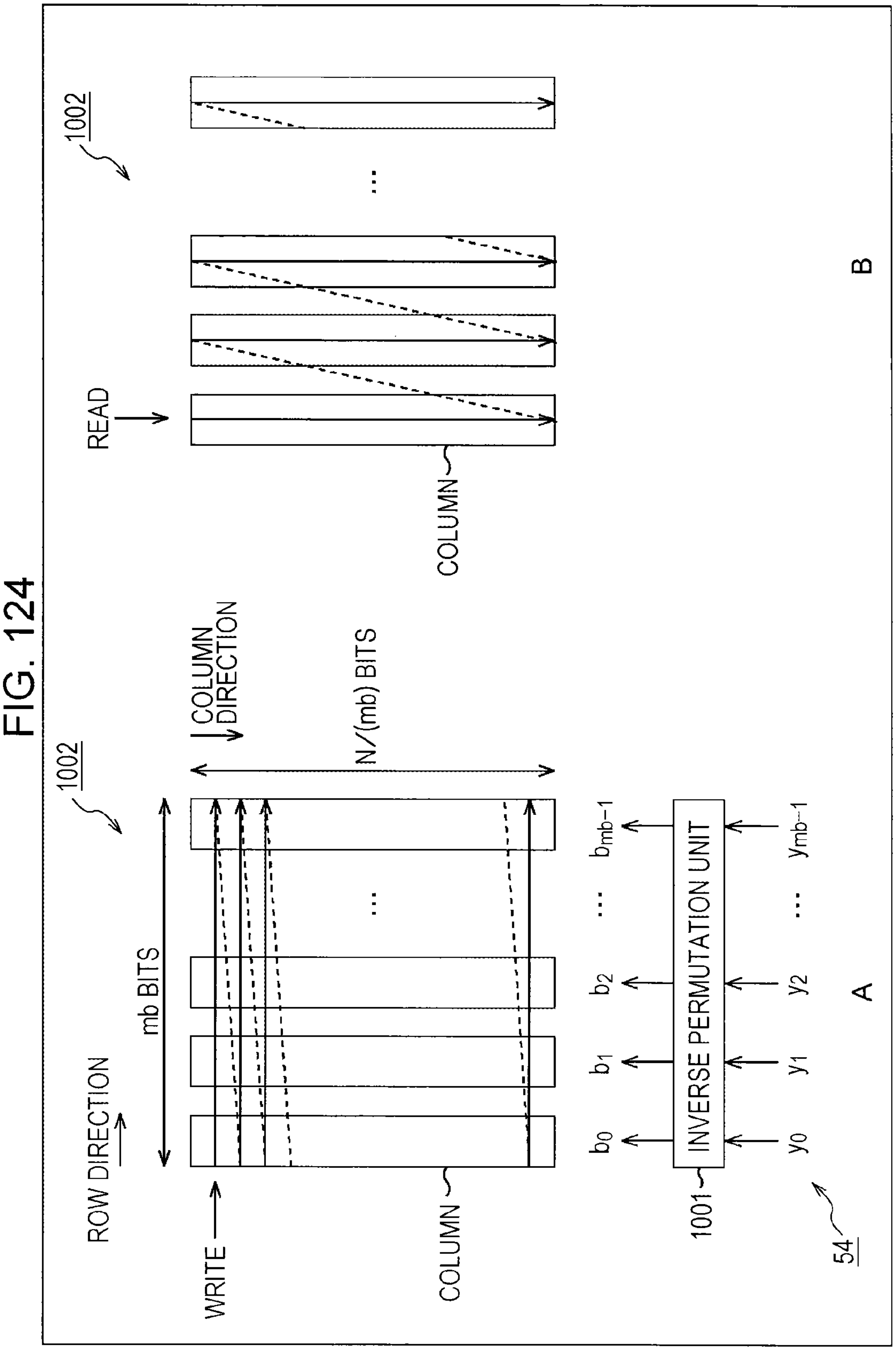

FIG. 124 includes diagrams depicting a process of a multiplexer 54 included in the bit deinterleaver 165.

Figure 125:
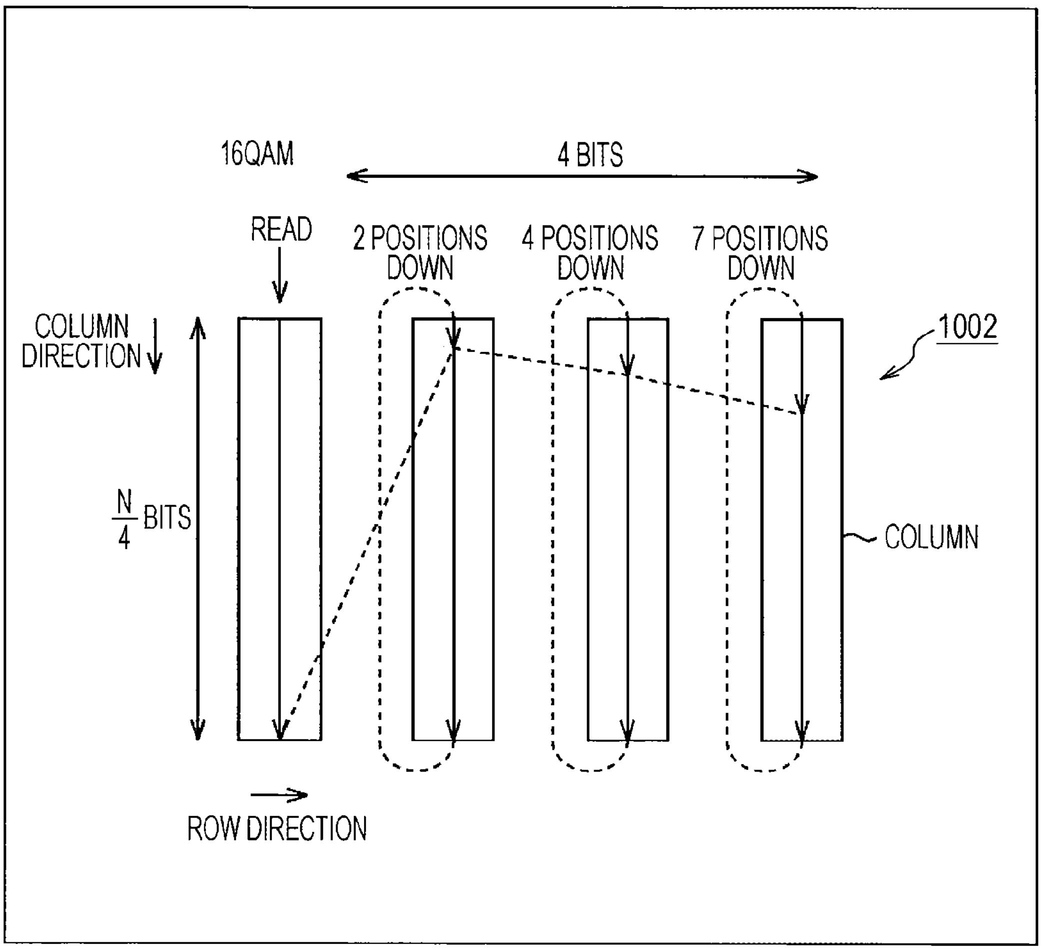

FIG. 125 is a diagram depicting the processing of a column twist deinterleaver 55.

Figure 126:
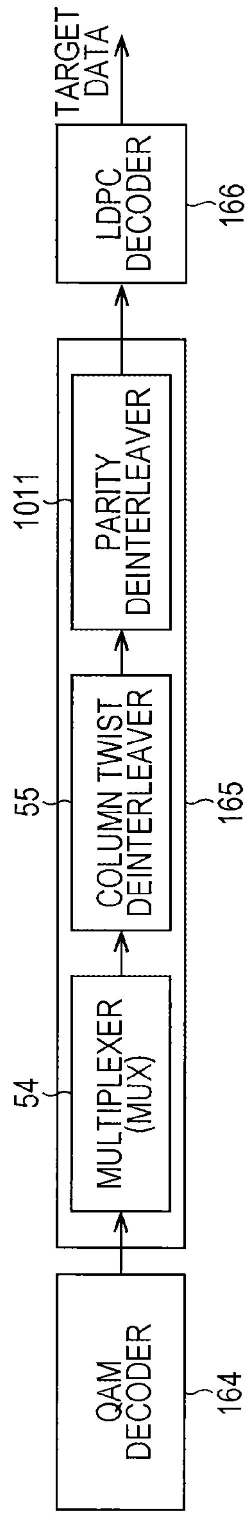

FIG. 126 is a block diagram illustrating another example configuration of the bit deinterleaver 165.

Figure 127:
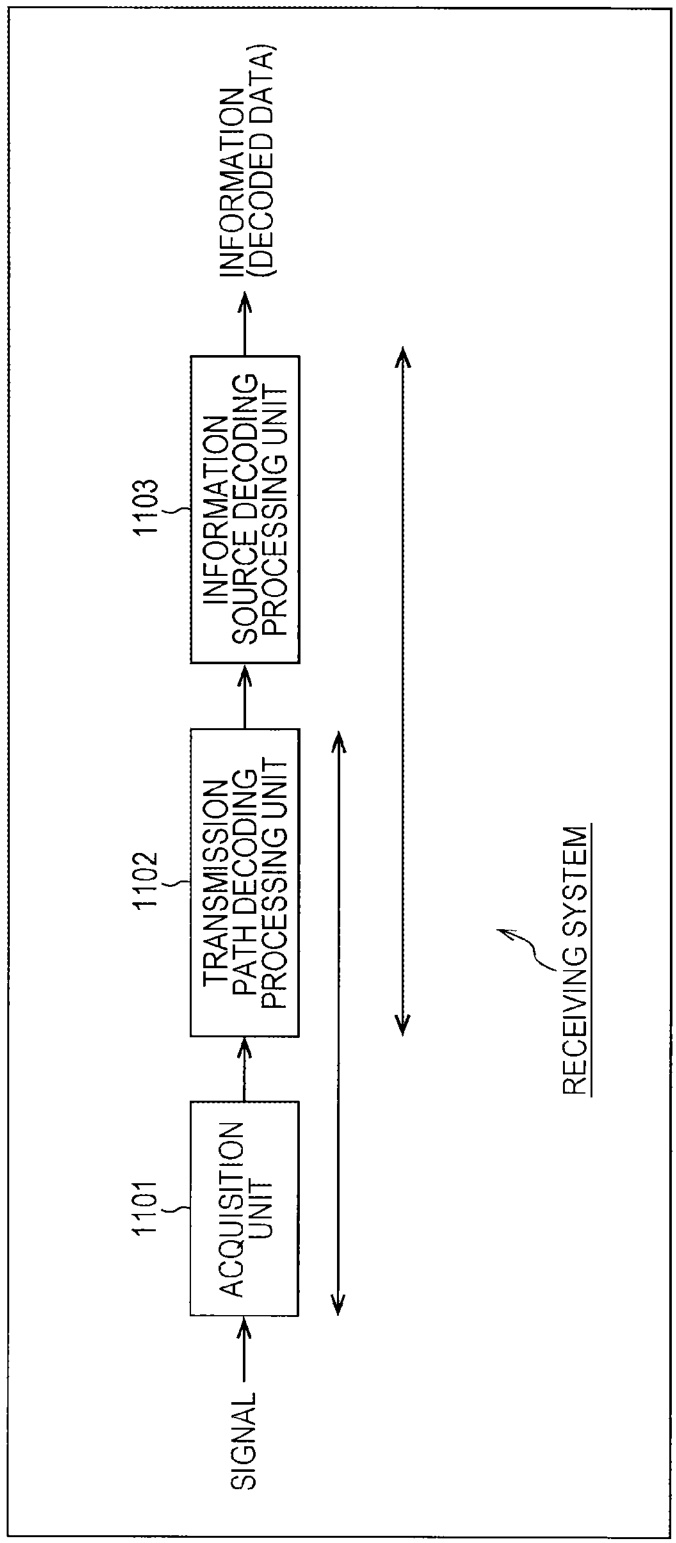

FIG. 127 is a block diagram illustrating a first example configuration of a receiving system in which the receiving device 12 can be used.

Figure 128:
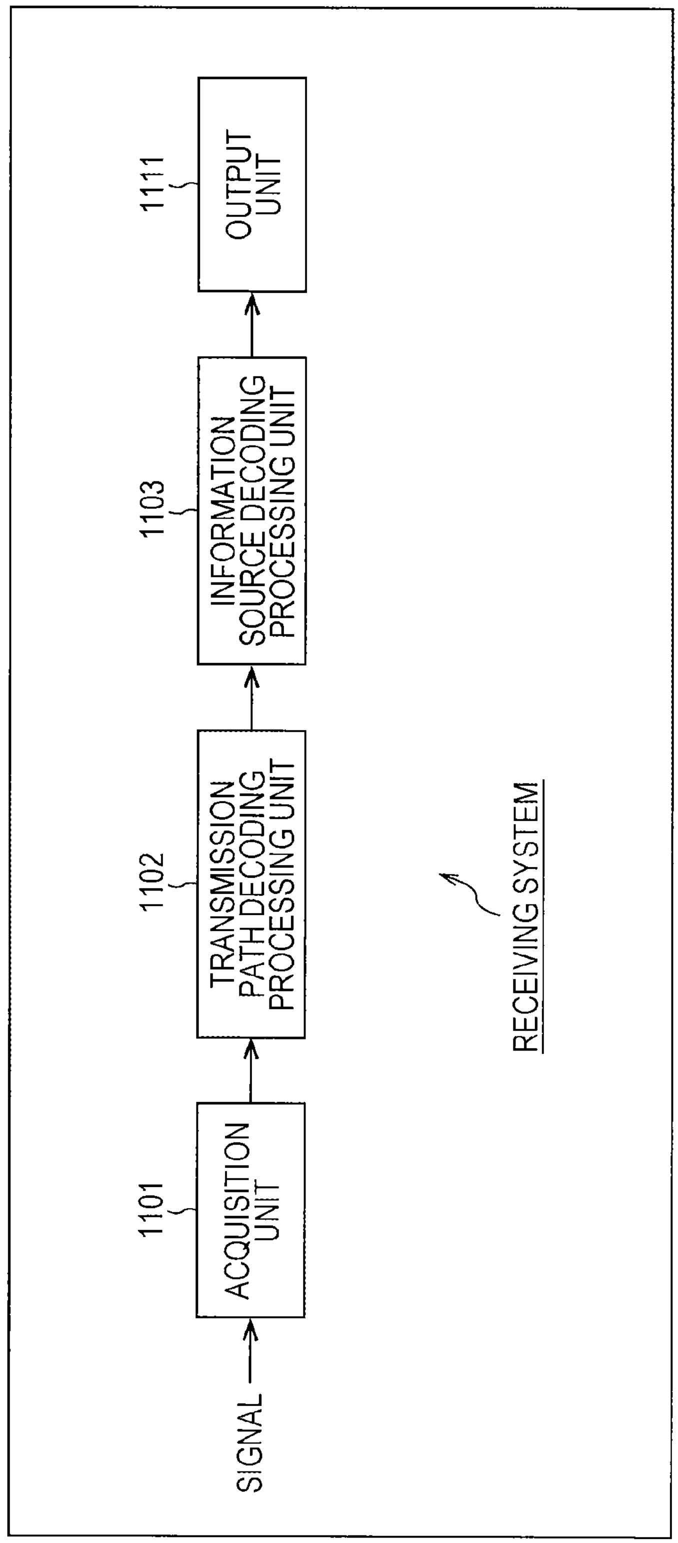

FIG. 128 is a block diagram illustrating a second example configuration of the receiving system in which the receiving device 12 can be used.

Figure 129:
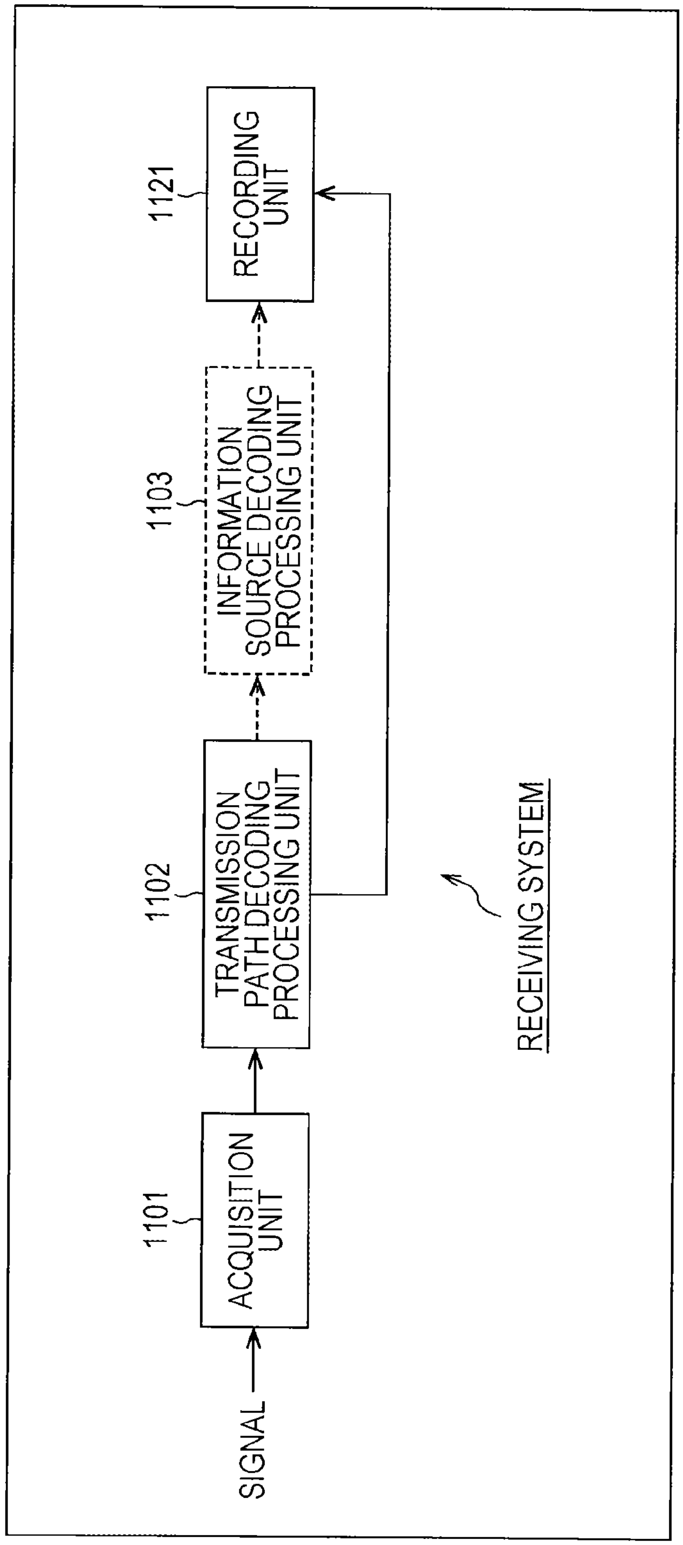

FIG. 129 is a block diagram illustrating a third example configuration of the receiving system in which the receiving device 12 can be used.

Figure 130:
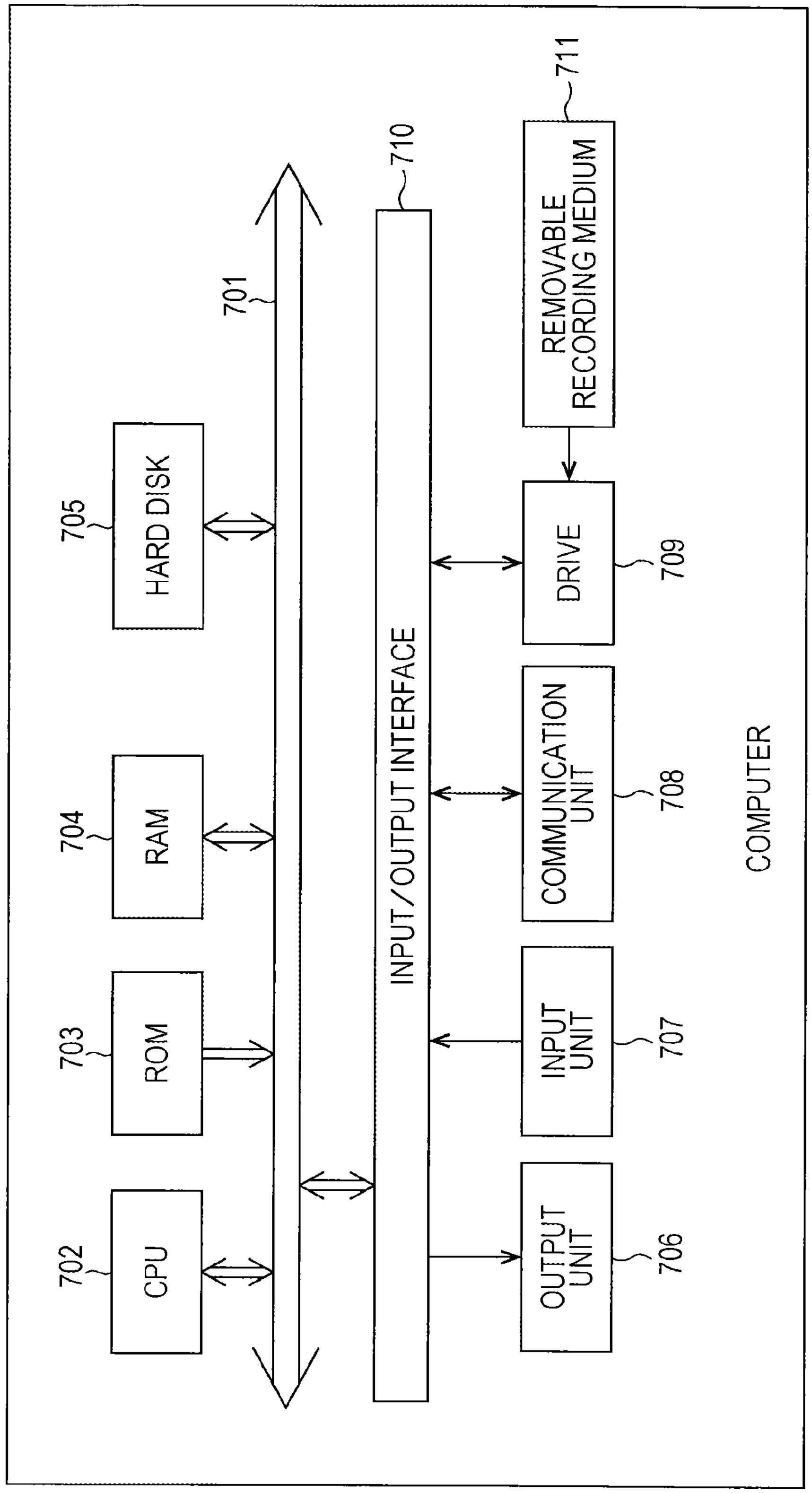

FIG. 130 is a block diagram illustrating an example configuration of an embodiment of a computer to which the present technology applies.

DESCRIPTION OF EMBODIMENTS

[Example Configuration of Transmission System to which Present Technology Applies]

Figure 7:
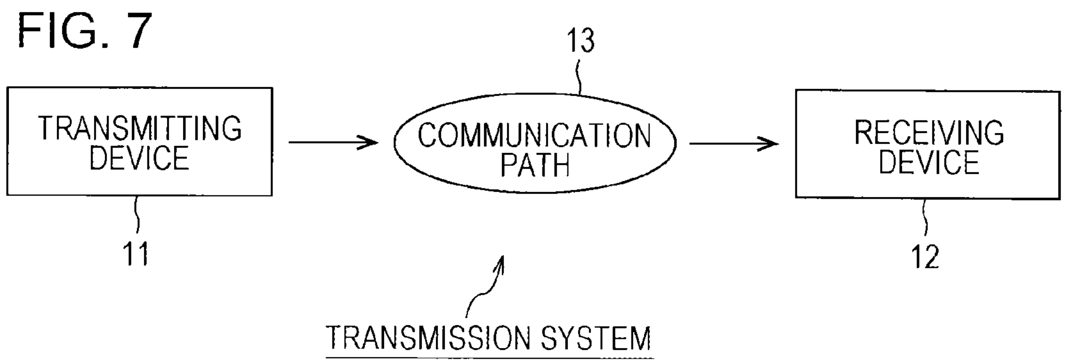
FIG. 7 is a diagram illustrating an example configuration of an embodiment of a transmission system to which the present technology applies.

FIG. 7 illustrates an example configuration of an embodiment of a transmission system (the term "system" refers to a logical set of devices or apparatuses, and the devices or apparatuses may or may not be accommodated in the same housing) to which the present technology applies.

Referring to FIG. 7, the transmission system includes a transmitting device 11 and a receiving device 12.

The transmitting device 11 is configured to transmit (or broadcast) data such as a television broadcast program. More specifically, the transmitting device 11 encodes the target data to be transmitted, such as image data and audio data of a program, into an LDPC code, and transmits the LDPC code via a communication path 13 such as a satellite link, a terrestrial link, or a cable (wired line).

The receiving device 12 receives an LDPC code transmitted from the transmitting device 11 via the communication path 13, decodes the LDPC code into target data, and outputs the target data.

Here, it is well established that an LDPC code used in the transmission system illustrated in FIG. 7 exhibits very high performance on an AWGN (Additive White Gaussian Noise) communication path.

However, burst errors or erasures may occur in the communication path 13. For example, notably in a case where the communication path 13 is a terrestrial link, in an OFDM (Orthogonal Frequency Division Multiplexing) system, a specific symbol may drop to zero in power (or be erased) in accordance with the delay of an echo (which is a path other than the main path) in a multi-path environment where a D/U (Desired to Undesired Ratio) is 0 dB (i.e., the power of the echo as the undesired power is equal to the power of the main path as the desired power).

Further, if the D/U is 0 dB, all OFDM symbols at a specific point in time may also drop to zero in power (or erased) due to a Doppler (dopper) frequency in a flutter (which is a communication path to which an echo with a Doppler frequency applied and having a delay of 0 is added).

In addition, burst errors may occur due to unstable power of the receiving device 12 or undesired wiring conditions from a receiver (not illustrated) that receives a signal from the transmitting device 11, such as an antenna, on the receiving device 12 side to the receiving device 12.

Figure 1:
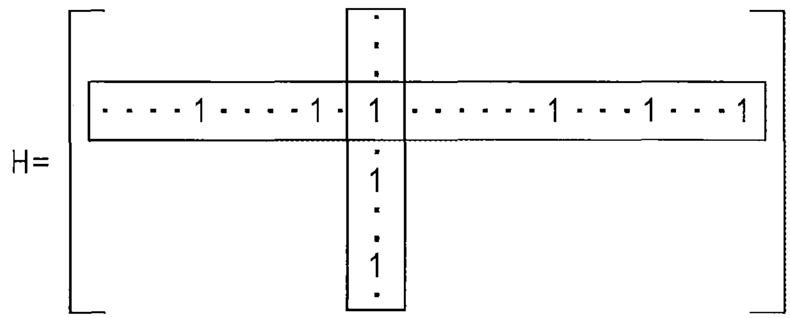
FIG. 1 is a diagram depicting a parity check matrix H of an LDPC code.
Figure 2:
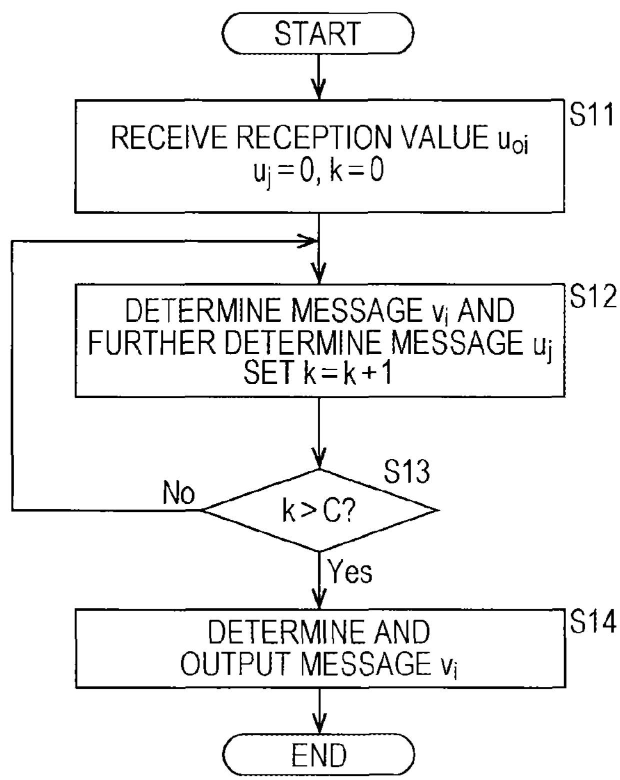
FIG. 2 is a flowchart depicting an LDPC code decoding procedure.
Figure 4:
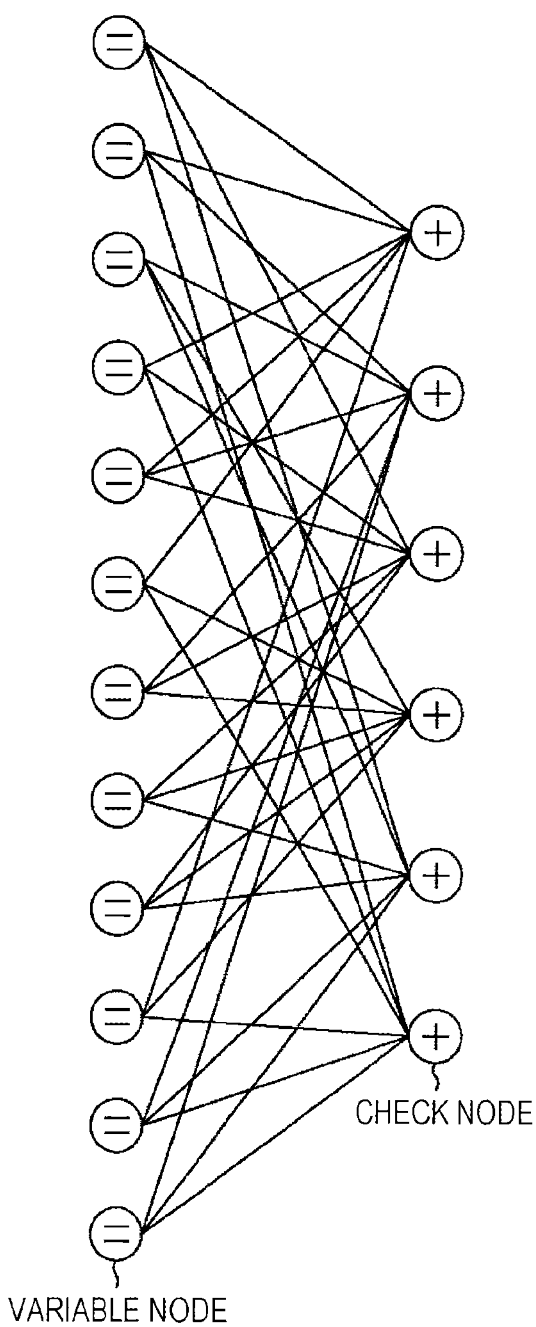
FIG. 4 is a diagram illustrating a Tanner graph of a parity check matrix.
Figure 5:
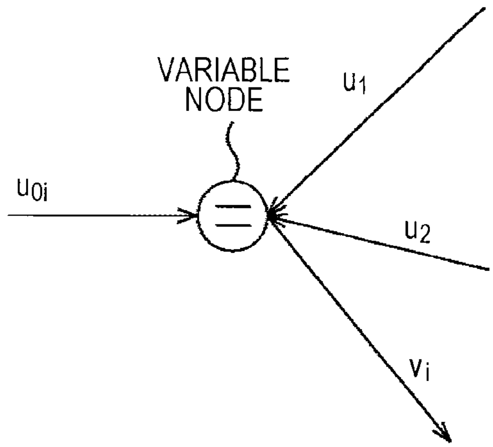
FIG. 5 is a diagram illustrating a variable node.
Figure 6:
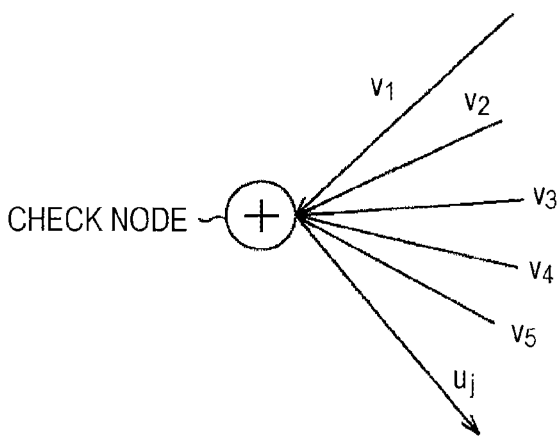
FIG. 6 is a diagram illustrating a check node.

In the LDPC code decoding process, on the other hand, as described above with reference to FIG. 5, the variable node computation of Expression (1), which involves addition of (the reception values $u_{0i}$ of) the code bits of the LDPC code, is performed at the respective columns of the parity check matrix H, that is, the variable nodes corresponding to the code bits of the LDPC code. Thus, an error occurring in a code bit used for variable node computation would reduce the accuracy of a determined message.

In the LDPC code decoding process, furthermore, the check node computation of Expression (7) is performed at a check node, by using messages determined at the variable nodes connected to the check node. Thus, an increase in the number of check nodes for which errors (including erasures) simultaneously occur in (code bits of an LDPC code corresponding to) a plurality of connected variable nodes would reduce decoding performance.

More specifically, for example, if two or more of variable nodes connected to a check node simultaneously become erasures, the check node returns a message with the probability of the value 0 being equal to the probability of the value 1 to all the variable nodes. In this case, the check node that returns the message with equal probabilities does not contribute to single decoding processing (one set of variable node computation and check node computation), resulting in a larger number of repetitions of decoding processing. Thus, decoding performance may deteriorate, and, additionally, the power consumption of the receiving device 12 that decodes the LDPC code may increase.

To address the inconveniences described above, the transmission system illustrated in FIG. 7 is capable of increasing the resistance to burst errors or erasures while maintaining performance in an AWGN communication path.

[Example Configuration of Transmitting Device 11]

Figure 8:
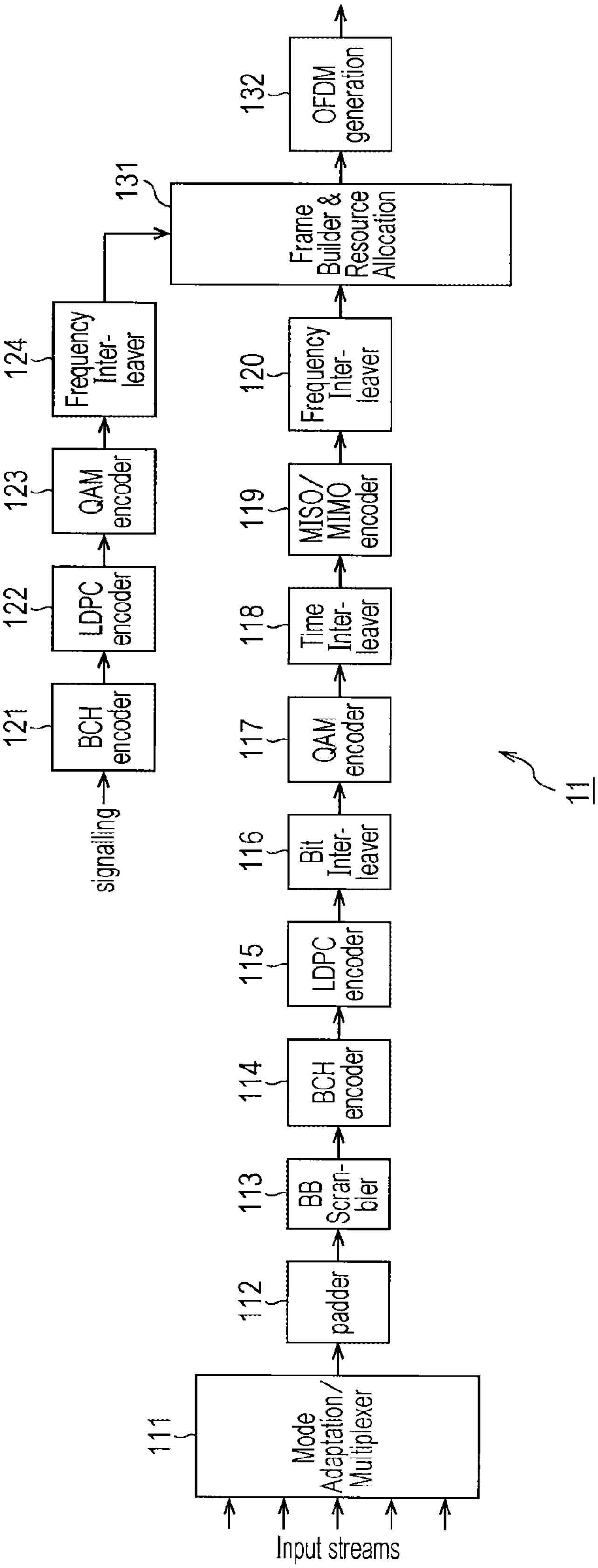
FIG. 8 is a block diagram illustrating an example configuration of a transmitting device 11.

FIG. 8 is a block diagram illustrating an example configuration of the transmitting device 11 illustrated in FIG. 7.

In the transmitting device 11, one or more input streams as target data are supplied to a mode adaptation/multiplexer 111.

The mode adaptation/multiplexer 111 performs processing such as mode selection and multiplexing the supplied one or more input streams, if necessary, and supplies the resulting data to a padder 112.

The padder 112 pads zeros (or adds null) to the data supplied from the mode adaptation/multiplexer 111, as necessary, and supplies the resulting data to a BB scrambler 113.

The BB scrambler 113 applies BB scrambling (Base-Band Scrambling) to the data supplied from the padder 112, and supplies the resulting data to a BCH encoder 114.

The BCH encoder 114 performs BCH encoding on the data supplied from the BB scrambler 113, and supplies the resulting data to an LDPC encoder 115 as LDPC target data to be subjected to LDPC encoding.

The LDPC encoder 115 performs LDPC encoding on the LDPC target data supplied from the BCH encoder 114 in accordance with a parity check matrix of an LDPC code, in which a parity matrix that is a portion of parity bits of the LDPC code has a stepwise structure, to obtain an LDPC code having information bits corresponding to the LDPC target data. The LDPC encoder 115 outputs the LDPC code.

More specifically, the LDPC encoder 115 performs LDPC encoding to encode the LDPC target data into, for example, an LDPC code defined in a certain standard such as DVB-S.2, DVB-T.2, or DVB-C.2 (corresponding to a parity check matrix) or a predetermined LDPC code (corresponding to a parity check matrix), and outputs the resulting LDPC code.

Here, an LDPC code defined in the DVB-S.2, DVB-T.2, or DVB-C.2 standard is an IRA (Irregular Repeat Accumulate) code, and a parity matrix in a parity check matrix of the LDPC code has a stepwise structure. The parity matrix and the stepwise structure will be described below. An example of the IRA code is described in, for example, "Irregular Repeat-Accumulate Codes," H. Jin, A. Khandekar, and R. J. McEliece, in Proceedings of 2nd International Symposium on Turbo Codes and Related Topics, pp. 1-8, September 2000.

The LDPC code output from the LDPC encoder 115 is supplied to a bit interleaver 116.

The bit interleaver 116 performs bit interleaving, described below, on the LDPC code supplied from the LDPC encoder 115, and supplies the LDPC code that has been subjected to bit interleaving to a QAM encoder 117.

The QAM encoder 117 maps the LDPC code supplied from the bit interleaver 116 to constellation points each representing one symbol of orthogonal modulation in units of one or more code bits of the LDPC code (or in units of symbols), and performs orthogonal modulation (multi-level modulation).

More specifically, the QAM encoder 117 maps the LDPC code supplied from the bit interleaver 116 to constellation points defined by the modulation scheme on which orthogonal modulation of the LDPC code is based, in an IQ plane (IQ constellation) defined by an I axis representing an I component that is in the same phase as that of the carrier and a Q axis representing a Q component orthogonal to the carrier, and performs orthogonal modulation.

Here, examples of the modulation scheme on which the orthogonal modulation performed by the QAM encoder 117 is based include modulation schemes defined in the DVB-S.2, DVB-T.2, DVB-C.2, and similar standards, and other modulation schemes, examples of which include BPSK (Binary Phase Shift Keying), QPSK (Quadrature Phase Shift Keying), 16APSK (Amplitude Phase-Shift Keying), 32APSK, 16QAM (Quadrature Amplitude Modulation), 64QAM, 256QAM, 1024QAM, 4096QAM, and 4PAM (Pulse Amplitude Modulation). Which of the modulation schemes the QAM encoder 117 uses to perform orthogonal modulation is set in advance through, for example, operation or the like by an operator of the transmitting device 11.

The data obtained by the processing of the QAM encoder 117 (i.e., the symbols mapped to the constellation points) is supplied to a time interleaver 118.

The time interleaver 118 performs time interleaving (which is interleaving in the time domain) on the data (i.e., symbols) supplied from the QAM encoder 117 in units of symbols, and supplies the resulting data to a MISO/MIMO encoder 119.

The MISO/MIMO encoder 119 performs space-time encoding on the data (i.e., symbols) supplied from the time interleaver 118, and supplies the resulting data to a frequency interleaver 120.

The frequency interleaver 120 performs frequency interleaving (which is interleaving in the frequency domain) on the data (i.e., symbols) supplied from the MISO/MIMO encoder 119 in units of symbols, and supplies the resulting data to a frame builder & resource allocation unit 131.

On the other hand, control data (signalling) for transmission control, such as BB signalling (Base Band Signalling) (BB Header), is supplied to a BCH encoder 121.

The BCH encoder 121 performs BCH encoding on the control data supplied thereto in a manner similar to that for the BCH encoder 114, and supplies the resulting data to an LDPC encoder 122.

The LDPC encoder 122 performs LDPC encoding on the data supplied from the BCH encoder 121, as LDPC target data, in a manner similar to that for the LDPC encoder 115, and supplies the resulting LDPC code to a QAM encoder 123.

The QAM encoder 123 maps the LDPC code supplied from the LDPC encoder 122 to constellation points each representing one symbol of orthogonal modulation, in units of one or more code bits of the LDPC code (i.e., in units of symbols) in a manner similar to that for the QAM encoder 117, and performs orthogonal modulation. The QAM encoder 123 supplies the resulting data (i.e., symbols) to a frequency interleaver 124.

The frequency interleaver 124 performs frequency interleaving on the data (i.e., symbols) supplied from the QAM encoder 123 in units of symbols in a manner similar to that for the frequency interleaver 120, and supplies the resulting data to the frame builder & resource allocation unit 131.

The frame builder & resource allocation unit 131 adds pilot symbols at desired positions of the data (i.e., symbols) supplied from the frequency interleavers 120 and 124, and configures a frame including a certain number of symbols (for example, a PL (Physical Layer) frame, a T2 frame, a C2 frame, etc.) from the resulting data (i.e., symbols). The frame builder & resource allocation unit 131 supplies the frame to an OFDM generation unit 132.

The OFDM generation unit 132 generates an OFDM signal from the frame supplied from the frame builder & resource allocation unit 131, corresponding to the frame, and transmits the OFDM signal via the communication path 13 (FIG. 7).

Note that the transmitting device 11 may be configured without including some of the blocks illustrated in FIG. 8, such as the time interleaver 118, the MISO/MIMO encoder 119, the frequency interleaver 120, and the frequency interleaver 124.

Figure 9:
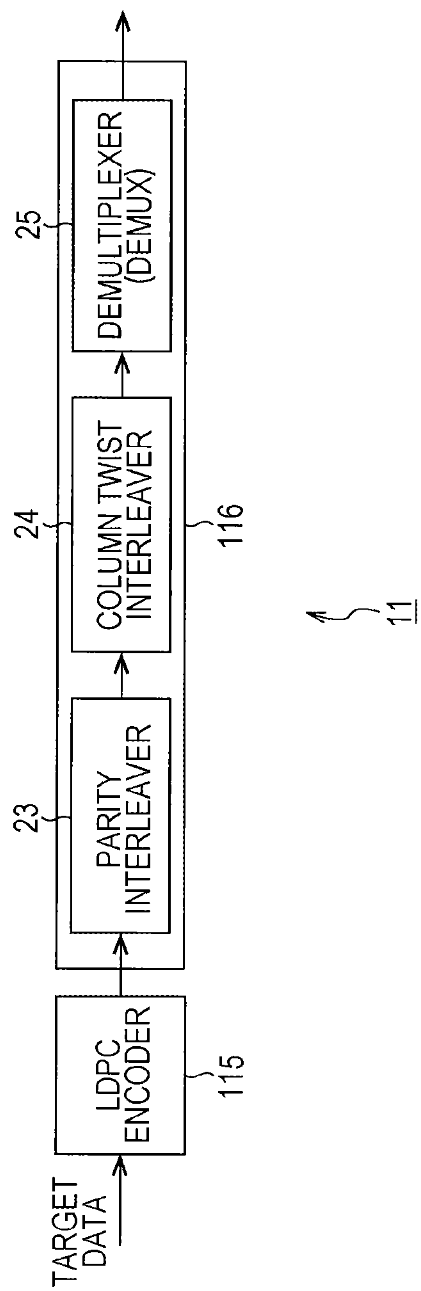
FIG. 9 is a block diagram illustrating an example configuration of a bit interleaver 116.

FIG. 9 illustrates an example configuration of the bit interleaver 116 illustrated in FIG. 8.

The bit interleaver 116 is a data processing device for interleaving data, and includes a parity interleaver 23, a column twist interleaver 24, and a demultiplexer (DEMUX) 25. Note that the bit interleaver 116 may be configured without including one or both of the parity interleaver 23 and the column twist interleaver 24.

The parity interleaver 23 performs parity interleaving on the LDPC code supplied from the LDPC encoder 115 to interleave parity bits of the LDPC code to different parity bit positions, and supplies the LDPC code that has been subjected to parity interleaving to the column twist interleaver 24.

The column twist interleaver 24 performs column twist interleaving on the LDPC code supplied from the parity interleaver 23, and supplies the LDPC code that has been subjected to column twist interleaving to the demultiplexer 25.

More specifically, the LDPC code is transmitted after one or more code bits of the LDPC code are mapped to a constellation point representing one symbol of orthogonal modulation using the QAM encoder 117 illustrated in FIG. 8.

The column twist interleaver 24 performs reordering processing, for example, column twist interleaving, described below, to reorder the code bits of the LDPC code supplied from the parity interleaver 23 so that a plurality of code bits of the LDPC code corresponding to 1s in an arbitrary row of the parity check matrix used in the LDPC encoder 115 are not included in one symbol.

The demultiplexer 25 performs permutation processing on the LDPC code supplied from the column twist interleaver 24 to permute the positions of two or more code bits of the LDPC code to be mapped to symbols, thereby obtaining an LDPC code with increased resistance to AWGN. The demultiplexer 25 then supplies the two or more code bits of the LDPC code, which are obtained through the permutation processing, to the QAM encoder 117 (FIG. 8) as a symbol.

Figure 10:
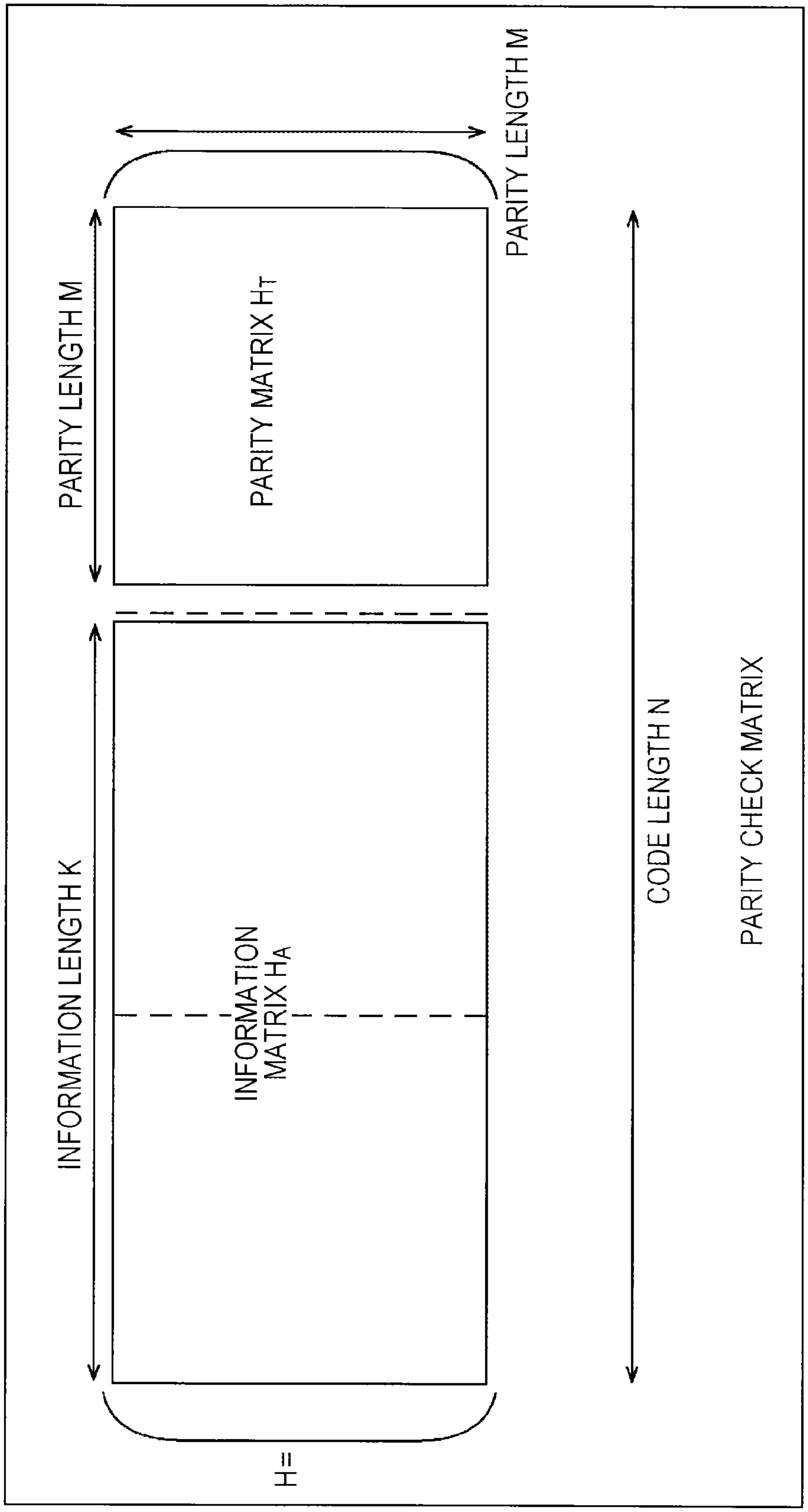
FIG. 10 is a diagram illustrating a parity check matrix.

Next, FIG. 10 illustrates the parity check matrix H that the LDPC encoder 115 illustrated in FIG. 8 uses for LDPC encoding.

The parity check matrix H has an LDGM (Low-Density Generation Matrix) structure, and can be expressed by the equation $H=[H_A|H_T]$ (which is a matrix whose left elements are the elements of an information matrix $H_A$ and right elements are the elements of a parity matrix $H_T$), where the information matrix $H_A$ is a portion corresponding to information bits and the parity matrix $H_T$ is a portion corresponding to parity bits among the code bits of the LDPC code.

Here, the number of information bits and the number of parity bits among the code bits of one LDPC code (i.e., one code word) are represented by an information length K and a parity length M, respectively. In addition, the number of code bits of one LDPC code is represented by a code length N (=K+M).

The information length K and the parity length M of an LDPC code having a certain code length N are determined in accordance with the code rate. In addition, the parity check matrix H is a matrix having M rows and N columns. Thus, the information matrix $H_A$ is an M×K matrix, and the parity matrix $H_T$ is an M×M matrix.

Figure 11:
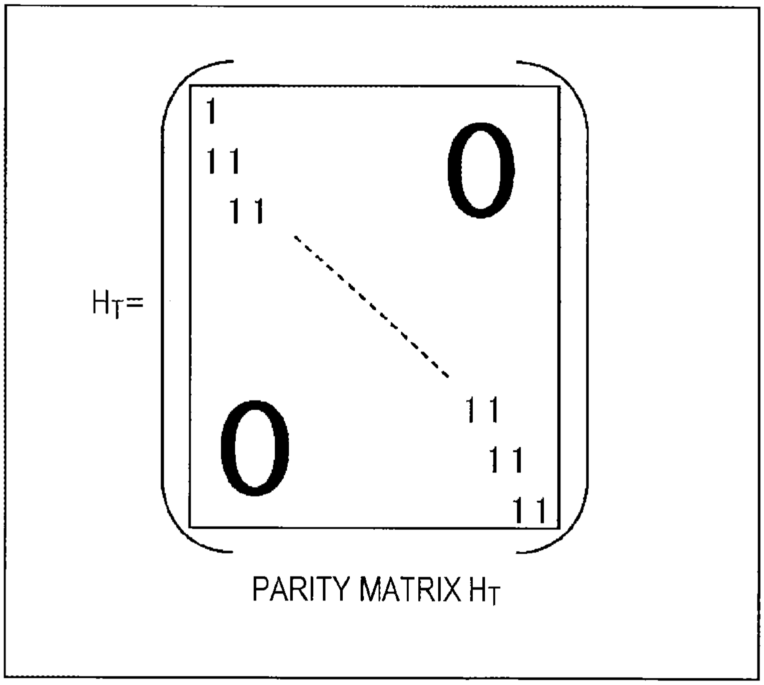
FIG. 11 is a diagram illustrating a parity matrix.

FIG. 11 illustrates a parity matrix $H_T$ of a parity check matrix H of an LDPC code defined in the DVB-S.2, DVB-T.2, and DVB-C.2 standards.

As illustrated in FIG. 11, the parity matrix $H_T$ of the parity check matrix H of the LDPC code defined in DVB-T.2 and similar standards is a matrix having a stepwise structure (i.e., a lower bidiagonal matrix) in which elements of 1 are arranged in a stepwise manner. The parity matrix $H_T$ has a row weight of 1 for the first row and a row weight of 2 for all the remaining rows. The parity matrix $H_T$ further has a column weight of 1 for the last column and a column weight of 2 for all the remaining columns.

In the manner described above, an LDPC code of a parity check matrix H including a parity matrix $H_T$ having a stepwise structure can be easily generated using the parity check matrix H.

More specifically, an LDPC code (i.e., a code word) is represented by a row vector c, and a column vector obtained by transposing the row vector is represented by $c^T$. In the row vector c, which is the LDPC code, furthermore, an information bit portion is represented by a row vector A, and a parity bit portion is represented by a row vector T.

In this case, the row vector c can be expressed by the equation $c=[A|T]$ (which is a row vector whose left elements are the elements of a row vector A and right elements are the elements of a row vector T), where the row vector A corresponds to information bits and the row vector T corresponds to parity bits.

It is necessary for the parity check matrix H and the row vector c=[A|T], which serves as the LDPC code, to satisfy the equation $Hc^T=0$. Thus, the values of the elements of the row vector T corresponding to parity bits in the row vector c=[A|T] satisfying the equation $Hc^T=0$ can be sequentially (or successively) determined by setting the elements in the respective rows of the column vector $Hc^T$ in the equation $Hc^T=0$ to zero in order, starting from the element in the first row, in a case where the parity matrix $H_T$ in the parity check matrix $H=[H_A|H_T]$ has the stepwise structure illustrated in FIG. 11.

Figure 12:
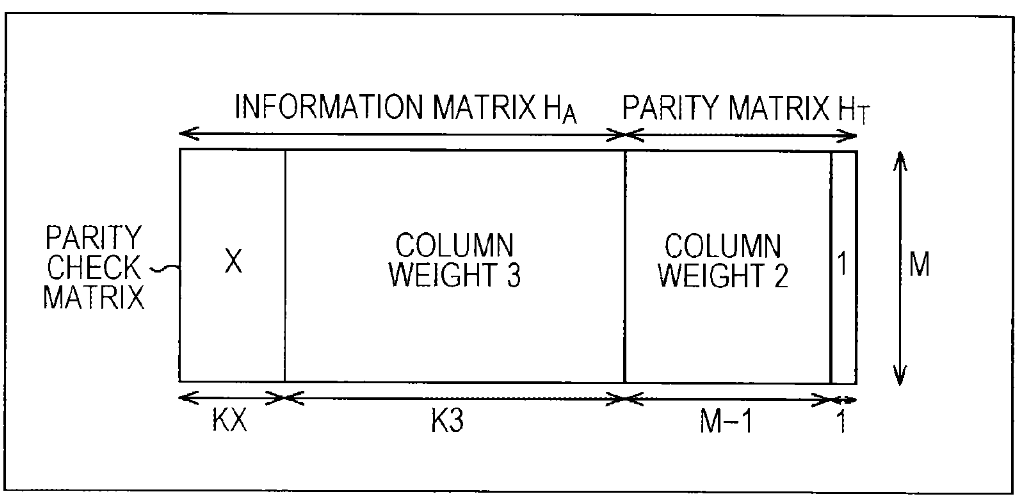
FIG. 12 is a diagram depicting a parity check matrix of an LDPC code defined in the DVB-S.2 standard.

FIG. 12 is a diagram depicting a parity check matrix H of an LDPC code defined in DVB-T.2 and similar standards.

The parity check matrix H of the LDPC code defined in DVB-T.2 and similar standards has a column weight X for KX columns, starting with the first column, a column weight of 3 for the subsequent K3 columns, a column weight of 2 for the subsequent (M−1) columns, and a column weight of 1 for the last column.

Here, the sum of columns given by KX+K3+M−1+1 equals the code length N.

FIG. 13 is a diagram illustrating the numbers of columns KX, K3, and M and the column weight X for the respective code rates r of LDPC codes defined in DVB-T.2 and similar standards.

In DVB-T.2 and similar standards, LDPC codes having code lengths N of 64800 bits and 16200 bits are defined.

In addition, 11 code rates (nominal rates), 1/4, 1/3, 2/5, 1/2, 3/5, 2/3, 3/4, 4/5, 5/6, 8/9, and 9/10, are defined for an LDPC code with a code length N of 64800 bits, and 10 code rates, 1/4, 1/3, 2/5, 1/2, 3/5, 2/3, 3/4, 4/5, 5/6, and 8/9, are defined for an LDPC code with a code length N of 16200 bits.

Hereinafter, the code length N of 64800 bits will also be referred to as "64 k bits", and the code length N of 16200 bits will also be referred to as "16 k bits".

It is well established that a code bit of an LDPC code corresponding to a column with a higher column weight in a parity check matrix H has a lower error rate.

In a parity check matrix H defined in DVB-T.2 and similar standards illustrated in FIGS. 12 and 13, the column weight tends to increase as the ordinal number of the columns of the parity check matrix H decreases (i.e., as the column comes closer to the left end of the parity check matrix H). Accordingly, robustness to errors (or resistance to errors) tends to increase as the ordinal number of the code bits of an LDPC code corresponding to the parity check matrix H decreases (i.e., the first code bit tends to be the most robust to errors), and tends to decrease as the ordinal number of the code bits increases (i.e., the last code bit tends to be the least robust to errors).

Figure 14:
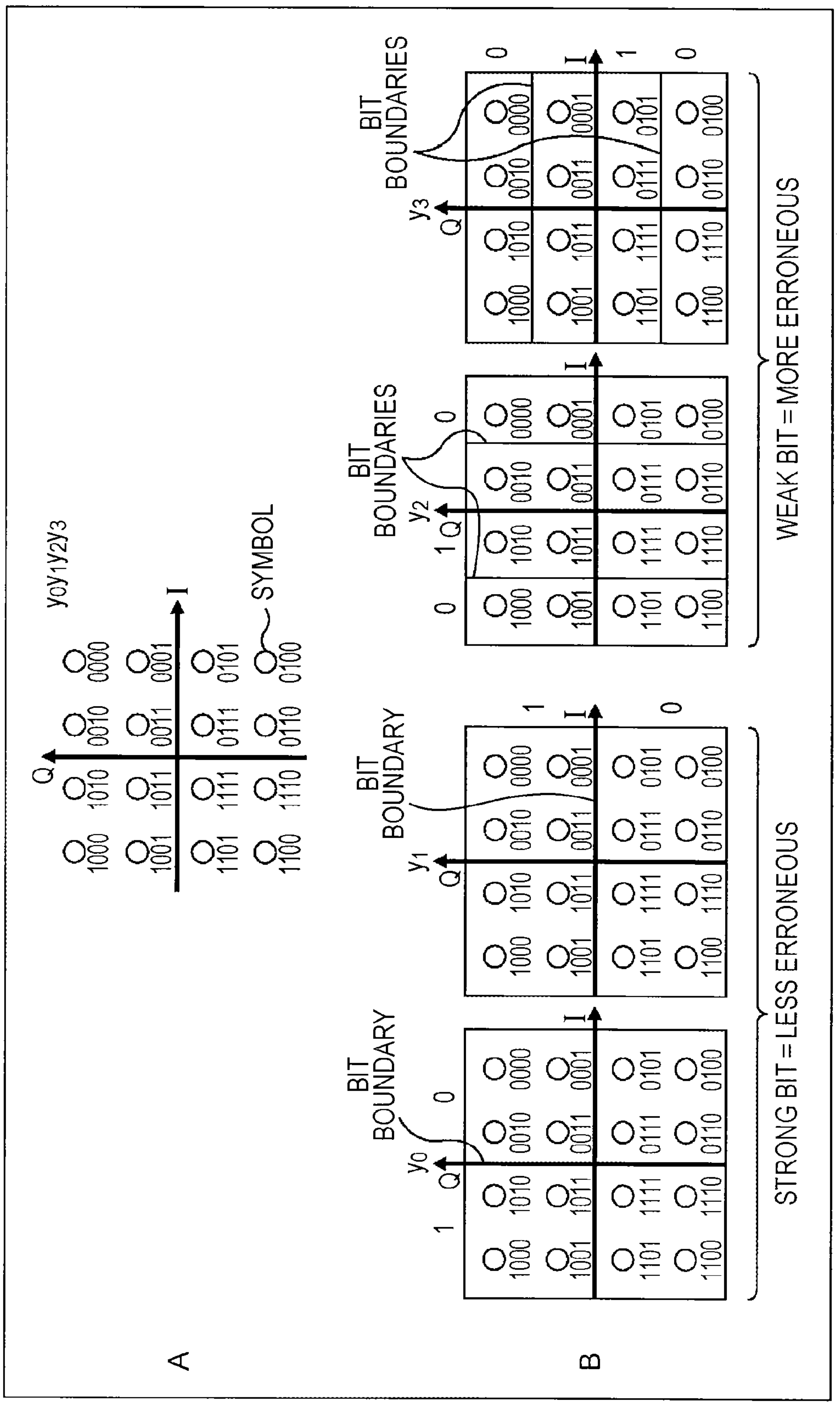
FIG. 14 includes diagrams illustrating an arrangement of constellation points of 16QAM.

Next, FIG. 14 illustrates example arrangements of (constellation points corresponding to) 16 symbols in an IQ plane in a case where the QAM encoder 117 illustrated in FIG. 8 performs 16QAM operation.

More specifically, part A of FIG. 14 illustrates symbols of DVB-T.216QAM.

In 16QAM, one symbol is represented as 4 bits, and 16 ($=2^4$) symbols are provided. Further, the 16 symbols are arranged in a square of 4 symbols in the I direction and 4 symbols in the Q direction, centered on the origin of the IQ plane.

Assuming now that the (i+1)-th bit from the most significant bit of a bit sequence represented by one symbol is represented by bit $y_i$, then 4 bits represented by one symbol of 16QAM can be represented by bits $y_0$, $y_1$, $y_2$, and $y_3$ in order, starting from the most significant bit. In a case where the modulation scheme is 16QAM, 4 code bits of an LDPC code are (symbolized) to a symbol (symbol values) of 4 bits $y_0$ to $y_3$.

Part B of FIG. 14 illustrates bit boundaries of 4 bits (hereinafter also referred to as "symbol bits") $y_0$ to $y_3$ represented by a 16QAM symbol.

Here, a bit boundary of symbol bits $y_i$ (in FIG. 14, i=0, 1, 2, 3) is a boundary between a symbol having a symbol bit $y_i$ of 0 and a symbol having a symbol bit $y_i$ of 1.

As illustrated in part B of FIG. 14, for the most significant symbol bit $y_0$ among the 4 symbol bits $y_0$ to $y_3$ represented by the 16QAM symbol, the only one bit boundary extends along the Q axis in the IQ plane. For the second symbol bit $y_1$ (the second most significant bit), the only one bit boundary extends along the I axis in the IQ plane.

In addition, two bit boundaries are provided for the third symbol bit $y_2$, one between the first and second columns of the 4×4 square of symbols, counting from the left, and the other between the third and fourth columns.

In addition, two bit boundaries are provided for the fourth symbol bit $y_3$, one between the first and second rows of the 4×4 square of symbols, counting from the top, and the other between the third and fourth rows.

Symbol bits $y_i$ represented by symbols are less erroneous (i.e., lower error probability) as the number of symbols spaced away from a bit boundary increases, and are more erroneous (i.e., higher error probability) as the number of symbols close to a bit boundary increases.

It is assumed now that a less erroneous bit (robust to errors) is referred to as a "strong bit" and a more erroneous bit (sensitive to errors) is referred to as a "weak bit". In the 4 symbol bits $y_0$ to $y_3$ of the 16QAM symbol, the most significant symbol bit $y_0$ and the second symbol bit $y_1$ are strong bits, and the third symbol bit $y_2$ and the fourth symbol bit $y_3$ are weak bits.

Figure 15:
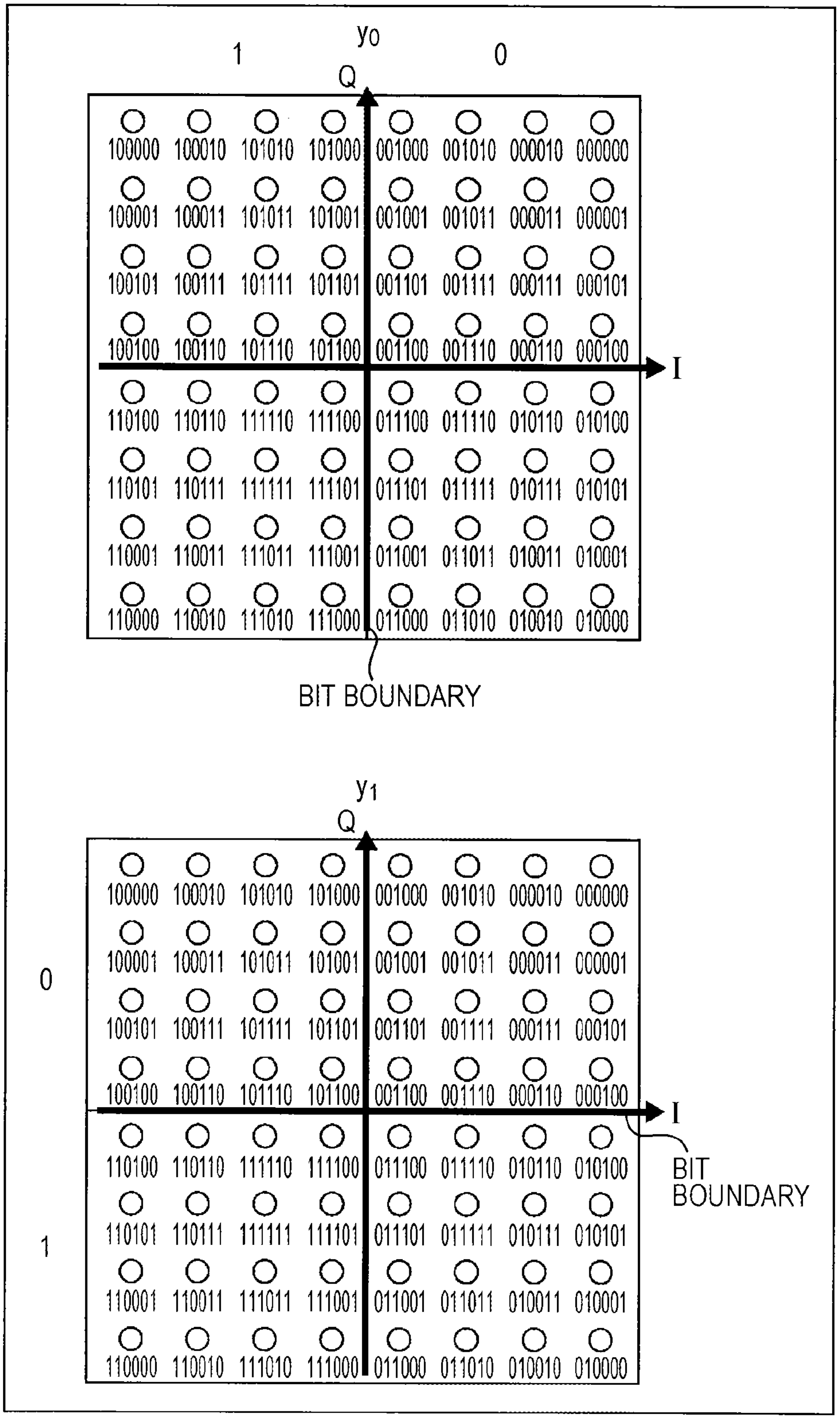
FIG. 15 is a diagram illustrating arrangements of constellation points of 64QAM.
Figure 16:
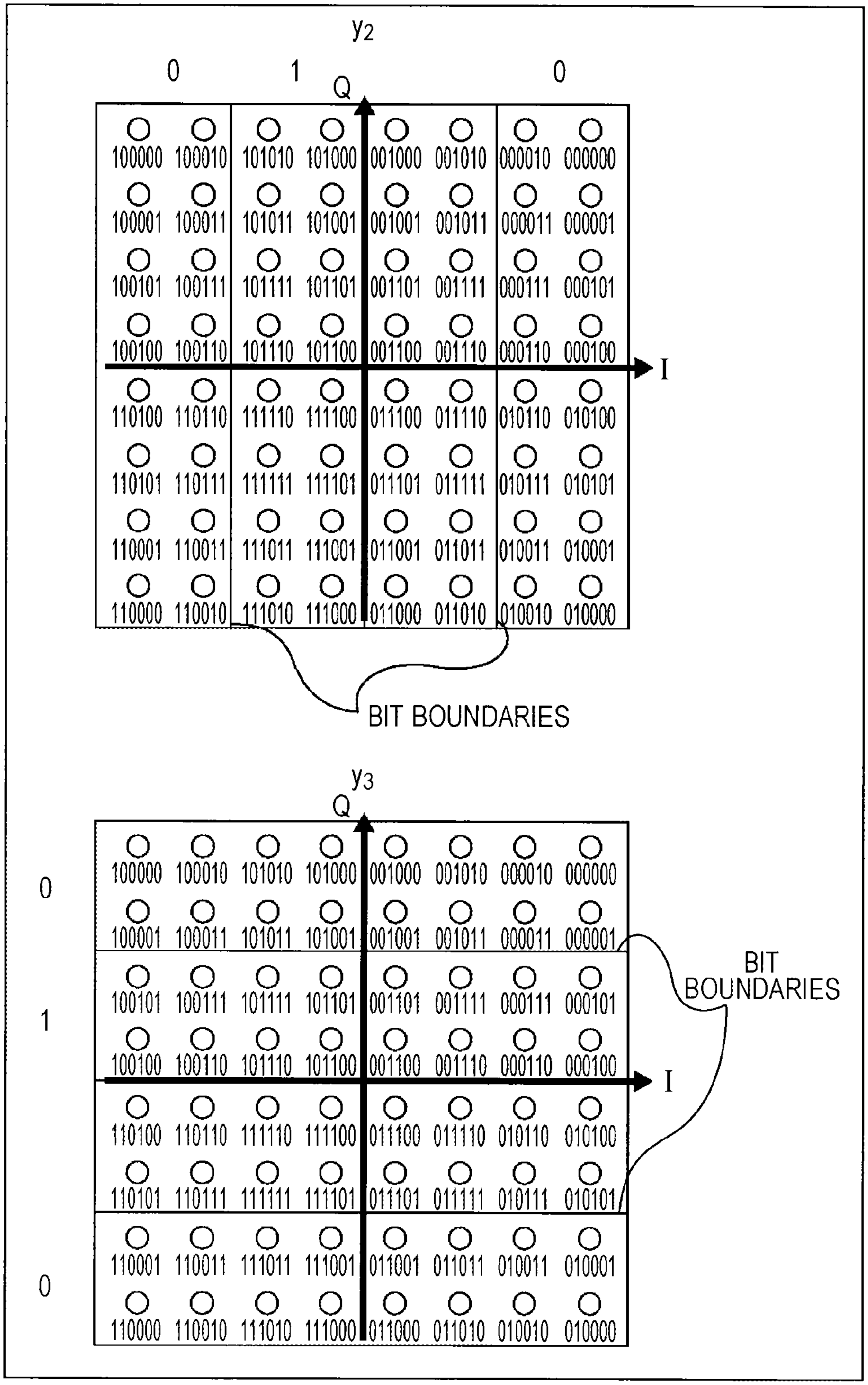
FIG. 16 is a diagram illustrating arrangements of constellation points of 64QAM.
Figure 17:
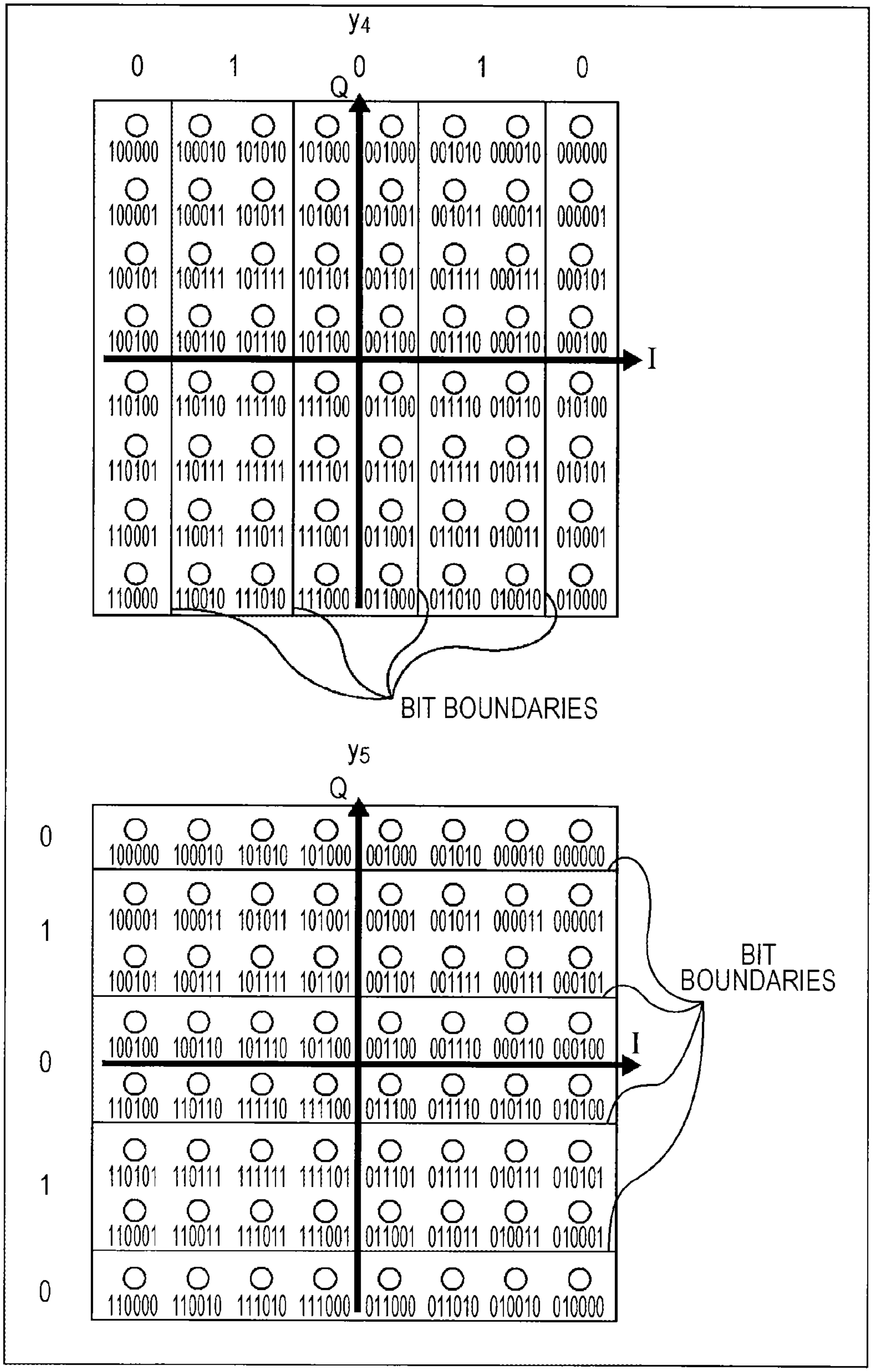
FIG. 17 is a diagram illustrating arrangements of constellation points of 64QAM.

FIGS. 15 to 17 illustrate example arrangements of (constellation points corresponding to) 64 symbols in an IQ plane in a case where the QAM encoder 117 illustrated in FIG. 8 performs 64QAM operation, that is, symbols of DVB-T.2 16QAM.

In 64QAM, one symbol represents 6 bits, and 64 ($=2^6$) symbols are provided. Further, the 64 symbols are arranged in a square of 8 symbols in the I direction and 8 symbols in the Q direction, centered on the origin of the IQ plane.

Symbol bits of one 64QAM symbol can be represented by bits $y_0$, $y_1$, $y_2$, $y_3$, $y_4$, and $y_5$ in order, starting from the most significant bit. In a case where the modulation scheme is 64QAM, 6 code bits of an LDPC code are mapped to a symbol of 6-bit symbol bits $y_0$ to $y_5$.

Here, FIG. 15 illustrates bit boundaries of the most significant symbol bit $y_0$ and the second symbol bit $y_1$ among the symbol bits $y_0$ to $y_5$ of the 64QAM symbol, FIG. 16 illustrates bit boundaries of the third symbol bit $y_2$ and the fourth symbol bit $y_3$, and FIG. 17 illustrates bit boundaries of the fifth symbol bit $y_4$ and the sixth symbol bit $y_5$.

As illustrated in FIG. 15, one bit boundary is provided for each of the most significant symbol bit $y_0$ and the second symbol bit $y_1$. Further, as illustrated in FIG. 16, two bit boundaries are provided for each of the third symbol bit $y_2$ and the fourth symbol bit $y_3$. As illustrated in FIG. 17, four bit boundaries are provided for each of the fifth symbol bit $y_4$ and the sixth symbol bit $y_5$.

Accordingly, among the symbol bits $y_0$ to $y_5$ of the 64QAM symbol, the most significant symbol bit $y_0$ and the second symbol bit $y_1$ are the strongest bits, and the third symbol bit $y_2$ and the fourth symbol bit $y_3$ are the second strongest bits. Then, the fifth symbol bit $y_4$ and the sixth symbol bit $y_5$ are weak bits.

It can be found from FIG. 14 and, furthermore, FIGS. 15 to 17 that symbol bits of an orthogonal modulation symbol have a tendency that more significant bits are stronger bits and less significant bits are weaker bits.

Figure 18:
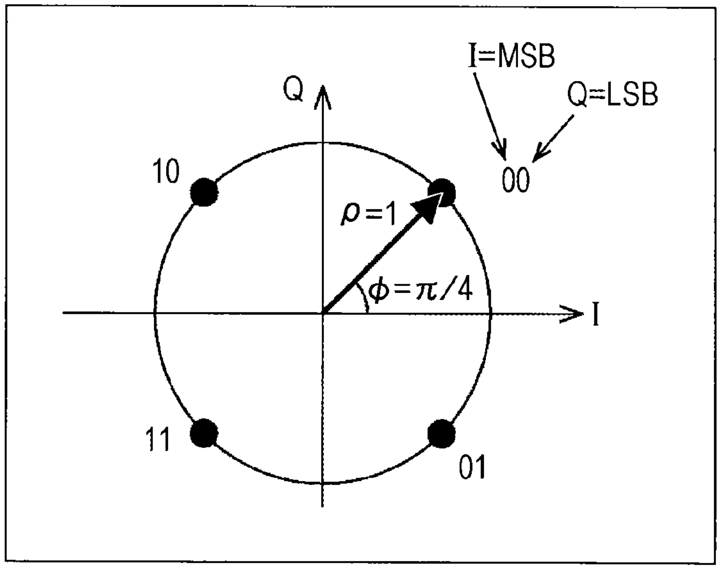
FIG. 18 is a diagram illustrating an arrangement of constellation points defined in the DVB-S.2 standard.

FIG. 18 is a diagram illustrating an example arrangement of (constellation points corresponding to) 4 symbols in an IQ plane in a case where a satellite link is used as the communication path 13 (FIG. 7) and the QAM encoder 117 illustrated in FIG. 8 performs QPSK operation, that is, a diagram of, for example, DVB-S.2 QPSK symbols.

In DVB-S.2 QPSK, each symbol is mapped to one of four constellation points on the circumference of a circle having a radius ρ of 1, centered on the origin of the IQ plane.

Figure 19:
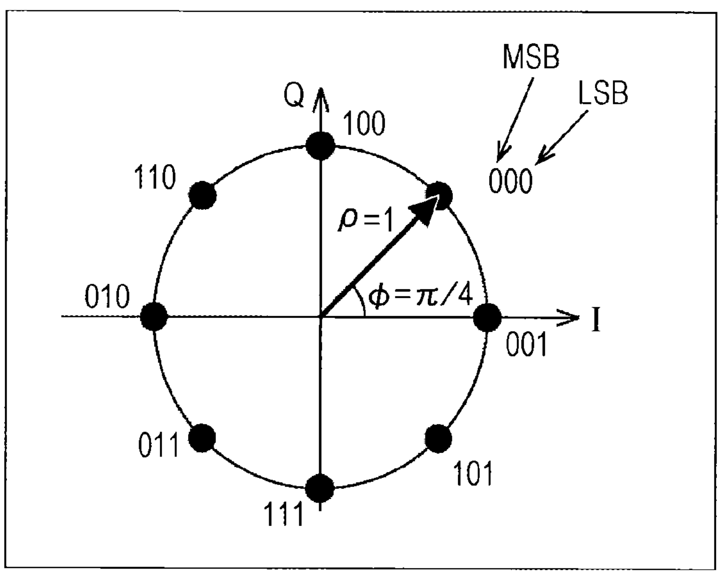
FIG. 19 is a diagram illustrating an arrangement of constellation points defined in the DVB-S.2 standard.

FIG. 19 is a diagram illustrating an example arrangement of 8 symbols in an IQ plane in a case where a satellite link is used as the communication path 13 (FIG. 7) and the QAM encoder 117 illustrated in FIG. 8 performs BPSK operation, that is, a diagram of, for example, DVB-S.2 BPSK symbols.

In DVB-S.2 BPSK, each symbol is mapped to one of eight constellation points on the circumference of a circle having a radius p of 1, centered on the origin of the IQ plane.

Figure 20:
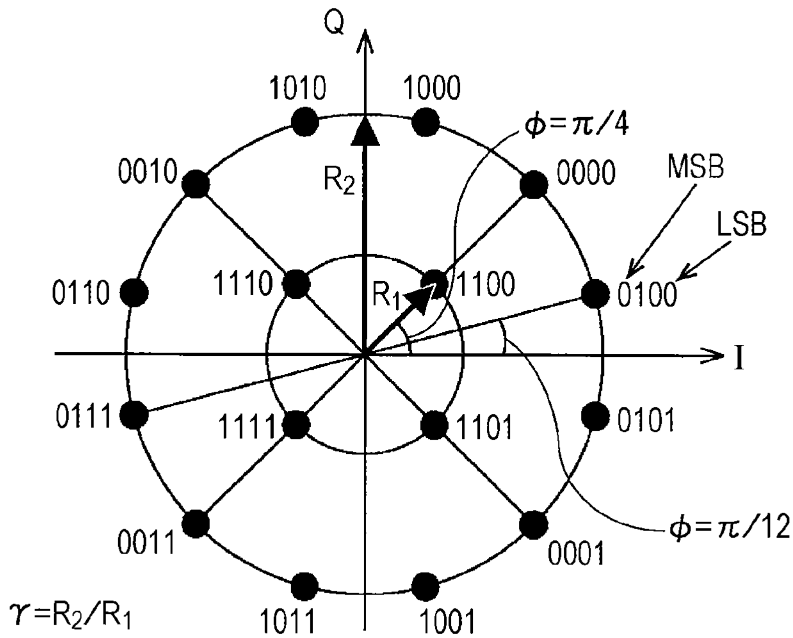
FIG. 20 includes diagrams illustrating an arrangement of constellation points defined in the DVB-S.2 standard.

FIG. 20 includes diagrams illustrating an example arrangement of 16 symbols in an IQ plane in a case where a satellite link is used as the communication path 13 (FIG. 7) and the QAM encoder 117 illustrated in FIG. 8 performs 16APSK operation, that is, diagrams of, for example, DVB-S.2 16APSK symbols.

Part A of FIG. 20 illustrates an arrangement of constellation points of DVB-S.216APSK.

In DVB-S.216APSK, each symbol is mapped to one of 16 constellation points in total, namely, 4 constellation points on the circumference of a circle having a radius $R_1$ and 12 constellation points on the circumference of a circle having a radius $R_2$ ($>R_1$), centered on the origin of the IQ plane.

Part B of FIG. 20 illustrates the ratio $\gamma=R_2/R_1$, which is the ratio of the radii $R_2$ and $R_1$ in the arrangement of constellation points of DVB-S.216APSK.

In the arrangement of constellation points of DVB-S.2 16APSK, the ratio γ of the radii $R_2$ and $R_1$ differs depending on the code rate.

Figure 21:
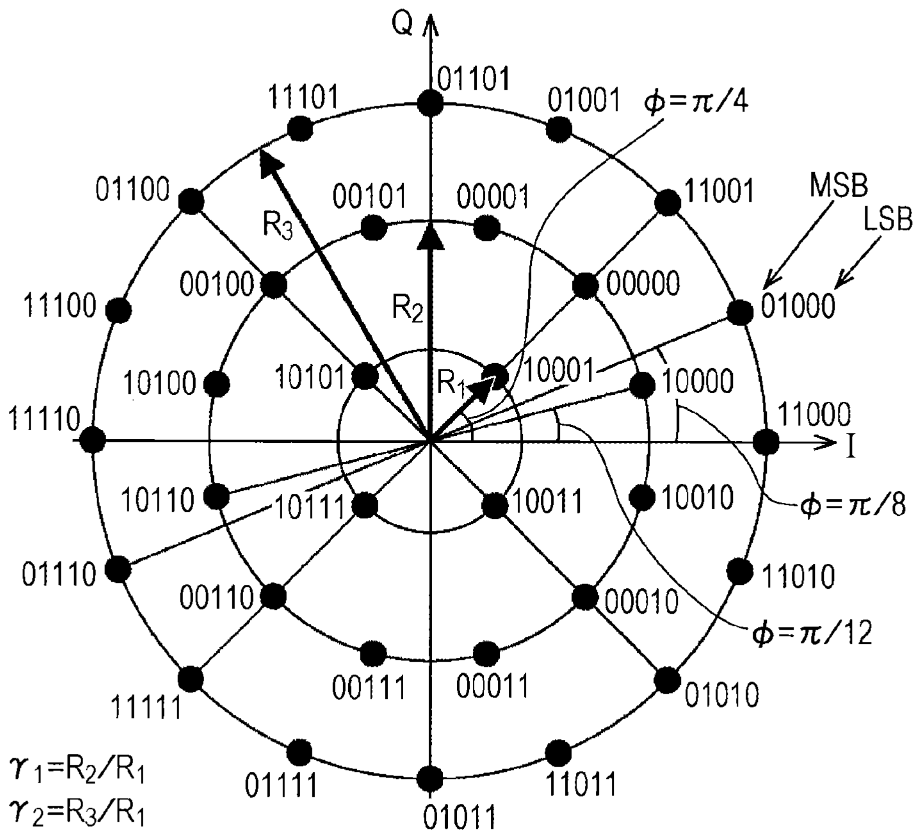
FIG. 21 includes diagrams illustrating an arrangement of constellation points defined in the DVB-S.2 standard.

FIG. 21 includes diagrams illustrating an example arrangement of 32 symbols in an IQ plane in a case where a satellite link is used as the communication path 13 (FIG. 7) and the QAM encoder 117 illustrated in FIG. 8 performs 32APSK operation, that is, diagrams of, for example, DVB-S.2 32APSK symbols.

Part A of FIG. 21 illustrates an arrangement of constellation points of DVB-S.232APSK.

In DVB-S.232APSK, each symbol is mapped to one of 32 constellation points in total, namely, 4 constellation points on the circumference of a circle having a radius $R_1$, 12 constellation points on the circumference of a circle having a radius $R_2$ ($>R_1$), and 16 constellation points on the circumference of a circle having a radius $R_3$ ($>R_2$), centered on the origin of the IQ plane.

Part B of FIG. 21 illustrates the ratio $\gamma_1=R_2/R_1$, which is the ratio of the radii $R_2$ and $R_1$, and the ratio $\gamma_2=R_3/R_1$, which is the ratio of the radii $R_3$ and $R_1$, in the arrangement of constellation points of DVB-S.232APSK.

In the arrangement of constellation points of DVB-S.2 32APSK, the ratio $\gamma_1$ of the radii $R_2$ and $R_1$ and the ratio $\gamma_2$ of the radii $R_3$ and $R_1$ each differ depending on the code rate.

The symbol bits of the symbols of the respective DVB-S.2 orthogonal modulation types (QPSK, 8PSK, 16APSK, and 32APSK) having the arrangements of constellation points illustrated in FIGS. 18 to 21 also include strong bits and weak bits similarly to those illustrated in FIGS. 14 to 17.

Here, as described above with reference to FIGS. 12 and 13, the LDPC code output from the LDPC encoder 115 (FIG. 8) includes code bits robust to errors and code bits sensitive to errors.

Furthermore, as described above with reference to FIGS. 14 to 21, the symbol bits of a symbol of orthogonal modulation performed by the QAM encoder 117 include strong bits and weak bits.

Thus, assigning code bits of an LDPC code which are sensitive to errors to symbol bits of an orthogonal modulation symbol which are sensitive to errors would reduce the resistance to errors as a whole.

Accordingly, an interleaver has been proposed that is configured to interleave code bits of an LDPC code such that a code bit of the LDPC code which is sensitive to errors is allocated to a strong bit (symbol bit) of an orthogonal modulation symbol.

The demultiplexer 25 illustrated in FIG. 9 is capable of performing the processing of the above-described interleaver.

Figure 22:
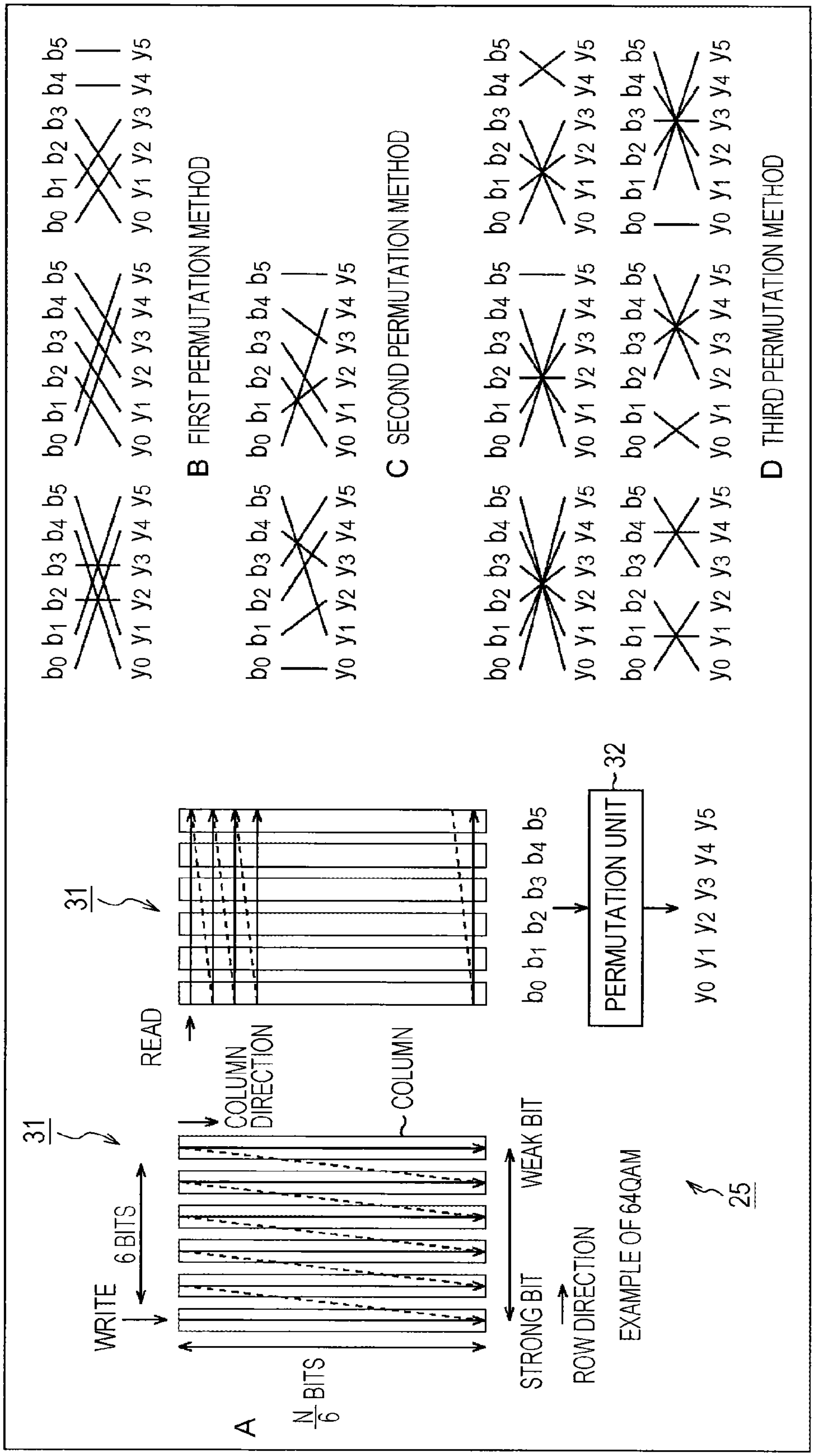
FIG. 22 includes diagrams depicting the processing of a demultiplexer 25.

FIG. 22 includes diagrams depicting the processing of the demultiplexer 25 illustrated in FIG. 9.

More specifically, part A of FIG. 22 illustrates an example functional configuration of the demultiplexer 25.

The demultiplexer 25 includes a memory 31 and a permutation unit 32.

An LDPC code is supplied to the memory 31 from the LDPC encoder 115.

The memory 31 has a storage capacity to store mb bits in its row (horizontal) direction and N/(mb) bits in its column (vertical) direction. Code bits of the LDPC code supplied to the memory 31 are written in the column direction, and are read in the row direction. The read code bits are supplied to the permutation unit 32.

Here, as described above, N(=information length K+parity length M) represents the code length of the LDPC code.

In addition, m represents the number of code bits of the LDPC code which are mapped to one symbol, and b is a certain positive integer and denotes a multiple used to obtain integer multiples of m. As described above, the demultiplexer 25 maps (or symbolizes) code bits of an LDPC code to a symbol, where the multiple b represents the number of symbols obtained by the demultiplexer 25 through single symbolization.

Part A of FIG. 22 illustrates an example configuration of the demultiplexer 25 in a case where the modulation scheme is 64QAM in which each symbol is mapped to one of 64 constellation points, or any other suitable modulation scheme. The number of code bits m of an LDPC code to be mapped to one symbol is therefore 6.

In part A of FIG. 22, furthermore, the multiple b is 1. Therefore, the memory 31 has a storage capacity of N/(6×1) bits in the column direction and (6×1) bits in the row direction.

Here, in the following, a storage area of the memory 31, which has one bit in the row direction and extends in the column direction, is referred to as a "column" as appropriate. In part A of FIG. 22, the memory 31 includes 6 (=6×1) columns.

The demultiplexer 25 writes code bits of the LDPC code to the memory 31 (in the column direction) from the top to the bottom of each column of the memory 31, where the writing operation moves toward the right, starting from the leftmost column.

Further, when the writing of code bits up to the bottom of the rightmost column is completed, code bits are read from the memory 31 in the row direction, starting from the first row of all the columns of the memory 31, in units of 6 bits (i.e., mb bits). The read code bits are supplied to the permutation unit 32.

The permutation unit 32 performs permutation processing to permute the positions of 6 code bits supplied from the memory 31, and outputs the resulting 6 bits as 6 symbol bits $y_0$, $y_1$, $y_3$, $y_3$, $y_4$, and $y_5$ representing one 64QAM symbol.

More specifically, mb (here, 6) code bits are read from the memory 31 in the row direction. If the i-th bit from the most significant bit of the mb code bits read from the memory 31 is represented by bit $b_1$ (where i=0, 1, . . . , mb-1), the 6 code bits read from the memory 31 in the row direction can be represented by bits $b_0$, $b_1$, $b_2$, $b_3$, $b_4$, and $b_5$ in order, starting from the most significant bit.

In terms of the column weights described with reference to FIGS. 12 and 13, the code bits in the bit $b_0$ direction are code bits robust to errors, and the code bits in the bit $b_5$ direction are code bits sensitive to errors.

The permutation unit 32 is configured to perform permutation processing to permute the positions of the 6 code bit $b_0$ to $b_5$ read from the memory 31 so that the code bits sensitive to errors among the 6 code bits $b_0$ to $b_5$ read from the memory 31 may be allocated to strong bits among the symbol bits $y_0$ to $y_5$ representing one 64QAM symbol.

Here, various methods for permuting the 6 code bits $b_0$ to $b_5$ read from the memory 31 and allocating them to the 6 symbol bits $y_0$ to $y_5$ representing one 64QAM symbol have been proposed by many companies.

Part B of FIG. 22 illustrates a first permutation method, part C of FIG. 22 illustrates a second permutation method, and part D of FIG. 22 illustrates a third permutation method.

In part B of FIG. 22 to part D of FIG. 22 (also in FIG. 23, described below), a line connecting bits $b_i$ and $y_3$ indicates that the code bit is allocated to the symbol bit $y_3$ of the symbol (i.e., the position of the code bit $b_i$ is replaced with that of the symbol bit $y_3$).

In the first permutation method illustrated in part B of FIG. 22, the use of one of three permutation types is proposed. In the second permutation method illustrated in part C of FIG. 22, the use of one of two permutation types is proposed.

In the third permutation method illustrated in part D of FIG. 22, the sequential selection and use of six permutation types are proposed.

Figure 23:
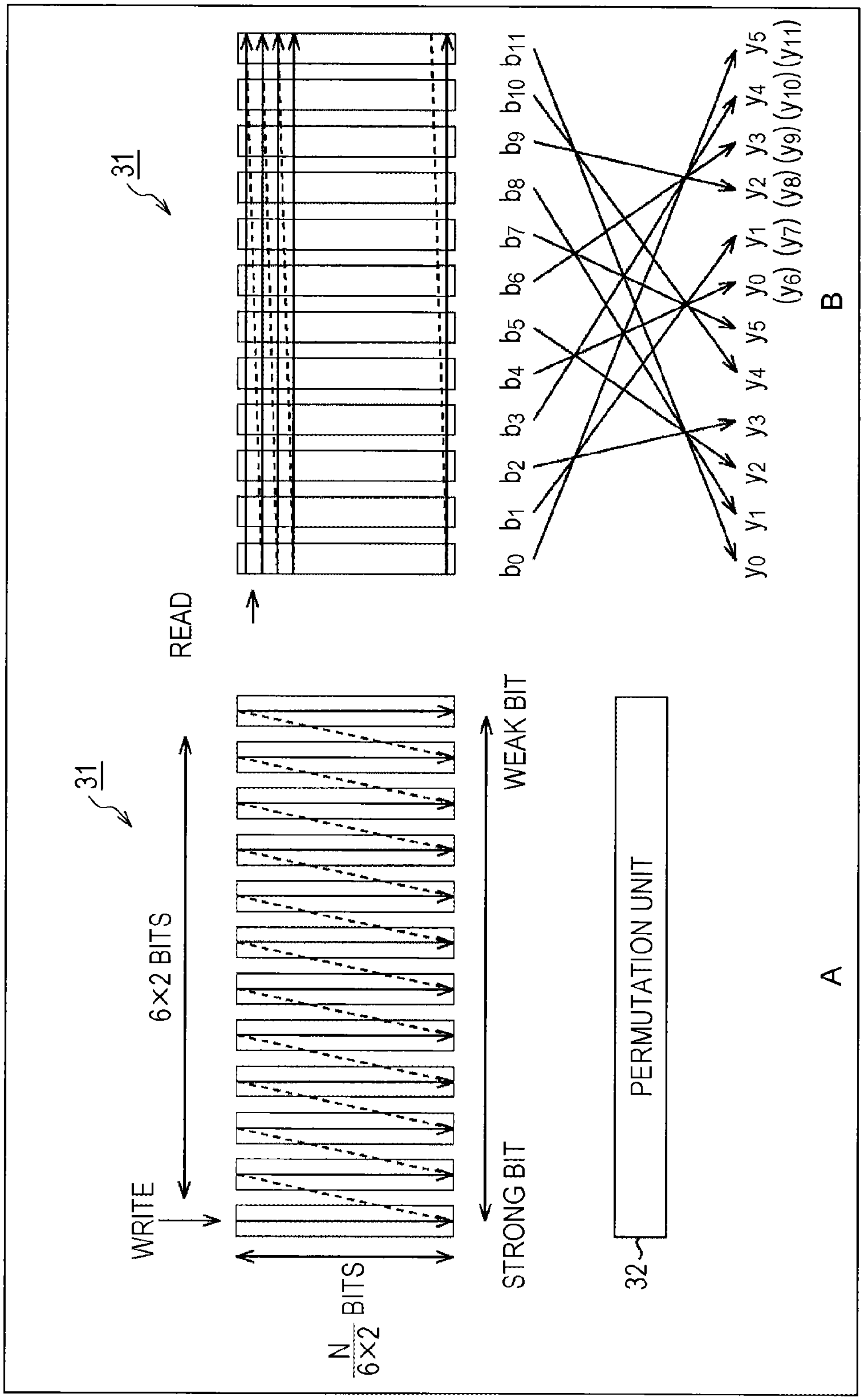
FIG. 23 includes diagrams depicting the processing of the demultiplexer 25.

FIG. 23 illustrates an example configuration of the demultiplexer 25 in a case where the modulation scheme is 64QAM in which each symbol is mapped to one of 64 constellation points, or any other suitable modulation scheme (and therefore, the number of code bits m of an LDPC code to be mapped to one symbol is 6, similarly to the case in FIG. 22) and in a case where the multiple b is 2, and also illustrates a fourth permutation method.

In a case where the multiple b is 2, the memory 31 has a storage capacity of N/(6×2) bits in the column direction and (6×2) bits in the row direction, and includes 12 (=6×2) columns.

Part A of FIG. 23 illustrates the order in which code bits of an LDPC code are written to the memory 31.

As described with reference to FIG. 22, the demultiplexer 25 writes code bits of the LDPC code to the memory 31 (in the column direction) from the top to the bottom of each column of the memory 31, where the writing operation moves toward the right, starting from the leftmost column.

Further, when the writing of code bits up to the bottom of the rightmost column is completed, code bits are read from the memory 31 in the row direction, starting from the first row of all the columns of the memory 31, in units of 12 bits (i.e., mb bits). The read code bits are supplied to the permutation unit 32.

The permutation unit 32 performs permutation processing to permute the positions of 12 code bits supplied from the memory 31, by using the fourth permutation method, and outputs the resulting 12 bits as 12 bits representing two symbols of 64QAM (i.e., b symbols), that is, 6 symbol bits $y_0$, $y_1$, $y_2$, $y_3$, $y_4$, and $y_5$ representing one 64QAM symbol and 6 symbol bits $y_0$, $y_1$, $y_2$, $y_3$, $y_4$, and $y_5$ representing the subsequent one symbol.

Here, part B of FIG. 23 illustrates a fourth permutation method that is a method for performing permutation processing by the permutation unit 32 illustrated in part A of FIG. 23.

Note that, in the permutation processing, in a case where the multiple b is 2 (also in a case where the multiple b is 3 or more), mb code bits are allocated to mb symbol bits of consecutive b symbols. In the following, including FIG. 23, the (i+1)-th bit from the most significant bit of mb symbol bits of consecutive b symbols is represented by bit (or symbol bit) $y_i$, for convenience of illustration.

The optimum permutation type of code bits, which increases the error-rate performance in an AWGN communication path, depends on the code rate or code length of an LDPC code, the modulation scheme, and so forth.

[Parity Interleaving]

Next, parity interleaving performed by the parity interleaver 23 illustrated in FIG. 9 will be described with reference to FIGS. 24 to 26.

Figure 24:
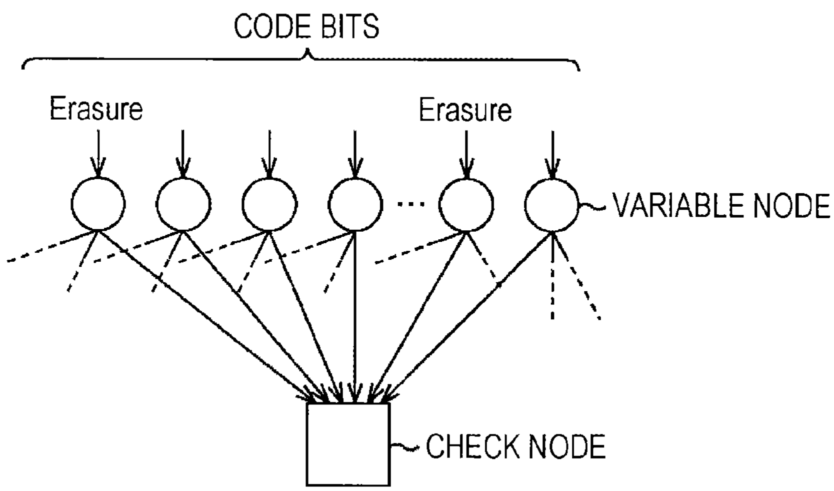
FIG. 24 is a diagram illustrating a Tanner graph for LDPC code decoding.

FIG. 24 illustrates (part of) a Tanner graph of a parity check matrix of an LDPC code.

As illustrated in FIG. 24, if errors such as erasures simultaneously occur in multiple, such as two, (code bits corresponding to) variable nodes connected to a check node, the check node returns a message with the probability of the value 0 being equal to the probability of the value 1 to all the variable nodes connected to the check node. Hence, the decoding performance deteriorates if a plurality of variable nodes connected to the same check node simultaneously become erasures or the like.

Meanwhile, the LDPC code output from the LDPC encoder 115 illustrated in FIG. 8, which is defined in the DVB-S.2 and similar standards, is an IRA code, and a parity matrix $H_T$ of the parity check matrix H has a stepwise structure, as illustrated in FIG. 11.

FIG. 25 illustrates a parity matrix $H_T$ having a stepwise structure, and a Tanner graph corresponding to the parity matrix $H_T$.

More specifically, part A of FIG. 25 illustrates a parity matrix $H_T$ having a stepwise structure, and part B of FIG. 25 illustrates a Tanner graph corresponding to the parity matrix $H_T$ illustrated in part A of FIG. 25.

In the parity matrix $H_T$ having a stepwise structure, elements of 1 are adjacent in each row (except the first row). Thus, in the Tanner graph of the parity matrix $H_T$, two adjacent variable nodes corresponding to two adjacent elements having the value 1 in the parity matrix $H_T$ are connected to the same check node.

Accordingly, if errors simultaneously occur in parity bits corresponding two adjacent variable nodes as described above due to burst errors, erasures, and the like, a check node connected to the two variable nodes (i.e., variable nodes whose messages are determined using the parity bits) corresponding to the two erroneous parity bits returns a message with the probability of the value 0 being equal to the probability of the value 1 to the variable nodes connected to the check node. The decoding performance thus deteriorates. Then, if the burst length (which is the number of consecutive erroneous parity bits) increases, the number of check nodes that return the message with equal probabilities increases, resulting in further deterioration of decoding performance.

Accordingly, the parity interleaver 23 (FIG. 9) performs parity interleaving on the LDPC code supplied from the LDPC encoder 115 to interleave parity bits to different parity bit positions in order to prevent the deterioration of decoding performance described above.

Figure 26:
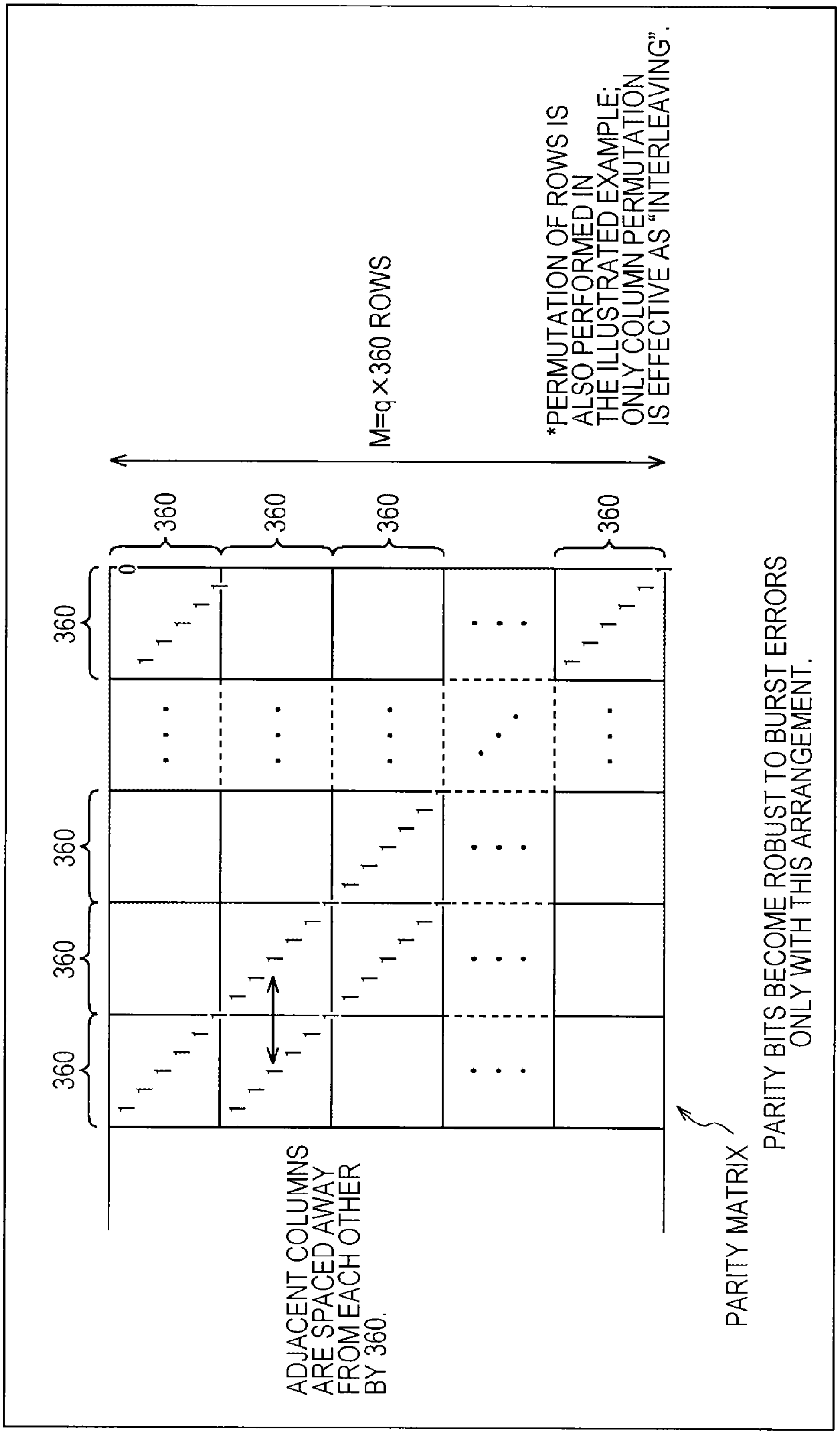
FIG. 26 is a diagram illustrating a parity matrix $H_T$ of a parity check matrix H corresponding to an LDPC code that has been subjected to parity interleaving.

FIG. 26 illustrates a parity matrix $H_T$ of a parity check matrix H corresponding to an LDPC code which has been subjected to parity interleaving by the parity interleaver 23 illustrated in FIG. 9.

Here, the information matrix $H_A$ of the parity check matrix H corresponding to the LDPC code defined in the DVB-S.2 and similar standards, which is output from the LDPC encoder 115, has a cyclic structure.

The term "cyclic structure" refers to a structure in which a certain column matches another column that is cyclically shifted. Examples of the cyclic structure include a structure in which the position of "1" in each row of every P columns corresponds to the position to which the position of the first column out of the P columns has been cyclically shifted in a column direction by a value proportional to the value q obtained by dividing the parity length M. In the following, the number of columns P in the cyclic structure will be referred to as the "number of unit columns of the cyclic structure" as appropriate.

As described with reference to FIGS. 12 and 13, examples of the LDPC codes defined in the DVB-S.2 and similar standards include two types of LDPC codes having code lengths N of 64800 bits and 16200 bits. For either of the two types of LDPC codes, the number of unit columns P of the cyclic structure is defined to be 360, which is one of the divisors, excluding 1 and M, of the parity length M.

In addition, the parity length M has a value other than the prime number represented by the equation $M=q\times P=q\times 360$, by using a value q which differs depending on the code rate. Therefore, similarly to the number of unit columns P of the cyclic structure, the value q is also one of the divisors, excluding 1 and M, of the parity length M, and is given by dividing the parity length M by the number of unit columns P of the cyclic structure (i.e., the parity length M is the product of the divisors P and q of the parity length M).

As described above, the parity interleaver 23 performs parity interleaving on an N-bit LDPC code to interleave the (K+qx+y+1)-th code bit among the code bits of the N-bit LDPC code to the (K+Py+x+1)-th code bit position, where K denotes the information length, x is an integer greater than or equal to 0 and less than P, and y is an integer greater than or equal to 0 and less than q.

The (K+qx+y+1)-th code bit and the (K+Py+x+1)-th code bit are code bits positioned after the (K+1)-th code bit, and are therefore parity bits. Accordingly, the position of a parity bit of an LDPC code is shifted by parity interleaving.

In this parity interleaving operation, (parity bits corresponding to) variable nodes connected to the check node are spaced away from each other by the number of unit columns P of the cyclic structure, i.e., in the illustrated example, 360 bits, thereby preventing simultaneous occurrence of errors in a plurality of variable nodes connected to the same check node for a burst length less than 360 bits. The resistance to burst errors can therefore be improved.

Note that the LDPC code, which has undergone parity interleaving such that the (K+qx+y+1)-th code bit is interleaved to the (K+Py+x+1)-th code bit position, is identical to an LDPC code of a parity check matrix (hereinafter also referred to as a "transformed parity check matrix") that is obtained through column permutation to replace the (K+qx+y+1)-th column of the original parity check matrix H with the (K+Py+x+1)-th column.

Furthermore, as illustrated in FIG. 26, the parity matrix of the transformed parity check matrix has a pseudo-cyclic structure whose number of unit columns is P (in FIG. 26, 360).

The term "pseudo-cyclic structure", as used herein, refers to a structure in which a portion of a matrix has a cyclic structure. A transformed parity check matrix produced by performing column permutation, corresponding to parity interleaving, on a parity check matrix of an LDPC code defined in the DVB-S.2 and similar standards has a portion of 360 rows and 360 columns in a right corner portion thereof (which corresponds to a shift matrix described below) in which only one element of "1" is missing (i.e., an element of "0" appears). In this regard, this cyclic structure is not a complete cyclic structure, called a pseudo-cyclic structure.

Note that the transformed parity check matrix illustrated in FIG. 26 is a matrix obtained by performing permutation of rows (row permutation), in addition to column permutation corresponding to parity interleaving, on the original parity check matrix H such that the transformed parity check matrix includes component matrices described below.

[Column Twist Interleaving]

Next, column twist interleaving as reordering processing performed by the column twist interleaver 24 illustrated in FIG. 9 will be described with reference to FIGS. 27 to 30.

The transmitting device 11 illustrated in FIG. 8 transmits one or more code bits of an LDPC code as one symbol. More specifically, for example, QPSK is used as a modulation scheme for the transmission of 2 code bits as one symbol, and 16APSK or 16QAM is used as a modulation scheme for the transmission of 4 code bits as one symbol.

In a case where 2 code bits are to be transmitted as one symbol, an error such as an erasure occurring in a certain symbol may cause all the code bits of the symbol to be erroneous (or erasures).

Accordingly, in order to reduce the probability of a plurality of (code bits corresponding to) variable nodes connected to the same check node becoming simultaneously erasures to improve decoding performance, it is necessary to prevent variable nodes corresponding to code bits of one symbol from being connected to the same check node.

In contrast, in the parity check matrix H of the LDPC code defined in the DVB-S.2 and similar standards, which is output from the LDPC encoder 115, as described above, the information matrix $H_A$ has a cyclic structure and the parity matrix $H_T$ has a stepwise structure. In addition, as described with reference to FIG. 26, in a transformed parity check matrix, which is a parity check matrix of an LDPC code that has been subjected to parity interleaving, the parity matrix also has a cyclic structure (more specifically, as described above, a pseudo-cyclic structure).

Figure 27:
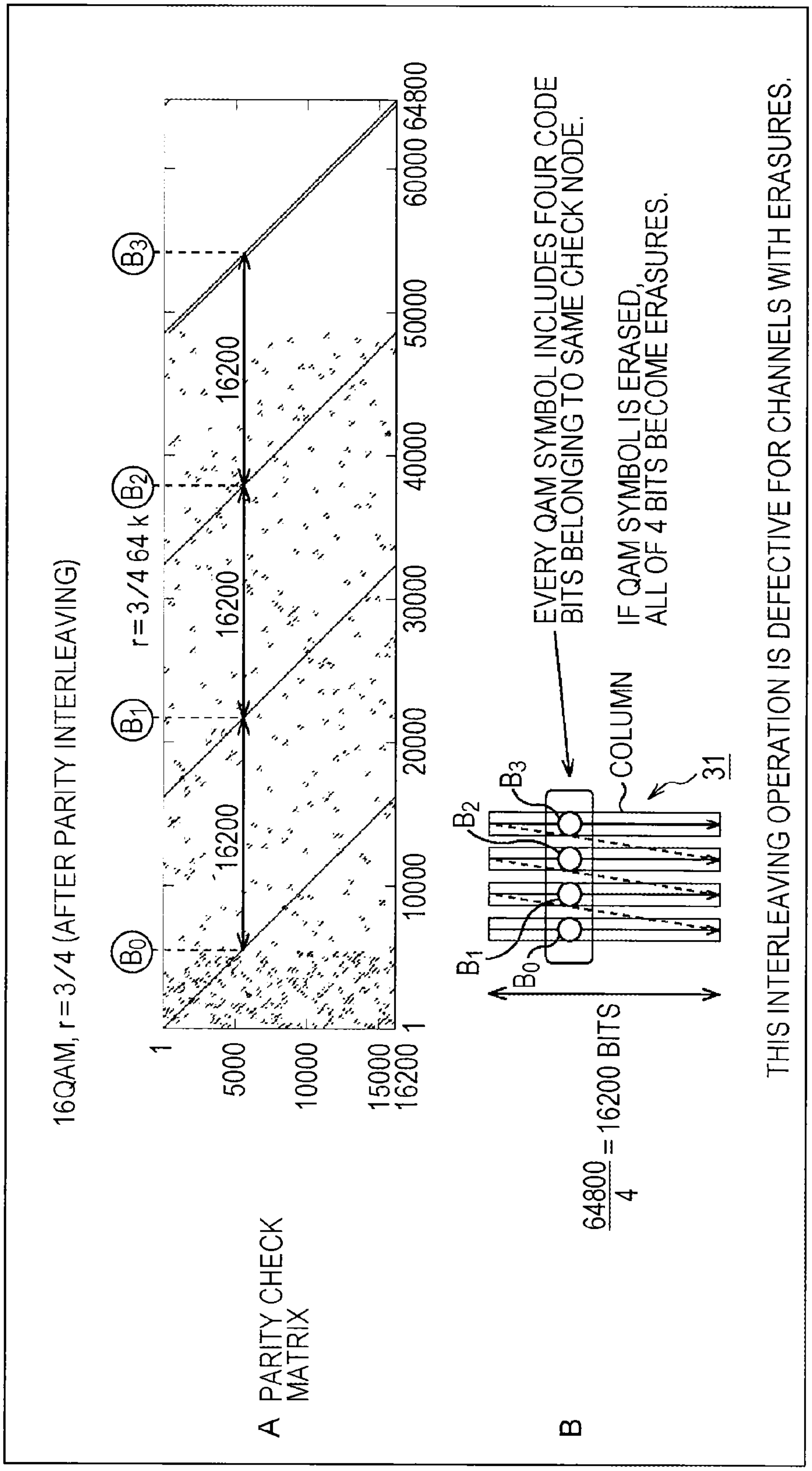
FIG. 27 includes diagrams illustrating a transformed parity check matrix.

FIG. 27 illustrates a transformed parity check matrix.

More specifically, part A of FIG. 27 illustrates a transformed parity check matrix of a parity check matrix H of an LDPC code having a code length N of 64800 bits and a code rate (r) of 3/4.

In the transformed parity check matrix illustrated in part A of FIG. 27, the positions of elements having the value 1 are indicated by dots ("•").

Part B of FIG. 27 illustrates processing that the demultiplexer 25 (FIG. 9) performs on an LDPC code of the transformed parity check matrix illustrated in part A of FIG. 27, that is, an LDPC code that has been subjected to parity interleaving.

In part B of FIG. 27, using a modulation scheme for mapping each symbol to one of 16 constellation points, such as 16APSK or 16QAM, code bits of the LDPC code that has been subjected to parity interleaving are written to four columns of the memory 31 in the demultiplexer 25 in a column direction.

The code bits written to the four columns of the memory 31 in the column direction are read in a row direction in units of 4 bits, and are mapped to one symbol.

In this case, 4 code bits $B_0$, $B_1$, $B_2$, and $B_3$, which are to be mapped to one symbol, may be code bits corresponding to 1s in an arbitrary row of the transformed parity check matrix illustrated in part A of FIG. 27. In this case, the variable nodes corresponding to the code bits $B_0$, $B_1$, $B_2$, and $B_3$ are connected to the same check node.

Accordingly, in a case where 4 code bits $B_0$, $B_1$, $B_2$, and $B_3$ of one symbol are code bits corresponding to is in an arbitrary row of the transformed parity check matrix, an erasure occurring in the symbol would make it difficult to determine an appropriate message for the same check node to which the variable nodes respectively corresponding to the code bits $B_0$, $B_1$, $B_2$, and $B_3$ are connected, resulting in deterioration of decoding performance.

Also for code rates other than a code rate of 3/4, a plurality of code bits corresponding to a plurality of variable nodes connected to the same check node may be mapped to one 16APSK or 16QAM symbol.

Accordingly, the column twist interleaver 24 performs column twist interleaving on the LDPC code that has been subjected to parity interleaving, which is supplied from the parity interleaver 23, to interleave code bits of the LDPC code so that a plurality of code bits corresponding to is in an arbitrary row of the transformed parity check matrix are not included in one symbol.

Figure 28:
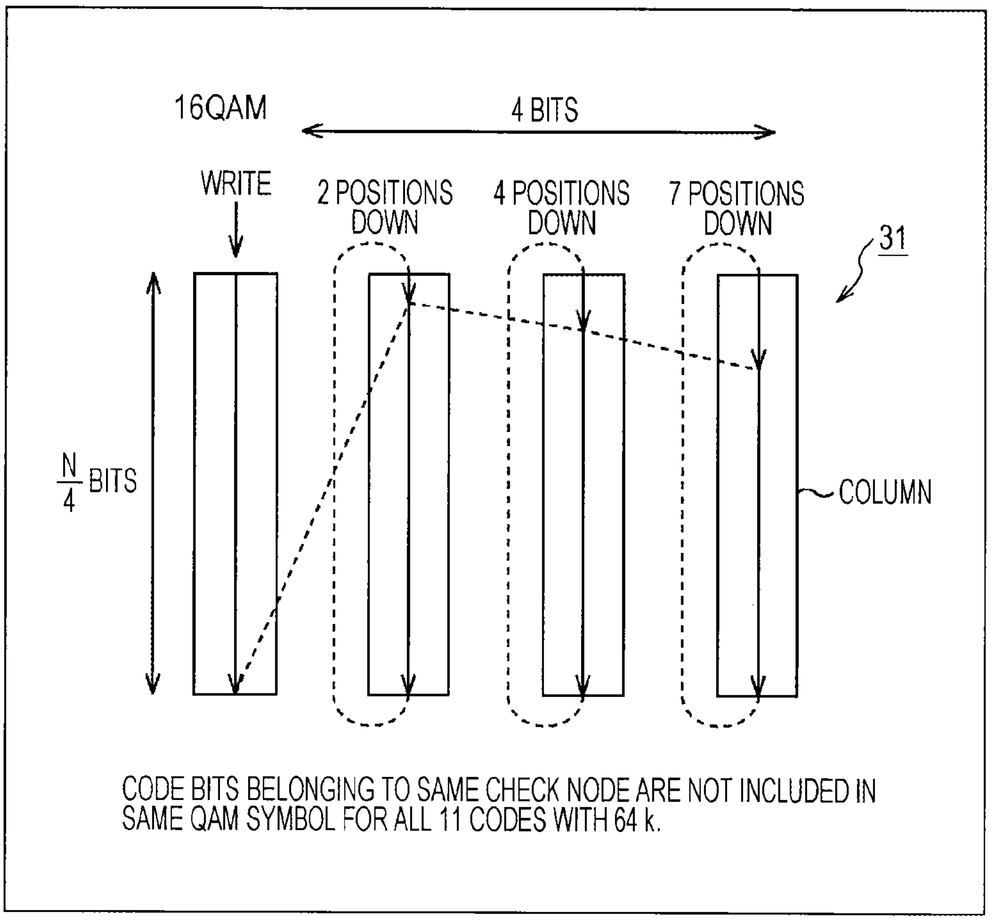
FIG. 28 is a diagram depicting the processing of a column twist interleaver 24.

FIG. 28 is a diagram depicting column twist interleaving.

More specifically, FIG. 28 illustrates the memory 31 (FIGS. 22 and 23) of the demultiplexer 25.

As described with reference to FIG. 22, the memory 31 has a storage capacity to store N/(mb) bits in its column (vertical) direction and mb bits in its row (horizontal) direction, and includes mb columns. Then, the column twist interleaver 24 performs column twist interleaving by controlling a write start position from which the writing operation starts when a code bit of an LDPC code is written to the memory 31 in the column direction and is read from the memory 31 in the row direction.

More specifically, the column twist interleaver 24 appropriately changes a write start position with which the writing of a code bit starts in each of a plurality of columns so that a plurality of code bits read in the row direction, which are to be mapped to one symbol, does not match code bits corresponding to is in an arbitrary row of the transformed parity check matrix (That is, the column twist interleaver 24 reorders code bits of the LDPC code so that a plurality of code bits corresponding to 1s in an arbitrary row of the parity check matrix are not included in the same symbol).

Here, FIG. 28 illustrates an example configuration of the memory 31 in a case where the modulation scheme is 16APSK or 16QAM and the multiple b described with reference to FIG. 22 is 1. Accordingly, the number of bits m of the code bits of the LDPC code that are to be mapped to one symbol is 4, and the memory 31 includes 4 (=mb) columns.

The column twist interleaver 24 (instead of the demultiplexer 25 illustrated in FIG. 22) writes code bits of the LDPC code to the memory 31 (in the column direction) from the top to the bottom of each of the 4 columns of the memory 31, where the writing operation moves toward the right, starting from the leftmost column.

Further, when the writing of code bits up to the rightmost column is completed, the column twist interleaver 24 reads code bits from the memory 31 in the row direction, starting from the first row of all the columns of the memory 31, in units of 4 bits (i.e., mb bits), and outputs the read code bits as an LDPC code that has been subjected to column twist interleaving to the permutation unit 32 (FIGS. 22 and 23) of the demultiplexer 25.

In this regard, in the column twist interleaver 24, if the address of the first (or top) position of each column is represented by 0 and the addresses of the respective positions in the column direction are represented by integers arranged in ascending order, the write start position for the leftmost column is set to the position at the address 0, the write start position for the second column (from the left) is set to the position at the address 2, the write start position for the third column is set to the position at the address 4, and the write start position for the fourth column is set to the position of the address 7.

Note that, after writing code bits up to the bottom of the column for which the write start position is set to a position other than the position at the address 0, the column twist interleaver 24 returns to the first position (i.e., the position at the address 0), and writes code bits up to the position immediately before the write start position. The column twist interleaver 24 then performs writing to the subsequent (right) column.

The column twist interleaving operation described above may prevent a plurality of code bits corresponding to a plurality of variable nodes connected to the same check node for an LDPC code defined in DVB-T.2 and similar standards from being mapped to one symbol of 16APSK or 16QAM (i.e., from being included in the same symbol). Therefore, decoding performance can be improved in a communication path with an erasure.

FIG. 29 illustrates the number of columns of the memory 31 which is necessary for column twist interleaving, and the addresses of write start positions, in association with each modulation scheme, for an LDPC code having a code length N of 64800 and each of the 11 code rates, which is defined in the DVB-T.2 standard.

The multiple b is 1, and the number of bits m of one symbol is 2 when, for example, QPSK is employed as a modulation scheme. In this case, as illustrated in FIG. 29, the memory 31 has 2 columns for storing 2×1 (=mb) bits in its row direction, and stores 64800/(2×1) bits in its column direction.

Further, the write start position for the first column out of the 2 columns of the memory 31 is set to the position at the address 0, and the write start position for the second column is set to the position at the address 2.

The multiple b is 1 when, for example, one of the first to third permutation types illustrated in FIG. 22 is employed as the permutation type of the permutation processing of the demultiplexer 25 (FIG. 9).

The multiple b is 2, and the number of bits m of one symbol is 2 when, for example, QPSK is employed as a modulation scheme. In this case, as illustrated in FIG. 29, the memory 31 has 4 columns for storing 2×2 bits in its row direction, and stores 64800/(2×2) bits in its column direction.

Further, the write start position for the first column out of the 4 columns of the memory 31 is set to the position at the address 0, the write start position for the second column is set to the position at the address 2, the write start position for the third column is set to the position at the address 4, and the write start position for the fourth column is set to the position at the address 7.

Note that the multiple b is 2 when, for example, the fourth permutation type illustrated in FIG. 23 is employed as the permutation type of the permutation processing of the demultiplexer 25 (FIG. 9).

The multiple b is 1, and the number of bits m of one symbol is 4 when, for example, 16QAM is employed as a modulation scheme. In this case, as illustrated in FIG. 29, the memory 31 has 4 columns for storing 4×1 bits in its row direction, and stores 64800/(4×1) bits in its column direction.

Further, the write start position for the first column out of the 4 columns of the memory 31 is set to the position at the address 0, the write start position for the second column is set to the position at the address 2, the write start position for the third column is set to the position at the address 4, and the write start position for the fourth column is set to the position at the address 7.

The multiple b is 2, and the number of bits m of one symbol is 4 when, for example, 16QAM is employed as a modulation scheme. In this case, as illustrated in FIG. 29, the memory 31 has 8 columns for storing 4×2 bits in its row direction, and stores 64800/(4×2) bits in its column direction.

Further, the write start position for the first column out of the 8 columns of the memory 31 is set to the position at the address 0, the write start position for the second column is set to the position at the address 0, the write start position for the third column is set to the position at the address 2, the write start position for the fourth column is set to the position at the address 4, the write start position for the fifth column is set to the position at the address 4, the write start position for the sixth column is set to the position at the address 5, the write start position for the seventh column is set to the position at the address 7, and the write start position for the eighth column is set to the position at the address 7.

The multiple b is 1, and the number of bits m of one symbol is 6 when, for example, 64QAM is employed as a modulation scheme. In this case, as illustrated in FIG. 29, the memory 31 has 6 columns for storing 6×1 bits in its row direction, and stores 64800/(6×1) bits in its column direction.

Further, the write start position for the first column out of the 6 columns of the memory 31 is set to the position at the address 0, the write start position for the second column is set to the position at the address 2, the write start position for the third column is set to the position at the address 5, the write start position for the fourth column is set to the position at the address 9, the write start position for the fifth column is set to the position at the address 10, and the write start position for the sixth column is set to the position at the address 13.

The multiple b is 2, and the number of bits m of one symbol is 6 when, for example, 64QAM is employed as a modulation scheme. In this case, as illustrated in FIG. 29, the memory 31 has 12 columns for storing 6×2 bits in its row direction, and stores 64800/(6×2) bits in its column direction.

Further, the write start position for the first column out of the 12 columns of the memory 31 is set to the position at the address 0, the write start position for the second column is set to the position at the address 0, the write start position for the third column is set to the position at the address 2, the write start position for the fourth column is set to the position at the address 2, the write start position for the fifth column is set to the position at the address 3, the write start position for the sixth column is set to the position at the address 4, the write start position for the seventh column is set to the position at the address 4, the write start position for the eighth column is set to the position at the address 5, the write start position for the ninth column is set to the position at the address 5, the write start position for the tenth column is set to the position at the address 7, the write start position for the eleventh column is set to the position at the address 8, and the write start position for the twelfth column is set to the position at the address 9.

The multiple b is 1, and the number of bits m of one symbol is 8 when, for example, 256QAM is employed as a modulation scheme. In this case, as illustrated in FIG. 29, the memory 31 has 8 columns for storing 8×1 bits in its row direction, and stores 64800/(8×1) bits in its column direction.

Further, the write start position for the first column out of the 8 columns of the memory 31 is set to the position at the address 0, the write start position for the second column is set to the position at the address 0, the write start position for the third column is set to the position at the address 2, the write start position for the fourth column is set to the position at the address 4, the write start position for the fifth column is set to the position at the address 4, the write start position for the sixth column is set to the position at the address 5, the write start position for the seventh column is set to the position at the address 7, and the write start position for the eighth column is set to the position at the address 7.

The multiple b is 2, and the number of bits m of one symbol is 8 when, for example, 256QAM is employed as a modulation scheme. In this case, as illustrated in FIG. 29, the memory 31 has 16 columns for storing 8×2 bits in its row direction, and stores 64800/(8×2) bits in its column direction.

Further, the write start position for the first column out of the 16 columns of the memory 31 is set to the position at the address 0, the write start position for the second column is set to the position at the address 2, the write start position for the third column is set to the position at the address 2, the write start position for the fourth column is set to the position at the address 2, the write start position for the fifth column is set to the position at the address 2, the write start position for the sixth column is set to the position at the address 3, the write start position for the seventh column is set to the position at the address 7, the write start position for the eighth column is set to the position at the address 15, the write start position for the ninth column is set to the position at the address 16, the write start position for the tenth column is set to the position at the address 20, the write start position for the eleventh column is set to the position at the address 22, the write start position for the twelfth column is set to the position at the address 22, the write start position for the thirteenth column is set to the position at the address 27, the write start position for the fourteenth column is set to the position at the address 27, the write start position for the fifteenth column is set to the position at the address 28, and the write start position for the sixteenth column is set to the position at the address 32.

The multiple b is 1, and the number of bits m of one symbol is 10 when, for example, 1024QAM is employed as a modulation scheme. In this case, as illustrated in FIG. 29, the memory 31 has 10 columns for storing 10×1 bits in its row direction, and stores 64800/(10×1) bits in its column direction.

Further, the write start position for the first column out of the 10 columns of the memory 31 is set to the position at the address 0, the write start position for the second column is set to the position at the address 3, the write start position for the third column is set to the position at the address 6, the write start position for the fourth column is set to the position at the address 8, the write start position for the fifth column is set to the position at the address 11, the write start position for the sixth column is set to the position at the address 13, the write start position for the seventh column is set to the position at the address 15, the write start position for the eighth column is set to the position at the address 17, the write start position for the ninth column is set to the position at the address 18, and the write start position for the tenth column is set to the position at the address 20.

The multiple b is 2, and the number of bits m of one symbol is 10 when, for example, 1024QAM is employed as a modulation scheme. In this case, as illustrated in FIG. 29, the memory 31 has 20 columns for storing 10×2 bits in its row direction, and stores 64800/(10×2) bits in its column direction.

Further, the write start position for the first column out of the 20 columns of the memory 31 is set to the position at the address 0, the write start position for the second column is set to the position at the address 1, the write start position for the third column is set to the position at the address 3, the write start position for the fourth column is set to the position at the address 4, the write start position for the fifth column is set to the position at the address 5, the write start position for the sixth column is set to the position at the address 6, the write start position for the seventh column is set to the position at the address 6, the write start position for the eighth column is set to the position at the address 9, the write start position for the ninth column is set to the position at the address 13, the write start position for the tenth column is set to the position at the address 14, the write start position for the eleventh column is set to the position at the address 14, the write start position for the twelfth column is set to the position at the address 16, the write start position for the thirteenth column is set to the position at the address 21, the write start position for the fourteenth column is set to the position at the address 21, the write start position for the fifteenth column is set to the position at the address 23, the write start position for the sixteenth column is set to the position at the address 25, the write start position for the seventeenth column is set to the position at the address 25, the write start position for the eighteenth column is set to the position at the address 26, the write start position for the nineteenth column is set to the position at the address 28, and the write start position for the twentieth column is set to the position at the address 30.

The multiple b is 1, and the number of bits m of one symbol is 12 when, for example, 4096QAM is employed as a modulation scheme. In this case, as illustrated in FIG. 29, the memory 31 has 12 columns for storing 12×1 bits in its row direction, and stores 64800/(12×1) bits in its column direction.

Further, the write start position for the first column out of the 12 columns of the memory 31 is set to the position at the address 0, the write start position for the second column is set to the position at the address 0, the write start position for the third column is set to the position at the address 2, the write start position for the fourth column is set to the position at the address 2, the write start position for the fifth column is set to the position at the address 3, the write start position for the sixth column is set to the position at the address 4, the write start position for the seventh column is set to the position at the address 4, the write start position for the eighth column is set to the position at the address 5, the write start position for the ninth column is set to the position at the address 5, the write start position for the tenth column is set to the position at the address 7, the write start position for the eleventh column is set to the position at the address 8, and the write start position for the twelfth column is set to the position at the address 9.

The multiple b is 2, and the number of bits m of one symbol is 12 when, for example, 4096QAM is employed as a modulation scheme. In this case, as illustrated in FIG. 29, the memory 31 has 24 columns for storing 12×2 bits in its row direction, and stores 64800/(12×2) bits in its column direction.

Further, the write start position for the first column out of the 24 columns of the memory 31 is set to the position at the address 0, the write start position for the second column is set to the position at the address 5, the write start position for the third column is set to the position at the address 8, the write start position for the fourth column is set to the position at the address 8, the write start position for the fifth column is set to the position at the address 8, the write start position for the sixth column is set to the position at the address 8, the write start position for the seventh column is set to the position at the address 10, the write start position for the eighth column is set to the position at the address 10, the write start position for the ninth column is set to the position at the address 10, the write start position for the tenth column is set to the position at the address 12, the write start position for the eleventh column is set to the position at the address 13, the write start position for the twelfth column is set to the position at the address 16, the write start position for the thirteenth column is set to the position at the address 17, the write start position for the fourteenth column is set to the position at the address 19, the write start position for the fifteenth column is set to the position at the address 21, the write start position for the sixteenth column is set to the position at the address 22, the write start position for the seventeenth column is set to the position at the address 23, the write start position for the eighteenth column is set to the position at the address 26, the write start position for the nineteenth column is set to the position at the address 37, the write start position for the twentieth column is set to the position at the address 39, the write start position for the twenty-first column is set to the position at the address 40, the write start position for the twenty-second column is set to the position at the address 41, the write start position for the twenty-third column is set to the position at the address 41, and the write start position for the twenty-fourth column is set to the position at the address 41.

FIG. 30 illustrates the number of columns of the memory 31 which is necessary for column twist interleaving, and the addresses of write start positions, in association with each modulation scheme, for an LDPC code having a code length N of 16200 and each of the 10 code rates, which is defined in the DVB-T.2 standard.

The multiple b is 1, and the number of bits m of one symbol is 2 when, for example, QPSK is employed as a modulation scheme. In this case, as illustrated in FIG. 30, the memory 31 has 2 columns for storing 2×1 bits in its row direction, and stores 16200/(2×1) bits in its column direction.

Further, the write start position for the first column out of the 2 columns of the memory 31 is set to the position at the address 0, and the write start position for the second column is set to the position at the address 0.

The multiple b is 2, and the number of bits m of one symbol is 2 when, for example, QPSK is employed as a modulation scheme. In this case, as illustrated in FIG. 30, the memory 31 has 4 columns for storing 2×2 bits in its row direction, and stores 16200/(2×2) bits in its column direction.

Further, the write start position for the first column out of the 4 columns of the memory 31 is set to the position at the address 0, the write start position for the second column is set to the position at the address 2, the write start position for the third column is set to the position at the address 3, and the write start position for the fourth column is set to the position at the address 3.

The multiple b is 1, and the number of bits m of one symbol is 4 when, for example, 16QAM is employed as a modulation scheme. In this case, as illustrated in FIG. 30, the memory 31 has 4 columns for storing 4×1 bits in its row direction, and stores 16200/(4×1) bits in its column direction.

Further, the write start position for the first column out of the 4 columns of the memory 31 is set to the position at the address 0, the write start position for the second column is set to the position at the address 2, the write start position for the third column is set to the position at the address 3, and the write start position for the fourth column is set to the position at the address 3.

The multiple b is 2, and the number of bits m of one symbol is 4 when, for example, 16QAM is employed as a modulation scheme. In this case, as illustrated in FIG. 30, the memory 31 has 8 columns for storing 4×2 bits in its row direction, and stores 16200/(4×2) bits in its column direction.

Further, the write start position for the first column out of the 8 columns of the memory 31 is set to the position at the address 0, the write start position for the second column is set to the position at the address 0, the write start position for the third column is set to the position at the address 0, the write start position for the fourth column is set to the position at the address 1, the write start position for the fifth column is set to the position at the address 7, the write start position for the sixth column is set to the position at the address 20, the write start position for the seventh column is set to the position at the address 20, and the write start position for the eighth column is set to the position at the address 21.

The multiple b is 1, and the number of bits m of one symbol is 6 when, for example, 64QAM is employed as a modulation scheme. In this case, as illustrated in FIG. 30, the memory 31 has 6 columns for storing 6×1 bits in its row direction, and stores 16200/(6×1) bits in its column direction.

Further, the write start position for the first column out of the 6 columns of the memory 31 is set to the position at the address 0, the write start position for the second column is set to the position at the address 0, the write start position for the third column is set to the position at the address 2, the write start position for the fourth column is set to the position at the address 3, the write start position for the fifth column is set to the position at the address 7, and the write start position for the sixth column is set to the position at the address 7.

The multiple b is 2, and the number of bits m of one symbol is 6 when, for example, 64QAM is employed as a modulation scheme. In this case, as illustrated in FIG. 30, the memory 31 has 12 columns for storing 6×2 bits in its row direction, and stores 16200/(6×2) bits in its column direction.

Further, the write start position for the first column out of the 12 columns of the memory 31 is set to the position at the address 0, the write start position for the second column is set to the position at the address 0, the write start position for the third column is set to the position at the address 0, the write start position for the fourth column is set to the position at the address 2, the write start position for the fifth column is set to the position at the address 2, the write start position for the sixth column is set to the position at the address 2, the write start position for the seventh column is set to the position at the address 3, the write start position for the eighth column is set to the position at the address 3, the write start position for the ninth column is set to the position at the address 3, the write start position for the tenth column is set to the position at the address 6, the write start position for the eleventh column is set to the position at the address 7, and the write start position for the twelfth column is set to the position at the address 7.

The multiple b is 1, and the number of bits m of one symbol is 8 when, for example, 256QAM is employed as a modulation scheme. In this case, as illustrated in FIG. 30, the memory 31 has 8 columns for storing 8×1 bits in its row direction, and stores 16200/(8×1) bits in its column direction.

Further, the write start position for the first column out of the 8 columns of the memory 31 is set to the position at the address 0, the write start position for the second column is set to the position at the address 0, the write start position for the third column is set to the position at the address 0, the write start position for the fourth column is set to the position at the address 1, the write start position for the fifth column is set to the position at the address 7, the write start position for the sixth column is set to the position at the address 20, the write start position for the seventh column is set to the position at the address 20, and the write start position for the eighth column is set to the position at the address 21.

The multiple b is 1, and the number of bits m of one symbol is 10 when, for example, 1024QAM is employed as a modulation scheme. In this case, as illustrated in FIG. 30, the memory 31 has 10 columns for storing 10×1 bits in its row direction, and stores 16200/(10×1) bits in its column direction.

Further, the write start position for the first column out of the 10 columns of the memory 31 is set to the position at the address 0, the write start position for the second column is set to the position at the address 1, the write start position for the third column is set to the position at the address 2, the write start position for the fourth column is set to the position at the address 2, the write start position for the fifth column is set to the position at the address 3, the write start position for the sixth column is set to the position at the address 3, the write start position for the seventh column is set to the position at the address 4, the write start position for the eighth column is set to the position at the address 4, the write start position for the ninth column is set to the position at the address 5, and the write start position for the tenth column is set to the position at the address 7.

The multiple b is 2, and the number of bits m of one symbol is 10 when, for example, 1024QAM is employed as a modulation scheme. In this case, as illustrated in FIG. 30, the memory 31 has 20 columns for storing 10×2 bits in its row direction, and stores 16200/(10×2) bits in its column direction.

Further, the write start position for the first column out of the 20 columns of the memory 31 is set to the position at the address 0, the write start position for the second column is set to the position at the address 0, the write start position for the third column is set to the position at the address 0, the write start position for the fourth column is set to the position at the address 2, the write start position for the fifth column is set to the position at the address 2, the write start position for the sixth column is set to the position at the address 2, the write start position for the seventh column is set to the position at the address 2, the write start position for the eighth column is set to the position at the address 2, the write start position for the ninth column is set to the position at the address 5, the write start position for the tenth column is set to the position at the address 5, the write start position for the eleventh column is set to the position at the address 5, the write start position for the twelfth column is set to the position at the address 5, the write start position for the thirteenth column is set to the position at the address 5, the write start position for the fourteenth column is set to the position at the address 7, the write start position for the fifteenth column is set to the position at the address 7, the write start position for the sixteenth column is set to the position at the address 7, the write start position for the seventeenth column is set to the position at the address 7, the write start position for the eighteenth column is set to the position at the address 8, the write start position for the nineteenth column is set to the position at the address 8, and the write start position for the twentieth column is set to the position at the address 10.

The multiple b is 1, and the number of bits m of one symbol is 12 when, for example, 4096QAM is employed as a modulation scheme. In this case, as illustrated in FIG. 30, the memory 31 has 12 columns for storing 12×1 bits in its row direction, and stores 16200/(12×1) bits in its column direction.

Further, the write start position for the first column out of the 12 columns of the memory 31 is set to the position at the address 0, the write start position for the second column is set to the position at the address 0, the write start position for the third column is set to the position at the address 0, the write start position for the fourth column is set to the position at the address 2, the write start position for the fifth column is set to the position at the address 2, the write start position for the sixth column is set to the position at the address 2, the write start position for the seventh column is set to the position at the address 3, the write start position for the eighth column is set to the position at the address 3, the write start position for the ninth column is set to the position at the address 3, the write start position for the tenth column is set to the position at the address 6, the write start position for the eleventh column is set to the position at the address 7, and the write start position for the twelfth column is set to the position at the address 7.

The multiple b is 2, and the number of bits m of one symbol is 12 when, for example, 4096QAM is employed as a modulation scheme. In this case, as illustrated in FIG. 30, the memory 31 has 24 columns for storing 12×2 bits in its row direction, and stores 16200/(12×2) bits in its column direction.

Further, the write start position for the first column out of the 24 columns of the memory 31 is set to the position at the address 0, the write start position for the second column is set to the position at the address 0, the write start position for the third column is set to the position at the address 0, the write start position for the fourth column is set to the position at the address 0, the write start position for the fifth column is set to the position at the address 0, the write start position for the sixth column is set to the position at the address 0, the write start position for the seventh column is set to the position at the address 0, the write start position for the eighth column is set to the position at the address 1, the write start position for the ninth column is set to the position at the address 1, the write start position for the tenth column is set to the position at the address 1, the write start position for the eleventh column is set to the position at the address 2, the write start position for the twelfth column is set to the position at the address 2, the write start position for the thirteenth column is set to the position at the address 2, the write start position for the fourteenth column is set to the position at the address 3, the write start position for the fifteenth column is set to the position at the address 7, the write start position for the sixteenth column is set to the position at the address 9, the write start position for the seventeenth column is set to the position at the address 9, the write start position for the eighteenth column is set to the position at the address 9, the write start position for the nineteenth column is set to the position at the address 10, the write start position for the twentieth column is set to the position at the address 10, the write start position for the twenty-first column is set to the position at the address 10, the write start position for the twenty-second column is set to the position at the address 10, the write start position for the twenty-third column is set to the position at the address 10, and the write start position for the twenty-fourth column is set to the position at the address 11.

Figure 31:
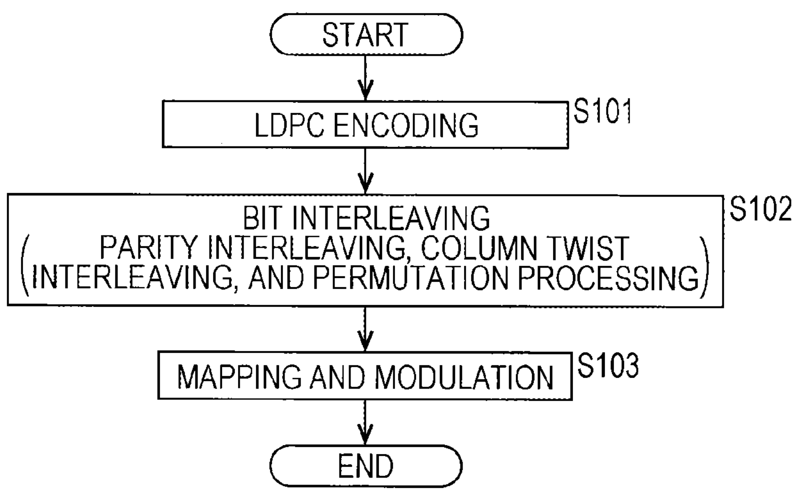
FIG. 31 is a flowchart depicting a process performed by the bit interleaver 116 and a QAM encoder 117.

FIG. 31 is a flowchart depicting a process performed in the LDPC encoder 115, the bit interleaver 116, and the QAM encoder 117 illustrated in FIG. 8.

The LDPC encoder 115 waits for LDPC target data to be supplied from the BCH encoder 114. In step S101, the LDPC encoder 115 encodes the LDPC target data into an LDPC code, and supplies the LDPC code to the bit interleaver 116. Then, the process proceeds to step S102.

In step S102, the bit interleaver 116 performs bit interleaving on the LDPC code supplied from the LDPC encoder 115, and supplies a symbol obtained by symbolizing the LDPC code that has been subjected to bit interleaving, to the QAM encoder 117. Then, the process proceeds to step S103.

More specifically, in step S102, in the bit interleaver 116 (FIG. 9), the parity interleaver 23 performs parity interleaving on the LDPC code supplied from the LDPC encoder 115, and supplies the LDPC code that has been subjected to parity interleaving to the column twist interleaver 24.

The column twist interleaver 24 performs column twist interleaving on the LDPC code supplied from the parity interleaver 23, and supplies the resulting LDPC code to the demultiplexer 25.

The demultiplexer 25 performs permutation processing to permute the code bits of the LDPC code that has been subjected to column twist interleaving by the column twist interleaver 24 and to map the permuted code bits to symbol bits of a symbol (i.e., bits representing the symbol).

Here, the permutation processing of the demultiplexer 25 may be performed in accordance with any of the first to fourth permutation types illustrated in FIGS. 22 and 23, and may also be performed in accordance with a certain predetermined allocation rule to allocate code bits of an LDPC code to symbol bits representing a symbol.

The symbols obtained by the permutation processing performed by the demultiplexer 25 are supplied from the demultiplexer 25 to the QAM encoder 117.

In step S103, the QAM encoder 117 maps the symbols supplied from the demultiplexer 25 to constellation points defined by the modulation scheme for the orthogonal modulation to be performed by the QAM encoder 117, and then performs orthogonal modulation. The resulting data is supplied to the time interleaver 118.

As described above, parity interleaving and column twist interleaving may improve resistance to erasures or burst errors in a case where a plurality of code bits of an LDPC code are transmitted as one symbol.

Here, in FIG. 9, the parity interleaver 23 serving as a block configured to perform parity interleaving and the column twist interleaver 24 serving as a block configured to perform column twist interleaving are configured as separate units, for convenience of illustration. However, the parity interleaver 23 and the column twist interleaver 24 may be integrated into a single unit.

More specifically, both parity interleaving and column twist interleaving can be performed by writing and reading code bits to and from a memory, and can be represented by a matrix that converts an address at which a code bit is to be written i.e., a write address) to an address at which a code bit is to be read (i.e., a read address).

Accordingly, once a matrix obtained by multiplying a matrix representing parity interleaving and a matrix representing column twist interleaving is determined, an LDPC code that has been subjected to parity interleaving and then column twist interleaving can be obtained by converting code bits using the determined matrix.

Furthermore, the demultiplexer 25 in addition to the parity interleaver 23 and the column twist interleaver 24 may also be integrated into a single unit.

More specifically, the permutation processing performed in the demultiplexer 25 can also be represented by a matrix that converts a write address in the memory 31 at which an LDPC code is stored to a read address.

Accordingly, once a matrix obtained by multiplying a matrix representing parity interleaving, a matrix representing column twist interleaving, and a matrix representing permutation processing is determined, parity interleaving, column twist interleaving, and permutation processing can be performed in a batch way using the determined matrix.

Note that either parity interleaving or column twist interleaving may be performed, or neither of them may be performed. For example, as in the DVB-S.2 system, if the communication path 13 (FIG. 7) is a non-AWGN channel that does not much take into account burst errors, flutters, and so forth, such as a satellite link, none of parity interleaving and column twist interleaving may be performed.

Next, simulations for measuring error rates (bit error rates) that were performed on the transmitting device 11 illustrated in FIG. 8 will be described with reference to FIGS. 32 to 34.

The simulations were performed using a communication path with a flutter having a D/U of 0 dB.

FIG. 32 illustrates a model of a communication path employed in the simulations.

More specifically, part A of FIG. 32 illustrates a model of a flutter employed in the simulations.

Further, part B of FIG. 32 illustrates a model of a communication path having the flutter represented by the model illustrated in part A of FIG. 32.

Note that, in part B of FIG. 32, H represents the model of the flutter illustrated in part A of FIG. 32. In part B of FIG. 32, furthermore, N represents the ICI (Inter Carrier Interference). In the simulations, an expected value $E[N^2]$ of the power of the ICI was approximated by AWGN.

Figure 33:
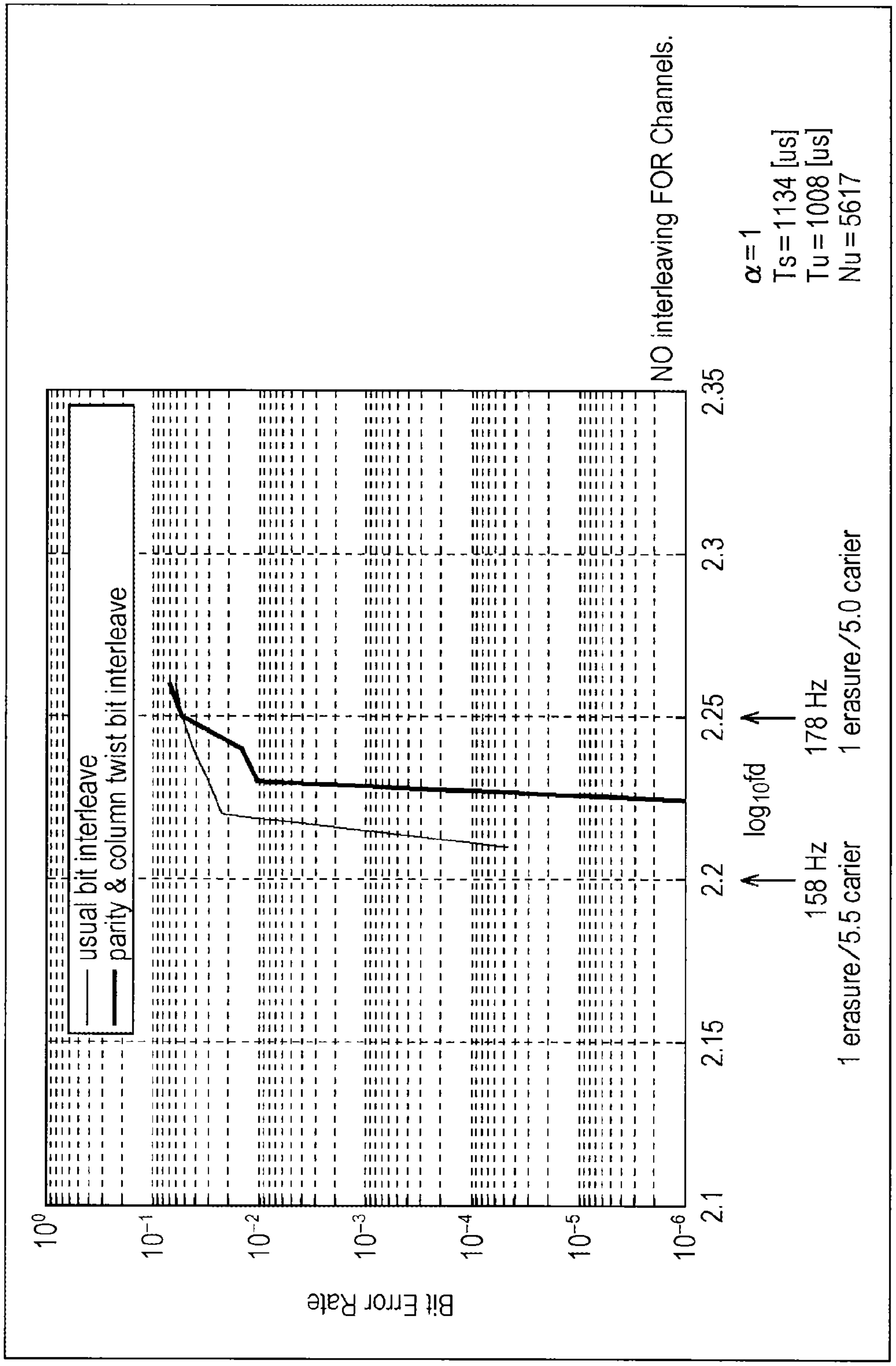
FIG. 33 is a diagram illustrating relationships between Doppler frequencies $f_d$ of flutters and error rates obtained in simulations.
Figure 34:
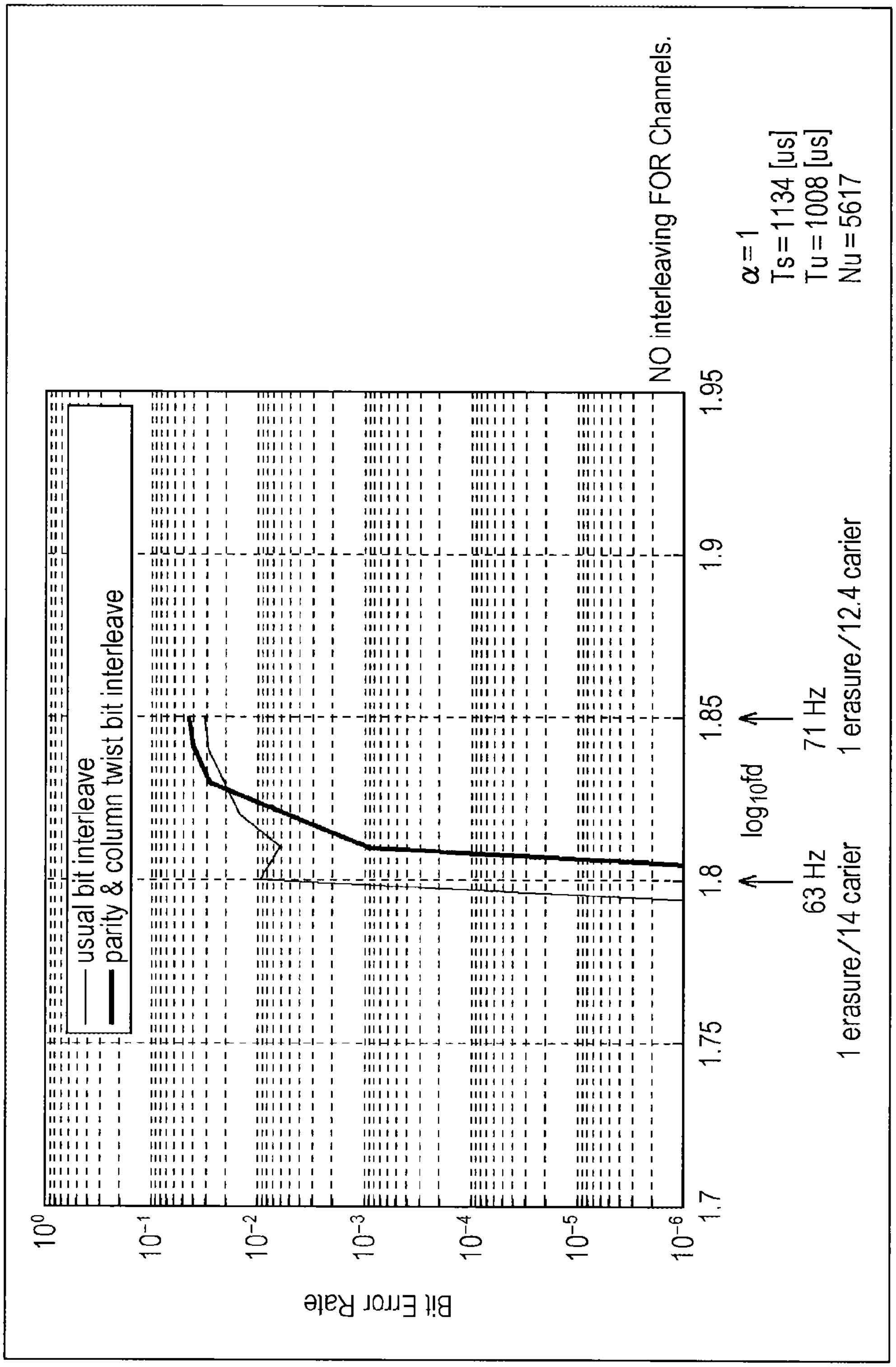
FIG. 34 is a diagram illustrating relationships between Doppler frequencies $f_d$ of flutters and error rates obtained in the simulations.

FIGS. 33 and 34 illustrate relationships between Doppler frequencies $f_d$ of flutters and error rates obtained in the simulations.

Note that FIG. 33 illustrates relationships between error rates and Doppler frequencies $f_d$ in a case where the modulation scheme is 16QAM, the code rate (r) is 3/4, and the permutation type is the first permutation type. FIG. 34 illustrates relationships between error rates and Doppler frequencies $f_d$ in a case where the modulation scheme is 64QAM, the code rate (r) is 5/6, and the permutation type is the first permutation type.

In FIGS. 33 and 34, furthermore, bold lines indicate relationships between error rates and Doppler frequencies $f_d$ in a case where parity interleaving, column twist interleaving, and permutation processing were all carried out, and thin lines indicate relationships between error rates and Doppler frequencies $f_d$ in a case where only permutation processing out of parity interleaving, column twist interleaving, and permutation processing was carried out.

It can be seen from any of FIGS. 33 and 34 that the error-rate performance is improved (i.e., error rates are reduced) in the case where parity interleaving, column twist interleaving, and permutation processing were all carried out, compared to the case where only permutation processing was carried out.

[Example Configuration of LDPC Encoder 115]

Figure 35:
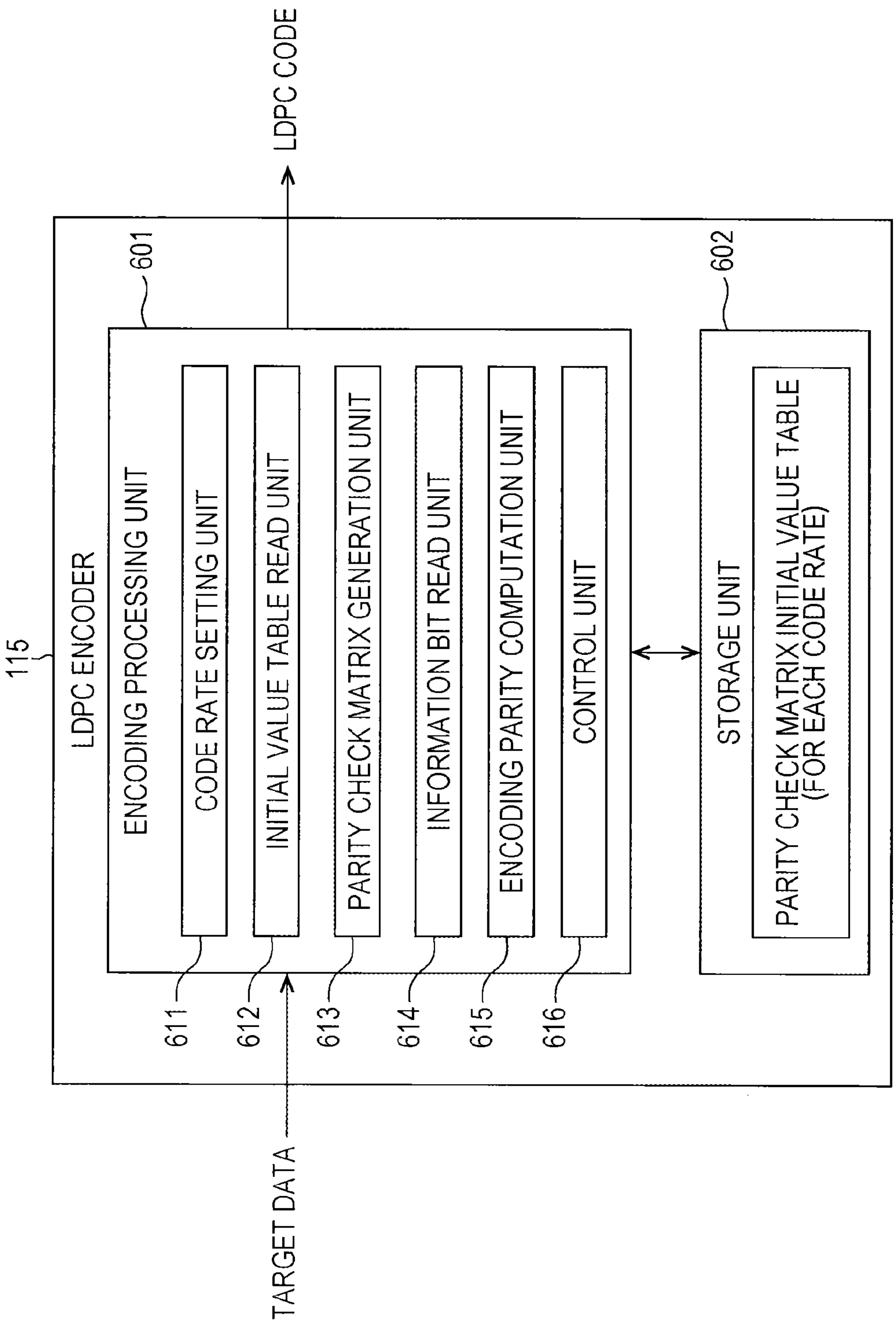
FIG. 35 is a block diagram illustrating an example configuration of an LDPC encoder 115.

FIG. 35 is a block diagram illustrating an example configuration of the LDPC encoder 115 illustrated in FIG. 8.

Note that the LDPC encoder 122 illustrated in FIG. 8 also has a similar configuration.

As described with reference to FIGS. 12 and 13, LDPC codes having two types of code lengths N of 64800 bits and 16200 bits are defined in the DVS-S.2 and similar standards.

In addition, 11 code rates, 1/4, 1/3, 2/5, 1/2, 3/5, 2/3, 3/4, 4/5, 5/6, 8/9, and 9/10, are defined for LDPC codes having a code length N of 64800 bits, and 10 code rates, 1/4, 1/3, 2/5, 1/2, 3/5, 2/3, 3/4, 4/5, 5/6, and 8/9, are defined for LDPC codes having a code length N of 16200 bits (FIGS. 12 and 13).

The LDPC encoder 115 is capable of performing encoding (i.e., error correcting encoding) using, for example, the LDPC codes having code lengths N of 64800 bits and 16200 bits and the respective code rates, in accordance with the parity check matrix H prepared for each code length N and each code rate.

The LDPC encoder 115 includes an encoding processing unit 601 and a storage unit 602.

The encoding processing unit 601 includes a code rate setting unit 611, an initial value table read unit 612, a parity check matrix generation unit 613, an information bit read unit 614, an encoding parity computation unit 615, and a control unit 616. The encoding processing unit 601 performs LDPC encoding on the LDPC target data supplied to the LDPC encoder 115, and supplies the resulting LDPC code to the bit interleaver 116 (FIG. 8).

More specifically, the code rate setting unit 611 sets a code length N and a code rate of the LDPC code in accordance with, for example, an operation of an operator or the like.

The initial value table read unit 612 reads a parity check matrix initial value table, described below, corresponding to the code length N and code rate set by the code rate setting unit 611 from the storage unit 602.

The parity check matrix generation unit 613 generates a parity check matrix H on the basis of the parity check matrix initial value table read by the initial value table read unit 612, by arranging elements of 1 in an information matrix $H_A$ having an information length K (=code length N−parity length M) corresponding to the code length N and code rate set by the code rate setting unit 611, in a column direction at intervals of 360 columns (i.e., the number of unit columns P of the cyclic structure). The parity check matrix H is stored in the storage unit 602.

The information bit read unit 614 reads (or extracts) information bits corresponding to the information length K from the LDPC target data supplied to the LDPC encoder 115.

The encoding parity computation unit 615 reads the parity check matrix H generated by the parity check matrix generation unit 613 from the storage unit 602, and generates a code word (i.e., an LDPC code) by calculating parity bits corresponding to the information bits read by the information bit read unit 614 in accordance with a certain formula by using the parity check matrix H.

The control unit 616 controls the blocks included in the encoding processing unit 601.

The storage unit 602 has stored therein a plurality of parity check matrix initial value tables and the like respectively corresponding to the plurality of code rates and the like illustrated in FIGS. 12 and 13 for the respective code lengths N such as 64800 bits and 16200 bits. In addition, the storage unit 602 temporarily stores data necessary for the processing of the encoding processing unit 601.

Figures 36, 37:
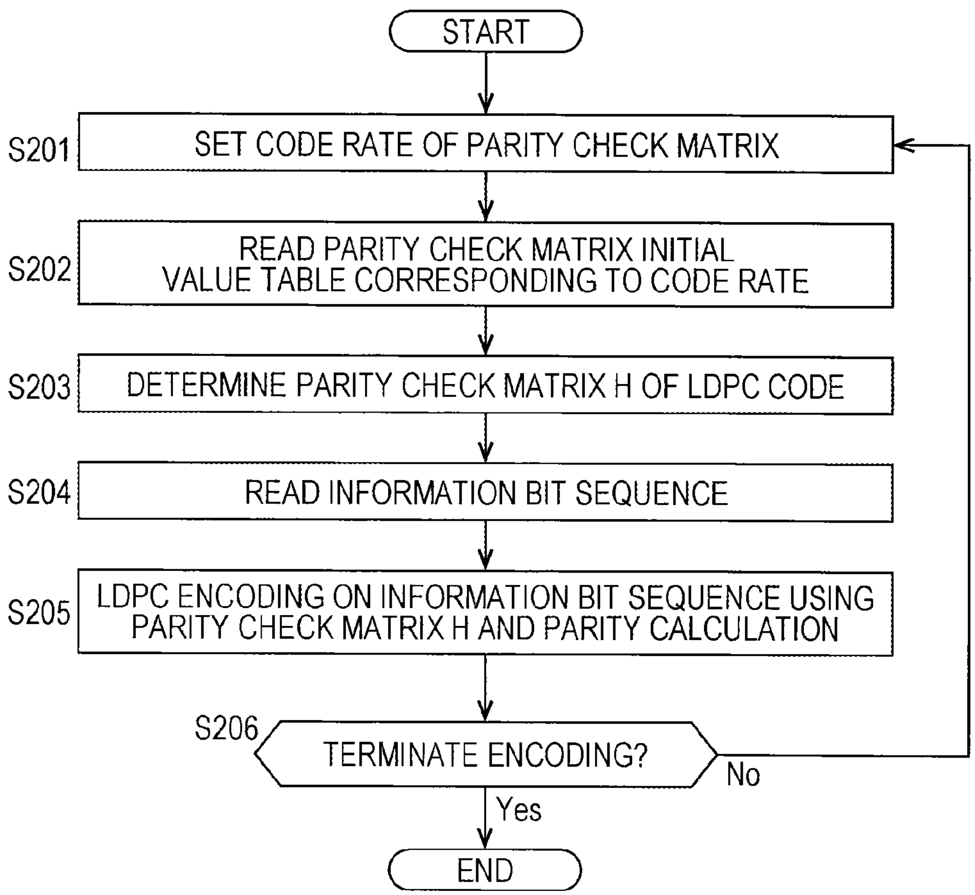
FIG. 36 is a flowchart depicting a process of the LDPC encoder 115.
FIG. 37 is a diagram illustrating an example of a parity check matrix initial value table with the code rate 1/4 and the code length 16200.

FIG. 36 is a flowchart depicting a process of the LDPC encoder 115 illustrated in FIG. 35.

In step S201, the code rate setting unit 611 determines (or sets) a code length N and a code rate r for LDPC encoding.

In step S202, the initial value table read unit 612 reads a predetermined parity check matrix initial value table corresponding to the code length N and code rate r determined by the code rate setting unit 611 from the storage unit 602.

In step S203, the parity check matrix generation unit 613 determines (or generates) a parity check matrix H of an LDPC code having the code length N and code rate r determined by the code rate setting unit 611 by using the parity check matrix initial value table read by the initial value table read unit 612 from the storage unit 602, and supplies the parity check matrix H to the storage unit 602 for storage.

In step S204, the information bit read unit 614 reads information bits of the information length K (=N×r) corresponding to the code length N and code rate r determined by the code rate setting unit 611 from the LDPC target data supplied to the LDPC encoder 115, and also reads the parity check matrix H determined by the parity check matrix generation unit 613 from the storage unit 602. Then, the information bit read unit 614 supplies the read information bits and parity check matrix H to the encoding parity computation unit 615.

In step S205, the encoding parity computation unit 615 sequentially computes parity bits of a code word c satisfying Expression (8) by using the information bits and the parity check matrix H supplied from the information bit read unit 614.

$$Hc^T=0 \tag{8}$$

In Expression (8), c denotes a row vector as a code word (i.e., LDPC code), and $c^T$ denotes the transpose of the row vector c.

Here, as described above, if an information bit portion of the row vector c as the LDPC code (i.e., one code word) is represented by a row vector A and a parity bit portion is represented by a row vector T, the row vector c can be represented by the equation c=[A|T] using the row vector A corresponding to information bits and the row vector T corresponding to parity bits.

It is necessary for the parity check matrix H and the row vector c=[A|T] corresponding to the LDPC code to satisfy the equation $Hc^T=0$. The values of the elements of the row vector T corresponding to parity bits in the row vector c=[A|T] satisfying the equation $Hc^T=0$ can be sequentially determined by setting the elements in the respective rows of the column vector $Hc^T$ in the equation $Hc^T=0$ to zero in order, starting from the element in the first row, in a case where the parity matrix $H_T$ in the parity check matrix $H=[H_A|H_T]$ has the stepwise structure illustrated in FIG. 11.

The encoding parity computation unit 615 determines parity bits T corresponding to the information bits A supplied from the information bit read unit 614, and outputs a code word c=[A|T], which is represented by the information bits A and the parity bits T, as a result of LDPC encoding of the information bits A.

Then, in step S206, the control unit 616 determines whether or not to terminate the LDPC encoding operation. If it is determined in step S206 that the LDPC encoding operation is not to be terminated, for example, if there is any LDPC target data to be subjected to LDPC encoding, the process returns to step S201 (or step S204), and the processing of steps S201 (or steps S204) to S206 is subsequently repeatedly performed.

Further, if it is determined in step S206 that the LDPC encoding operation is to be terminated, for example, if there is no LDPC target data to be subjected to LDPC encoding, the LDPC encoder 115 terminates the process.

As described above, parity check matrix initial value tables corresponding to the respective code lengths N and the respective code rates r are prepared, and the LDPC encoder 115 performs LDPC encoding with a certain code length N and a certain code rate r by using a parity check matrix H generated from the parity check matrix initial value table corresponding to the certain code length N and the certain code rate r.

[Example of Parity Check Matrix Initial Value Table]

A parity check matrix initial value table is a table showing the positions of elements of 1 in an information matrix $H_A$ (FIG. 10) having an information length K corresponding to a code length N and code rate r of an LDPC code (i.e., an LDPC code defined by the parity check matrix H) in the parity check matrix H, in units of 360 columns (i.e., the number of unit columns P of the cyclic structure). A parity check matrix initial value table is created in advance for each of parity check matrices H having the respective code lengths N and the respective code rates r.

FIG. 37 is a diagram illustrating an example of a parity check matrix initial value table.

More specifically, FIG. 37 illustrates a parity check matrix initial value table for a parity check matrix H having a code length N of 16200 bits and a code rate (nominal code rate defined in DVB-T.2) r of 1/4, which is defined in the DVB-T.2 standard.

The parity check matrix generation unit 613 (FIG. 35) determines a parity check matrix H in the following way using the parity check matrix initial value table.

Figure 38:
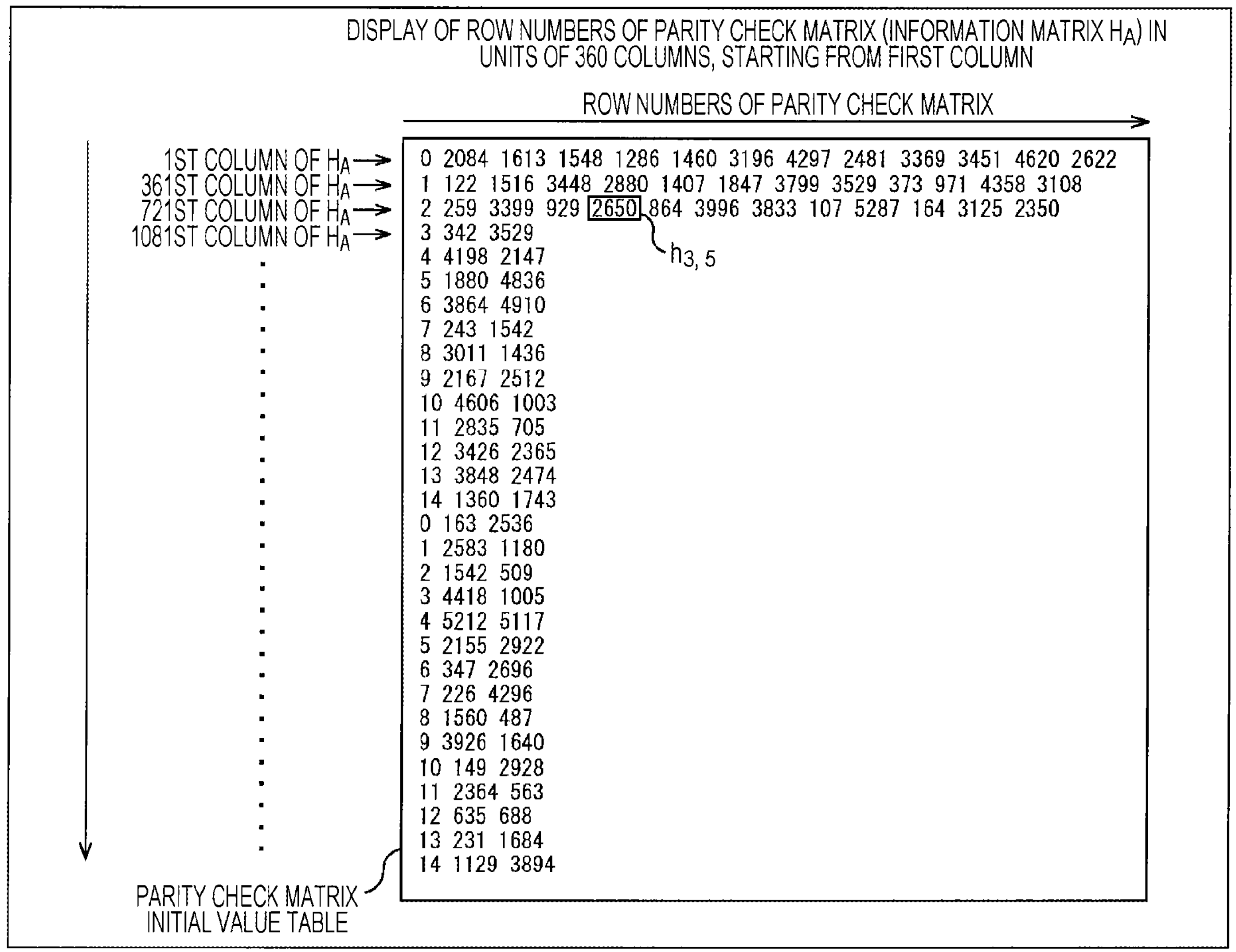
FIG. 38 is a diagram depicting a method for determining a parity check matrix H from a parity check matrix initial value table.

More specifically, FIG. 38 illustrates a method for determining a parity check matrix H from a parity check matrix initial value table.

Note that the parity check matrix initial value table illustrated in FIG. 38 is a parity check matrix initial value table for a parity check matrix H having a code length N of 16200 bits and a code rate r of 2/3, which is defined in the DVB-T.2 standard.

As described above, a parity check matrix initial value table is a table showing the positions of elements of 1 in an information matrix $H_A$ (FIG. 10) having an information length K corresponding to a code length N and code rate r of an LDPC code in units of 360 columns (i.e., the number of unit columns P of the cyclic structure). In the i-th row of the parity check matrix initial value table, row numbers of elements of 1 in the {1+360×(i−1)}-th column of the parity check matrix H (i.e., row numbers in which the row number of the first row of the parity check matrix H is set to 0), the number of which is equal to the number of column weights assigned to the {1+360×(i−1)}-th column, are arranged.

Here, since the parity matrix $H_T$ (FIG. 10) of the parity check matrix H, corresponding to the parity length M, is determined in the manner illustrated in FIG. 25, the information matrix $H_A$ (FIG. 10) of the parity check matrix H, corresponding to the information length K, is determined using the parity check matrix initial value table.

The number of rows k+1 of the parity check matrix initial value table differs depending on the information length K.

A relationship given by Expression (9) is established between the information length K and the number of rows k+1 of the parity check matrix initial value table.

$$K=(k+1)\times 360 \quad (9)$$

Here, in Expression (9), 360 is the number of unit columns P of the cyclic structure described with reference to FIG. 26.

In the parity check matrix initial value table illustrated in FIG. 38, 13 values are arranged in each of the first to third rows, and three values are arranged in each of the fourth to (k+1)-th row (in FIG. 38, the 30th row).

Accordingly, the column weights of the parity check matrix H determined from the parity check matrix initial value table illustrated in FIG. 38 are 13 for the first to {1+360×(3−1)−1}-th columns, and 3 for the {1+360×(3−1)}-th to K-th columns.

In the parity check matrix initial value table illustrated in FIG. 38, the first row shows 0, 2084, 1613, 1548, 1286, 1460, 3196, 4297, 2481, 3369, 3451, 4620, and 2622, indicating that the elements of the rows with the row numbers 0, 2084, 1613, 1548, 1286, 1460, 3196, 4297, 2481, 3369, 3451, 4620, and 2622 in the first column of the parity check matrix H are 1 (and that the other elements are 0).

In the parity check matrix initial value table illustrated in FIG. 38, furthermore, the second row shows 1, 122, 1516, 3448, 2880, 1407, 1847, 3799, 3529, 373, 971, 4358, and 3108, indicating that the elements of the rows with the row numbers 1, 122, 1516, 3448, 2880, 1407, 1847, 3799, 3529, 373, 971, 4358, and 3108 in the 361st (=1+360×(2−1)) column of the parity check matrix H are 1.

In the manner described above, a parity check matrix initial value table shows the positions of elements of 1 in an information matrix $H_A$ of a parity check matrix H in units of 360 columns.

The elements in the columns other than the {1+360×(i−1)}-th column of the parity check matrix H, that is, the elements in the (2+360×(i−1))-th to (360×i)-th columns, are arranged by cyclically shifting the elements of 1 in the {1+360×(i−1)}-th column, which are defined using the parity check matrix initial value table, downward (i.e., downward along the columns) in a periodic manner in accordance with the parity length M.

More specifically, for example, the elements in the {2+360×(i−1)}-th column are obtained by cyclically shifting the elements in the {1+360×(i−1)}-th column downward by M/360 (=q). The elements in the subsequent {3+360×(i−1)}-th column are obtained by cyclically shifting the elements in the {1+360×(i−1)}-th column downward by 2×M/360 (=2×q) (i.e., by cyclically shifting the elements in the {2+360×(i−1)}-th column downward by M/360 (=q)).

It is assumed now that the value in the i-th row (i.e., the i-th row from the top) and the j-th column (i.e., the j-th column from the left) of a parity check matrix initial value table is represented by $h_{i,j}$, and the row number of the j-th element of 1 in the w-th column of a parity check matrix H is represented by $H_{w-j}$. In this case, the row number $H_{w-j}$ of an element of 1 in the w-th column, which is a column other than the {1+360×(i−1)}-th column of the parity check matrix H, can be determined using Expression (10).

$$H_{w-j}=\mathrm{mod}(h_{i,j}+\mathrm{mod}((w-1),P)\times q,M)$$

Here, mod(x, y) represents the remainder after division of x by y.

In addition, P denotes the number of unit columns of cyclic structure, described above, and is, for example, 360 in the DVB-S.2, DVB-T.2, and DVB-C.2 standards, as described above. Further, q denotes the value M/360 that is obtained by dividing the parity length M by the number of unit columns P of the cyclic structure (=360).

The parity check matrix generation unit 613 (FIG. 35) specifies a row number of an element of 1 in the {1+360×(i−1)}-th column of the parity check matrix H by using the parity check matrix initial value table.

The parity check matrix generation unit 613 (FIG. 35) further determines the row number $H_{w-j}$ of an element of 1 in the w-th column, which is a column other than the {1+360×(i−1)}-th column of the parity check matrix H, in accordance with Expression (10), and generates a parity check matrix H whose elements corresponding to the row numbers obtained in the way described above are 1.

[New LDPC Codes]

Incidentally, there has been a demand for proposing an improved version (hereinafter also referred to as "DVB-Sx") of the DVB-S.2 standard.

In the CfT (Call for Technology), which was submitted in the meeting for DVB-Sx standardization, a certain number of ModCods (which are combinations of modulation schemes (Modulation) and LDPC codes (Code)) are demanded for each range of C/N (Carrier to Noise Ratio) (SNR (Signal to Noise Ratio)) in accordance with use case.

More specifically, in the CfT, the first request is to prepare 20 ModCods for a C/N range of 7 dB from 5 dB to 12 dB for DTH (Direct To Home) use.

In the CfT, additionally, the second request is to prepare 22 ModCods for a C/N range of 12 dB from 12 dB to 24 dB, the third request is to prepare 12 ModCods for a C/N range of 8 dB from −3 dB to 5 dB, and the fourth request is to prepare 5 ModCods for a C/N range of 7 dB from −10 dB to −3 dB.

In the CfT, furthermore, it is also requested that the FER (Frame Error Rate) for the ModCods in the first to fourth requests be approximately $10^{-5}$ (or less).

Note that, in the CfT, the first request has a priority of "1", which is the highest, whereas the second to fourth requests have a priority of "2", which is lower than the priority of the first request.

Accordingly, the present technology provides (a parity check matrix of) an LDPC code capable of satisfying at least the first request having the highest priority in the CfT, as a new LDPC code.

Figure 39:
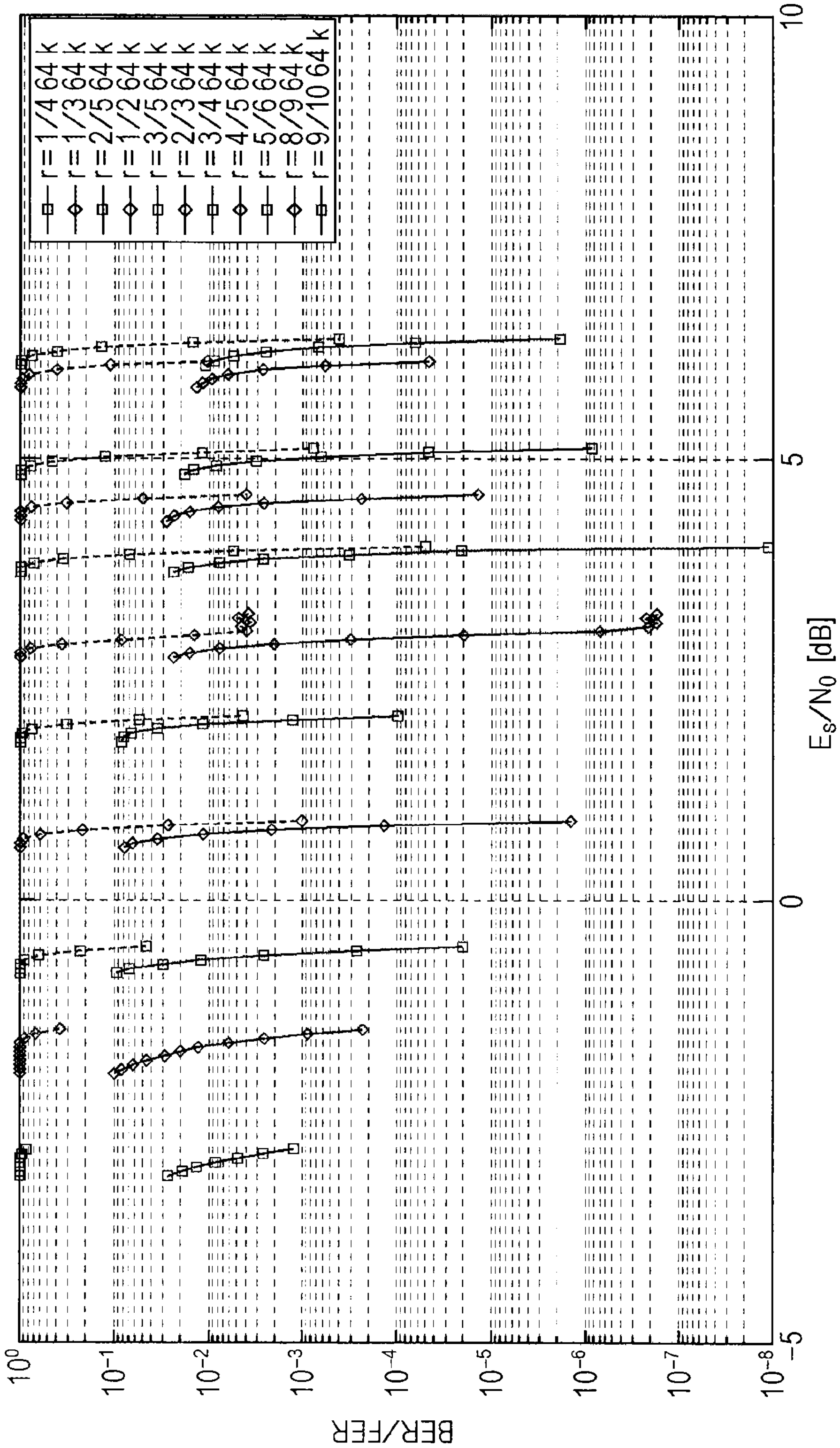
FIG. 39 is a diagram illustrating the BER/FER characteristics of an LDPC code having a code length of 64800 bits, which is defined in the DVB-S.2 standard.

FIG. 39 illustrates BER/FER curves for LDPC codes having a code length N of 64 k bits and 11 code rates, which are defined in the DVB-S.2, in a case where QPSK is employed as a modulation scheme.

In FIG. 39, the horizontal axis represents $E_s/N_0$ (the ratio of the signal power per symbol to the noise power) corresponding to the C/N, and the vertical axis represents FER/BER. Note that, in FIG. 39, solid lines indicate FERs, and dotted lines indicate BERs (Bit Error Rates).

In FIG. 39, FER (BER) curves for LDPC codes having a code length N of 64 k bits and 11 code rates, which are defined in the DVB-S.2 standard, are plotted for an $E_s/N_0$ range of 10 dB in a case where QPSK is employed as a modulation scheme.

More specifically, in FIG. 39, 11 FER curves for ModCods for which the modulation scheme is fixed to QPSK are drawn for an $E_s/N_0$ range of approximately 10 dB from approximately −3 dB to approximately 7 dB.

Accordingly, for LDPC codes having a code length N of 64 k bits and 11 code rates, which are defined in the DVB-S.2 standard, the interval between FER curves for ModCods on average (hereinafter also referred to as an "average interval") is approximately 1 dB (≅a 10 dB/(10−1)).

In contrast, since the first request in the CfT requests that 20 ModCods be prepared for an $E_s/N_c$ (C/N) range of 7 dB, the average interval between FER curves for ModCods is approximately 0.3 dB (≅7 dB/(20−1)).

In a case where the modulation scheme is fixed to one type such as QPSK, LDPC codes with code rates, the number of which is approximately three times (≅1 dB/0.3 dB) the 11 code rates, or approximately 30 code rates, would be sufficient to ensure sufficient room to obtain ModCods having an average interval of 0.3 dB which meets the first request in the CfT, compared to the case of DVB-S.2 in which ModCods having an average interval of approximately 1 dB are obtained using LDPC codes with the 11 code rates.

In the present technology, accordingly, LDPC codes having a code length of 64 k and code rates of i/30 (where i is a positive integer less than 30) are prepared as LDPC codes having code rates for which approximately 30 code rates are readily settable, and are provided as new LDPC codes which meet at least the first request having the highest priority in the CfT.

It is to be noted that parity matrices $H_T$ of parity check matrices H of the new LDPC codes have a stepwise structure (FIG. 11), similarly to an LDPC code defined in the DVB-S.2 standard, in terms of keeping compatibility with DVB-S.2 as much as possible.

In addition, similarly to an LDPC code defined in the DVB-S.2 standard, information matrices $H_A$ of parity check matrices H of the new LDPC codes have a cyclic structure, where the number of unit columns P of the cyclic structure is also 360.

Figures 40, 41:
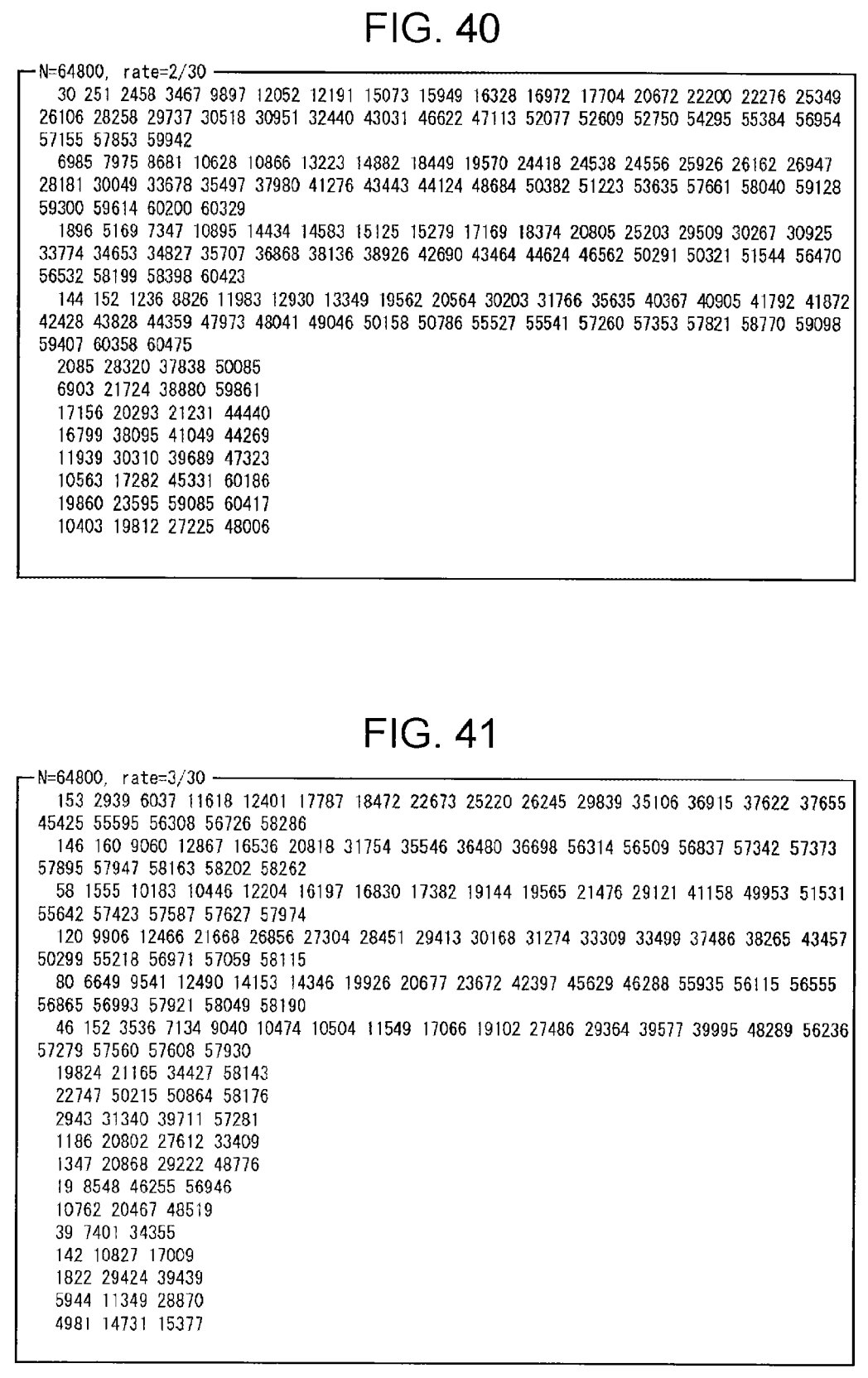

FIGS. 40 to 106 are diagrams illustrating an example of parity check matrix initial value tables for new LDPC codes having a code length N of 64 k bits and code rates of 1/30, as described above.

Here, the new LDPC codes are LDPC codes whose code rates are represented by i/30, and therefore include LDPC codes having up to 29 code rates, 1/30, 2/30, 3/30, . . . , 28/30, and 29/30.

However, an LDPC code with a code rate of 1/30 may be used in a limited fashion in terms of efficiency. In addition, an LDPC code with a code rate of 29/30 may be used in a limited fashion in terms of error rate (BER/FER).

For the reason described above, among LDPC codes with 29 code rates, namely, code rates of 1/30 to 29/30, one or both of an LDPC code with a code rate of 1/30 and an LDPC code with a code rate of 29/30 can be configured not to be used as new LDPC codes.

Herein, LDPC codes with 28 code rates, for example, LDPC codes with code rates of 2/30 to 29/30 among code rates of 1/30 to 29/30, are used as new LDPC codes, and parity check matrix initial value tables for parity check matrices H of the new LDPC codes will be given hereinbelow.

FIG. 40 illustrates a parity check matrix initial value table for a parity check matrix H of an LDPC code having a code length N of 64 k bits and a code rate r of 2/30.

FIG. 41 illustrates a parity check matrix initial value table for a parity check matrix H of an LDPC code having a code length N of 64 k bits and a code rate r of 3/30.

Figure 42:
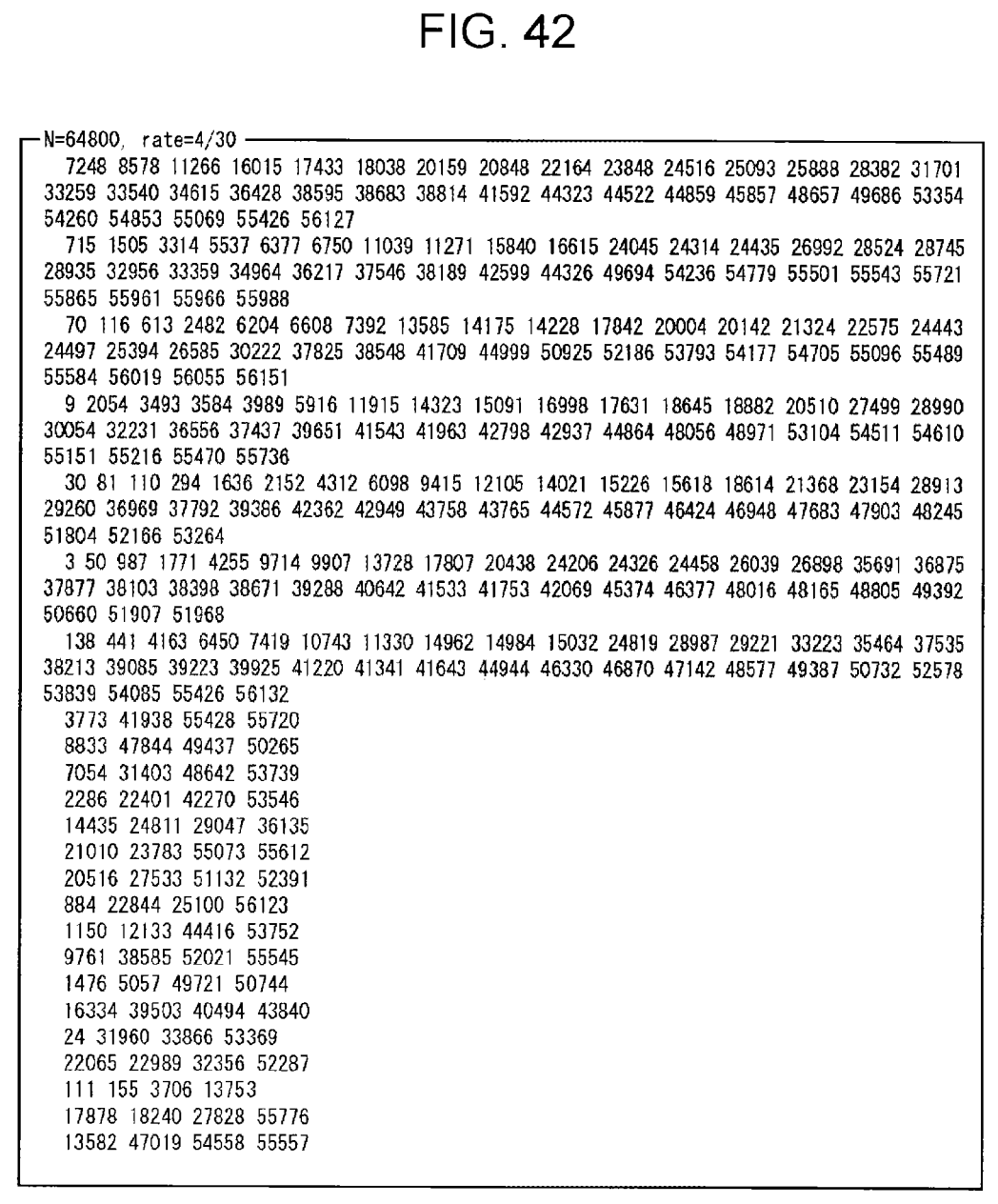

FIG. 42 illustrates a parity check matrix initial value table for a parity check matrix H of an LDPC code having a code length N of 64 k bits and a code rate r of 4/30.

Figure 43:
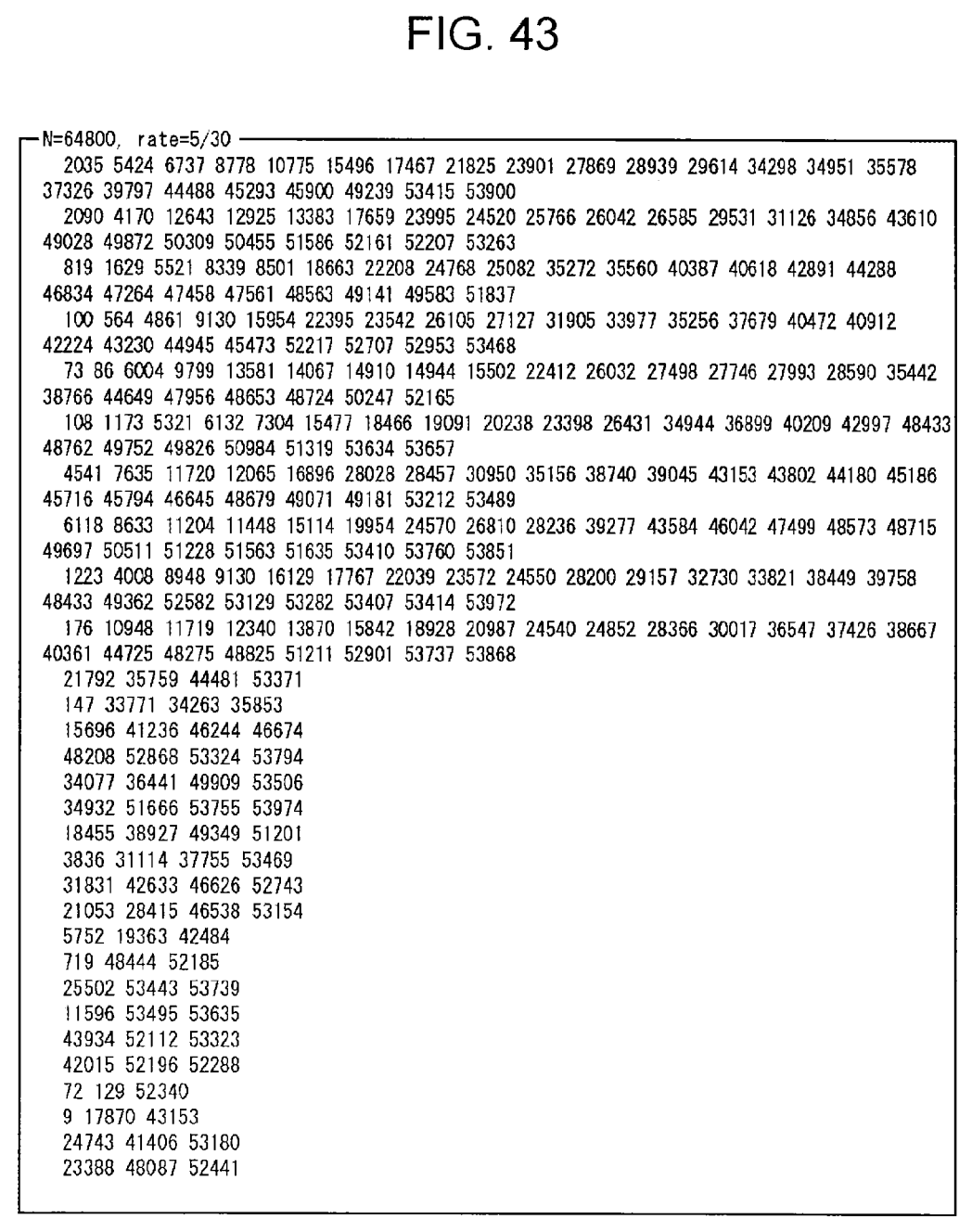

FIG. 43 illustrates a parity check matrix initial value table for a parity check matrix H of an LDPC code having a code length N of 64 k bits and a code rate r of 5/30.

Figure 44:
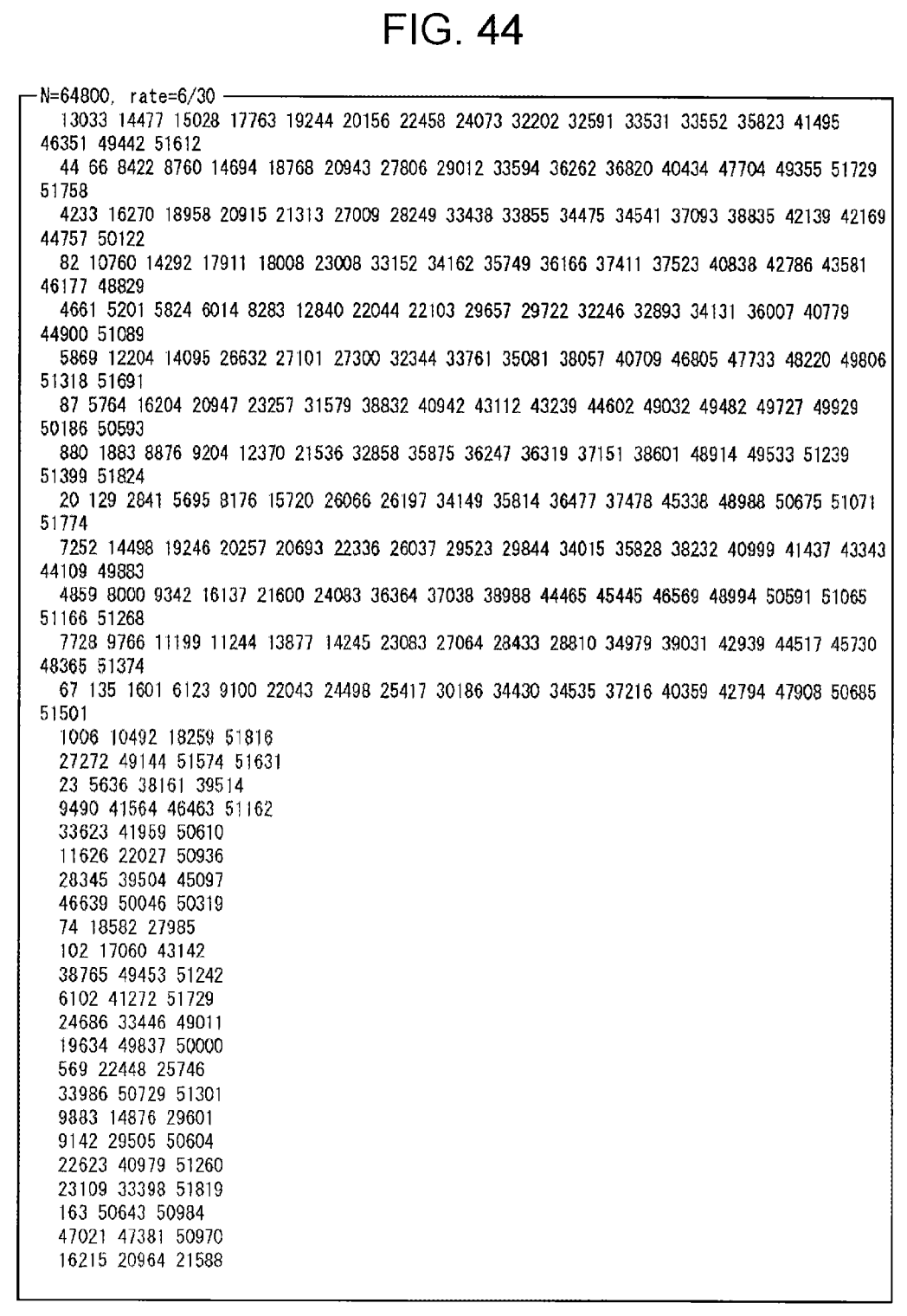

FIG. 44 illustrates a parity check matrix initial value table for a parity check matrix H of an LDPC code having a code length N of 64 k bits and a code rate r of 6/30.

Figure 45:
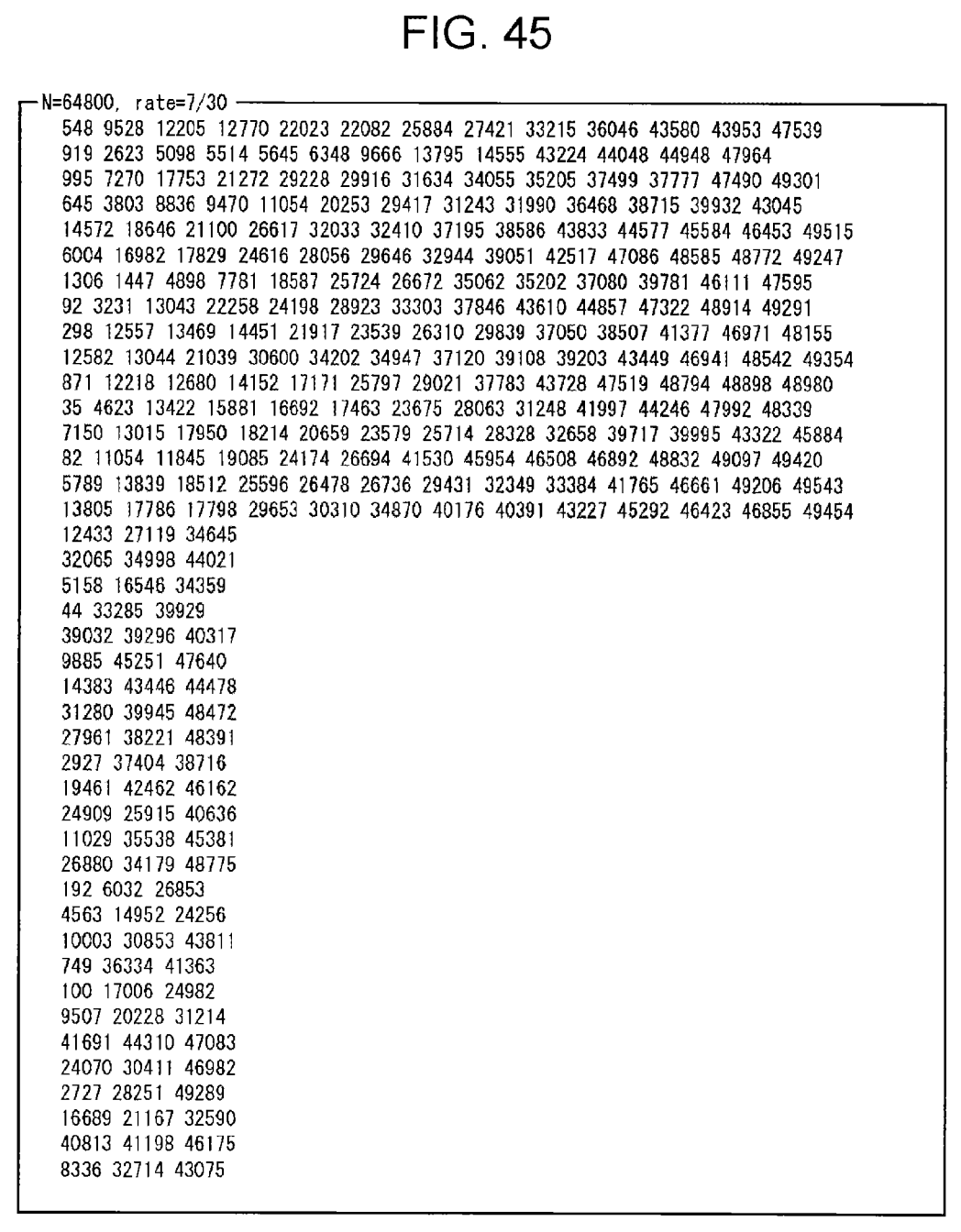

FIG. 45 illustrates a parity check matrix initial value table for a parity check matrix H of an LDPC code having a code length N of 64 k bits and a code rate r of 7/30.

Figure 46:
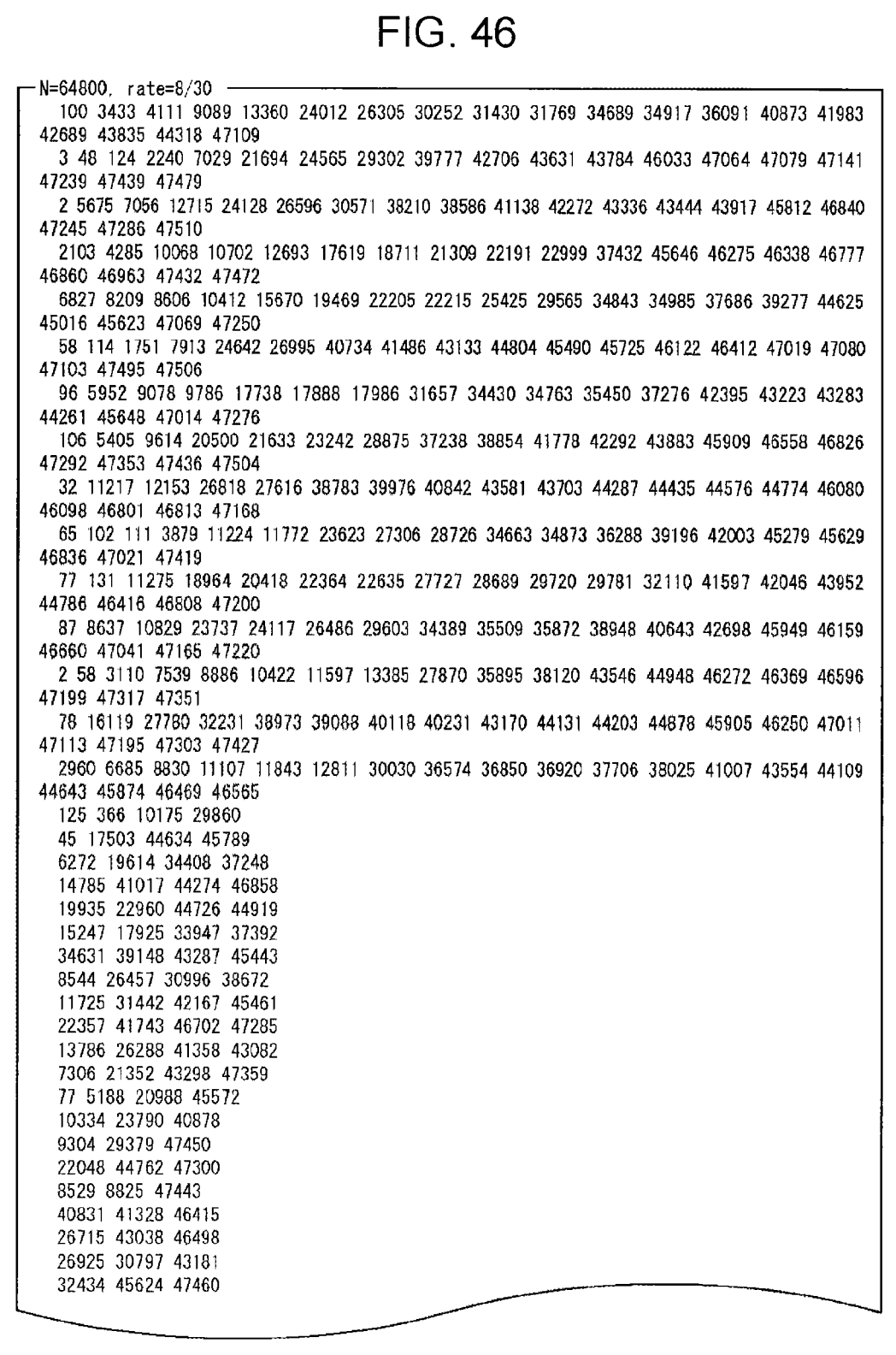

FIGS. 46 and 47 illustrate a parity check matrix initial value table for a parity check matrix H of an LDPC code having a code length N of 64 k bits and a code rate r of 8/30.

Figure 48:
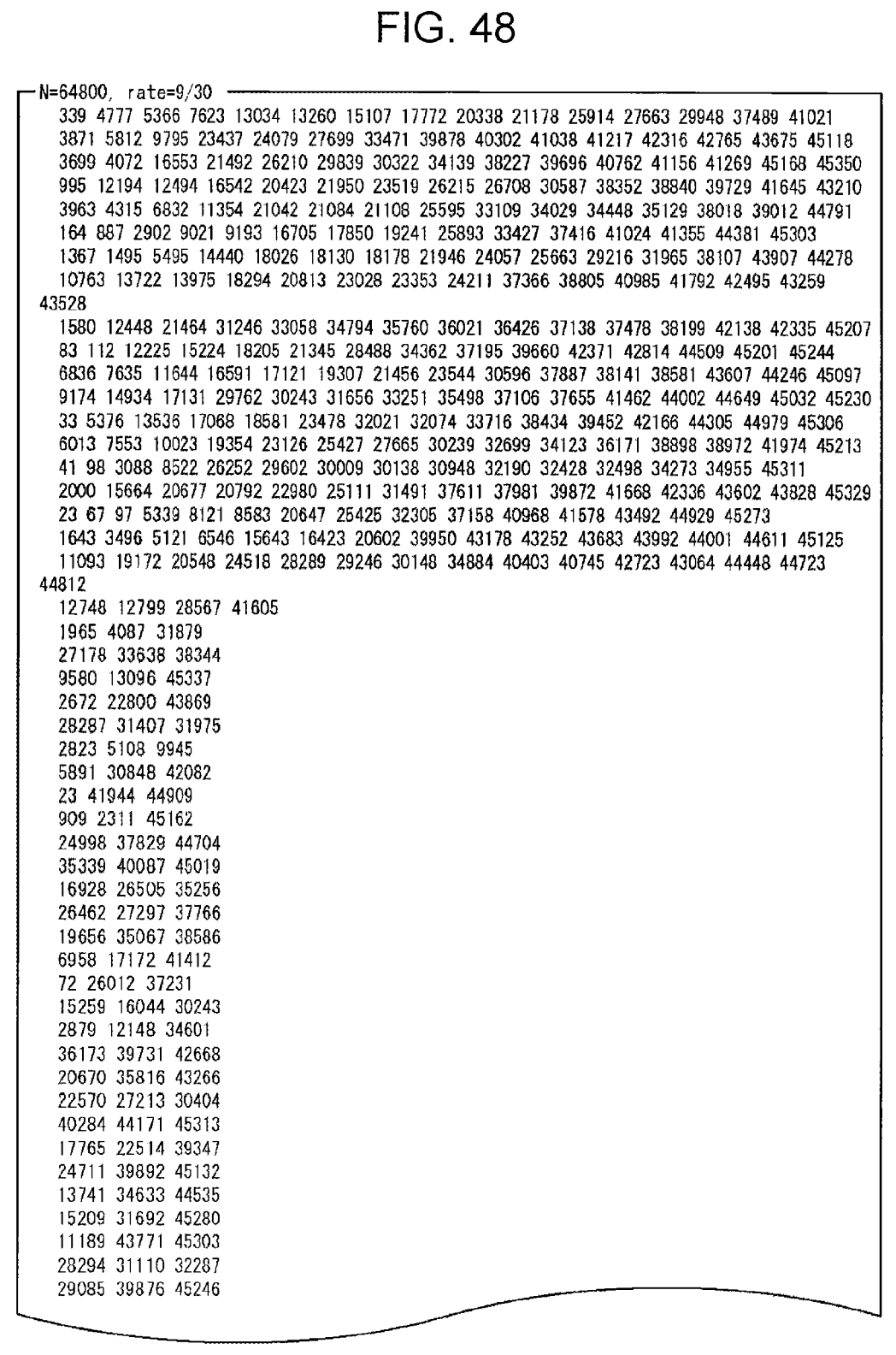
Figure 49:
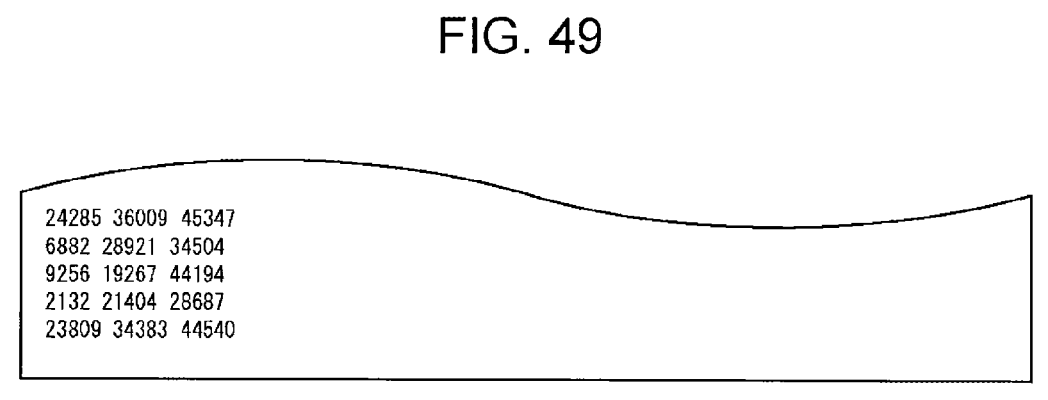

FIGS. 48 and 49 illustrate a parity check matrix initial value table for a parity check matrix H of an LDPC code having a code length N of 64 k bits and a code rate r of 9/30.

Figure 50:
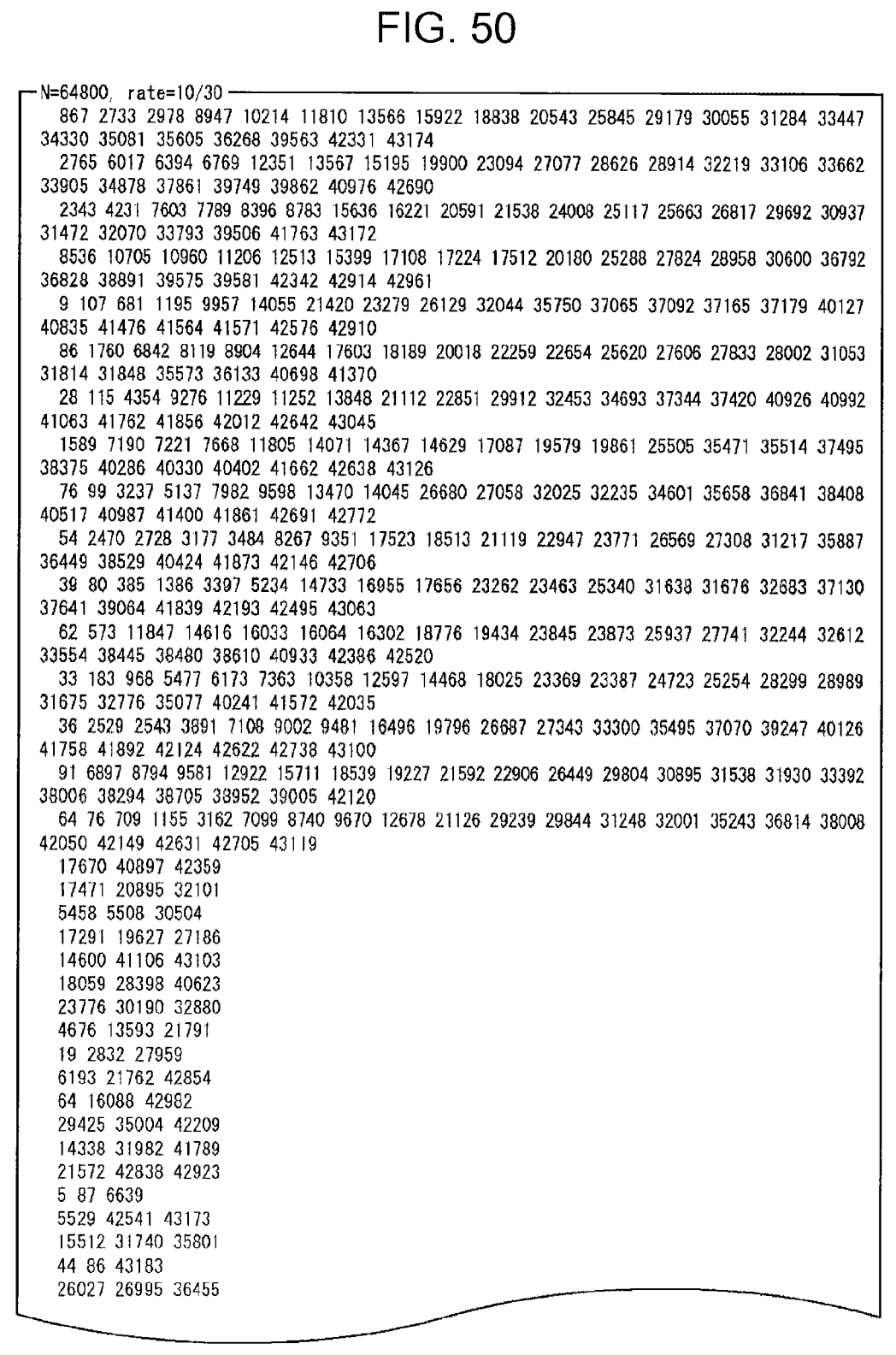
Figure 51:
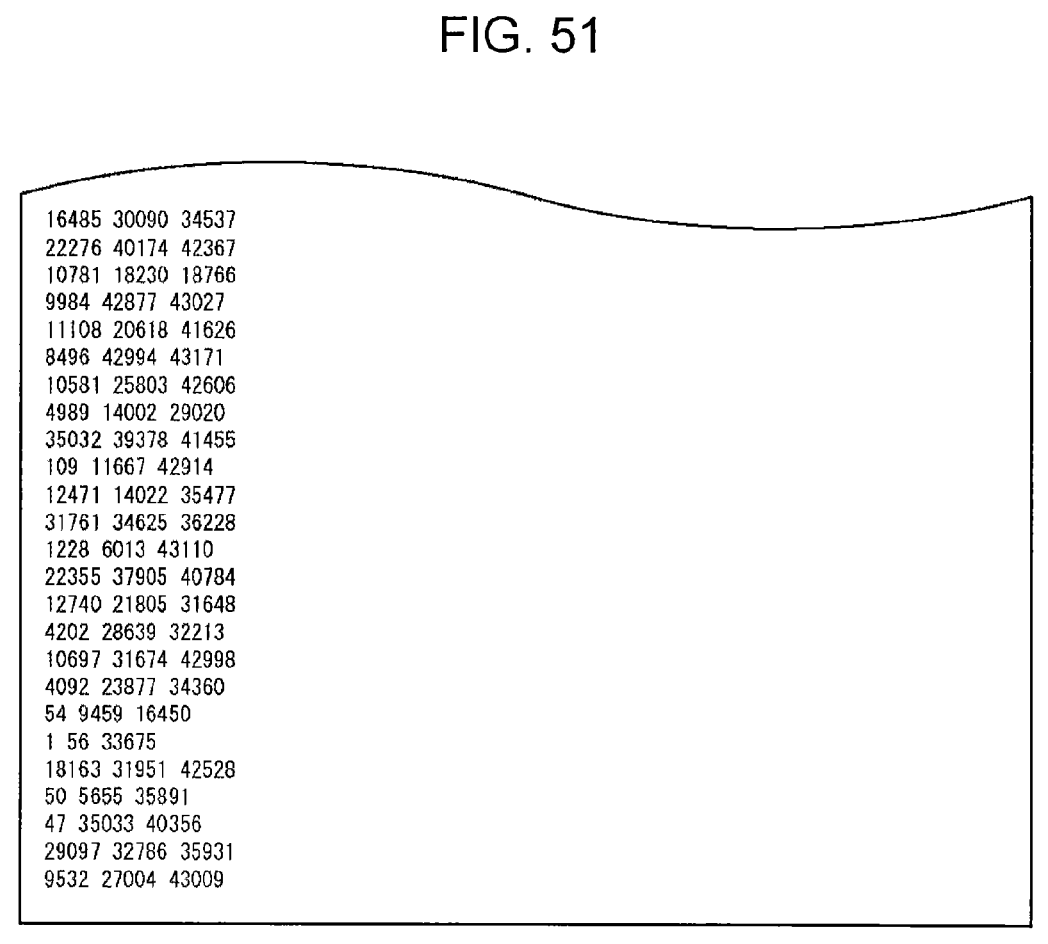

FIGS. 50 and 51 illustrate a parity check matrix initial value table for a parity check matrix H of an LDPC code having a code length N of 64 k bits and a code rate r of 10/30.

Figure 52:
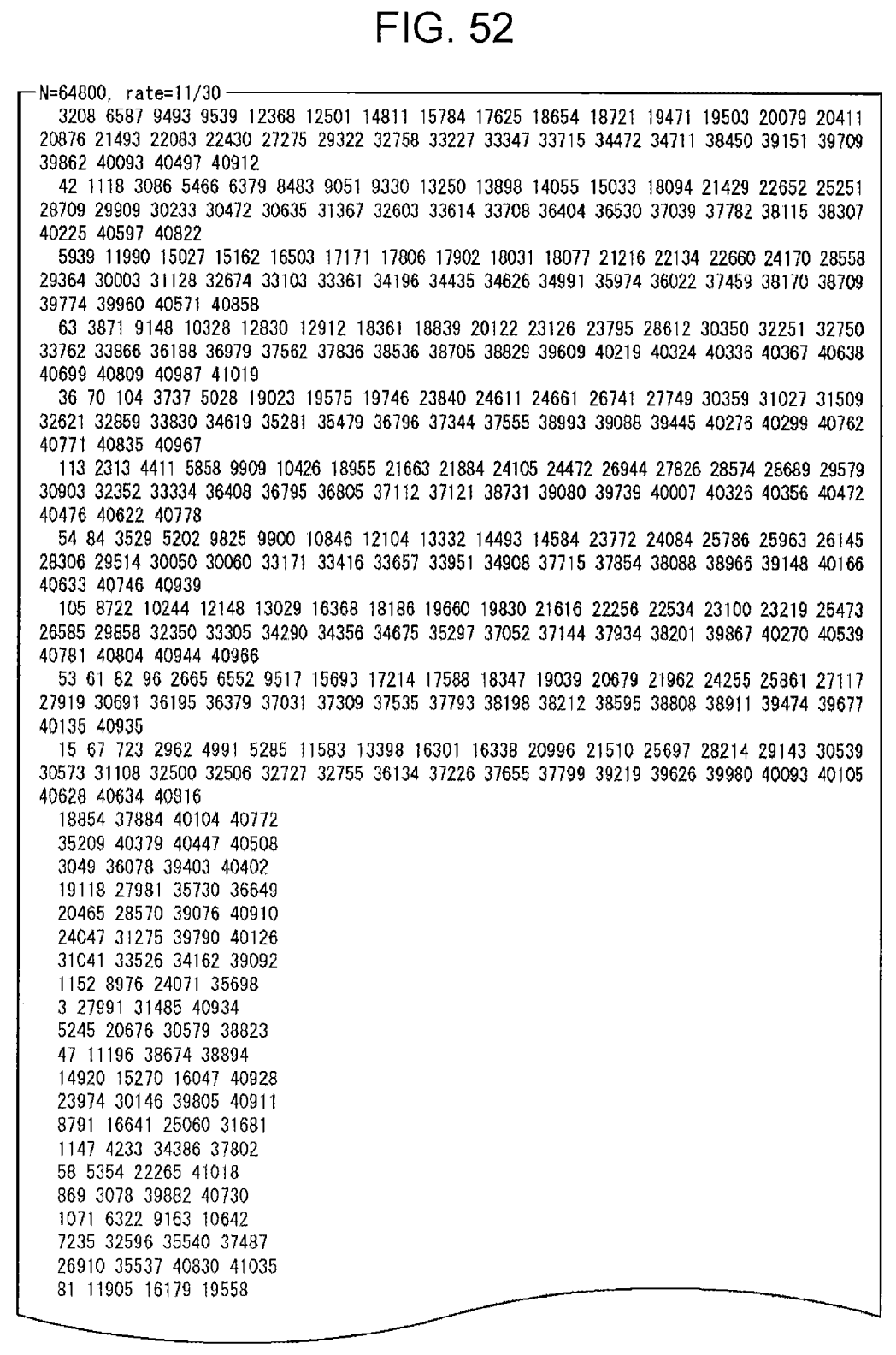
Figure 53:
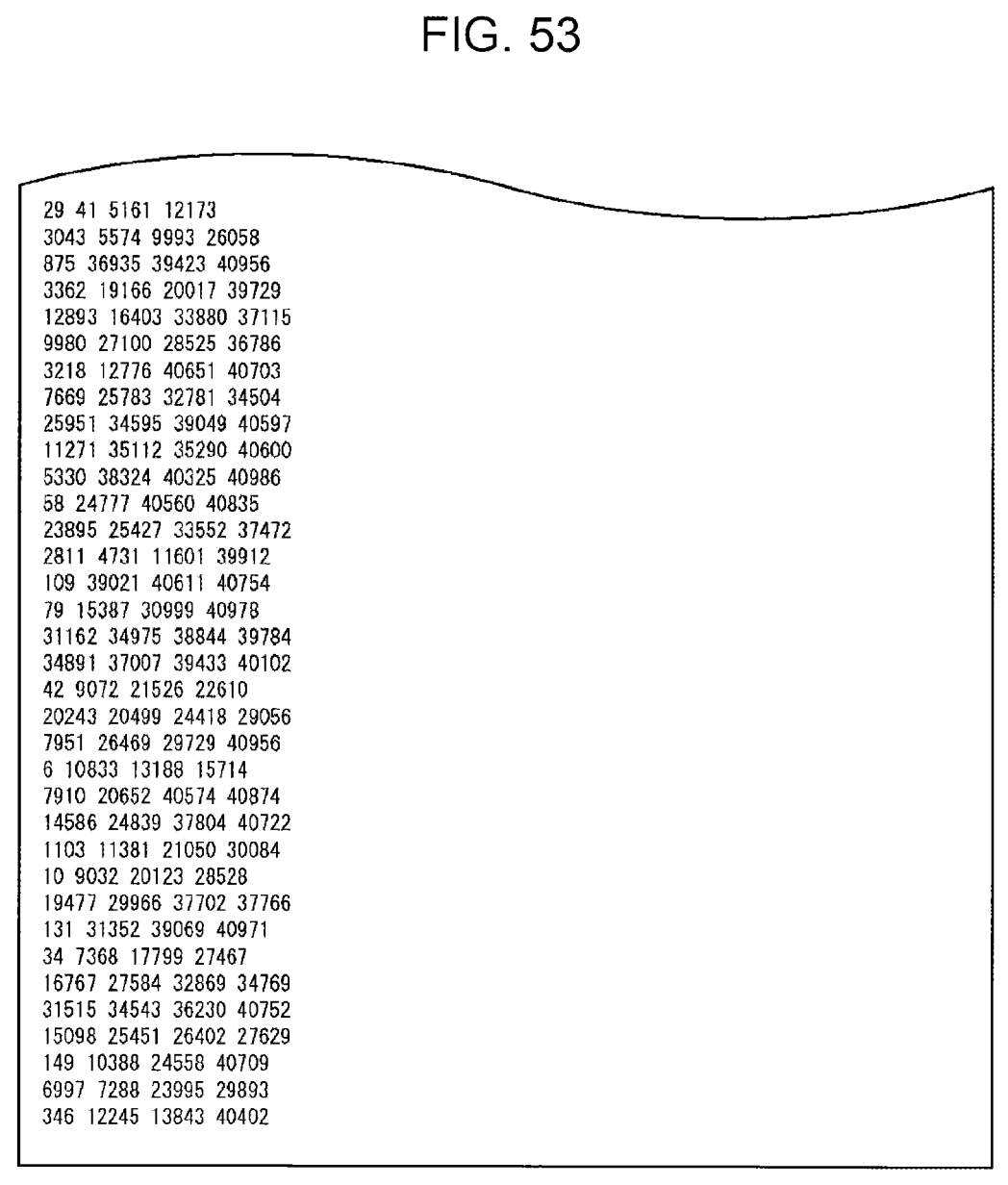

FIGS. 52 and 53 illustrate a parity check matrix initial value table for a parity check matrix H of an LDPC code having a code length N of 64 k bits and a code rate r of 11/30.

Figure 54:
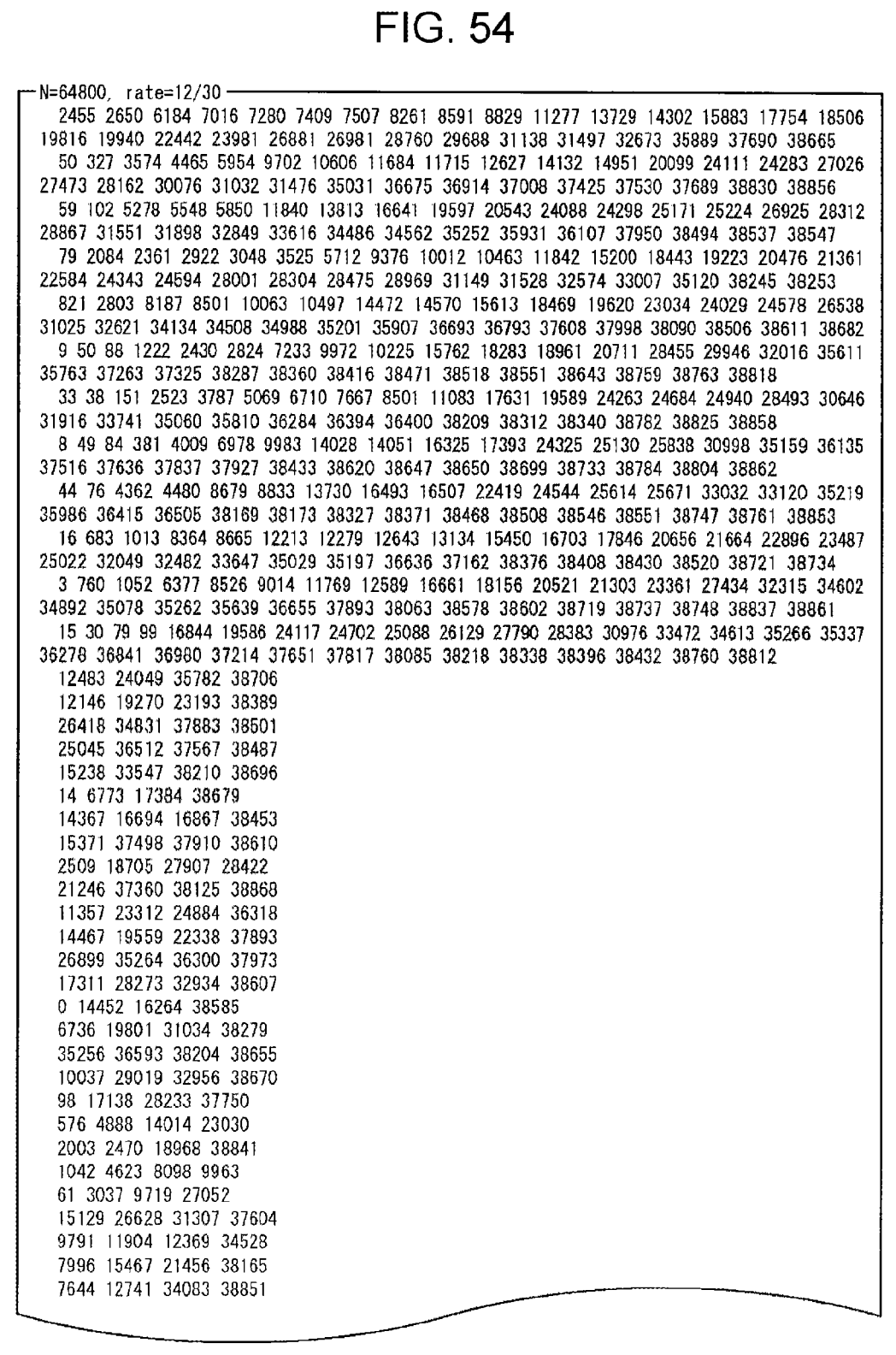
Figure 55:
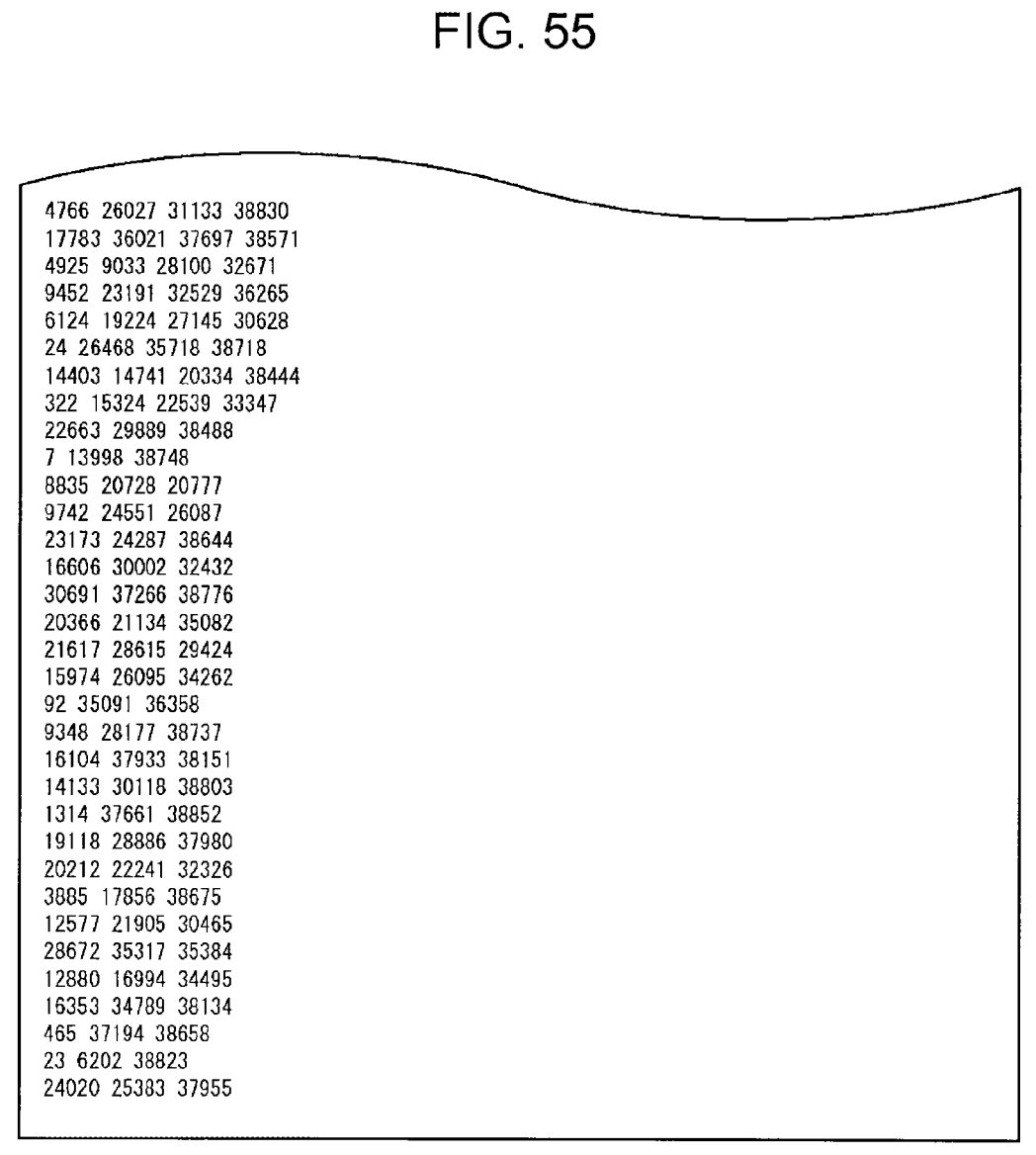

FIGS. 54 and 55 illustrate a parity check matrix initial value table for a parity check matrix H of an LDPC code having a code length N of 64 k bits and a code rate r of 12/30.

Figure 56:
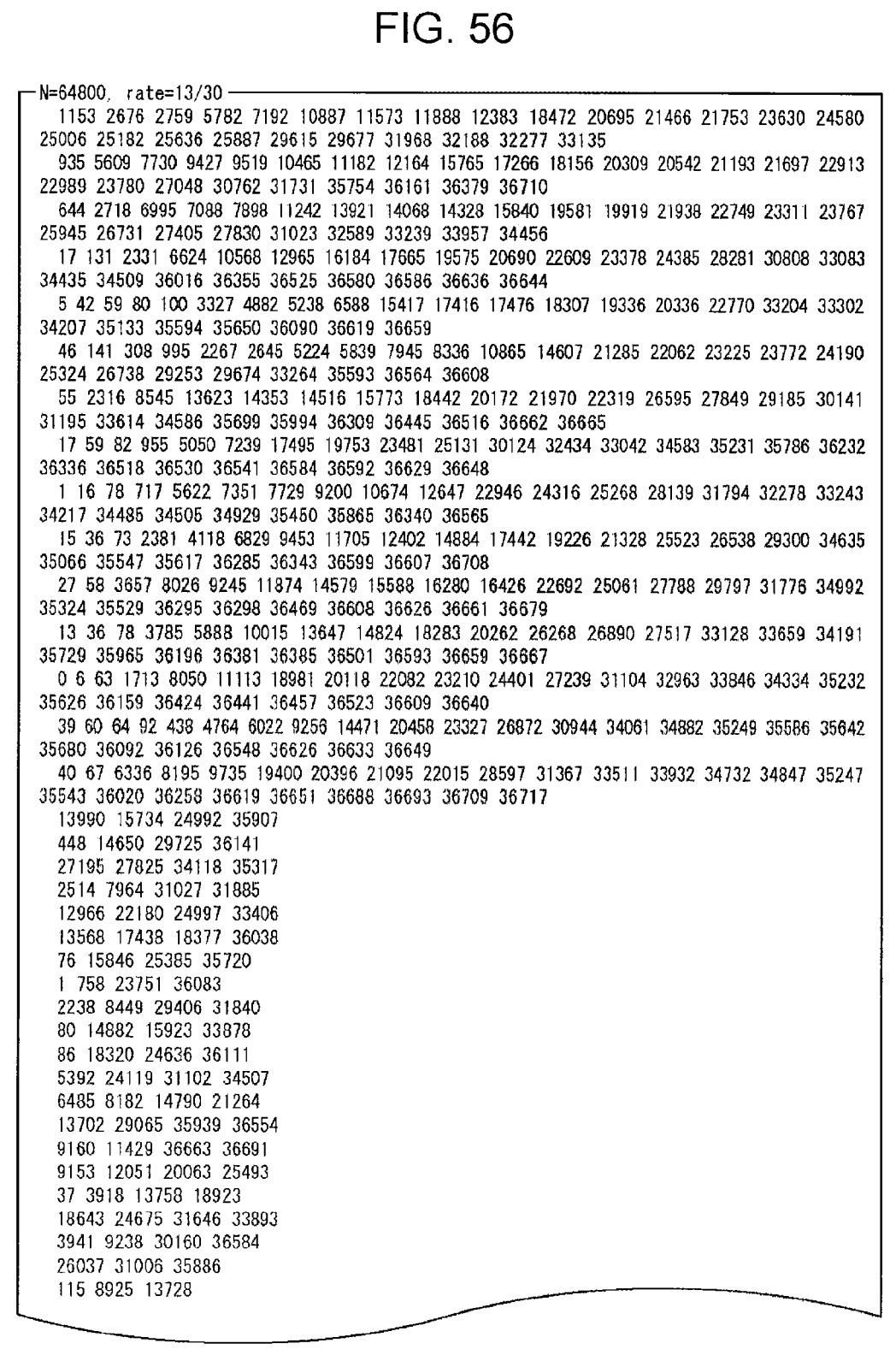
Figure 57:
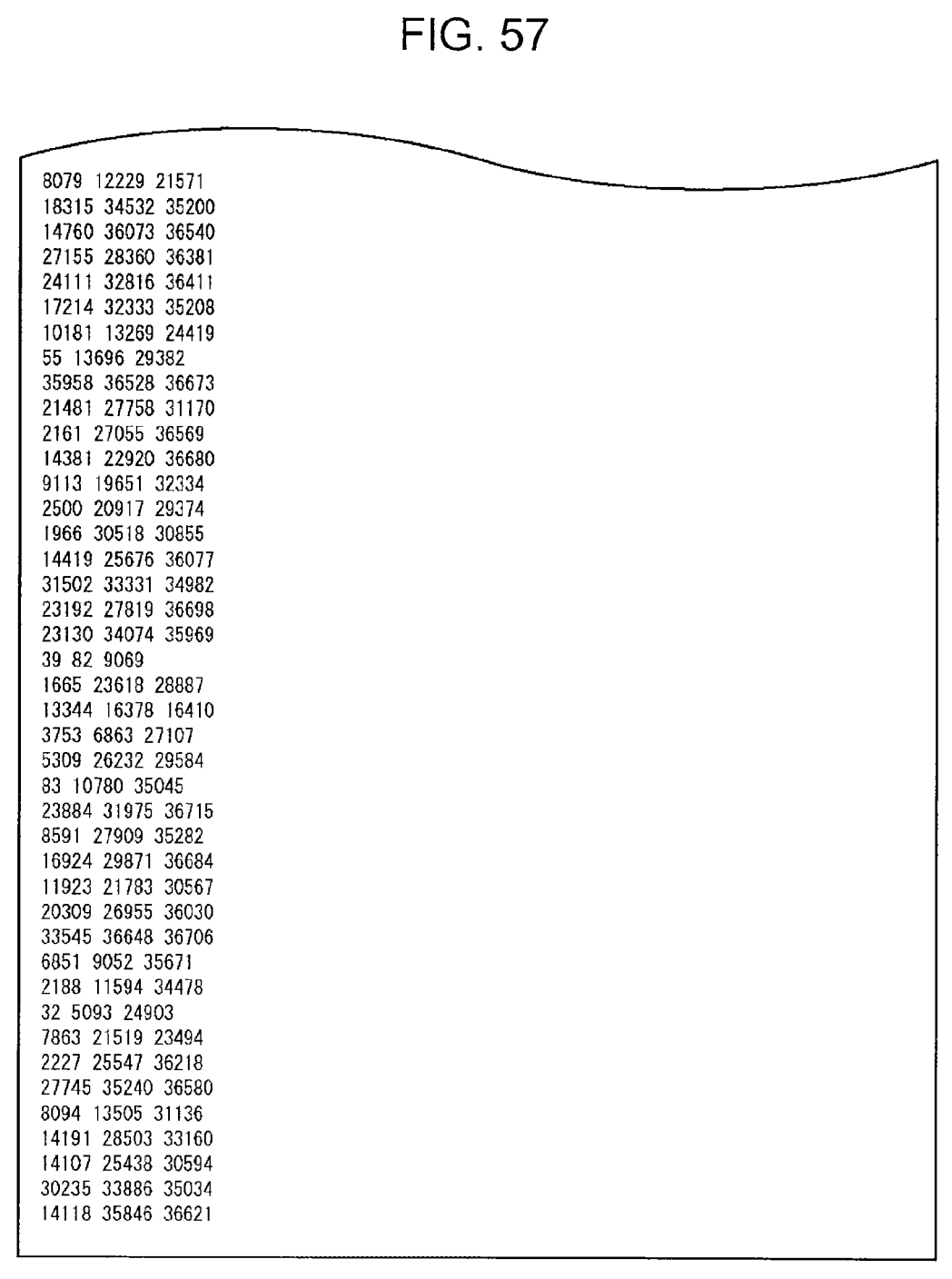

FIGS. 56 and 57 illustrate a parity check matrix initial value table for a parity check matrix H of an LDPC code having a code length N of 64 k bits and a code rate r of 13/30.

Figure 58:
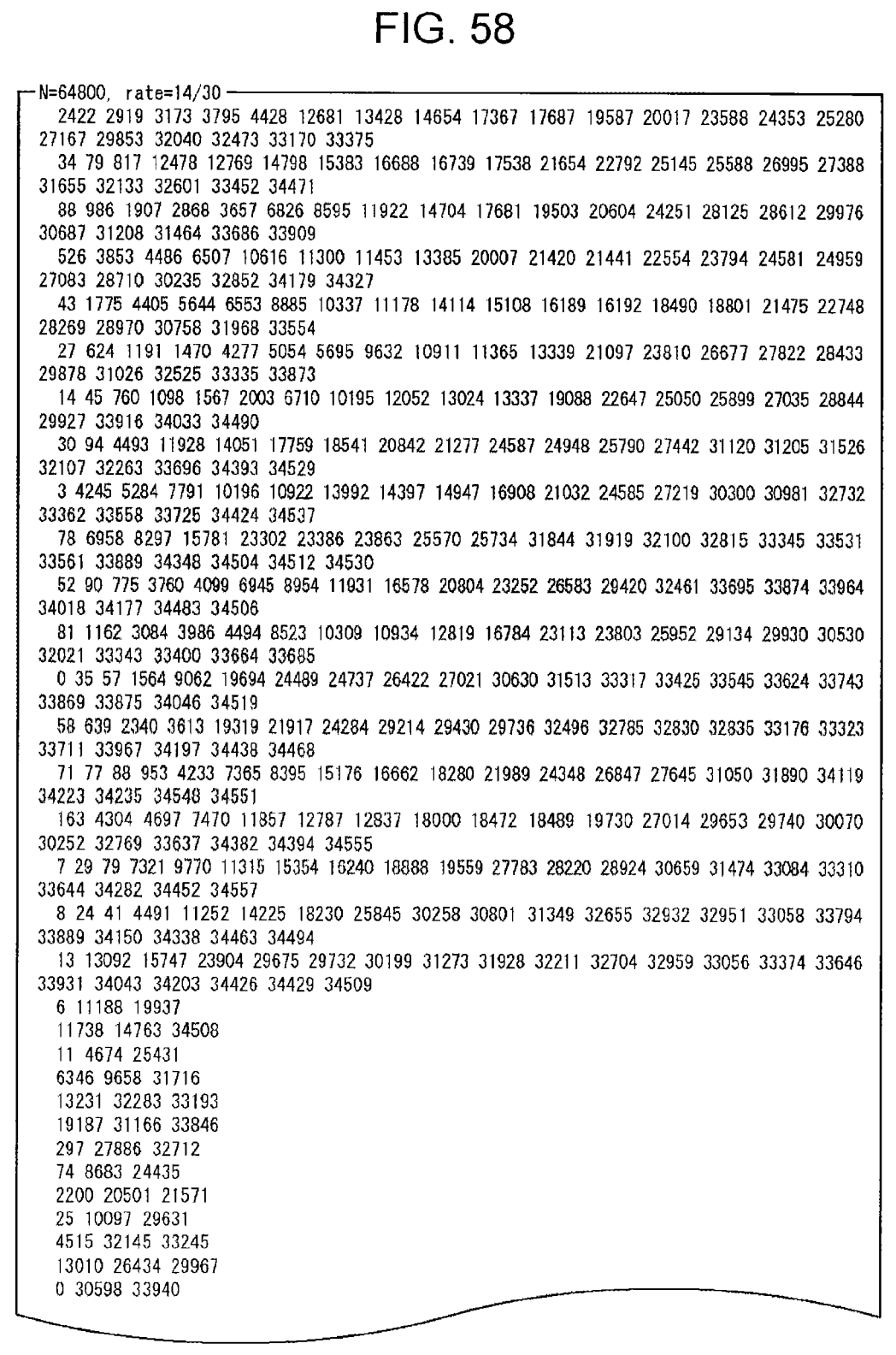
Figure 59:
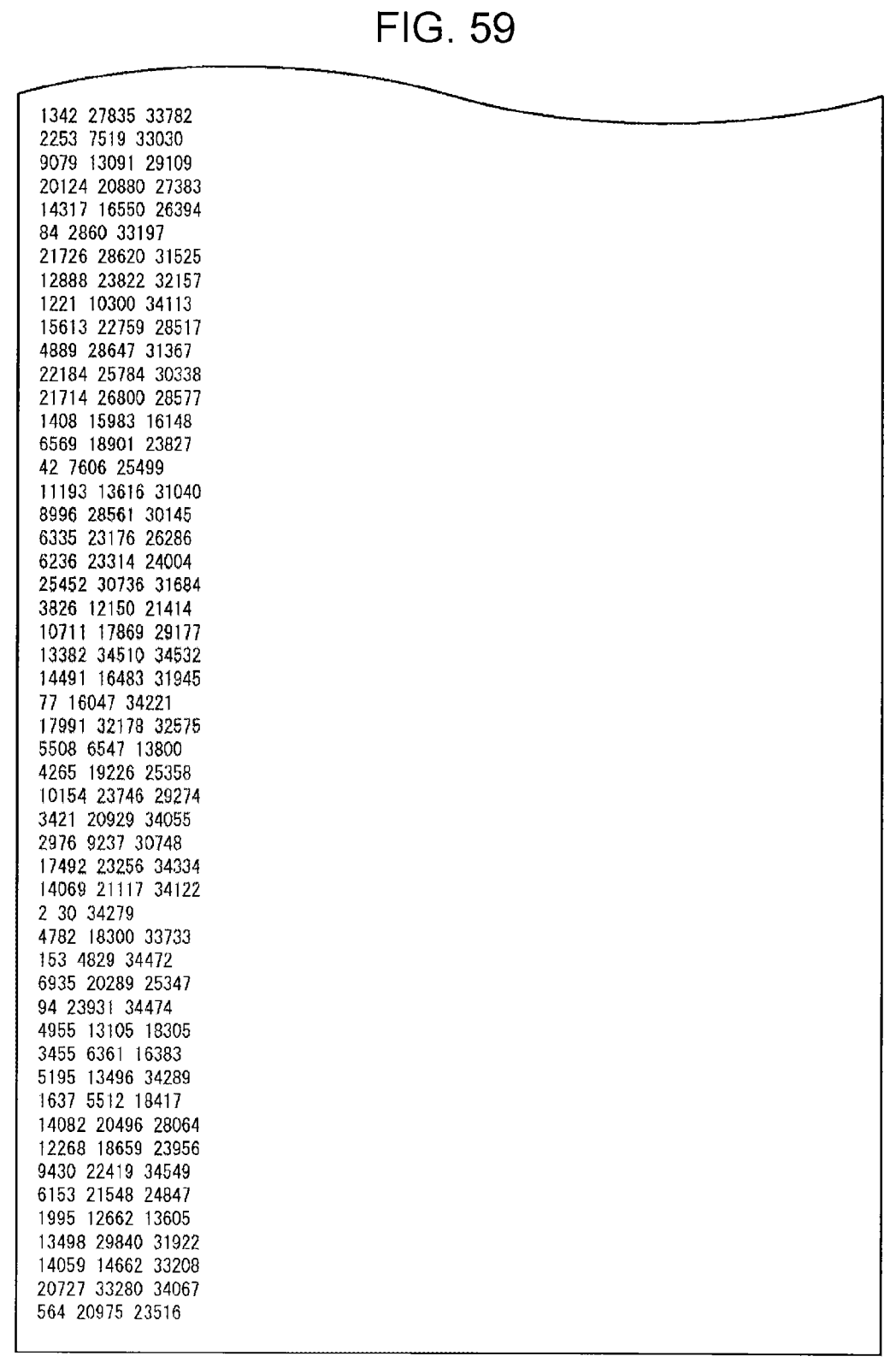

FIGS. 58 and 59 illustrate a parity check matrix initial value table for a parity check matrix H of an LDPC code having a code length N of 64 k bits and a code rate r of 14/30.

Figure 60:
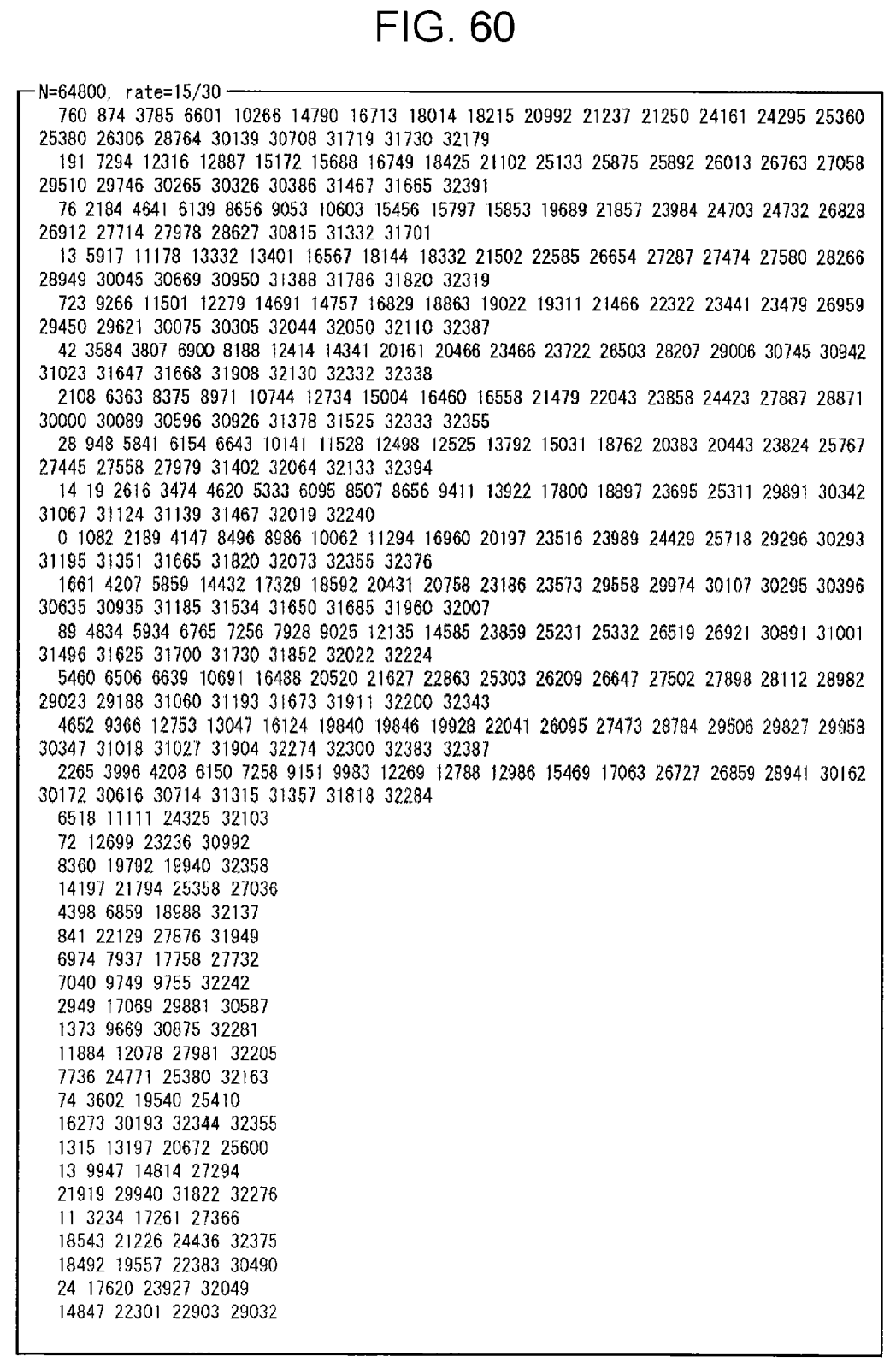
Figure 61:
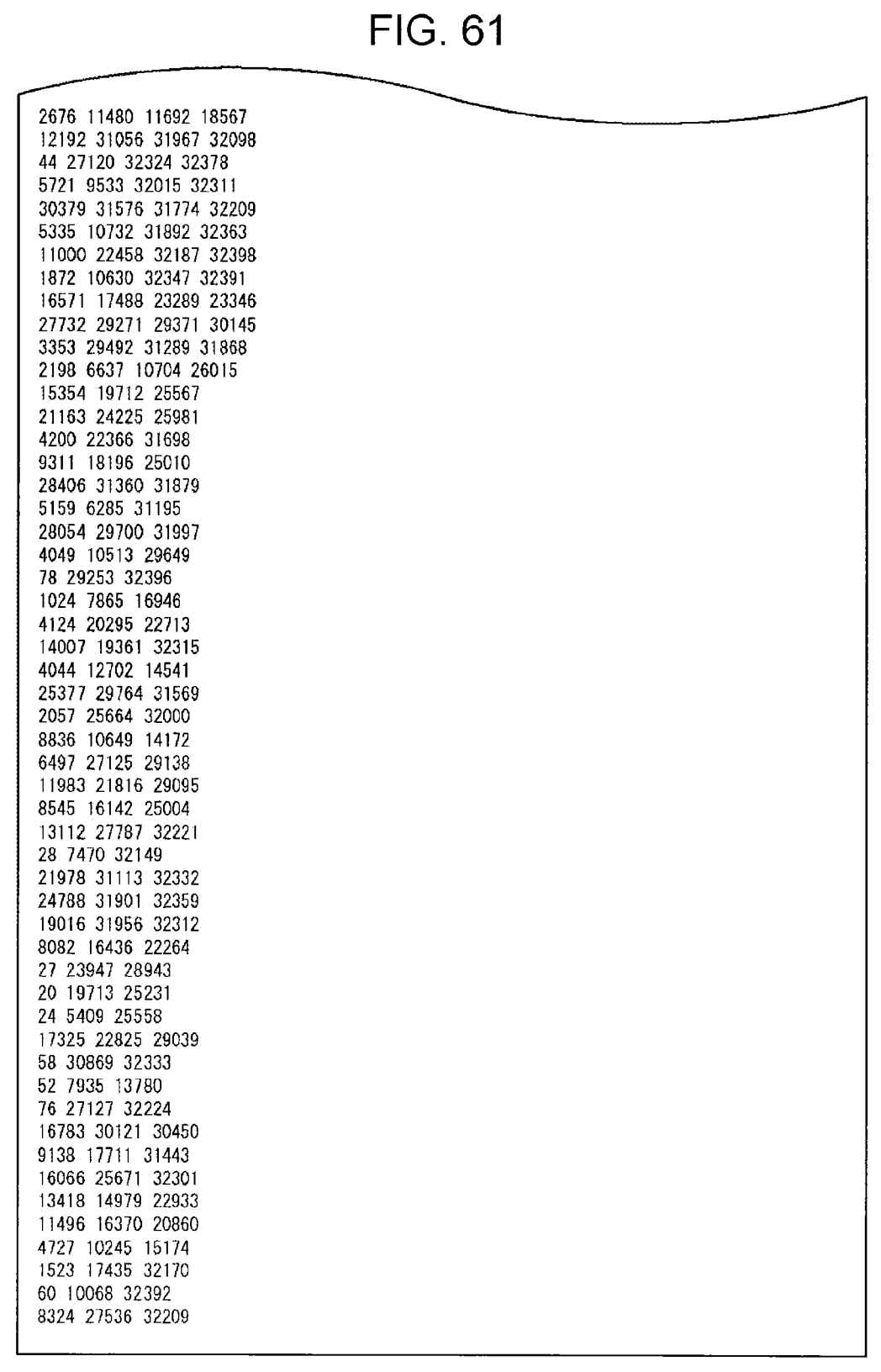

FIGS. 60 and 61 illustrate a parity check matrix initial value table for a parity check matrix H of an LDPC code having a code length N of 64 k bits and a code rate r of 15/30.

Figure 62:
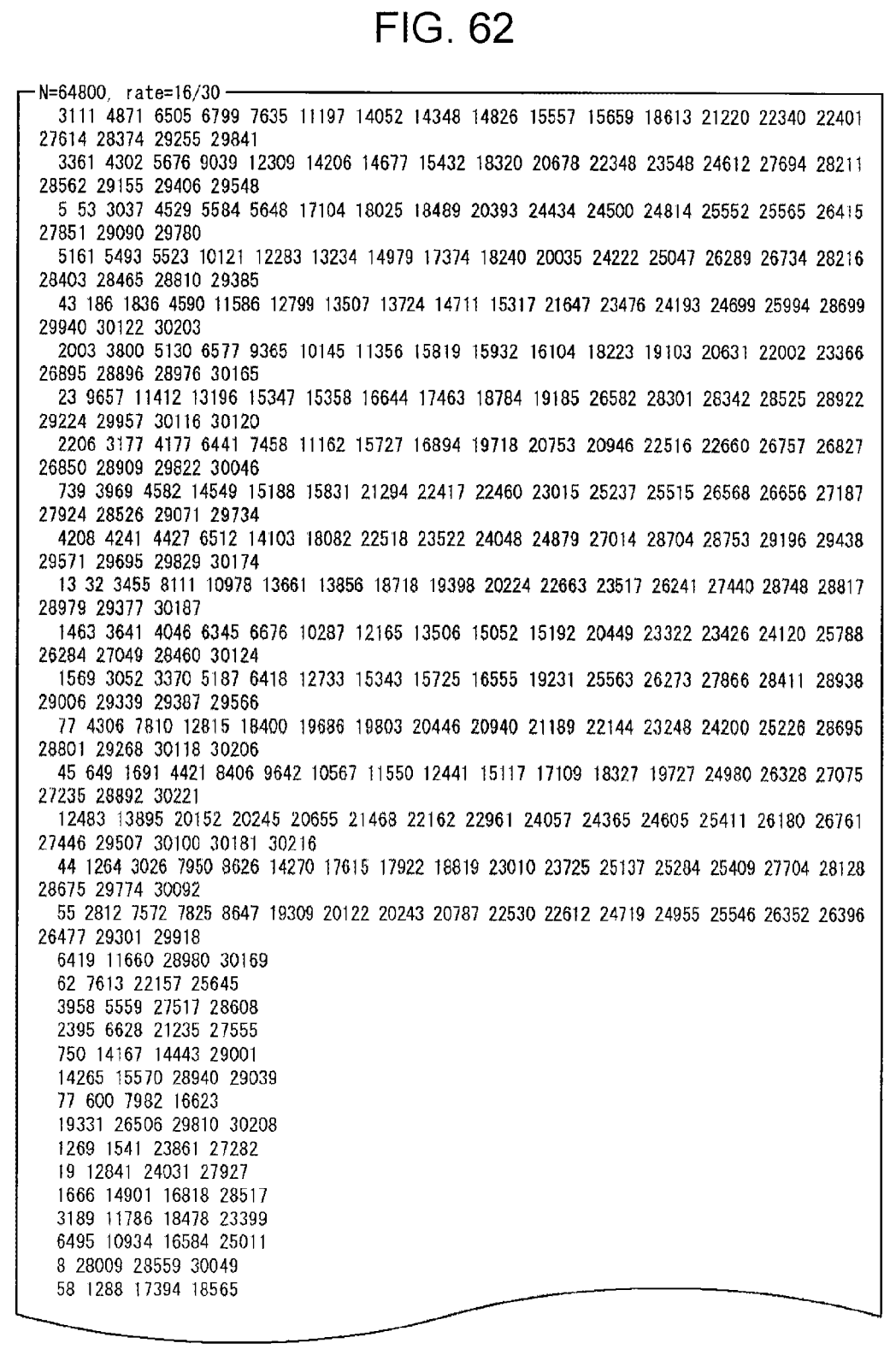
Figure 63:
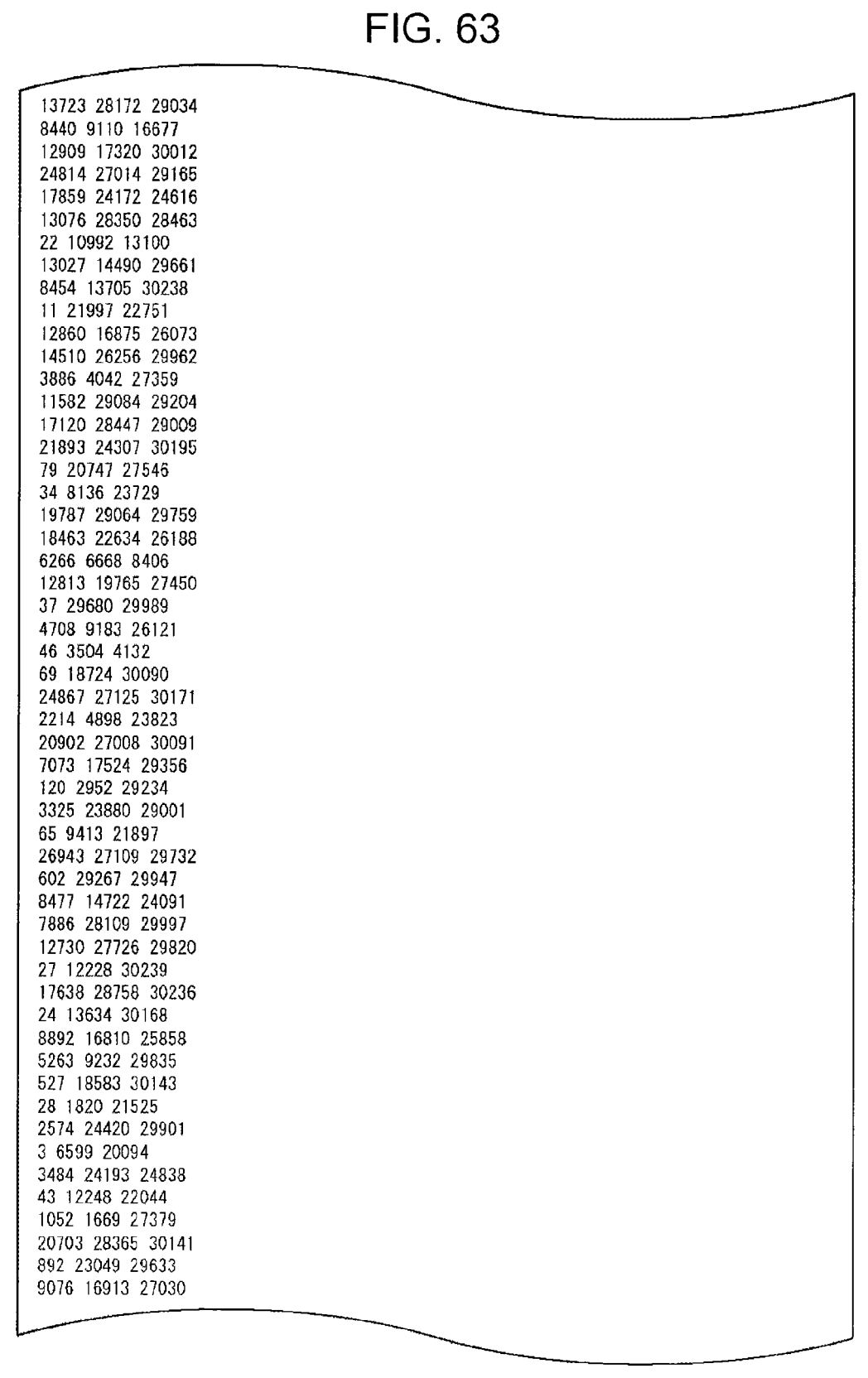
Figure 64:
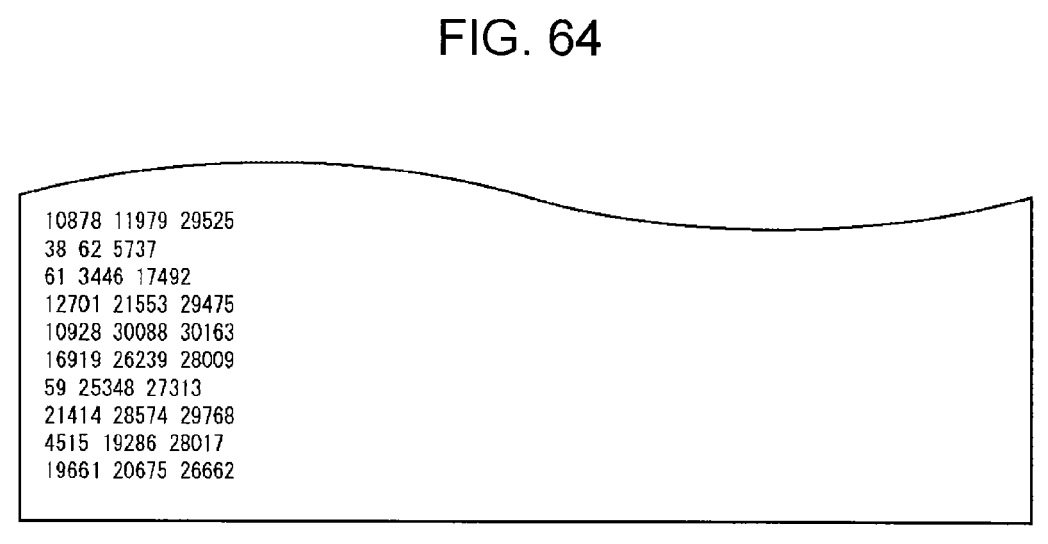

FIGS. 62, 63, and 64 illustrate a parity check matrix initial value table for a parity check matrix H of an LDPC code having a code length N of 64 k bits and a code rate r of 16/30.

Figure 65:
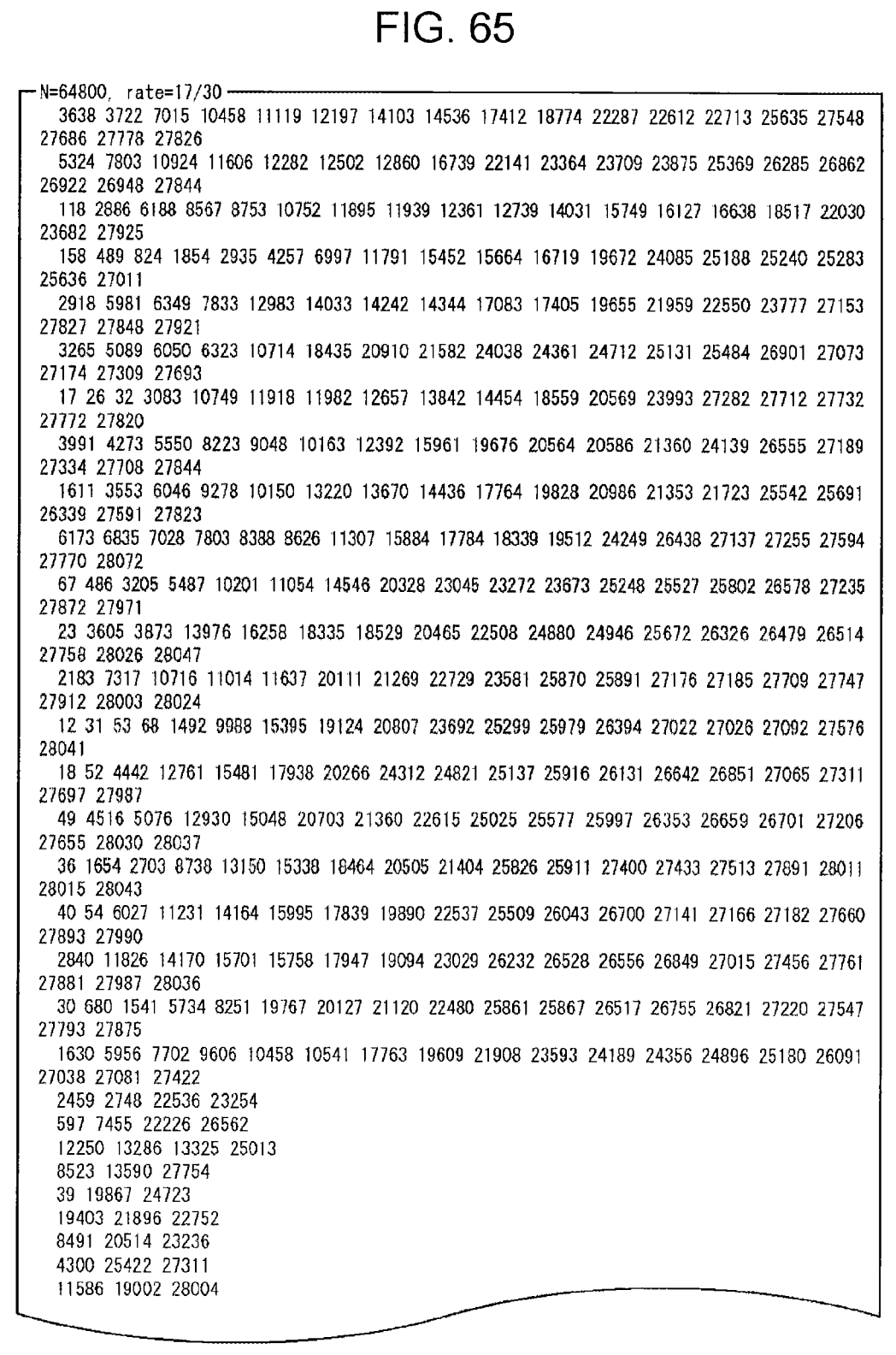
Figure 66:
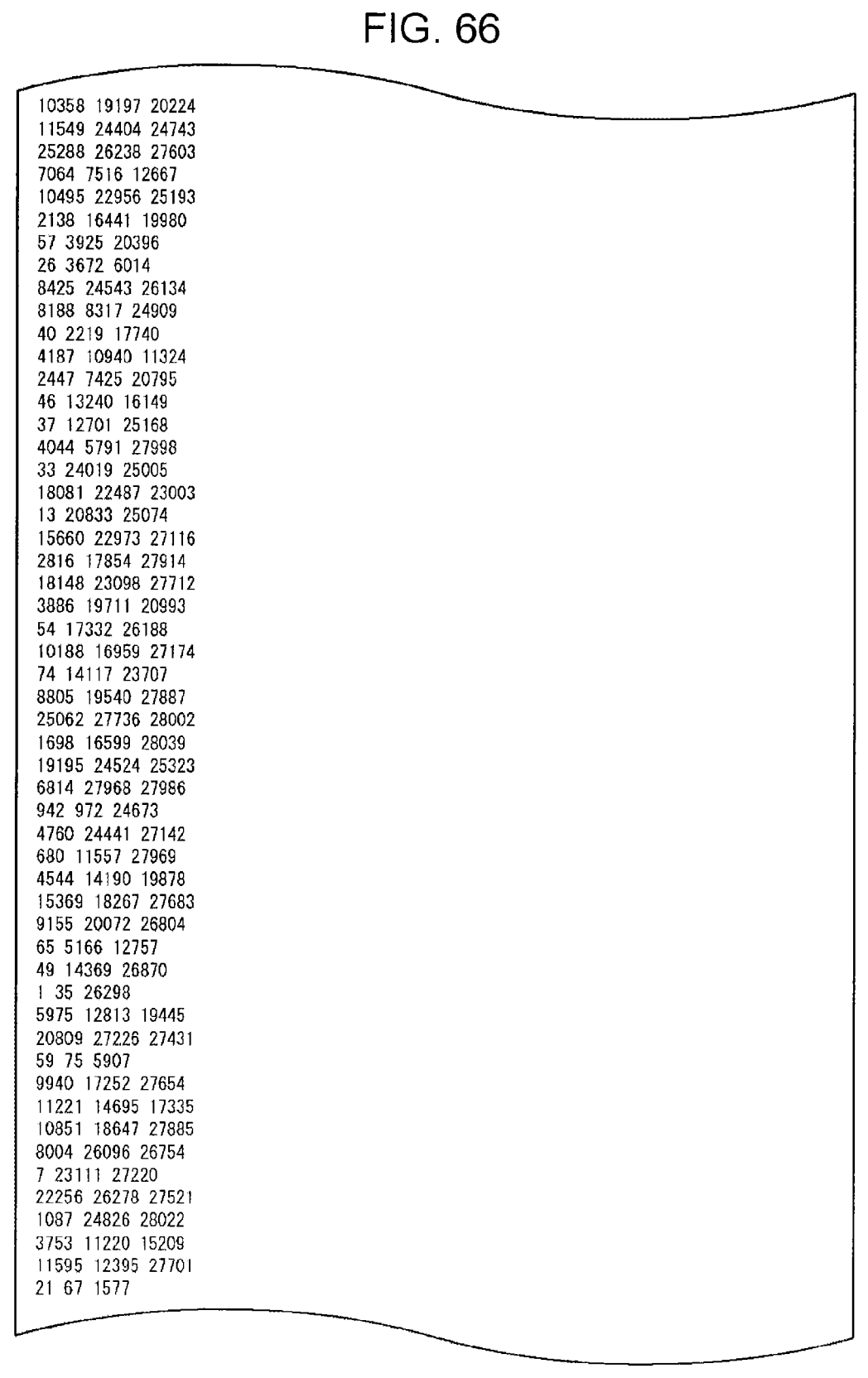
Figure 67:
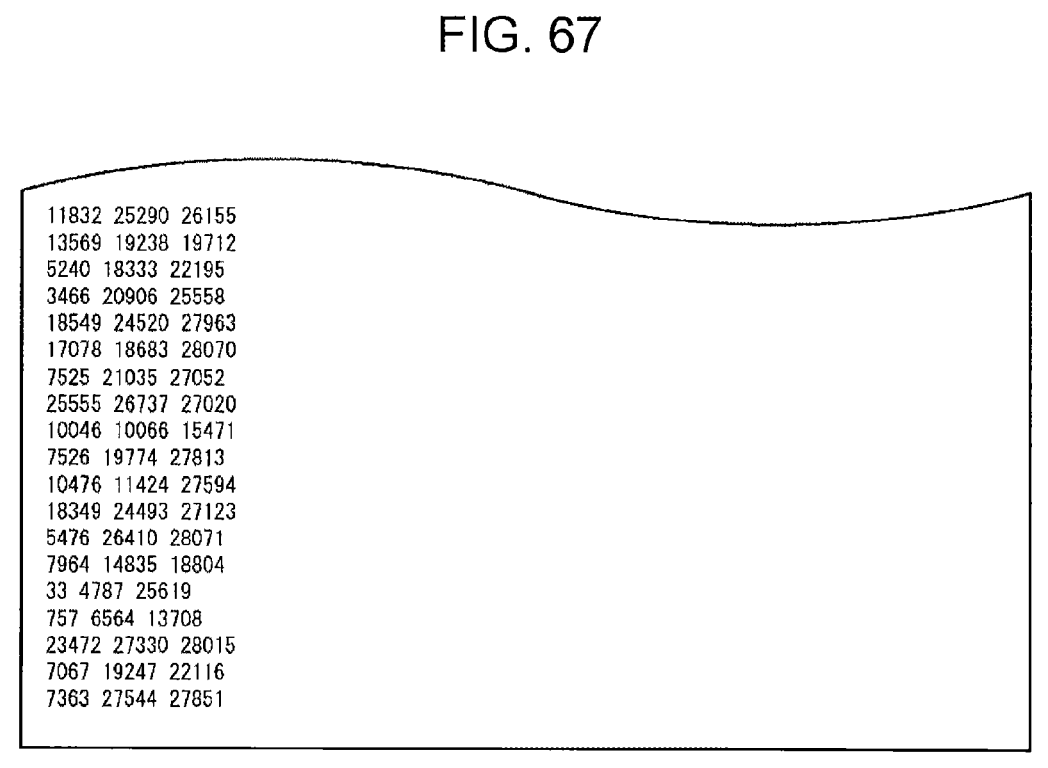

FIGS. 65, 66, and 67 illustrate a parity check matrix initial value table for a parity check matrix H of an LDPC code having a code length N of 64 k bits and a code rate r of 17/30.

Figure 68:
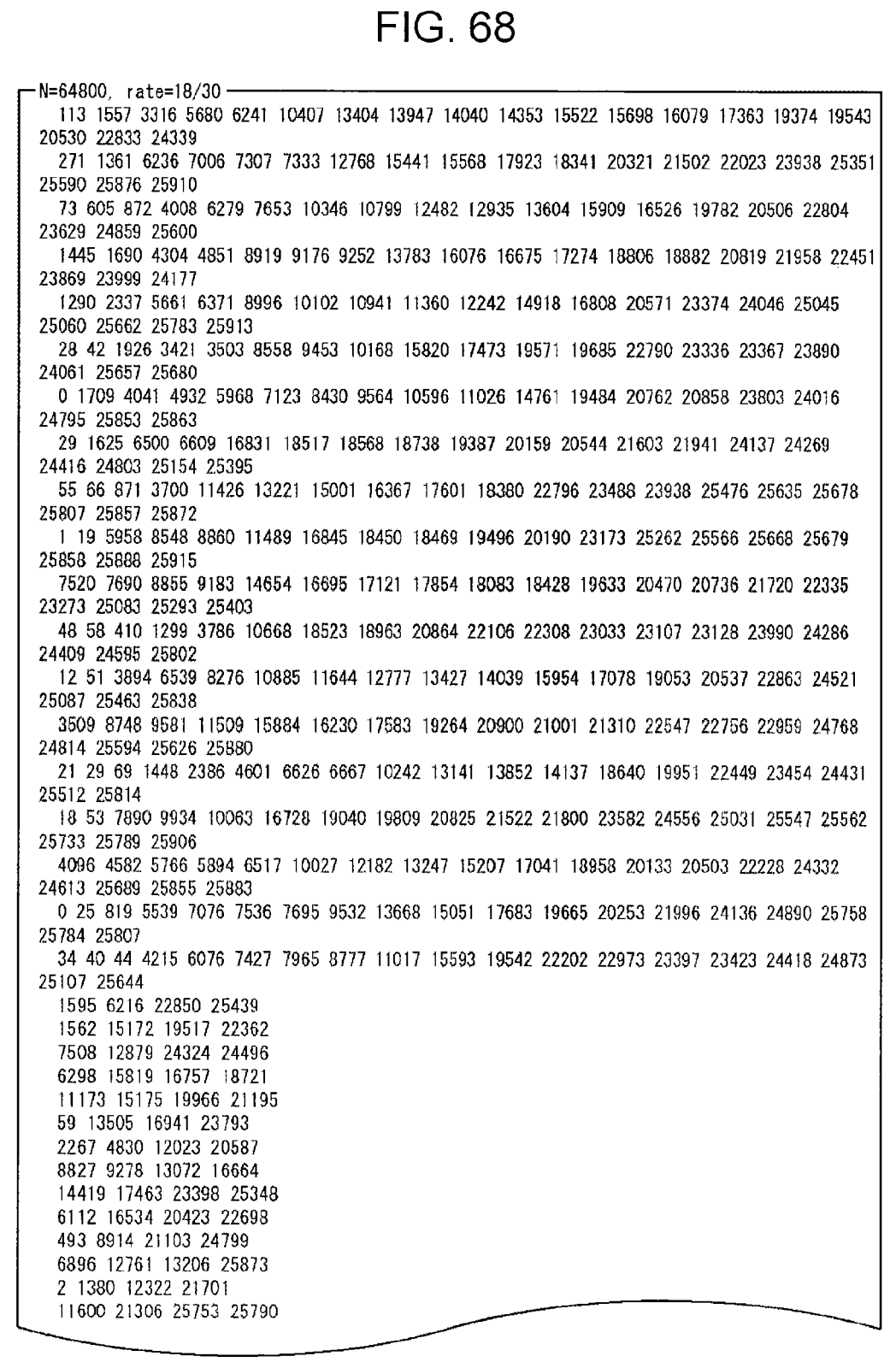
Figure 69:
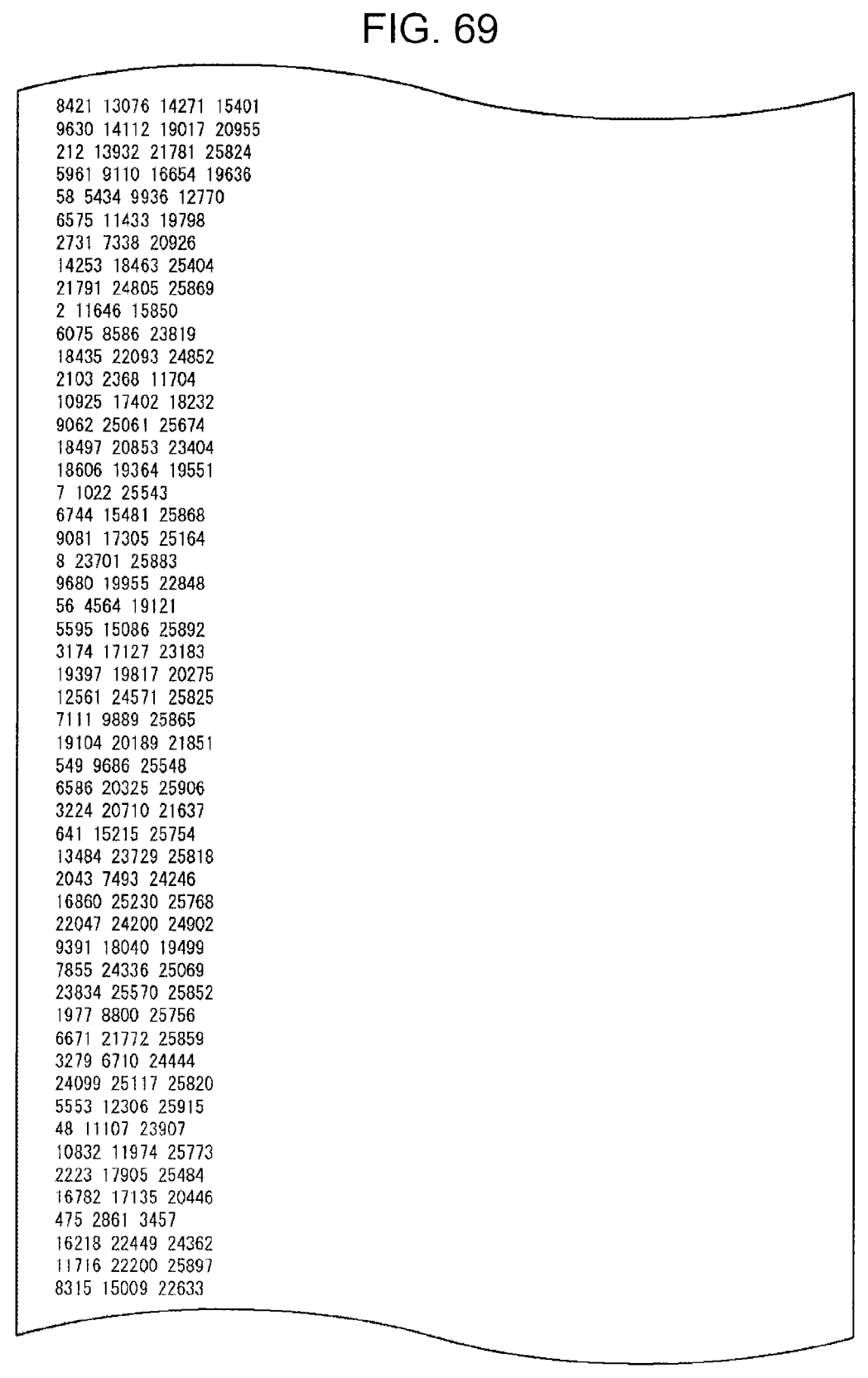
Figure 70:
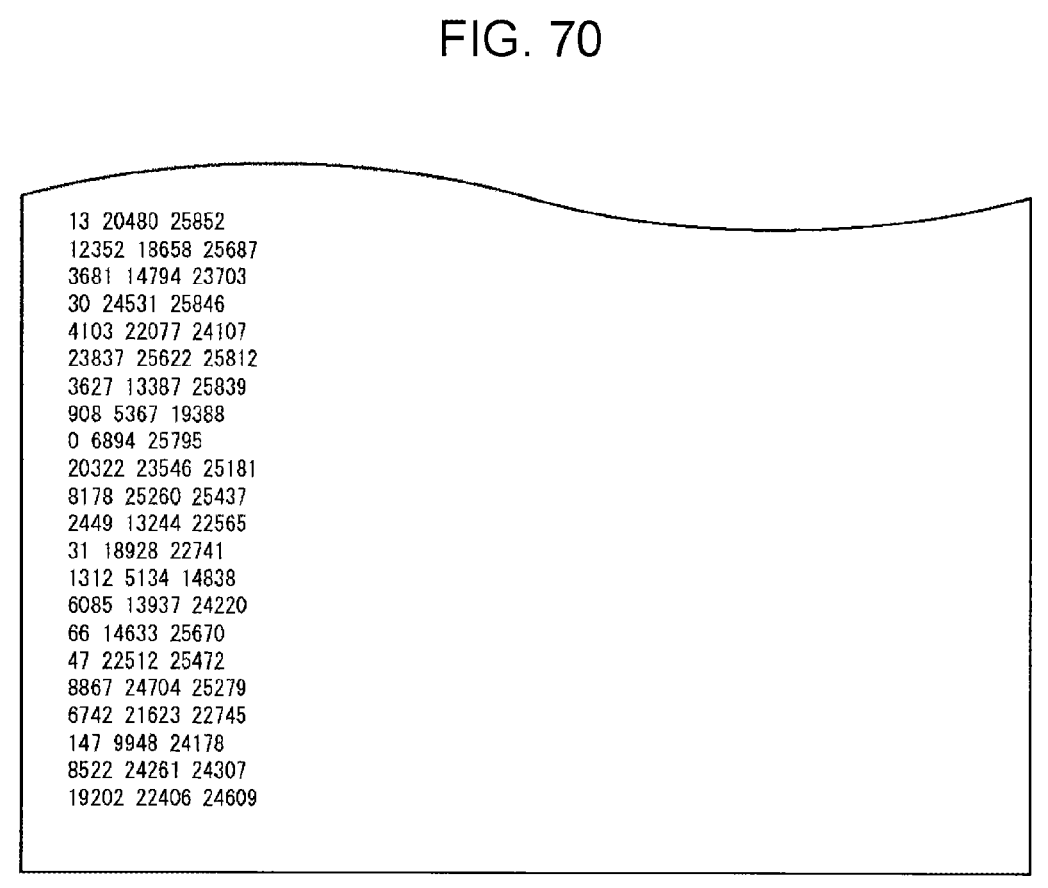

FIGS. 68, 69, and 70 illustrate a parity check matrix initial value table for a parity check matrix H of an LDPC code having a code length N of 64 k bits and a code rate r of 18/30.

Figure 71:
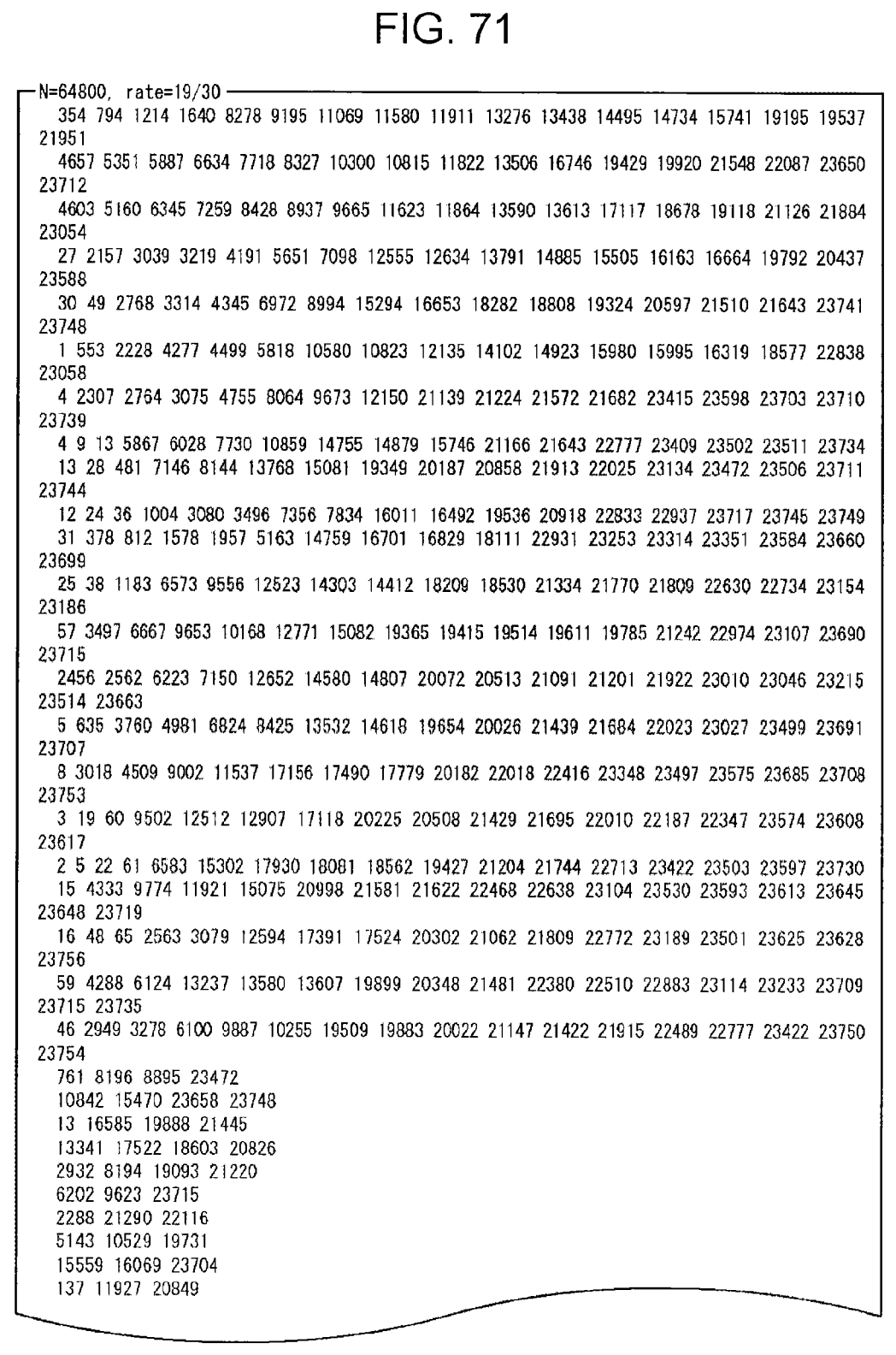
Figure 72:
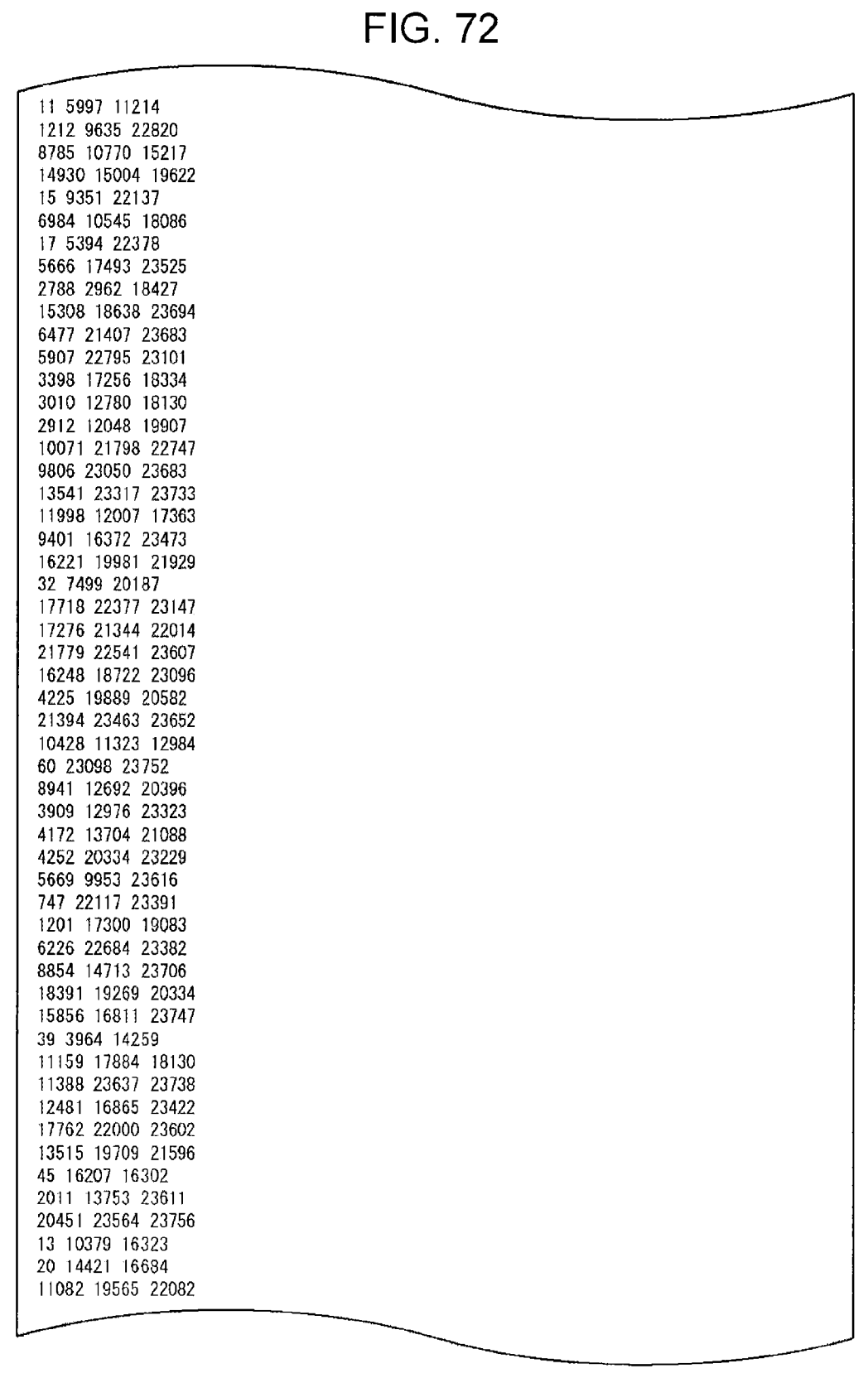
Figure 73:
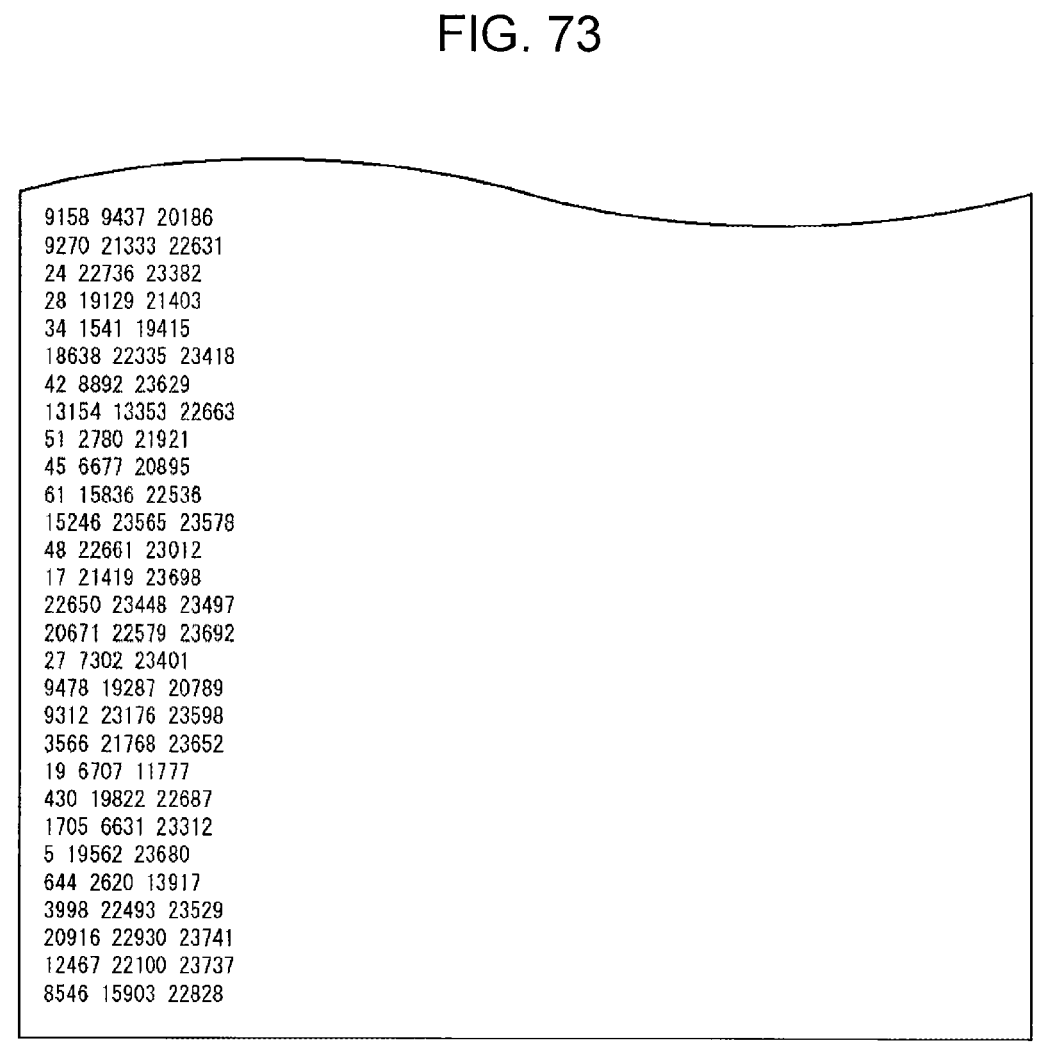

FIGS. 71, 72, and 73 illustrate a parity check matrix initial value table for a parity cheek matrix H of an LDPC code having a code length N of 64 k bits and a code rate r of 19/30.

FIGS. 74, 75, and 76 illustrate a parity check matrix initial value table for a parity check matrix H of an LDPC code having a code length N of 64 k bits and a code rate r of 20/30.

Figure 77:
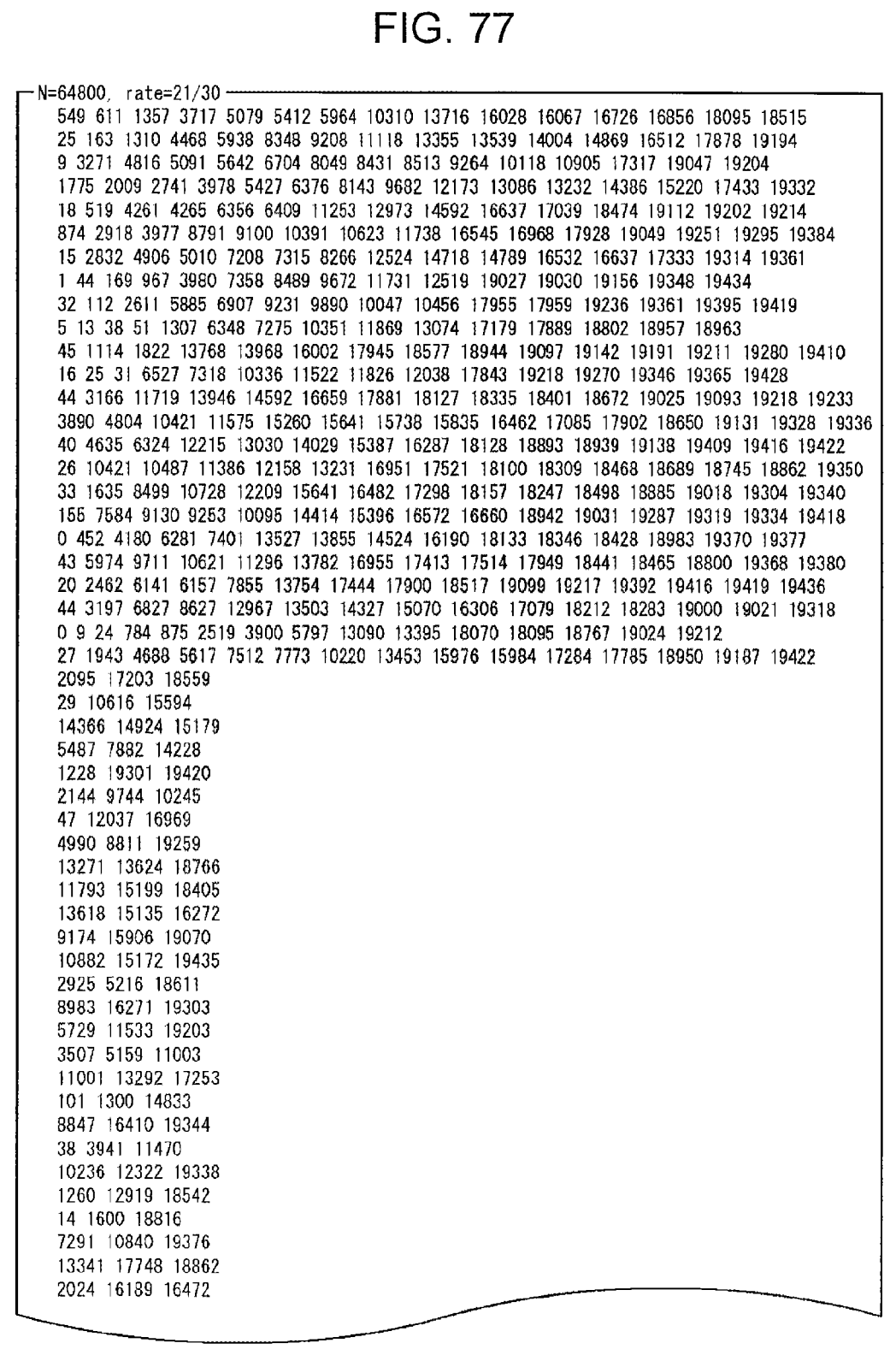
Figure 78:
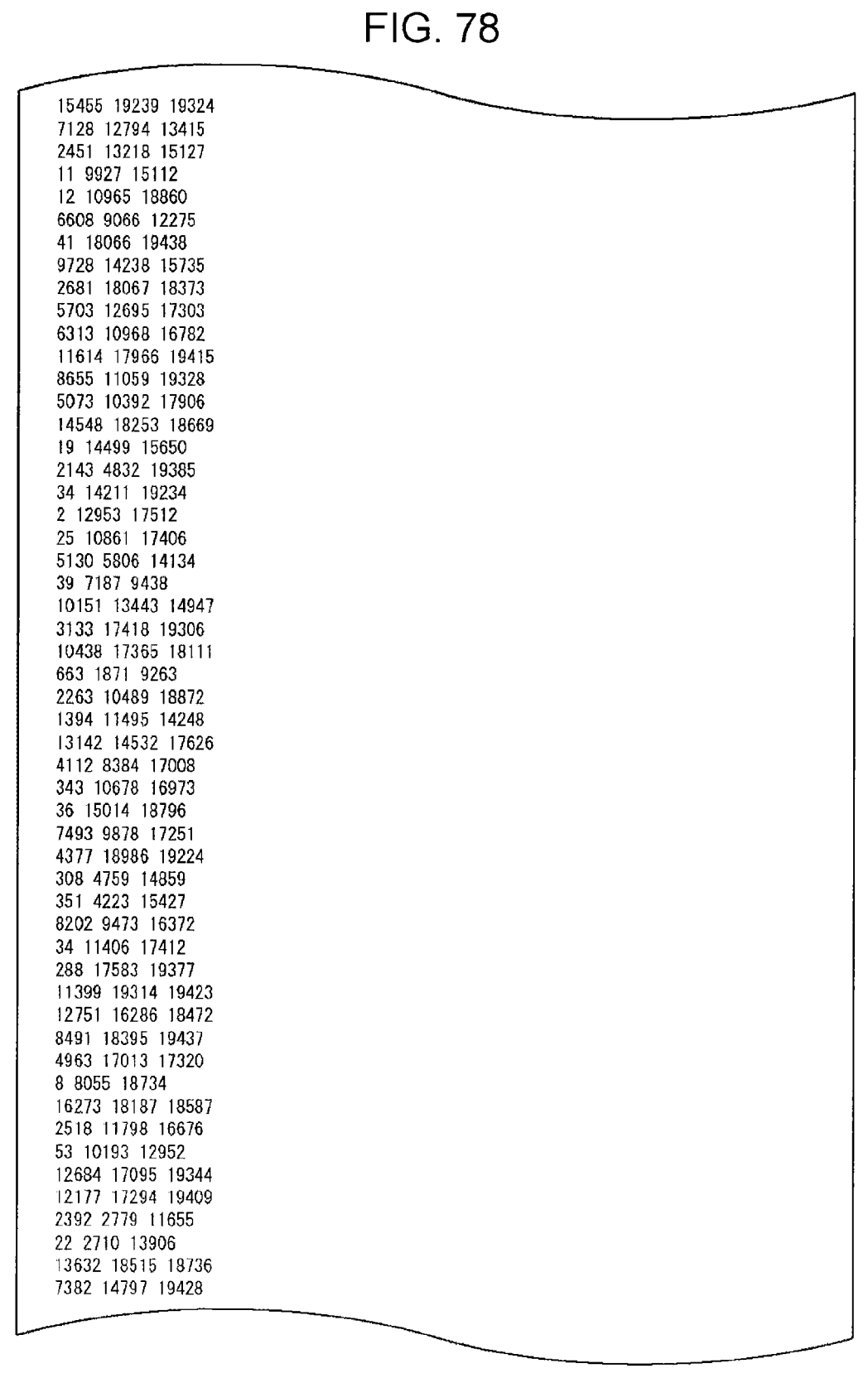
Figure 79:
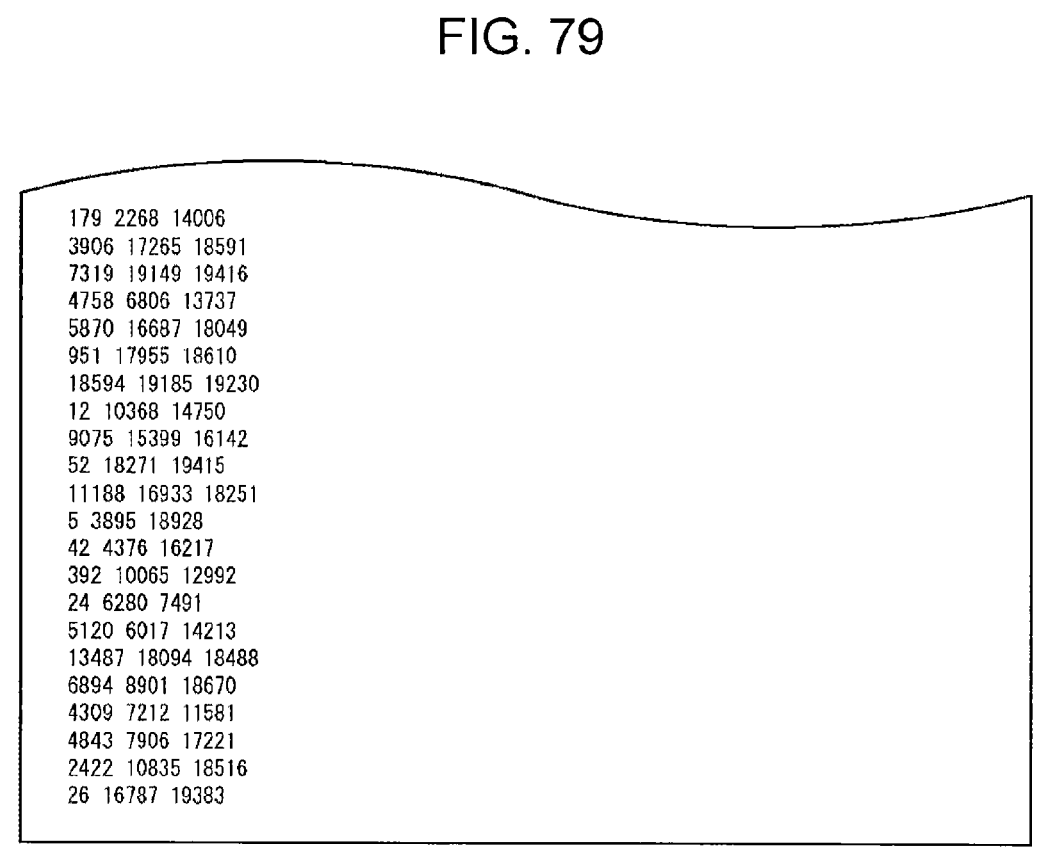

FIGS. 77, 78, and 79 illustrate a parity check matrix initial value table for a parity check matrix H of an LDPC code having a code length N of 64 k bits and a code rate r of 21/30.

FIGS. 80, 81, and 82 illustrate a parity check matrix initial value table for a parity check matrix H of an LDPC code having a code length N of 64 k bits and a code rate r of 22/30.

Figure 83:
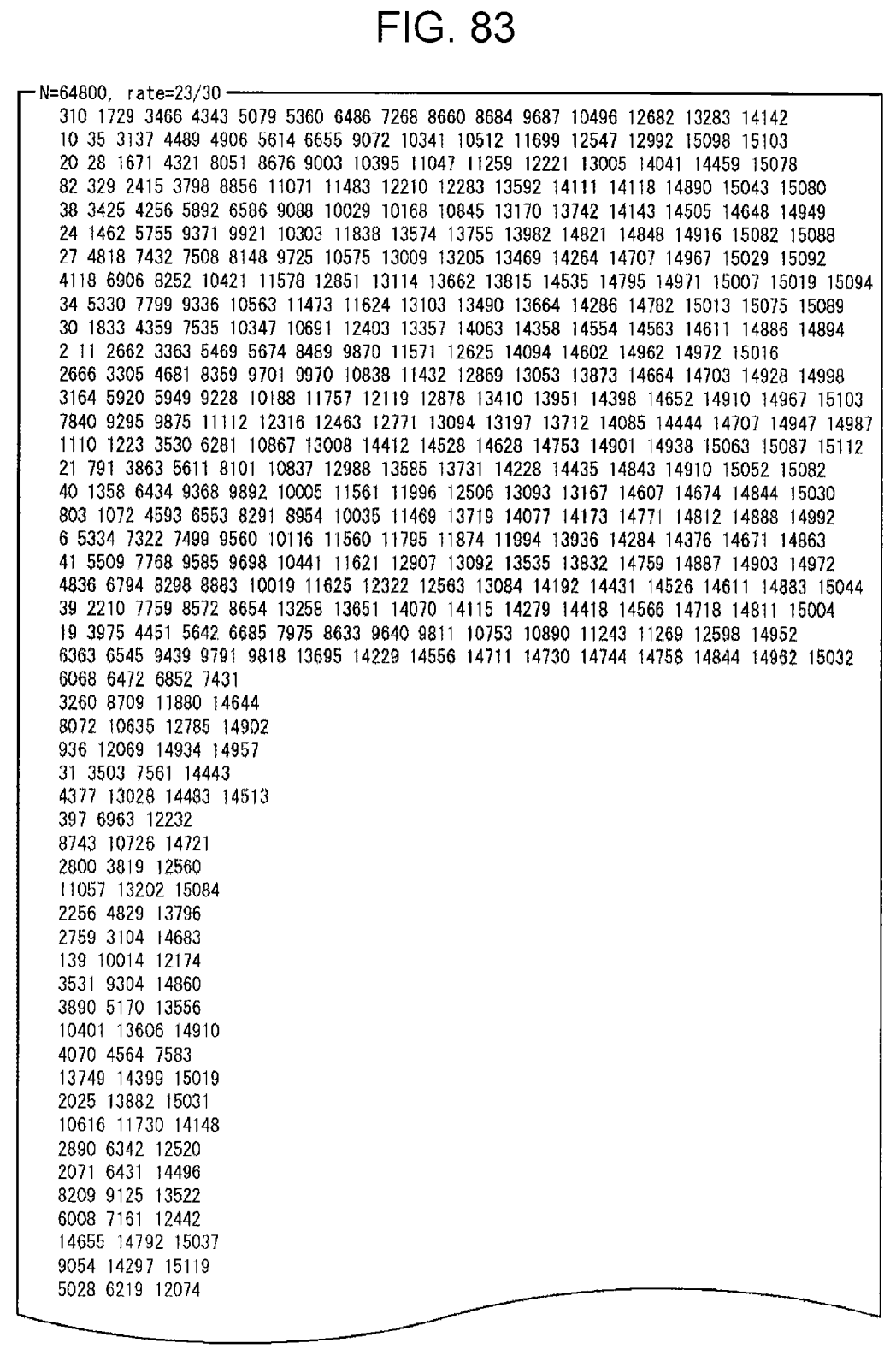
Figure 84:
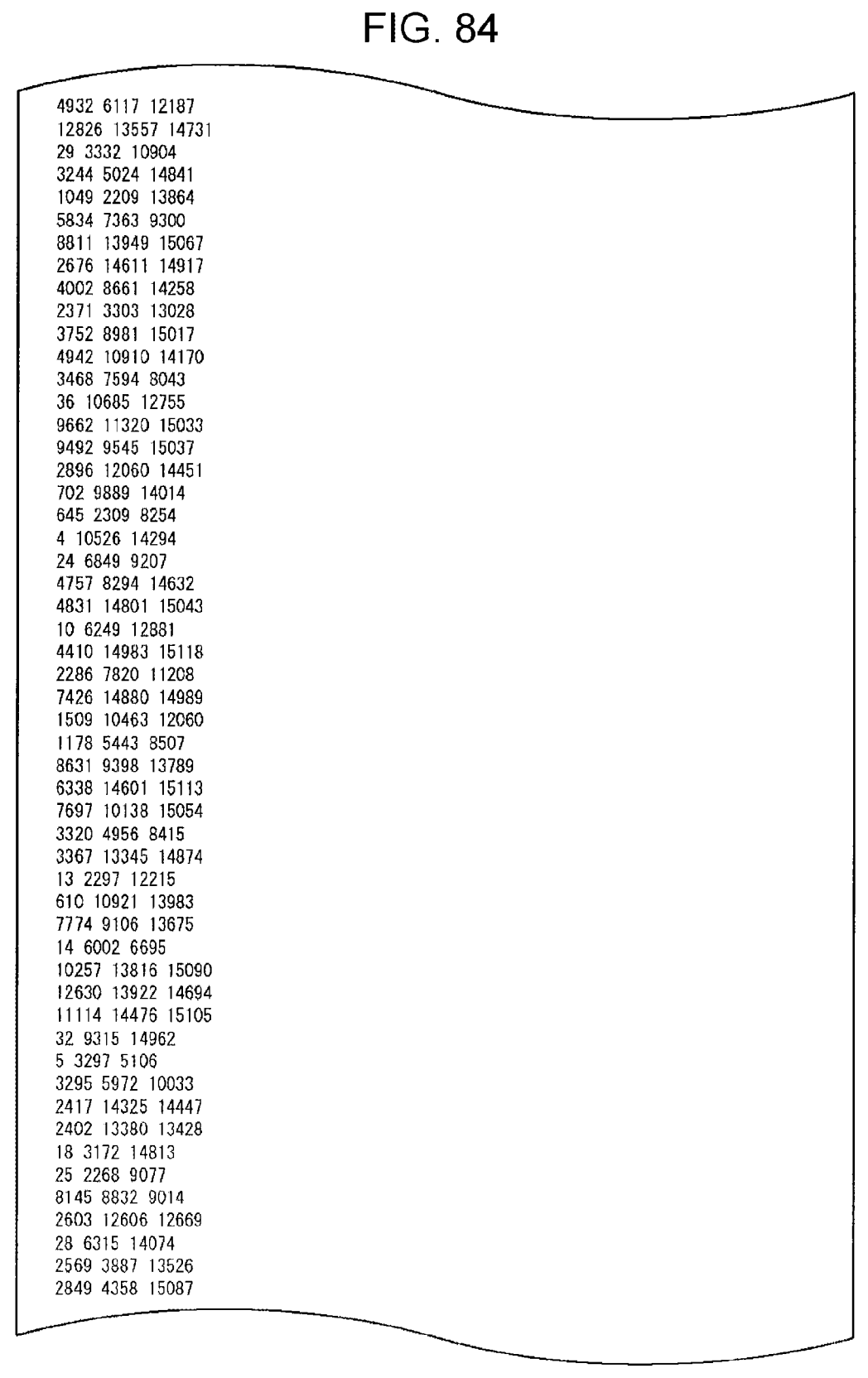
Figure 85:
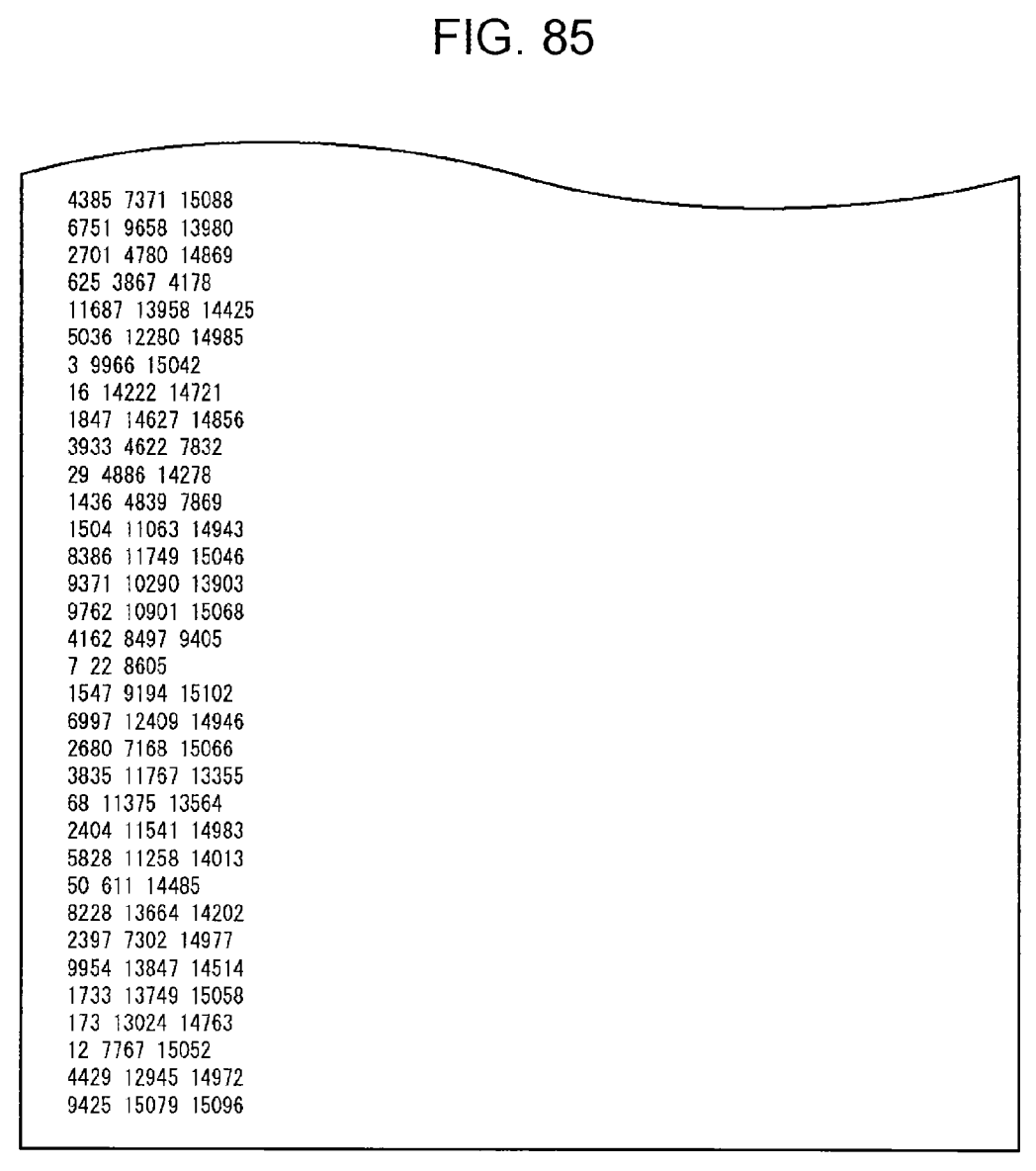

FIGS. 83, 84, and 85 illustrate a parity check matrix Initial value table for a parity check matrix H of an LDPC code having a code length N of 64 k bits and a code rate r of 23/30.

FIGS. 86, 87, and 88 illustrate a parity check matrix initial value table for a parity check matrix H of an LDPC code having a code length N of 64 k bits and a code rate r of 24/30.

FIGS. 89, 90, and 91 illustrate a parity check matrix initial value table for a parity check matrix H of an LDPC code having a code length N of 64 k bits and a code rate r of 25/30.

FIGS. 92, 93, and 94 illustrate a parity check matrix initial value table for a parity check matrix H of an LDPC code having a code length N of 64 k bits and a code rate r of 26/30.

FIGS. 95, 96, 97, and 98 illustrate a parity check matrix initial value table for a parity check matrix H of an LDPC code having a code length N of 64 k bits and a code rate of 27/30.

FIGS. 99, 100, 101, and 102 illustrate a parity check matrix initial value table for a parity check matrix H of an LDPC code having a code length N of 64 k bits and a code rate of 28/30.

FIGS. 103, 104, 105, and 106 illustrate a parity check matrix initial value table for a parity check matrix H of an LDPC code having a code length N of 64 k bits and a code rate of 29/30.

The LDPC encoder 115 (FIGS. 8 and 35) is capable of performing encoding on a (new) LDPC code having a code length N of 64 k bits and any of 28 code rates r of 2/30 to 29/30 by using a parity check matrix H determined from one of the parity check matrix initial value tables illustrated in FIGS. 40 to 106.

In the illustrated example, the storage unit 602 of the LDPC encoder 115 (FIG. 8) stores the parity check matrix initial value tables illustrated in FIGS. 40 to 106.

It is to be noted that not all the LDPC codes with 28 code rates r of 2/30 to 29/30 (which are determined from the parity check matrix initial value tables) illustrated in FIGS. 40 to 106 may be used as new LDPC. That is, an LDPC code or codes with any one or more code rates among the LDPC codes with 28 code rates r of 2/30 to 29/30 illustrated in FIGS. 40 to 106 may be employed as a new LDPC code or codes.

LDPC codes obtained using parity check matrices H determined from the parity check matrix initial value tables illustrated in FIGS. 40 to 106 may be high-performance LDPC codes.

The term "high-performance LDPC code", as used herein, refers to an LDPC code obtained from an appropriate parity check matrix H.

Furthermore, the term "appropriate parity check matrix H" refers to a parity check matrix satisfying a certain condition in which the BER (and FER) is (or are) reduced when an LDPC code obtained from a parity check matrix H is transmitted with a low $E_5/N_0$ or $E_b/N_0$ (which is the ratio of the signal power per bit to the noise power).

An appropriate parity check matrix H may be determined through simulations for measuring BERs when, for example, LDPC codes obtained from various parity check matrices satisfying a certain condition are transmitted with a low $E_s/N_0$.

Examples of the certain condition that an appropriate parity check matrix H is to satisfy include a condition that analysis results obtained using an analytical technique for the performance evaluation of codes, called density evolution, are good, and a condition that a loop of elements of 1, called cycle 4, does not exist.

Here, it is well established that a concentration of elements of 1, like cycle 4, in an information matrix $H_A$ will reduce the decoding performance of an LDPC code. Thus, the absence of cycle 4 is demanded as a certain condition that an appropriate parity check matrix H is to satisfy.

Note that the certain condition that an appropriate parity check matrix H is to satisfy may be determined, as desired, in terms of various factors such as improved decoding performance of an LDPC code and easy (or simplified) decoding processing of an LDPC code.

Figure 107:
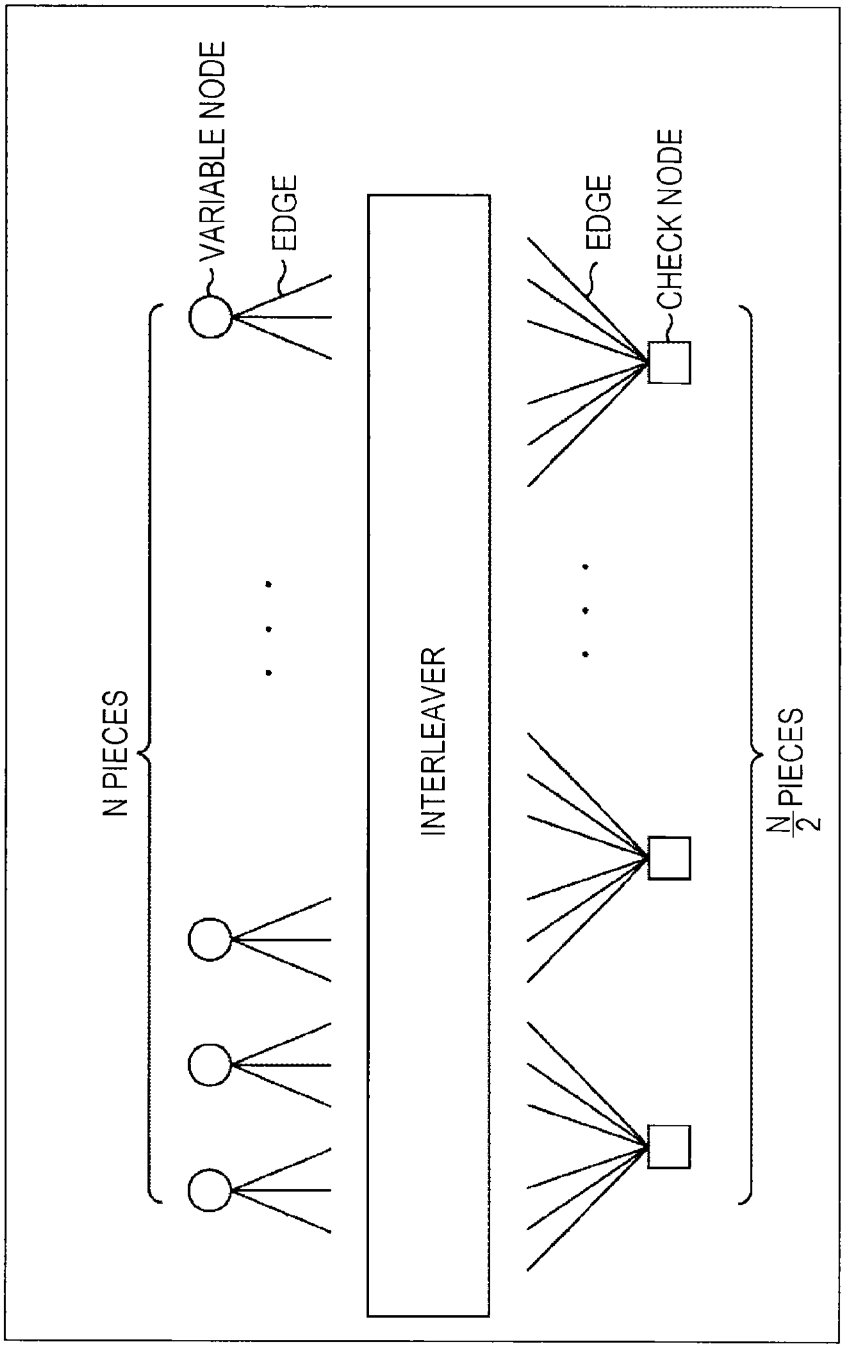
FIG. 107 is a diagram illustrating an example of a Tanner graph of an ensemble defined by a degree sequence indicating a column weight of 3 and a row weight of 6.
Figure 108:
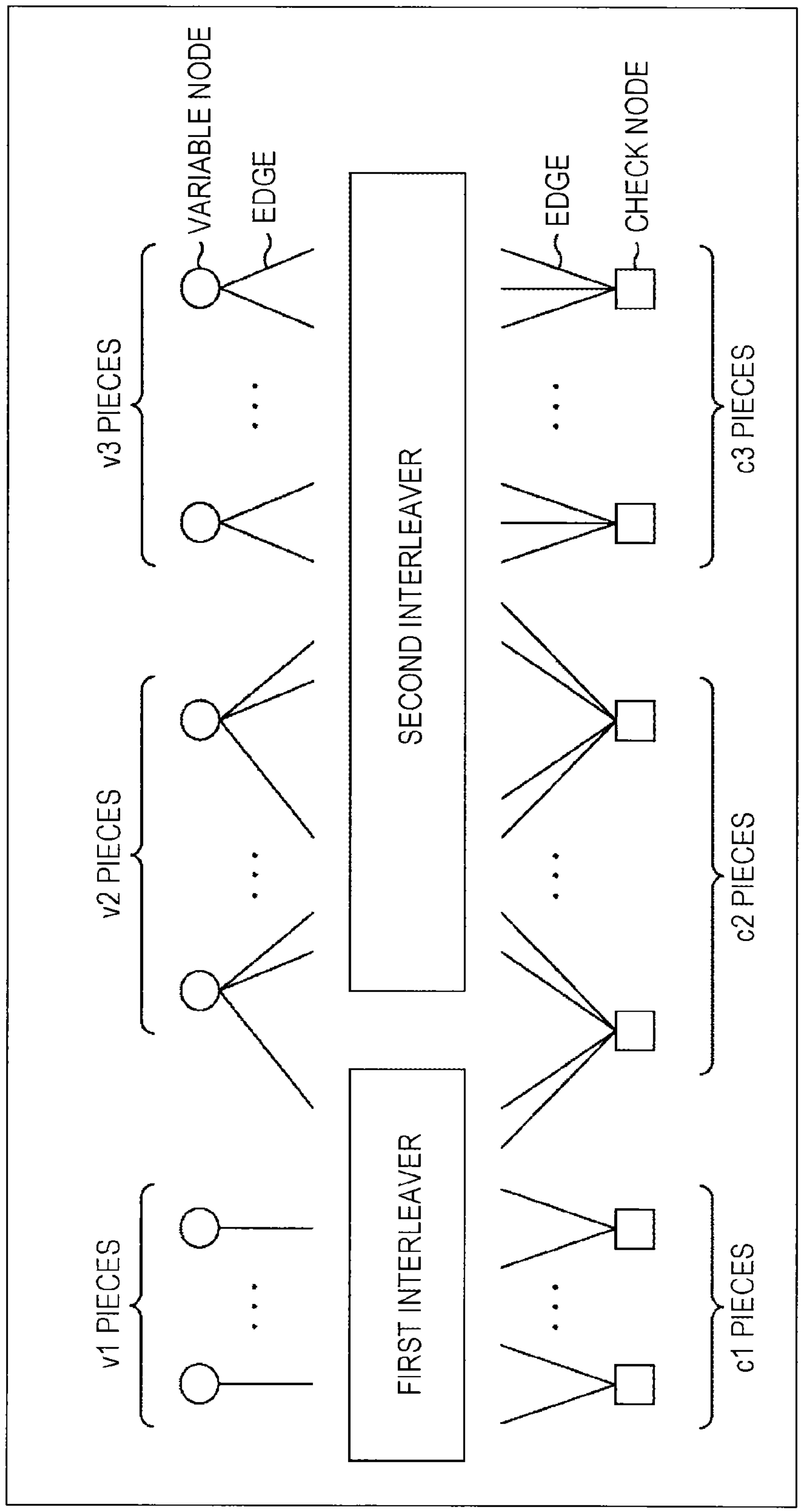
FIG. 108 is a diagram illustrating an example of a Tanner graph of a multi-edge type ensemble.

FIGS. 107 and 108 are diagrams depicting density evolution through which analysis results are obtained, as a certain condition that an appropriate parity check matrix H is to satisfy.

Density evolution is a code analysis technique for calculating an expected value of error probability for the set of all LDPC codes ("ensemble") whose code length N, which is characterized by a degree sequence described below, is infinite (∞).

For example, if a noise variance increases from zero in an AWGN channel, the expected value of error probability for a certain ensemble is initially zero, and becomes non-zero if the noise variance is greater than or equal to a certain threshold.

In the density evolution method, it can be determined whether the ensemble performance (i.e., the appropriateness of a parity check matrix) is good or not, by comparing noise variance thresholds (hereinafter also referred to as "performance thresholds") over which the expected values of error probability for ensembles become non-zero.

Note that the general performance of a specific LDPC code can be predicted by determining an ensemble including the LDPC code and performing density evolution on the ensemble.

Accordingly, once an ensemble with good performance is found, an LDPC code with good performance may be found from among the LDPC codes included in the ensemble.

Here, the degree sequence, described above, represents the ratio of variable nodes or check nodes with a weight of each value to the code length N of an LDPC code.

For example, a regular (3,6) LDPC code with a code rate of 1/2 belongs to an ensemble characterized by a degree sequence indicating that the weight (column weight) for all the variable nodes is 3 and the weight (row weight) for all the check nodes is 6.

FIG. 107 illustrates a Tanner graph of the above-described ensemble.

The Tanner graph illustrated in FIG. 107 includes N variable nodes indicated by circles ("○") in FIG. 107, the number of which is equal to the code length N, and N/2 check nodes indicated by squares ("□") in FIG. 107, the number of which is equal to a value obtained by multiplying the code length N by the code rate 1/2.

Three edges, the number of which is equal to the column weight, are connected to each variable node. Therefore, 3N edges in total are connected to the N variable nodes.

In addition, six edges, the number of which is equal to the row weight, are connected to each check node. Therefore, 3N edges in total are connected to the N/2 check nodes.

In the Tanner graph illustrated in FIG. 107, one interleaver is also included.

The interleaver randomly reorders the 3N edges connected to the N variable nodes, and connects each of the reordered edges to one of the 3N edges connected to the N/2 check nodes.

There are $(3N)!(=(3N)\times(3N-1)\times \ldots \times 1)$ reordering patterns in which the interleaver reorders the 3N edges connected to the N variable nodes. Accordingly, an ensemble characterized by a degree sequence indicating that the weight for all the variable nodes is 3 and the weight for all the check nodes is 6 is the set of (3N)! LDPC codes.

In a simulation for determining an LDPC code with good performance (i.e., an appropriate parity check matrix), a multi-edge type ensemble was used in density evolution.

In the multi-edge type, an interleaver through which edges connected to variable nodes and edges connected to check nodes extend is divided into a plurality of pieces (multi-edge), which may allow more accurate characterization of an ensemble.

FIG. 108 illustrates an example of a Tanner graph of a multi-edge type ensemble.

In the Tanner graph illustrated in FIG. 108, two interleavers, namely, a first interleaver and a second interleaver, are included.

In addition, the Tanner graph illustrated in FIG. 108 includes v1 variable nodes each having one edge connected to the first interleaver and zero edges connected to the second interleaver, v2 variable nodes each having one edge connected to the first interleaver and two edges connected to the second interleaver, and v3 variable nodes each having zero edges connected to the first interleaver and two edges connected to the second interleaver.

The Tanner graph illustrated in FIG. 108 further includes c1 check nodes each having two edges connected to the first interleaver and zero edges connected to the second interleaver, c2 check nodes each having two edges connected to the first interleaver and two edges connected to the second interleaver, and c3 check nodes each having zero edges connected to the first interleaver and three edges connected to the second interleaver.

Here, density evolution and an implementation thereof are described in, for example, "On the Design of Low-Density Parity-Check Codes within 0.0045 dB of the Shannon Limit", S. Y. Chung, G. D. Forney, T. J. Richardson, R. Urbanke, IEEE Communications Leggers, VOL. 5, NO. 2, February 2001.

In a simulation for determining (a parity check matrix initial value table of) a new LDPC code, an ensemble for which the performance threshold, which is $E_b/N_0$ (which is the ratio of the signal power per bit to the noise power) at which a BER begins to drop (i.e., decreases), is less than or equal to a certain value was found using multi-edge type density evolution, and an LDPC code that reduces a BER in a plurality of modulation schemes used in DVB-S.2 and the like, such as QPSK, was selected as an LDPC code with good performance from among the LDPC codes belonging to the ensemble.

The parity check matrix initial value tables of the new LDPC codes described above are parity check matrix initial value tables of LDPC codes having a code length N of 64 k bits, which are determined through the simulations described above.

FIG. 109 is a diagram illustrating minimum cycle lengths and performance thresholds for parity check matrices H which are determined from parity check matrix initial value tables of new LDPC codes having a code length N of 64 k bits and 28 code rates of 2/30 to 29/30 illustrated in FIGS. 40 to 106.

Here, a minimum cycle length (or girth) is a minimum value of the length (loop length) of a loop composed of elements of 1 in a parity check matrix H.

Cycle 4 (a loop of elements of 1, with a loop length of 4) does not exist in a parity check matrix H determined from a parity check matrix initial value table of a new LDPC code.

In addition, as the code rate r decreases, the redundancy of an LDPC code increases. Thus, the performance threshold tends to be improved (i.e., decrease) as the code rate r decreases.

Figure 110:
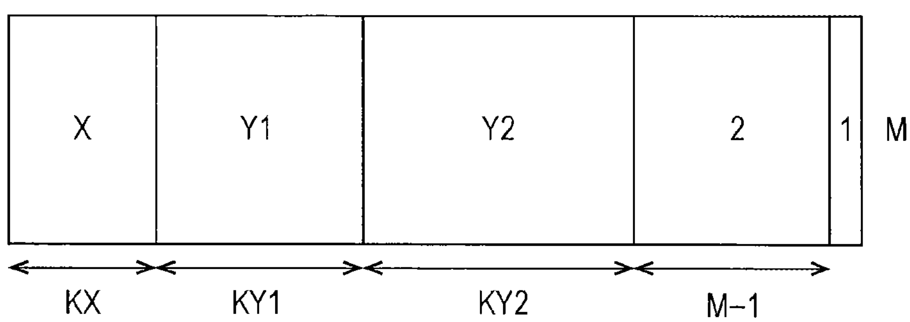
FIG. 110 is a diagram depicting a parity check matrix of an LDPC code with the code length 64800.

FIG. 110 is a diagram depicting a parity check matrix H (hereinafter also referred to as a "parity check matrix H of a new LDPC code") (determined from each of the parity check matrix initial value tables) illustrated in FIGS. 40 to 106.

The parity check matrix H of the new LDPC code has a column weight X for KX columns, starting with the first column, a column weight of Y1 for the subsequent KY1 columns, a column weight of Y2 for the subsequent KY2 columns, a column weight of 2 for the subsequent (M−1) columns, and a column weight of 1 for the last column.

Here, the sum of columns given by KX+KY1+KY2+M−1+1 equals the code length N=64800 bits.

FIG. 111 is a diagram illustrating the numbers of columns KX, KY1, KY2, and M, and the column weights X, Y1, and Y2 illustrated in FIG. 110 for the respective code rates r of the new LDPC codes.

In a parity check matrix H of a new LDPC code having a code length N of 64 k, similarly to the parity check matrix described with reference to FIGS. 12 and 13, the column weight tends to increase as the ordinal number of the columns of the parity check matrix H decreases (i.e., as the column comes closer to the left end of the parity check matrix H). Accordingly, robustness to errors (or resistance to errors) tends to increase as the ordinal number of the code bits of a new LDPC code decreases (i.e., the first code bit tends to be the most robust to errors).

It is noted that the amount of shift q used in cyclic shifting which is performed to determine a parity check matrix from a parity check matrix initial value table of a new LDPC code having a code length N of 64 k in the way described with reference to FIG. 38 is represented by the equation q=M/P=M/360.

Accordingly, the amounts of shift for new LDPC codes with code rates of 2/30, 3/30, 4/30, 5/30, 6/30, 7/30, 8/30, 9/30, 10/30, 11/30, 12/30, 13/30, 14/30, 15/30, 16/30, 17/30, 18/30, 19/30, 20/30, 21/30, 22/30, 23/30, 24/30, 25/30, 26/30, 27/30, 28/30, and 29/30 are 168, 162, 156, 150, 144, 138, 132, 126, 120, 114, 108, 102, 96, 90, 84, 78, 72, 66, 60, 54, 48, 42, 36, 30, 24, 18, 12, and 6, respectively.

Figure 112:
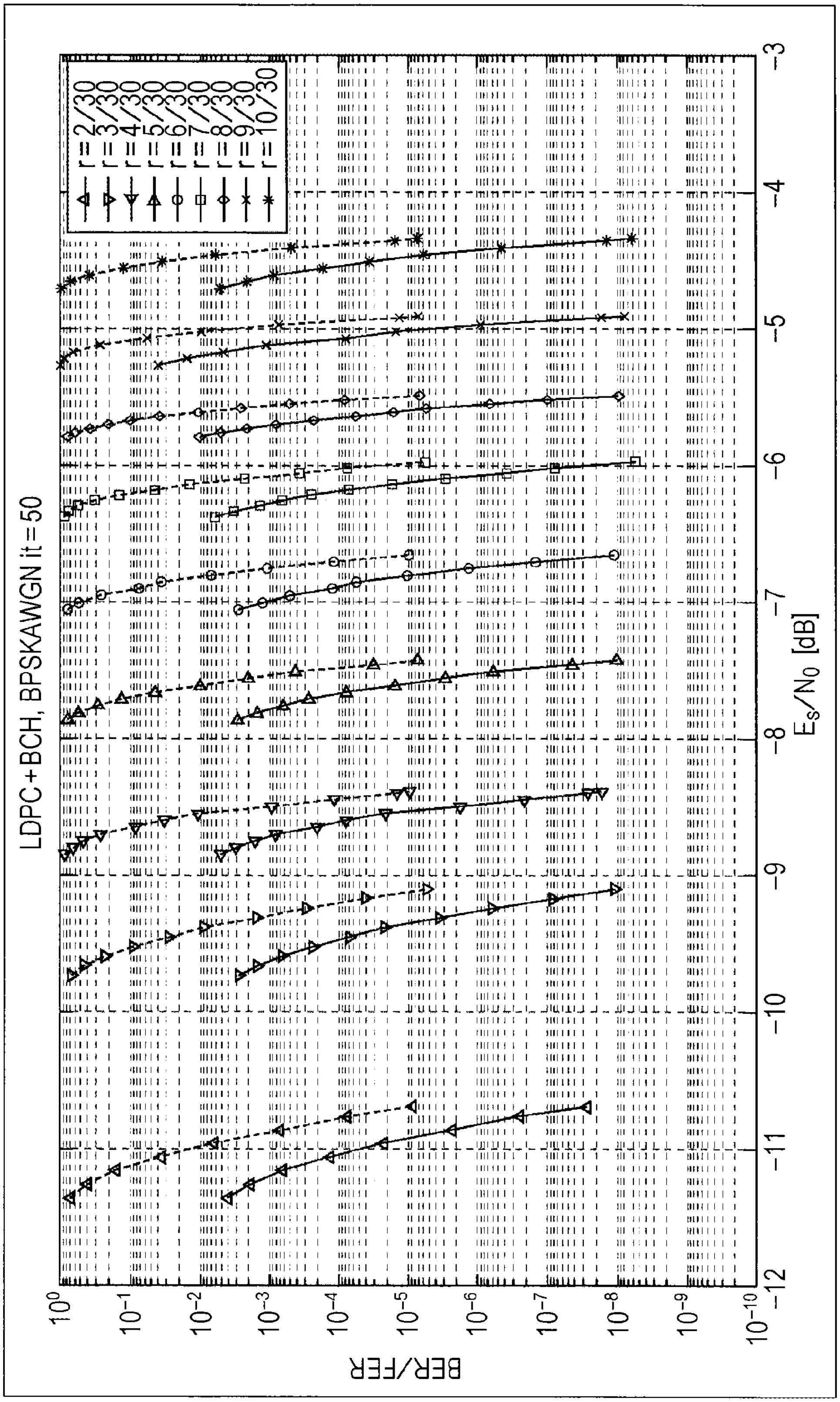
FIG. 112 is a diagram illustrating simulated BERs/FERs of LDPC codes with the code length 64800.
Figure 113:
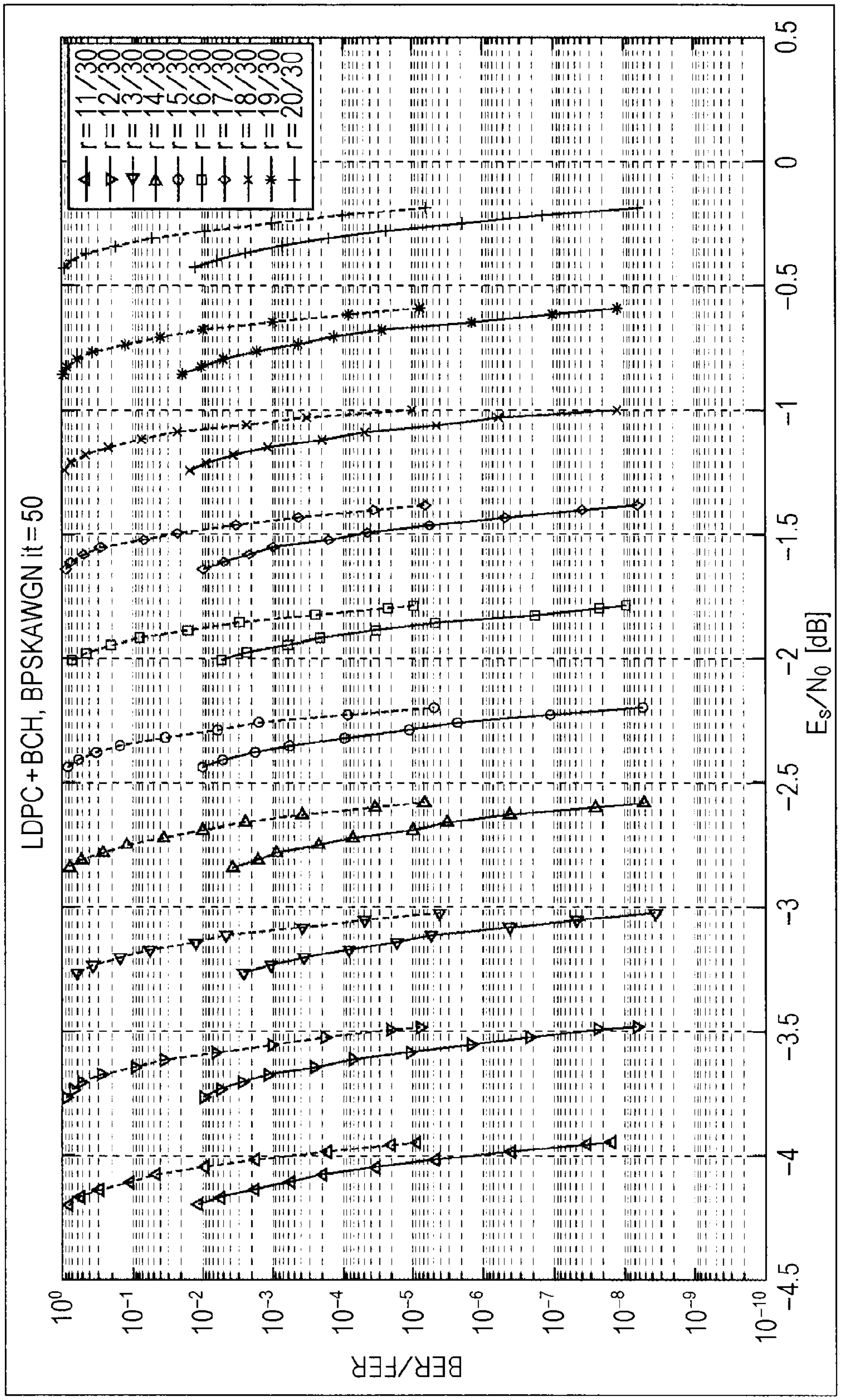
FIG. 113 is a diagram illustrating simulated BERs/FERs of LDPC codes with the code length 64800.
Figure 114:
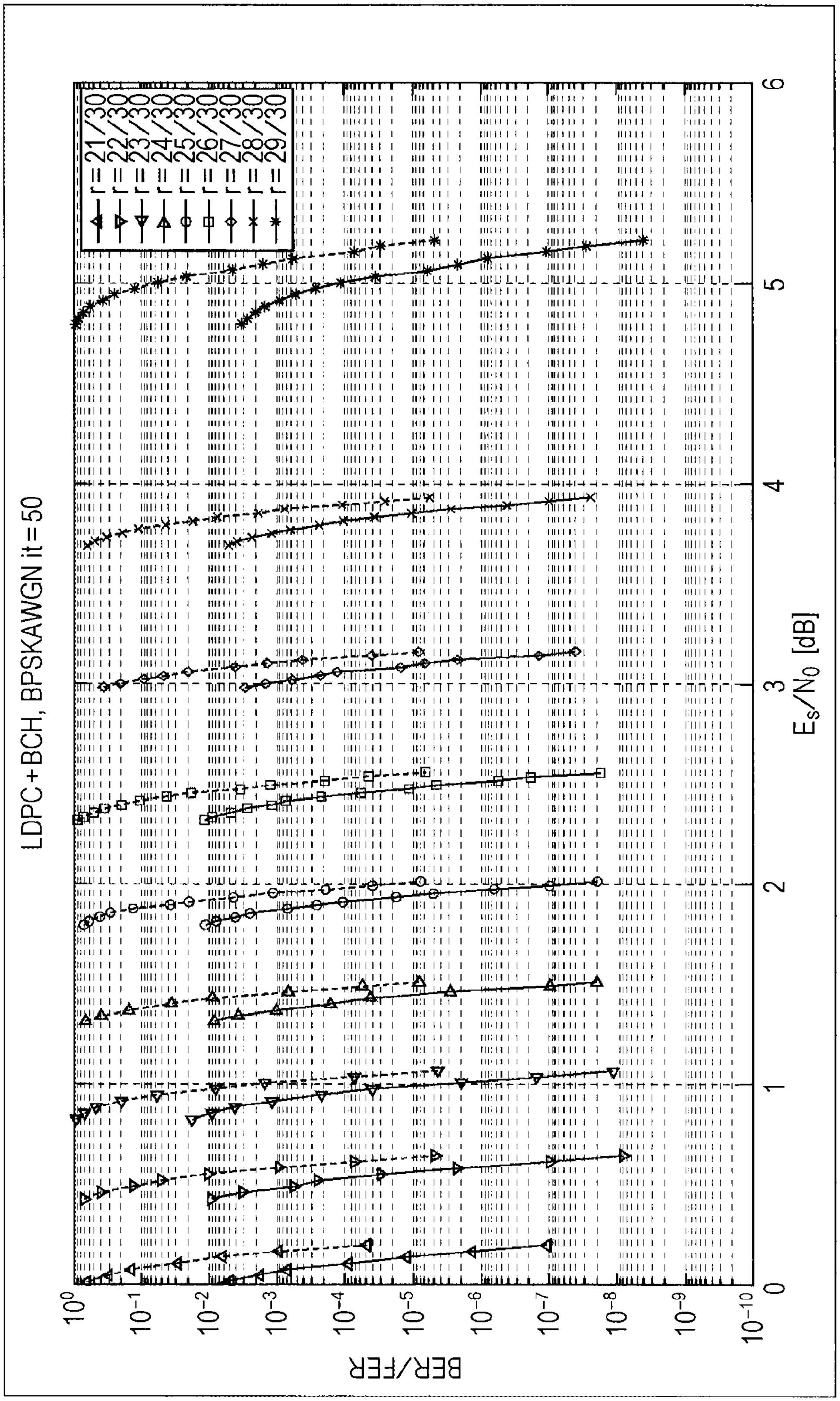
FIG. 114 is a diagram illustrating simulated BERs/FERs of LDPC codes with the code length 64800.

FIGS. 112, 113, and 114 are diagrams illustrating simulated BERs/FERs for the new LDPC codes illustrated in FIGS. 40 to 106.

The simulations were based on the assumption of an AWGN communication path (or channel), in which BPSK was employed as a modulation scheme and the number of times of repetitive decoding C(it) was 50.

In FIGS. 112, 113, and 114, the horizontal axis represents $E_s/N_0$, and the vertical axis represents BER/FER. Note that solid lines indicate BERs and dotted lines indicate FERs.

In FIGS. 112 to 114, FER (BER) curves for the respective new LDPC codes with 28 code rates of 2/30 to 29/30 exhibit FERs less than or equal to $10^{-5}$ for an $E_s/N_0$ range of (approximately) 15 dB from (substantially) −10 dB to 5 dB.

In the simulations, 28 ModCods having an FER less than or equal to $10^{-5}$ for an $E_s/N_0$ range of 15 dB from −10 dB to 5 dB can be set. Accordingly, 20 or more ModCods having an FER less than or equal to $10^{-5}$ for a range of 7 dB from 5 dB to 12 dB can be sufficiently predicted to be set by taking into account various modulation schemes other than BPSK used in the simulations, such as QPSK, BPSK, 16APSK, 32APSK, 16QAM, 32QAM, and 64QAM.

Thus, it is possible to provide an LDPC code having good error-rate performance, meeting the first request in the CfT.

In addition, referring to FIGS. 112 to 114, most of FER (BER) curves for new LDPC codes are drawn at almost equal intervals less than 1 dB for each of low-, intermediate-, and high-code-rate groups. Accordingly, the new LDPC codes may provide broadcasters that broadcast programs using the transmitting device 11 with an advantage in facilitating selection of code rates to be used for broadcasting in accordance with the state of channels (i.e., the communication path 13).

Note that, in the simulations for determining the BER/FER curves illustrated in FIGS. 112 to 114, BCH encoding was performed on information, and the resulting BCH codes underwent LDPC encoding.

FIG. 115 includes diagrams depicting BCH encoding which was used in the simulations.

More specifically, part A of FIG. 115 is a diagram illustrating parameters of BCH encoding that is performed prior to the LDPC encoding into an LDPC code of 64 k, which is defined in the DVB-S.2 standard.

In DVB-S.2, 192, 160, or 128 redundancy bits are added in accordance with the code rate of an LDPC code, thereby providing BCH encoding capable of 12-, 10-, or 8-bit error correction.

Part B of FIG. 115 is a diagram illustrating parameters of BCH encoding which were used in the simulations.

In the simulations, similarly to the case of DVB-S.2, BCH encoding capable of 12-, 10-, or 8-bit error correction was performed by addition of 192, 160, or 128 redundancy bits in accordance with the code rate of an LDPC code.

[Example Configuration of Receiving Device 12]

Figure 116:
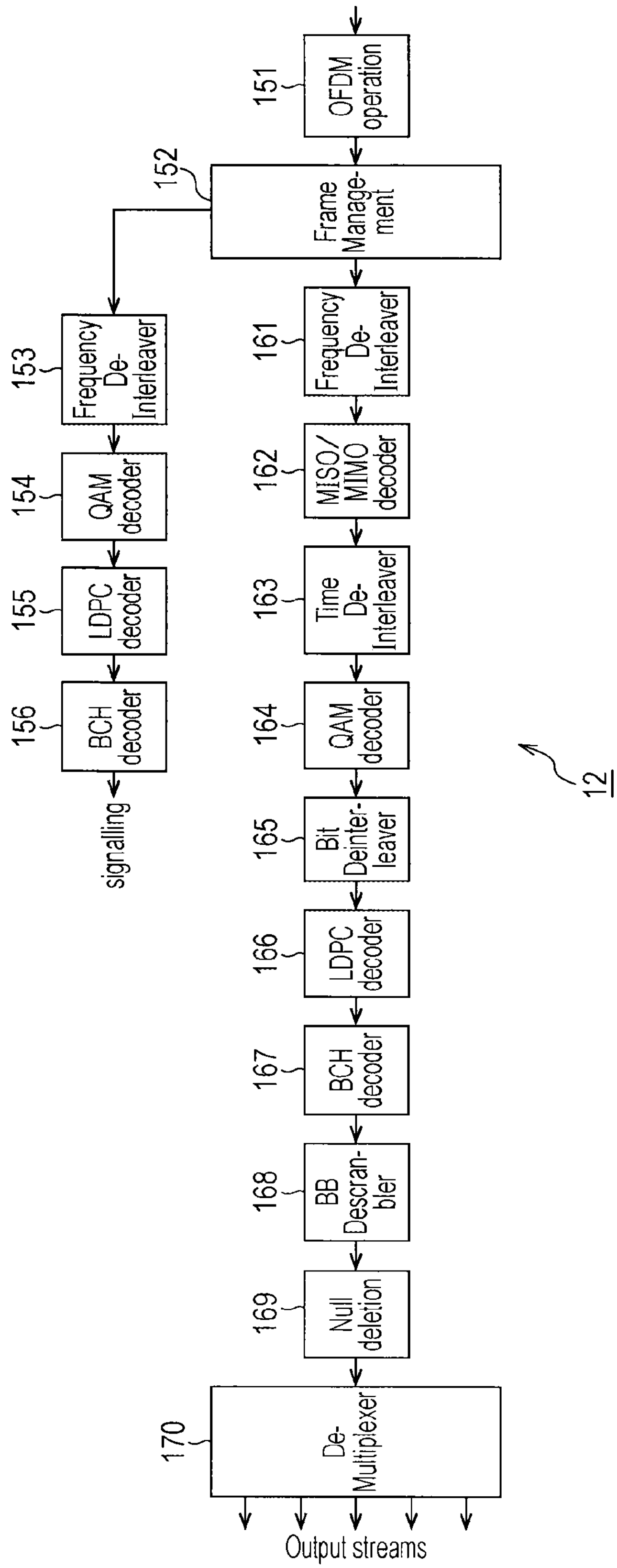
FIG. 116 is a block diagram illustrating an example configuration of a receiving device 12.

FIG. 116 is a block diagram illustrating an example configuration of the receiving device 12 illustrated in FIG. 7.

An OFDM processing unit (OFDM operation) 151 receives an OFDM signal from the transmitting device 11 (FIG. 7), and performs signal processing on the OFDM signal. The data (i.e., symbols) obtained through signal processing performed by the OFDM processing unit 151 is supplied to a frame management unit (Frame Management) 152.

The frame management unit 152 performs processing (frame interpretation) of a frame including the symbols supplied from the OFDM processing unit 151 to obtain symbols of target data and symbols of control data, and supplies the symbols of the target data and the symbols of the control data to frequency deinterleavers 161 and 153, respectively.

The frequency deinterleaver 153 performs frequency deinterleaving on the symbols supplied from the frame management unit 152 in units of symbols, and supplies the resulting symbols to a QAM decoder 154.

The QAM decoder 154 demaps the symbols (i.e., symbols mapped to constellation points) supplied from the frequency deinterleaver 153 (i.e., decodes the constellation points) for orthogonal demodulation, and supplies the resulting data (i.e., an LDPC code) to an LDPC decoder 155.

The LDPC decoder 155 performs LDPC decoding on the LDPC code supplied from the QAM decoder 154, and supplies the resulting LDPC target data (in the illustrated example, a BCH code) to a BCH decoder 156.

The BCH decoder 156 performs BCH decoding on the LDPC target data supplied from the LDPC decoder 155, and outputs the resulting control data (signalling).

On the other hand, the frequency deinterleaver 161 performs frequency deinterleaving on the symbols supplied from the frame management unit 152 in units of symbols, and supplies the resulting symbols to an MISO/MIMO decoder 162.

The MISO/MIMO decoder 162 performs space-time decoding on the data (i.e., symbols) supplied from the frequency deinterleaver 161, and supplies the resulting data to a time deinterleaver 163.

The time deinterleaver 163 performs time deinterleaving on the data (i.e., symbols) supplied from the MISO/MIMO decoder 162 in units of symbols, and supplies the resulting data to a QAM decoder 164.

The QAM decoder 164 demaps the symbols (i.e., symbols mapped to constellation points) supplied from the time deinterleaver 163 (i.e., decodes the constellation points) for orthogonal demodulation, and supplies the resulting data (i.e., symbols) to a bit deinterleaver 165.

The bit deinterleaver 165 performs bit deinterleaving on the data (i.e., symbols) supplied from the QAM decoder 164, and supplies the resulting LDPC code to an LDPC decoder 166.

The LDPC decoder 166 performs LDPC decoding on the LDPC code supplied from the bit deinterleaver 165, and supplies the resulting LDPC target data (in the illustrated example, a BCH code) to a BCH decoder 167.

The BCH decoder 167 performs BCH decoding on the LDPC target data supplied from the LDPC decoder 155, and supplies the resulting data to a BB descrambler 168.

The BB descrambler 168 performs BB descrambling on the data supplied from the BCH decoder 167, and supplies the resulting data to a null deletion unit (Null Deletion) 169.

The null deletion unit 169 deletes the null added by the padder 112 illustrated in FIG. 8, from the data supplied from the BB descrambler 168, and supplies the resulting data to a demultiplexer 170.

The demultiplexer 170 separates one or more streams (target data) multiplexed in the data supplied from the null deletion unit 169, performs necessary processing, and outputs the resulting data as output streams.

Note that the receiving device 12 may be configured without including some of the blocks illustrated in FIG. 116. More specifically, for example, if the transmitting device 11 (FIG. 8) is configured without including the time interleaver 118, the MISO/MIMO encoder 119, the frequency interleaver 120, and the frequency interleaver 124, the receiving device 12 may be configured without including the time deinterleaver 163, the MISO/MIMO decoder 162, the frequency deinterleaver 161, and the frequency deinterleaver 153, which are the blocks corresponding to the time interleaver 118, the MISO/MIMO encoder 119, the frequency interleaver 120, and the frequency interleaver 124 of the transmitting device 11, respectively.

Figure 117:
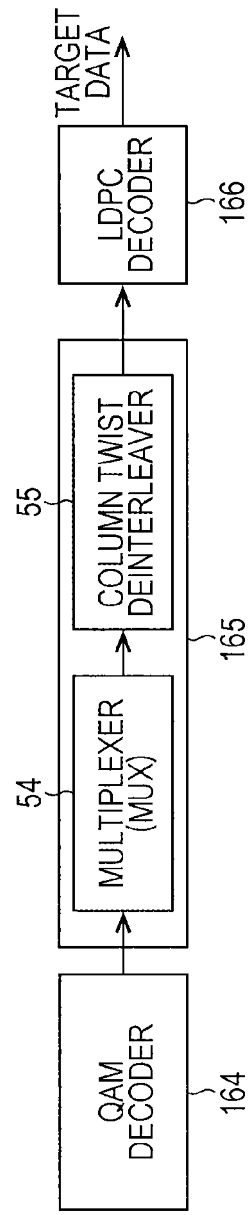
FIG. 117 is a block diagram illustrating an example configuration of a bit deinterleaver 165.

FIG. 117 is a block diagram illustrating an example configuration of the bit deinterleaver 165 illustrated in FIG. 116.

The bit deinterleaver 165 includes a multiplexer (MUX) 54 and a column twist deinterleaver 55, and performs (bit) deinterleaving on the symbol bits of the symbols supplied from the QAM decoder 164 (FIG. 116).

More specifically, the multiplexer 54 performs inverse permutation processing (which is the inverse of permutation processing), corresponding to the permutation processing performed by the demultiplexer 25 illustrated in FIG. 9, on the symbol bits of the symbols supplied from the QAM decoder 164. That is, the multiplexer 54 performs inverse permutation processing to restore the positions of the code bits (i.e., symbol bits) of the LDPC code permuted through the permutation processing to the original positions, and supplies the resulting LDPC code to the column twist deinterleaver 55.

The column twist deinterleaver 55 performs column twist deinterleaving (which is the inverse of column twist interleaving), corresponding to column twist interleaving as the reordering processing performed by the column twist interleaver 24 illustrated in FIG. 9, on the LDPC code supplied from the multiplexer 54. That is, the column twist deinterleaver 55 performs inverse reordering processing, for example, column twist deinterleaving, to restore the code bits of the LDPC code whose order has been changed through column twist interleaving as reordering processing to the original order.

Specifically, the column twist deinterleaver 55 performs column twist deinterleaving by writing and reading the code bits of the LDPC code to and from a memory for deinterleaving which has a configuration similar to that of the memory 31 illustrated in, typically, FIG. 28.

However, the column twist deinterleaver 55 writes code bits to the memory for deinterleaving in its row direction by using, as a write address, the read address at which a code bit has been read from the memory 31. In addition, the column twist deinterleaver 55 reads code bits from the memory for deinterleaving in its column direction by using, as a read address, the write address at which a code bit has been written to the memory 31.

The LDPC code obtained as a result of column twist deinterleaving is supplied from the column twist deinterleaver 55 to the LDPC decoder 166.

Here, if the LDPC code supplied from the QAM decoder 164 to the bit deinterleaver 165 has been subjected to parity interleaving, column twist interleaving, and permutation processing, the bit deinterleaver 165 may perform all of the inverse operations, namely, parity deinterleaving corresponding to parity interleaving (which is the inverse of parity interleaving operation, i.e., parity deinterleaving for restoring the code bits of the LDPC code whose order has been changed through parity interleaving to the original order), inverse permutation processing corresponding to permutation processing, and column twist deinterleaving corresponding to column twist interleaving.

In the bit deinterleaver 165 illustrated in FIG. 117, however, parity deinterleaving is not performed because the bit deinterleaver 165 does not include a block configured to perform parity deinterleaving corresponding to parity interleaving although it includes the multiplexer 54 that performs inverse permutation processing corresponding to permutation processing and the column twist deinterleaver 55 that performs column twist deinterleaving corresponding to column twist interleaving.

Accordingly, the LDPC code on which inverse permutation processing and column twist deinterleaving have been performed but parity deinterleaving has not been performed is supplied from (the column twist deinterleaver 55 of) the bit deinterleaver 165 to the LDPC decoder 166.

The LDPC decoder 166 performs LDPC decoding on the LDPC code supplied from the bit deinterleaver 165 by using a transformed parity check matrix obtained by performing at least column permutation corresponding to parity interleaving on the parity check matrix H that the LDPC encoder 115 illustrated in FIG. 8 has used for LDPC encoding, and outputs the resulting data as a result of decoding the LDPC target data.

Figure 118:
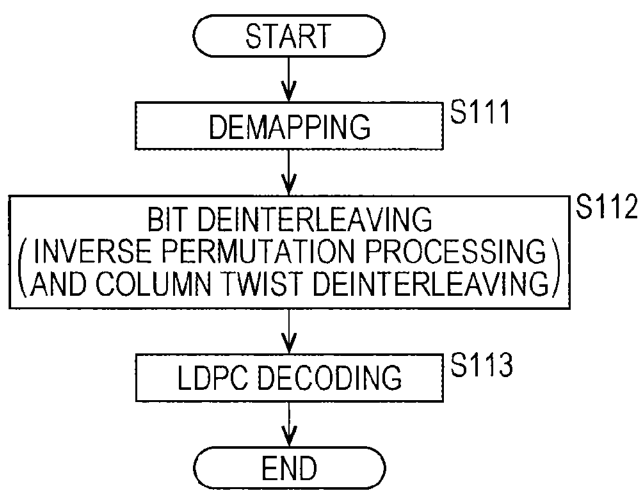
FIG. 118 is a flowchart depicting a process performed by a QAM decoder 164, the bit deinterleaver 165, and an LDPC decoder 166.

FIG. 118 is a flowchart depicting a process performed by the QAM decoder 164, the bit deinterleaver 165, and the LDPC decoder 166 illustrated in FIG. 117.

In step S111, the QAM decoder 164 demaps the symbols (i.e., symbols mapped to constellation points) supplied from the time deinterleaver 163 for orthogonal demodulation, and supplies the resulting data to the bit deinterleaver 165. Then, the process proceeds to step S112.

In step S112, the bit deinterleaver 165 performs deinterleaving (i.e., bit deinterleaving) on the symbol bits of the symbols supplied from the QAM decoder 164. Then, the process proceeds to step S113.

More specifically, in step S112, the multiplexer 54 in the bit deinterleaver 165 performs inverse permutation processing on the symbol bits of the symbols supplied from the QAM decoder 164, and supplies the code bits of the resulting LDPC code to the column twist deinterleaver 55.

The column twist deinterleaver 55 performs column twist deinterleaving on the LDPC code supplied from the multiplexer 54, and supplies the resulting LDPC code to the LDPC decoder 166.

In step S113, the LDPC decoder 166 performs LDPC decoding on the LDPC code supplied from the column twist deinterleaver 55 by using the parity check matrix H that the LDPC encoder 115 illustrated in FIG. 8 has used for LDPC encoding, that is, by using a transformed parity check matrix obtained by performing at least column permutation corresponding to parity interleaving on the parity check matrix H, and outputs the resulting data to the BCH decoder 167 as a result of decoding the LDPC target data.

Note that, also in FIG. 117, similarly to the case illustrated in FIG. 9, the multiplexer 54 that performs inverse permutation processing and the column twist deinterleaver 55 that performs column twist deinterleaving are configured as separate units, for convenience of illustration. However, the multiplexer 54 and the column twist deinterleaver 55 may be integrated into a single unit.

In addition, if the bit interleaver 116 illustrated in FIG. 9 does not perform column twist interleaving, the bit deinterleaver 165 illustrated in FIG. 117 need not be provided with the column twist deinterleaver 55.

Next, LDPC decoding performed by the LDPC decoder 166 illustrated in FIG. 116 will be described in further detail.

As described above, the LDPC decoder 166 illustrated in FIG. 116 performs LDPC decoding on the LDPC code supplied from the column twist deinterleaver 55, on which inverse permutation processing and column twist deinterleaving have been performed but parity deinterleaving has not been performed, by using a transformed parity check matrix obtained by performing at least column permutation corresponding to parity interleaving on the parity check matrix H that the LDPC encoder 115 illustrated in FIG. 8 has used for LDPC encoding.

Here, LDPC decoding may be performed using a transformed parity check matrix so as to keep the operating frequency within a sufficiently feasible range while reducing the size of circuitry. Such LDPC decoding has been previously proposed (see, for example, Japanese Patent No. 4224777).

Accordingly, first, LDPC decoding using a transformed parity check matrix, which has been previously proposed, will be described with reference to FIGS. 119 to 122.

Figure 119:
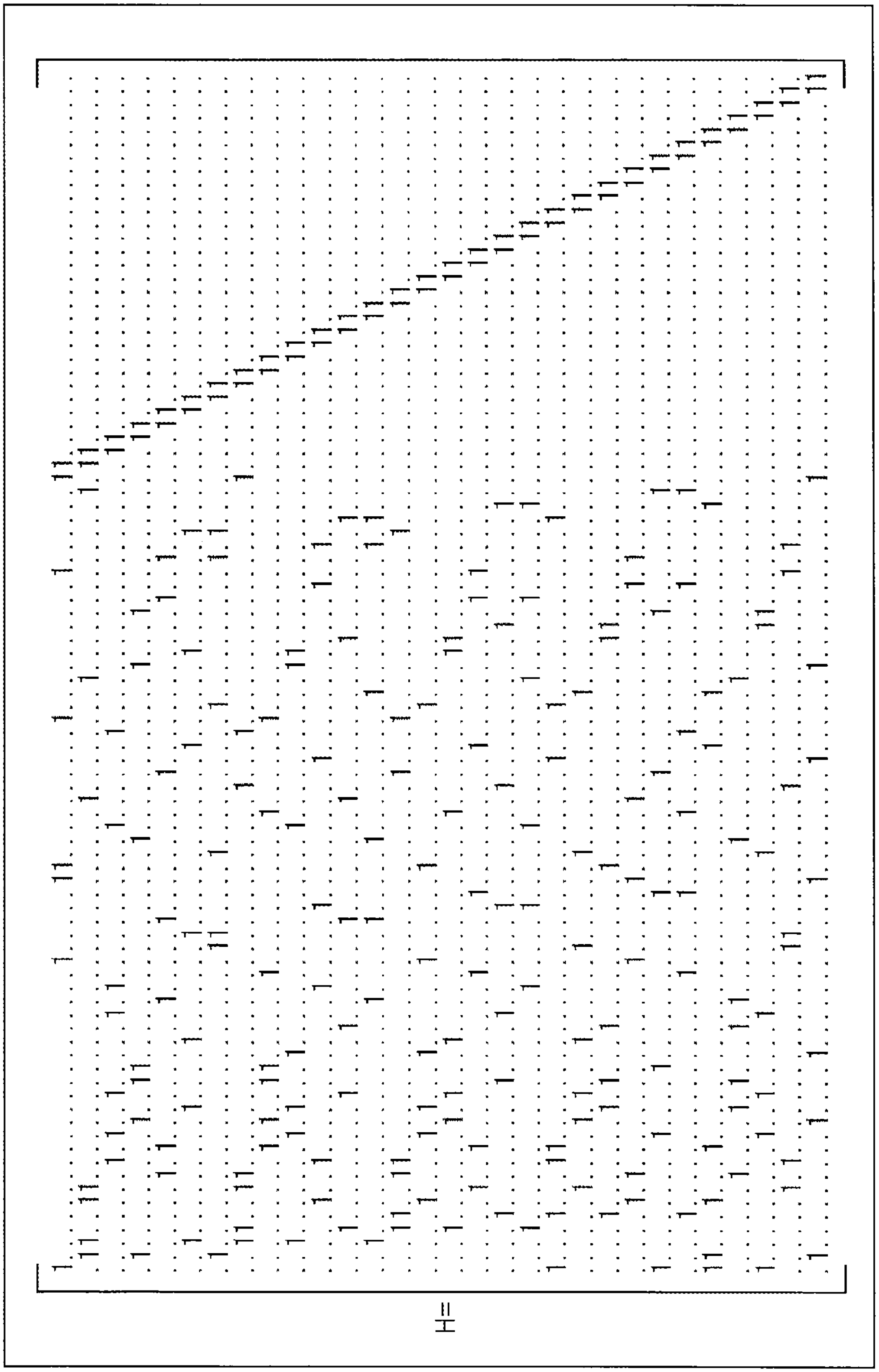
FIG. 119 is a diagram illustrating an example of a parity check matrix of an LDPC code.

FIG. 119 illustrates an example of a parity check matrix H of an LDPC code having a code length N of 90 and a code rate of 2/3.

Note that, in FIG. 119 (also in FIGS. 120 and 121, described below), "0" is represented by a period (".").

In the parity check matrix H illustrated in FIG. 119, a parity matrix has a stepwise structure.

Figure 120:
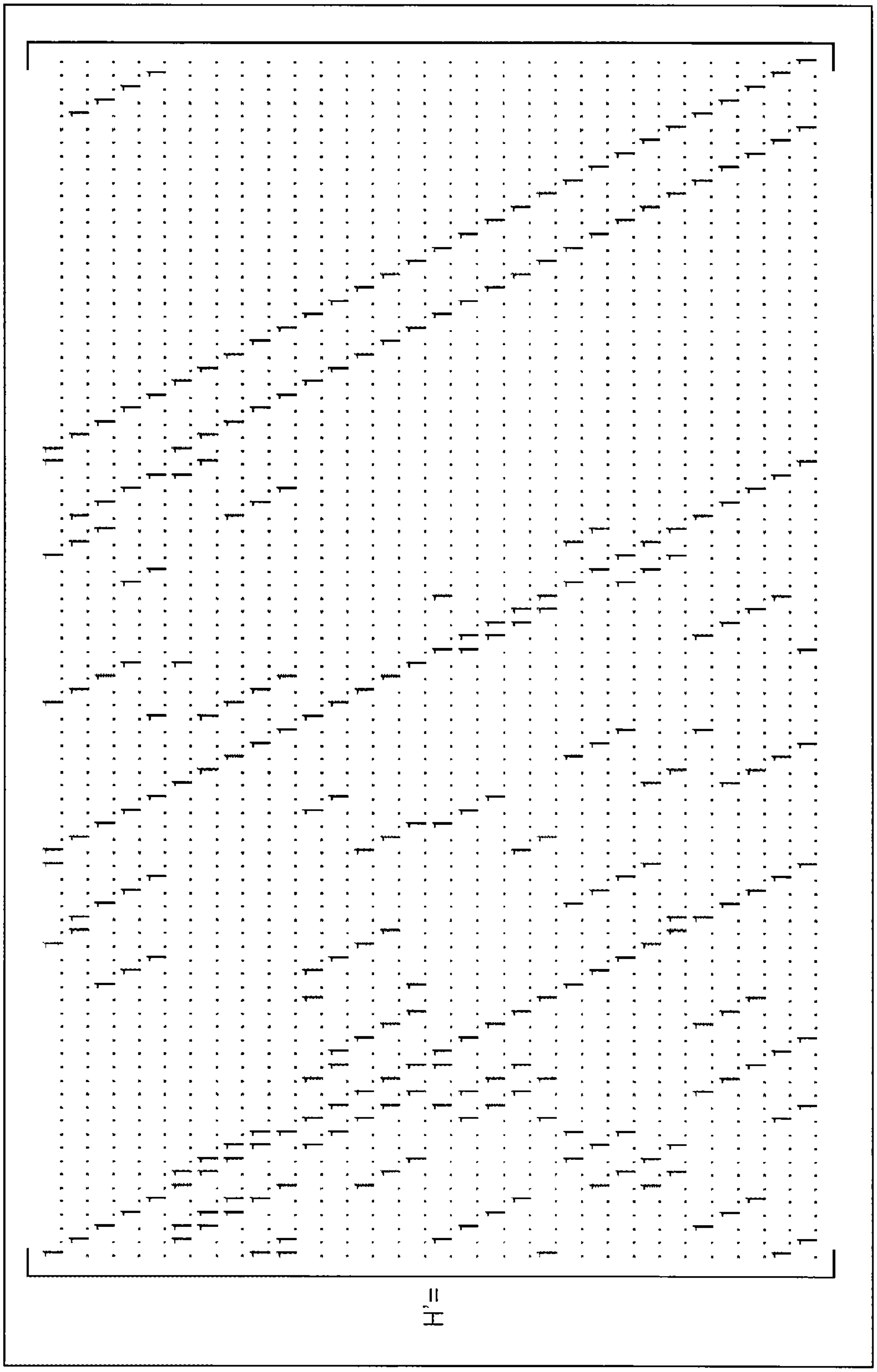

FIG. 120 illustrates a parity check matrix H' obtained by performing row permutation of Expression (11) and column permutation of Expression (12) on the parity check matrix H illustrated in FIG. 119.

$$\text{Row permutation:}(6s+t+1)\text{-}th \text{ row}\rightarrow(5t+s+1)\text{-}th \text{ row} \quad (11)$$

$$\text{Column permutation:}(6x+y+61)\text{-}th \text{ column}\rightarrow(5y+x+61)\text{-}th \text{ column} \quad (12)$$

Note that, in Expressions (11) and (12), s, t, x, and y are integers in the ranges of $0\leq s<5$, $0\leq t<6$, $0\leq x<5$, and $0\leq t<6$, respectively.

The row permutation of Expression (11) allows permutation such that the 1st, 7th, 13th, 19th, and 25th rows, whose numbers are divided by 6 yielding a remainder of 1, are replaced with the 1st, 2nd, 3rd, 4th, and 5th rows, respectively, and the 2nd, 8th, 14th, 20th, and 26th rows, whose numbers are divided by 6 yielding a remainder of 2, are replaced with the 6th, 7th, 8th, 9th, and 10th rows, respectively.

Further, the column permutation of Expression (12) allows permutation such that the 61st, 67th, 73rd, 79th, and 85th columns, whose numbers are divided by 6 yielding a remainder of 1, among the columns subsequent to the 61st column (parity matrix), are replaced with the 61st, 62nd, 63rd, 64th, and 65th columns, respectively, and the 62nd, 68th, 74th, 80th, and 86th columns, whose numbers are divided by 6 yielding a remainder of 2, are replaced with the 66th, 67th, 68th, 69th, and 70th columns, respectively.

A matrix obtained by performing row and column permutations on the parity check matrix H illustrated in FIG. 119 in the way described above is the parity check matrix H' illustrated in FIG. 120.

Here, the row permutation of the parity check matrix H would not affect the order of the code bits of the LDPC code.

Furthermore, the column permutation of Expression (12) corresponds to parity interleaving that is performed to interleave the (K+qx+y+1)-th code bit to the (K+Py+x+1)-th code bit position as described above, when the information length K is 60, the number of unit columns P of the cyclic structure is 5, and the divisor q (=M/P) of the parity length M (in the illustrated example, 30) is 6.

Accordingly, the parity check matrix H' illustrated in FIG. 120 is a transformed parity check matrix obtained by performing at least column permutation to replace the (K+qx+y+1)-th column of the parity check matrix (hereinafter referred to as an "original parity check matrix" as appropriate) H illustrated in FIG. 119 with the (K+Py+x+1)-th column.

Multiplying the transformed parity check matrix H' illustrated in FIG. 120 by an LDPC code obtained by performing the same permutation as that of Expression (12) on the LDPC code of the original parity check matrix H illustrated in FIG. 119 yields a zero vector. More specifically, if a row vector obtained by performing column permutation of Expression (12) on a row vector c as an LDPC code (i.e., a code word) of the original parity check matrix H is represented by c', $Hc^T$ is a zero vector due to the nature of the parity check matrix, and therefore $H'c'^T$ is also a zero vector.

Thus, the transformed parity check matrix H' illustrated in FIG. 120 is a parity check matrix of an LDPC code c' obtained by performing column permutation of Expression (12) on the LDPC code c of the original parity check matrix H.

Accordingly, a similar result of decoding to that obtained by decoding the LDPC code of the original parity check matrix H using the parity check matrix H may be obtained by decoding (LDPC decoding) the LDPC code c', which is obtained by performing column permutation of Expression (12) on the LDPC code c of the original parity check matrix H, using the transformed parity check matrix H' illustrated in FIG. 120 and then performing the inverse of the column permutation of Expression (12) on the decoded LDPC code c'.

Figure 121:
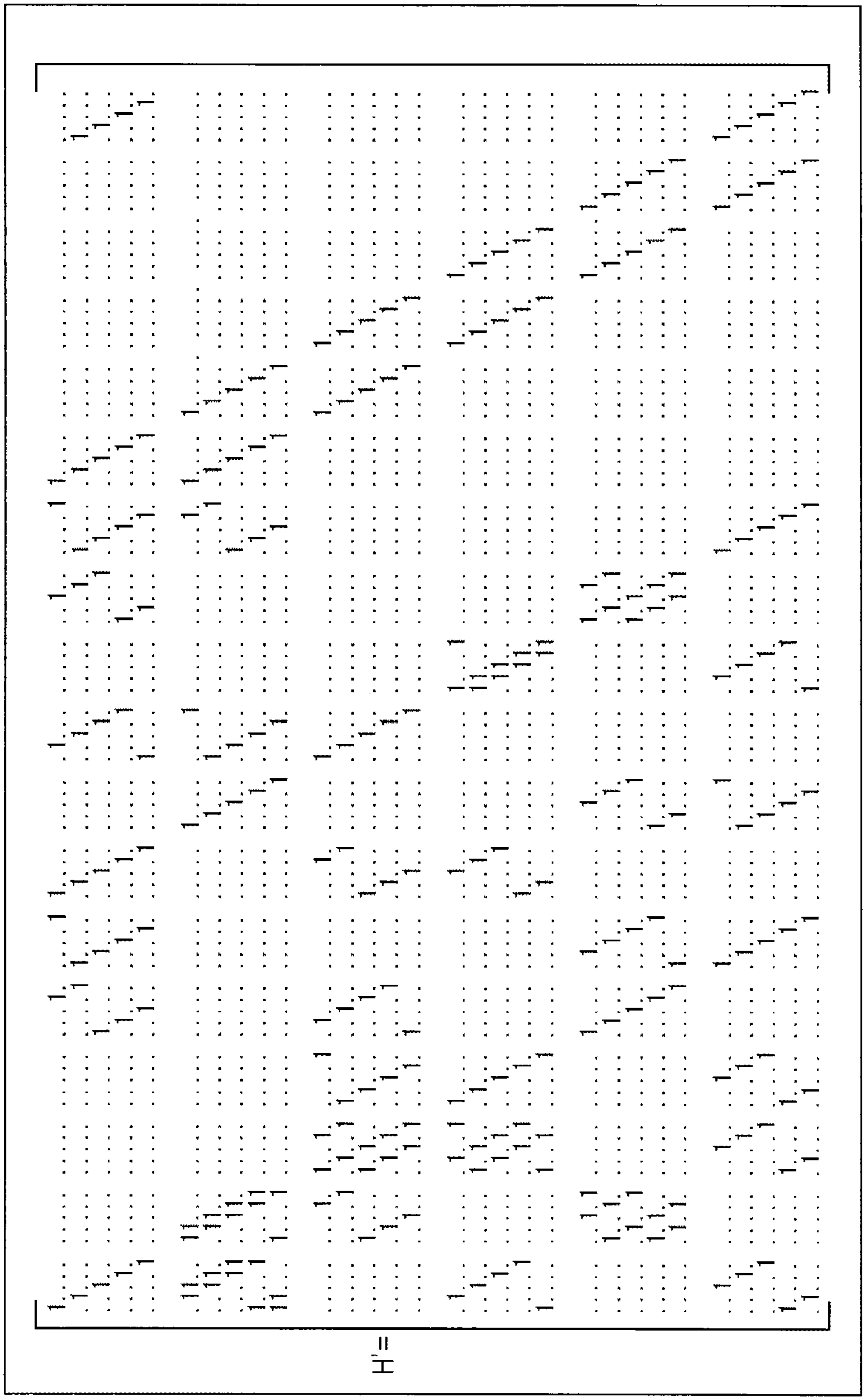

FIG. 121 illustrates the transformed parity check matrix H' illustrated in FIG. 120 whose elements are spaced apart from one another in units of 5×5 matrices.

In FIG. 121, the transformed parity check matrix H' is represented by a combination of 5×5 (=P×P) unit matrices, matrices each having one or more elements of 1 in a unit matrix which are replaced by elements of 0 (hereinafter referred to as "quasi-unit matrices" as appropriate), matrices produced by cyclically shifting a unit matrix or a quasi-unit matrix (hereinafter referred to as "shift matrices" as appropriate), matrices each of which is the sum of two or more of a unit matrix, a quasi-unit matrix, and a shift matrix (hereinafter referred to as "sum matrices" as appropriate), and 5×5 zero matrices.

The transformed parity check matrix H' illustrated in FIG. 121 can be said to be composed of 5×5 unit matrices, quasi-unit matrices, shift matrices, sum matrices, and zero matrices. These 5×5 matrices (unit matrices, quasi-unit matrices, shift matrices, sum matrices, and zero matrices) constituting the transformed parity check matrix H' are hereinafter referred to as "component matrices" as appropriate.

An LDPC code of a parity check matrix represented by P×P component matrices may be decoded using an architecture that simultaneously performs check node computation and variable node computation each for P nodes.

Figure 122:
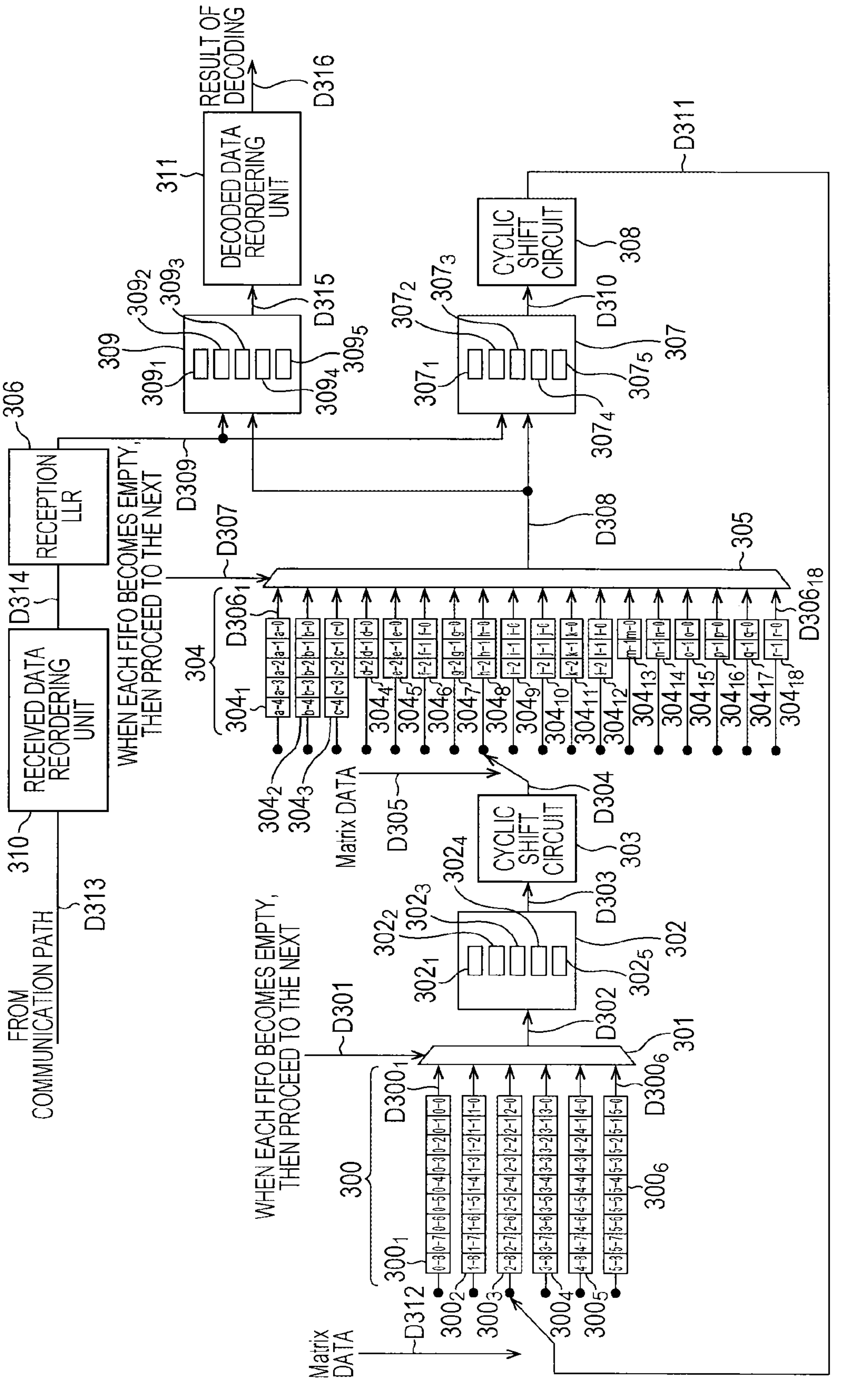

FIG. 122 is a block diagram illustrating an example configuration of a decoding device that performs the decoding operation described above.

More specifically, FIG. 122 illustrates an example configuration of a decoding device configured to decode an LDPC code by using the transformed parity check matrix H' illustrated in FIG. 121, which is obtained by performing at least column permutation of Expression (12) on the original parity check matrix H illustrated in FIG. 119.

The decoding device illustrated in FIG. 122 includes an edge data storage memory 300 having six FIFOs $300_1$ to $300_6$, a selector 301 for selecting one of the FIFOs $300_1$ to $300_6$, a check node calculation unit 302, two cyclic shift circuits 303 and 308, an edge data storage memory 304 having 18 FIFOs $304_1$ to $304_{18}$, a selector 305 for selecting one of the FIFOs $304_1$ to $304_{18}$, a received data memory 306 for storing received data, a variable node calculation unit 307, a decoded word calculation unit 309, a received data reordering unit 310, and a decoded data reordering unit 311.

First, a description will be made of a method for storing data in the edge data storage memories 300 and 304.

The edge data storage memory 300 includes the six FIFOs $300_1$ to $300_6$, the number of which is equal to a value obtained by dividing the number of rows of the transformed parity check matrix H' illustrated in FIG. 121, i.e., 30, by the number of rows of each component matrix (i.e., the number of unit columns P of the cyclic structure), i.e., 5. Each of the FIFOs $300_y$ (y=1, 2, . . . , 6) includes storage areas of multiple stages, and is configured such that messages corresponding to five edges, the number of which is equal to the number of rows and the number of columns of each component matrix (i.e., the number of unit columns P of the cyclic structure), can be simultaneously read from and written to the storage area of each stage. In addition, the number of stages of the storage areas of each of the FIFOs $300_y$ is 9, which is the maximum of the numbers of is (Hamming weights) in the row direction of the transformed parity check matrix illustrated in FIG. 121.

Data (i.e., messages $v_i$ from variable nodes) corresponding to the positions of is in the first to fifth rows of the transformed parity check matrix H' illustrated in FIG. 121 is stored in the FIFO $300_1$ in such a manner that every row is filled with the data elements in the lateral direction (i.e., Cs are ignored). More specifically, if the element in the j-th row and the i-th column is represented by (j,i), data corresponding to the positions of is in the 5×5 unit matrix of (1,1) to (5,5) of the transformed parity check matrix H' is stored in the storage area of the first stage of the FIFO $300_1$. Data corresponding to the positions of is in the shift matrix (which is a shift matrix obtained by cyclically shifting the 5×5 unit matrix to the right by three elements) of (1,21) to (5,25) of the transformed parity check matrix H' is stored in the storage area of the second stage. Similarly, data is stored in the storage areas of the third to eighth stages in association with the transformed parity check matrix H'. Furthermore, data corresponding to the positions of is in the shift matrix (which is a shift matrix obtained by replacing is in the first row with 0s in the 5×5 unit matrix and cyclically shifting the 5×5 unit matrix to the left by one element) of (1,86) to (5,90) of the transformed parity check matrix H' is stored in the storage area of the ninth stage.

Data corresponding to the positions of is in the sixth to tenth rows of the transformed parity check matrix H' illustrated in FIG. 121 is stored in the FIFO $300_2$. More specifically, data corresponding to the positions of is in a first shift matrix included in a sum matrix (which is a sum matrix representing the sum of a first shift matrix obtained by cyclically shifting the 5×5 unit matrix to the right by one element and a second shift matrix obtained by cyclically shifting the 5×5 unit matrix to the right by two elements) of (6,1) to (10,5) of the transformed parity check matrix H' is stored in the storage area of the first stage of the FIFO $300_2$. Furthermore, data corresponding to the positions of 1s in the second shift matrix included in the sum matrix of (6,1) to (10,5) of the transformed parity check matrix H' is stored in the storage area of the second stage.

More specifically, in the case of a component matrix having a weight of 2 or more, when the component matrix is represented by the sum of two or more of a P×P unit matrix having a weight of 1, a quasi-unit matrix produced by replacing one or more elements of 1 in the unit matrix with elements of 0, and a shift matrix produced by cyclically shifting the unit matrix or the quasi-unit matrix, data corresponding to the positions of 1s in the unit matrix having a weight of 1, the quasi-unit matrix, or the shift matrix (i.e., messages corresponding to edges belonging to the unit matrix, the quasi-unit matrix, or the shift matrix) is stored in the same address (i.e., the same FIFO among the FIFOs $300_1$ to $300_6$).

Data is also stored in the storage areas of the subsequent third to ninth stages in association with the transformed parity check matrix H'.

Similarly, data is stored in the FIFOs $300_3$ to $300_6$ in association with the transformed parity check matrix H'.

The edge data storage memory 304 includes 18 FIFOs $304_1$ to $304_{18}$, the number of which is equal to a value obtained by dividing the number of columns of the transformed parity check matrix H', i.e., 90, by the number of columns of each component matrix (i.e., the number of unit columns P of the cyclic structure), i.e., 5. Each of the FIFOs $304_k$ (x=1, 2, . . . , 18) includes storage areas of multiple stages, and is configured such that messages corresponding to five edges, the number of which is equal to the number of rows and the number of columns of each component matrix (i.e., the number of unit columns P of the cyclic structure), can be simultaneously read from and written to the storage area of each stage.

Data (i.e., messages $u_j$ from check nodes) corresponding to the positions of 1s in the first to fifth columns of the transformed parity check matrix H' illustrated in FIG. 121 is stored in the FIFO $304_1$ in such a manner that every column is filled with the data elements in the longitudinal direction (i.e., 0s are ignored). Specifically, data corresponding to the positions of is in the 5×5 unit matrix of (1,1) to (5,5) of the transformed parity check matrix H' is stored in the storage area of the first stage of the FIFO $304_1$. Data corresponding to the positions of is in a first shift matrix included in a sum matrix (which is a sum matrix representing the sum of a first shift matrix obtained by cyclically shifting the 5×5 unit matrix to the right by one element and a second shift matrix obtained by cyclically shifting the 5×5 unit matrix to the right by two elements) of (6,1) to (10,5) of the transformed parity check matrix H' is stored in the storage area of the second stage. Furthermore, data corresponding to the positions of is in the second shift matrix included in the sum matrix of (6,1) to (10,5) of the transformed parity check matrix H' is stored in the storage area of the third stage.

More specifically, in the case of a component matrix having a weight of 2 or more, when the component matrix is represented by the sum of two or more of a P×P unit matrix having a weight of 1, a quasi-unit matrix produced by replacing one or more elements of 1 in the unit matrix with elements of 0, and a shift matrix produced by cyclically shifting the unit matrix or the quasi-unit matrix, data corresponding to the positions of is in the unit matrix having a weight of 1, the quasi-unit matrix, or the shift matrix (i.e., messages corresponding to edges belonging to the unit matrix, the quasi-unit matrix, or the shift matrix) is stored in the same address (i.e., the same FIFO among the FIFOs 304$_1$ to 304$_H$).

Data is also stored in the storage areas of the subsequent fourth and fifth stages in association with the transformed parity check matrix H'. The number of stages of storage areas of the FIFO 304$_1$ is 5, which is the maximum of the numbers of is (Hamming weights) in the row direction in the first to fifth columns of the transformed parity check matrix H'.

Similarly, data is also stored in the FIFOs 304$_2$ and 304$_3$ in association with the transformed parity check matrix H', with the respective lengths (the numbers of stages) being 5. Data is also stored in the FIFOs 304$_4$ to 304$_{12}$ in association with the transformed parity check matrix H', with the respective lengths being 3. Data is also stored in the FIFOs 304$_{13}$ to 304$_{18}$ in association with the transformed parity check matrix H', with the respective lengths being 2.

A description will now be made of the operation of the decoding device illustrated in FIG. 122.

The edge data storage memory 300, which includes the six FIFOs 300$_1$ to 300$_6$, selects a FIFO to store data from among the FIFOs 300$_1$ to 300$_6$ in accordance with information (matrix data) D312 indicating which row in the transformed parity check matrix H' illustrated in FIG. 121 five messages D311 supplied from the cyclic shift circuit 308 located upstream of the edge data storage memory 300 belong to, and collectively stores the five messages D311 in the selected FIFO in order. Further, when reading data, the edge data storage memory 300 reads five messages D300$_1$ in order from the FIFO 300$_1$, and supplies the read messages D300$_1$ to the selector 301 located downstream of the edge data storage memory 300. After the reading of messages from the FIFO 300$_1$ is completed, the edge data storage memory 300 also reads messages in order from the FIFOs 300$_2$ to 300$_6$, and supplies the read messages to the selector 301.

The selector 301 selects five messages received from a FIFO from which data is currently being read among the FIFOs 300$_1$ to 300$_6$ in accordance with a selection signal D301, and supplies the selected messages as messages D302 to the check node calculation unit 302.

The check node calculation unit 302 includes five check node calculators 302$_1$ to 302$_5$, and performs check node computation in accordance with Expression (7) using the messages D302 (D302$_1$ to D302$_5$) (corresponding to messages $v_i$ in Expression (7)) supplied through the selector 301. The check node calculation unit 302 supplies five messages D303 (D303$_1$ to D303$_5$) (corresponding to messages $u_j$ in Expression (7)) obtained as a result of the check node computation to the cyclic shift circuit 303.

The cyclic shift circuit 303 cyclically shifts the five messages D303$_1$ to D303$_5$ determined by the check node calculation unit 302 on the basis of information (matrix data) D305 indicating the number of original unit matrices (or quasi-unit matrices) which have been cyclically shifted in the transformed parity check matrix H' to obtain the corresponding edge, and supplies results to the edge data storage memory 304 as messages D304.

The edge data storage memory 304, which includes the 18 FIFOs 304$_1$ to 304$_{18}$, selects an FIFO to store data from among the FIFOs 304$_1$ to 304$_{18}$ in accordance with information D305 indicating which row in the transformed parity check matrix H' the five messages D304 supplied from the cyclic shift circuit 303 located upstream of the edge data storage memory 304 belong to, and collectively stores the five messages D304 in the selected FIFO in order. Further, when reading data, the edge data storage memory 304 reads five messages D306$_1$ in order from the FIFO 304$_1$, and supplies the read messages D306$_1$ to the selector 305 located downstream of the edge data storage memory 304. After the reading of data from the FIFO 304$_1$ is completed, the edge data storage memory 304 also reads messages in order from the FIFOs 304$_2$ to 304$_{18}$, and supplies the read messages to the selector 305.

The selector 305 selects five messages from a FIFO from which data is currently being read among the FIFOs 304$_1$ to 304$_{18}$ in accordance with a selection signal D307, and supplies the selected messages as messages D308 to the variable node calculation unit 307 and the decoded word calculation unit 309.

On the other hand, the received data reordering unit 310 reorders an LDPC code D313 corresponding to the parity check matrix H illustrated in FIG. 119, which has been received through the communication path 13, by performing column permutation of Expression (12), and supplies the resulting data as received data D314 to the received data memory 306. The received data memory 306 calculates reception LLRs (log-likelihood ratios) from the received data D314 supplied from the received data reordering unit 310, and stores the reception LLRs. The received data reordering unit 310 further collectively supplies the reception LLRs in units of five reception LLRs as reception values D309 to the variable node calculation unit 307 and the decoded word calculation unit 309.

The variable node calculation unit 307 includes five variable node calculators 307$_1$ to 307$_5$, and performs variable node computation in accordance with Expression (1) using the messages D308 (D308$_1$ to D308$_5$) (i.e., messages $u_j$ in Expression (1)) supplied through the selector 305 and the five reception values D309 (reception values $u_{0i}$ in Expression (1)) supplied from the received data memory 306. The variable node calculation unit 307 supplies messages D310 (D310$_1$ to D310$_5$) (i.e., messages $v_1$ in Expression (1)) obtained as a result of the computation to the cyclic shift circuit 308.

The cyclic shift circuit 308 cyclically shifts the messages D310$_1$ to D310$_5$ calculated by the variable node calculation unit 307 on the basis of information indicating the number of original unit matrices (or quasi-unit matrices) which have been cyclically shifted in the transformed parity check matrix H' to obtain the corresponding edge, and supplies results to the edge data storage memory 300 as messages D311.

The series of operations described above can be performed once to perform single decoding of an LDPC code (variable node computation and check node computation). After decoding an LDPC code a certain number of times, the decoding device illustrated in FIG. 122 determines and outputs final decoded data through the decoded word calculation unit 309 and the decoded data reordering unit 311.

More specifically, the decoded word calculation unit 309 includes five decoded word calculators 309$_1$ to 309$_5$, and serves as a final stage of a plurality of decoding operations to calculate decoded data (i.e., a decoded word) in accordance with Expression (5) using the five messages D308

(D$308_1$ to D$308_5$) (i.e., messages $u_j$ in Expression (5)) output from the selector 305 and the five reception values D309 (i.e., reception values $u_{0i}$ in Expression (5)) supplied from the received data memory 306. The decoded word calculation unit 309 supplies decoded data D315 obtained as a result of the calculation to the decoded data reordering unit 311.

The decoded data reordering unit 311 changes the order of the decoded data D315 supplied from the decoded word calculation unit 309 by performing the inverse of the column permutation of Expression (12), and outputs the resulting data as final decoded data D316.

As described above, one or both of the row permutation and the column permutation are performed on the parity check matrix (i.e., the original parity check matrix) to convert the parity check matrix into a parity check matrix (i.e., a transformed parity check matrix) that can be represented by a combination of component matrices, namely, a P×P unit matrix, a quasi-unit matrix produced by replacing one or more elements of 1 with elements of 0, a shift matrix produced by cyclically shifting the unit matrix or the quasi-unit matrix, a sum matrix representing the sum of two or more of the unit matrix, the quasi-unit matrix, and the shift matrix, and a P×P zero matrix. This allows decoding of an LDPC code by using an architecture that simultaneously performs check node computation and variable node computation each for P nodes, where P is less than the number of rows or the number of columns of the parity check matrix. The use of an architecture that simultaneously performs node computation (computation of check nodes and computation of variable nodes) for P nodes, where P is less than the number of rows or the number of columns of a parity check matrix, makes it possible to perform multiple repetitive decoding while keeping the operating frequency within a feasible range, compared to the case where node computation is simultaneously performed for nodes, the number of which is equal to the number of rows or the number of columns of a parity check matrix.

Similarly to the decoding device illustrated in FIG. 122, the LDPC decoder 166 included in the receiving device 12 illustrated in FIG. 116 is configured to perform LDPC decoding by, for example, simultaneously performing check node computation and variable node computation each for P nodes.

More specifically, it is assumed now that, for ease of description, the parity check matrix of the LDPC code output from the LDPC encoder 115 included in the transmitting device 11 illustrated in FIG. 8 is, for example, the parity check matrix H illustrated in FIG. 119 in which a parity matrix has a stepwise structure. In this case, the parity interleaver 23 of the transmitting device 11 performs parity interleaving to interleave the (K+qx+y+1)-th code bit to the (K+Py+x+1)-th code bit position with the information length K being 60, the number of unit columns P of the cyclic structure being 5, and the divisor q (=M/P) of the parity length M being 6.

As described above, this parity interleaving operation corresponds to the column permutation of Expression (12). Thus, it is not necessary for the LDPC decoder 166 to perform the column permutation of Expression (12).

In the receiving device 12 illustrated in FIG. 116, therefore, as described above, an LDPC code on which parity deinterleaving has not been performed, that is, an LDPC code on which the column permutation of Expression (12) has been performed, is supplied from the column twist deinterleaver 55 to the LDPC decoder 166. The LDPC decoder 166 performs processing similar to that of the decoding device illustrated in FIG. 122, except that the column permutation of Expression (12) is not performed.

Figure 123:
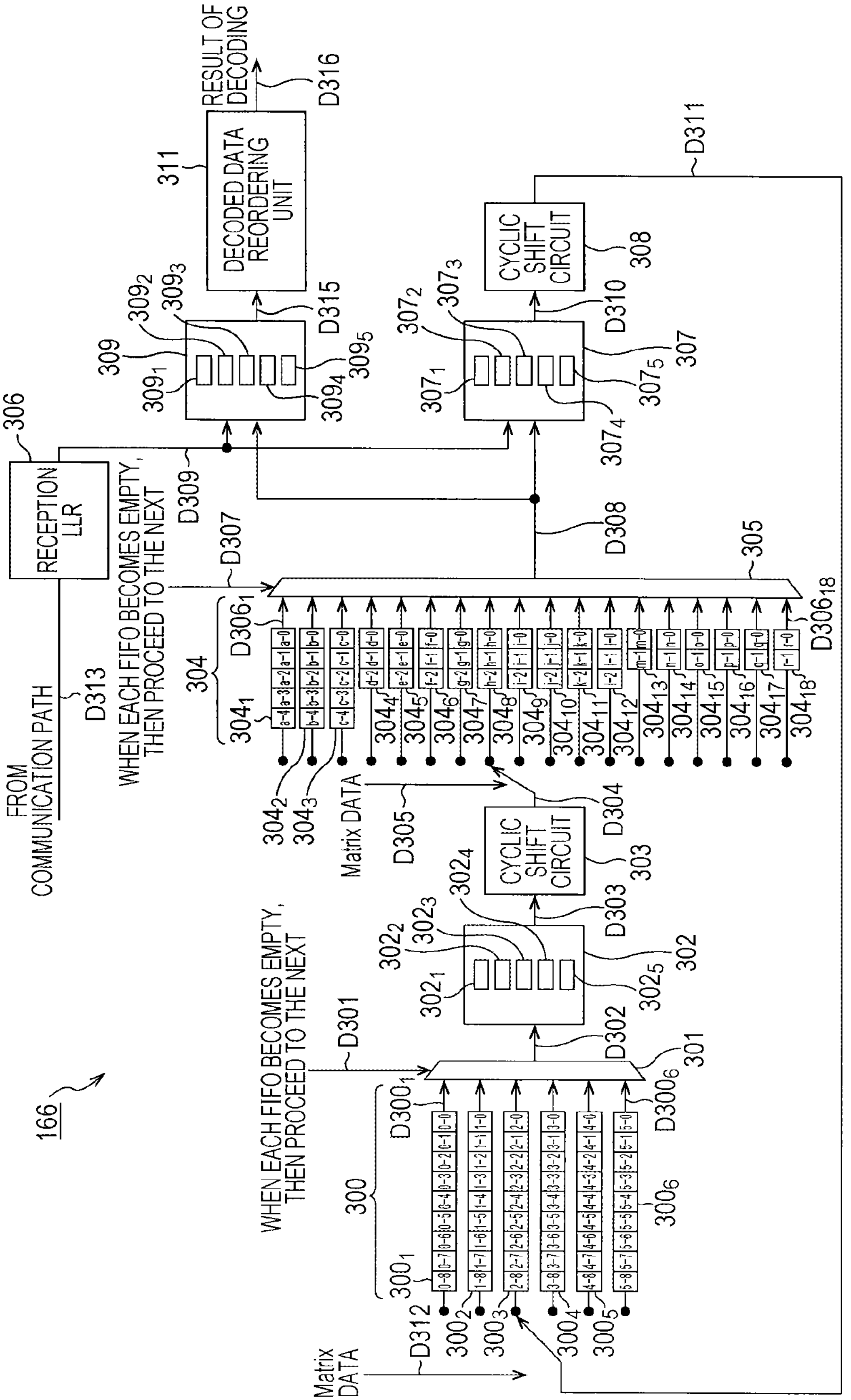

More specifically, FIG. 123 illustrates an example configuration of the LDPC decoder 166 illustrated in FIG. 116.

In FIG. 123, the LDPC decoder 166 has a configuration similar to the decoding device illustrated in FIG. 122, except that the received data reordering unit 310 illustrated in FIG. 122 is not included, and performs processing similar to that of the decoding device illustrated in FIG. 122, except that the column permutation of Expression (12) is not performed, which is not described herein.

As described above, the LDPC decoder 166 may be configured without including the received data reordering unit 310, and can be smaller in size than the decoding device illustrated in FIG. 122.

Note that, in FIGS. 119 to 123, for ease of illustration, the code length N of an LDPC code is 90, the information length K is 60, the number of unit columns P of the cyclic structure (i.e., the number of rows and the number of columns of a component matrix) is 5, and the divisor q (=M/P) of the parity length M is 6. However, the code length N, the information length K, the number of unit columns P of the cyclic structure, and the divisor q (=M/P) are not limited to the values described above.

More specifically, the LDPC encoder 115 in the transmitting device 11 illustrated in FIG. 8 outputs an LDPC code with, for example, the code length N being 64800, 16200, or the like, the information length K being given by N−Pq (=N−M), the number of unit columns P of the cyclic structure being 360, and the divisor q being given by M/P. The LDPC decoder 166 illustrated in FIG. 123 may be used to perform LDPC decoding on the LDPC code described above by simultaneously performing check node computation and variable node computation each for P nodes.

FIG. 124 includes diagrams depicting the processing of the multiplexer 54 included in the bit deinterleaver 165 illustrated in FIG. 117.

More specifically, part A of FIG. 124 illustrates an example functional configuration of the multiplexer 54.

The multiplexer 54 includes an inverse permutation unit 1001 and a memory 1002.

The multiplexer 54 performs inverse permutation processing (which is the inverse of permutation processing), corresponding to the permutation processing performed by the demultiplexer 25 of the transmitting device 11, on the symbol bits of the symbols supplied from the QAM decoder 164 located upstream of the multiplexer 54. That is, the multiplexer 54 performs inverse permutation processing to restore the positions of the code bits (symbol bits) of the LDPC code that have been permuted through the permutation processing to the original positions, and supplies the resulting LDPC code to the column twist deinterleaver 55 located downstream of the multiplexer 54.

More specifically, mb symbol bits $y_0, y_1, \ldots, y_{mb-1}$ of b symbols are supplied to the inverse permutation unit 1001 in the multiplexer 54 in units of (consecutive) b symbols.

The inverse permutation unit 1001 performs inverse permutation to restore the mb symbol bits $y_0$ to $y_{mb-1}$ to the order of the mb original code bits to $b_0, b_1, \ldots, b_{mb-1}$(i.e., the order of the code bits $b_0$ to $b_{mb-1}$ before the permutation unit 32 included in the demultiplexer 25 on the transmitting device 11 side performs permutation), and outputs the resulting mb code bits $b_0$ to $b_{mb-1}$.

Similarly to the memory 31 included in the demultiplexer 25 on the transmitting device 11 side, the memory 1002 has a storage capacity to store mb bits in its row (horizontal)

direction and N/(mb) bits in its column (vertical) direction. In other words, the memory 1002 includes mb columns for storing N/(mb) bits.

Note that code bits of the LDPC code output from the inverse permutation unit 1001 are written to the memory 1002 in the direction in which a code bit is read from the memory 31 in the demultiplexer 25 of the transmitting device 11, and the code bits written in the memory 1002 are read from the memory 1002 in the direction in which a code bit is written to the memory 31.

Accordingly, as illustrated in part A of FIG. 124, the multiplexer 54 of the receiving device 12 writes code bits of the LDPC code output from the inverse permutation unit 1001 in the row direction in units of mb bits, where the writing operation moves from the top to the bottom of the memory 1002, starting from the first row.

Further, when the writing of code bits corresponding to one code length is completed, the multiplexer 54 reads the code bits from the memory 1002 in the column direction, and supplies the read code bits to the column twist deinterleaver 55 located downstream of the multiplexer 54.

Here, part B of FIG. 124 is a diagram illustrating the reading of code bits from the memory 1002.

The multiplexer 54 reads code bits of the LDPC code (in the column direction) from the top to the bottom of each of the columns of the memory 1002, where the reading operation moves toward the right, starting from the leftmost column.

FIG. 125 is a diagram depicting the processing of the column twist deinterleaver 55 included in the bit deinterleaver 165 illustrated in FIG. 117.

More specifically, FIG. 125 illustrates an example configuration of the memory 1002 of the multiplexer 54.

The memory 1002 has a storage capacity to store mb bits in its column (vertical) direction and N/(mb) bits in its row (horizontal) direction, and includes mb columns.

The column twist deinterleaver 55 performs column twist deinterleaving by controlling a read start position when code bits of the LDPC code are written to the memory 1002 in the row direction and are read from the memory 1002 in the column direction.

More specifically, the column twist deinterleaver 55 performs inverse reordering processing to restore the code bits whose order has been changed through column twist interleaving to the original order, by changing the read start position with which the reading of a code bit is started, as desired, for each of a plurality of columns.

Here, FIG. 125 illustrates an example configuration of the memory 1002 in a case where, as described with reference to FIG. 28, the modulation scheme is 16APSK, 16QAM, or the like and the multiple b is 1. In this case, the number of bits m of one symbol is 4, and the memory 1002 includes 4 (=mb) columns.

Instead of the multiplexer 54, the column twist deinterleaver 55 writes code bits of the LDPC code output from the inverse permutation unit 1001 in the row direction, where the writing operation moves downward sequentially from the first row of the memory 1002.

Further, when the writing of code bits corresponding to one code length is completed, the column twist deinterleaver 55 reads the code bits from the memory 1002 (in the column direction) from the top to the bottom, where the reading operation moves toward the right, starting from the leftmost column.

Note that the column twist deinterleaver 55 reads code bits from the memory 1002, using, as a read start position of the code bit, the write start position from which the column twist interleaver 24 on the transmitting device 11 side writes a code bit.

More specifically, if the address of the position of the first (or top) of each column is represented by 0 and the addresses of the respective positions in the column direction are represented by integers arranged in ascending order, the column twist deinterleaver 55 sets the read start position for the leftmost column to the position at the address 0, the read start position for the second column (from the left) to the position at the address 2, the read start position for the third column to the position at the address 4, and the read start position for the fourth column tc the position at the address 7 in a case where the modulation scheme is 16APSK or 16QAM and the multiple b is 1.

Note that, after reading code bits up to the bottom of the column for which the read start position is set to a position other than the position at the address 0, the column twist deinterleaver 55 returns to the first position (i.e., the position at the address 0), and reads code bits up to the position immediately before the read start position. The column twist deinterleaver 55 then performs reading from the subsequent (right) column.

The column twist deinterleaving operation described above allows the order of code bits that have been reordered through column twist interleaving to return to the original order.

FIG. 126 is a block diagram illustrating another example configuration of the bit deinterleaver 165 illustrated in FIG. 116.

Note that, in FIG. 126, portions corresponding to those illustrated in FIG. 117 are assigned the same reference numerals, and a description thereof will be omitted hereinafter, as appropriate.

More specifically, the bit deinterleaver 165 illustrated in FIG. 126 has a configuration similar to that illustrated in FIG. 117, except that a parity deinterleaver 1011 is further included.

In FIG. 126, the bit deinterleaver 165 includes a multiplexer (MUX) 54, a column twist deinterleaver 55, and a parity deinterleaver 1011, and performs bit deinterleaving on code bits of the LDPC code supplied from the QAM decoder 164.

More specifically, the multiplexer 54 performs inverse permutation processing (which is the inverse of permutation processing), corresponding to the permutation processing performed by the demultiplexer 25 of the transmitting device 11, on the LDPC code supplied from the QAM decoder 164. That is, the multiplexer 54 performs inverse permutation processing to restore the positions of the code bits permuted through permutation processing to the original positions, and supplies the resulting LDPC code to the column twist deinterleaver 55.

The column twist deinterleaver 55 performs column twist deinterleaving, corresponding to column twist interleaving as the reordering processing performed by the column twist interleaver 24 of the transmitting device 11, on the LDPC code supplied from the multiplexer 54.

The LDPC code obtained as a result of column twist deinterleaving is supplied from the column twist deinterleaver 55 to the parity deinterleaver 1011.

The parity deinterleaver 1011 performs parity deinterleaving (which is the inverse of parity interleaving operation), corresponding to parity interleaving performed by the parity interleaver 23 of the transmitting device 11, on the code bits on which column twist deinterleaving has been performed by the column twist deinterleaver 55. That is, the parity deinterleaver 1011 performs parity deinterleaving to restore the code bits of the LDPC code whose order has been changed through parity interleaving to the original order.

The LDPC code obtained as a result of parity deinterleaving is supplied from the parity deinterleaver 1011 to the LDPC decoder 166.

Accordingly, the bit deinterleaver 165 illustrated in FIG. 126 supplies an LDPC code on which inverse permutation processing, column twist deinterleaving, and parity deinterleaving have been performed, i.e., an LDPC code obtained through LDPC encoding in accordance with the parity check matrix H, to the LDPC decoder 166.

The LDPC decoder 166 performs LDPC decoding on the LDPC code supplied from the bit deinterleaver 165 by using the parity check matrix H that the LDPC encoder 115 of the transmitting device 11 has used for LDPC encoding. More specifically, the LDPC decoder 166 performs LDPC decoding on the LDPC code supplied from the bit deinterleaver 165 by using the parity check matrix H that the LDPC encoder 115 of the transmitting device 11 has used for LDPC encoding, or by using a transformed parity check matrix obtained by performing at least column permutation, corresponding to parity interleaving, on the parity check matrix H.

Here, in FIG. 126, an LDPC code obtained through LDPC encoding in accordance with the parity check matrix H is supplied from (the parity deinterleaver 1011 of) the bit deinterleaver 165 to the LDPC decoder 166. Accordingly, in a case where the LDPC decoding of the LDPC code is performed using the parity check matrix H that the LDPC encoder 115 of the transmitting device 11 has used for LDPC encoding, the LDPC decoder 166 may be implemented as, for example, a decoding device configured to perform LDPC decoding using a full serial decoding method for sequentially performing computation of messages (i.e., check node messages and variable node messages) on a node-by-node basis, or a decoding device configured to perform LDPC decoding using a full parallel decoding method for simultaneously (or in parallel) performing computation of messages for all the nodes.

Furthermore, in a case where the LDPC decoder 166 performs LDPC decoding on an LDPC code using a transformed parity check matrix obtained by performing at least column permutation, corresponding to parity interleaving, on the parity check matrix H that the LDPC encoder 115 of the transmitting device 11 has used for LDPC encoding, the LDPC decoder 166 may be implemented as a decoding device having an architecture that simultaneously performs check node computation and variable node computation each for P (or a divisor of P other than 1) nodes, which is the decoding device (FIG. 122) including the received data reordering unit 310 configured to perform column permutation similar to column permutation for obtaining a transformed parity check matrix on an LDPC code to reorder the code bits of the LDPC code.

Note that, in FIG. 126, the multiplexer 54 that performs inverse permutation processing, the column twist deinterleaver 55 that performs column twist deinterleaving, and the parity deinterleaver 1011 that performs parity deinterleaving are configured as separate units, for convenience of illustration. However, two or more of the multiplexer 54, the column twist deinterleaver 55, and the parity deinterleaver 1011 may be integrated into a single unit, similarly to the parity interleaver 23, the column twist interleaver 24, and the demultiplexer 25 of the transmitting device 11.

In addition, if the bit interleaver 116 (FIG. 8) of the transmitting device 11 is configured without including the parity interleaver 23 or the column twist interleaver 24, the bit deinterleaver 165 illustrated in FIG. 126 may be configured without including the column twist deinterleaver 55 or the parity deinterleaver 1011.

Also in this case, the LDPC decoder 166 may be implemented as a decoding device of the full serial decoding type that performs LDPC decoding using the parity check matrix H itself, a decoding device of the full parallel decoding type that performs LDPC decoding using the parity check matrix H itself, or the decoding device (FIG. 122) including the received data reordering unit 310 configured to perform LDPC decoding by simultaneously performing check node computation and variable node computation each for P nodes using a transformed parity check matrix H'.

[Example Configuration of Receiving System]

FIG. 127 is a block diagram illustrating a first example configuration of a receiving system to which the receiving device 12 is applicable.

In FIG. 127, the receiving system includes an acquisition unit 1101, a transmission path decoding processing unit 1102, and an information source decoding processing unit 1103.

The acquisition unit 1101 acquires a signal including an LDPC code obtained by performing at least LDPC encoding on LDPC target data such as image data and audio data of a program via a transmission path (or communication path) (not illustrated) such as terrestrial digital broadcasting, satellite digital broadcasting, a CATV network, the Internet, or any other suitable network, and supplies the signal to the transmission path decoding processing unit 1102.

Here, in a case where the acquisition unit 1101 acquires a signal broadcasted from, for example, a broadcast station via terrestrial, satellite, CATV (Cable Television), or any other network, the acquisition unit 1101 may be implemented as a tuner, an STB (Set Top Box), or the like. Further, in a case where the acquisition unit 1101 acquires a signal transmitted using, for example, multicast technology like IPTV (Internet Protocol Television) from a web server, the acquisition unit 1101 may be implemented as a network I/F (Interface) such as a NIC (Network Interface Card).

The transmission path decoding processing unit 1102 corresponds to the receiving device 12. The transmission path decoding processing unit 1102 performs a transmission path decoding process, including at least processing for correcting errors caused in a transmission path, on the signal acquired by the acquisition unit 1101 via a transmission path, and supplies the resulting signal to the information source decoding processing unit 1103.

More specifically, the signal acquired by the acquisition unit 1101 via a transmission path is a signal obtained by performing at Least error correcting encoding to correct errors caused in a transmission path. The transmission path decoding processing unit 1102 performs a transmission path decoding process such as an error correction process on the above-described signal.

Here, examples of the error correcting encoding include LDPC encoding and BCH encoding. Here, at least LDPC encoding is performed as error correcting encoding.

Furthermore, the transmission path decoding process may include, for example, demodulation of modulation signals.

The information source decoding processing unit 1103 performs an information source decoding process, including at least processing for expanding compressed information into original information, on the signal on which the transmission path decoding process has been performed.

More specifically, the signal acquired by the acquisition unit 1101 via a transmission path may have been subjected to compression encoding for compressing information in order to reduce the amount of data such as image data and audio data as information. In this case, the information source decoding processing unit 1103 performs an information source decoding process, such as processing for expanding compressed information into original information (i.e., expansion processing), on the signal on which the transmission path decoding process has been performed.

Note that, if the signal acquired by the acquisition unit 1101 via a transmission path has not been subjected to compression encoding, the information source decoding processing unit 1103 does not perform processing for expanding compressed information into original information.

Here, examples of the expansion processing include MPEG decoding. Furthermore, the transmission path decoding process may include descrambling and so forth in addition to expansion processing.

In the receiving system having the configuration described above, the acquisition unit 1101 acquires a signal obtained by performing compression encoding such as MPEG encoding and error correcting encoding such as LDPC encoding on data such as image data and audio data, via a transmission path, and supplies the acquired signal to the transmission path decoding processing unit 1102.

The transmission path decoding processing unit 1102 performs a transmission path decoding process, for example, processing similar to that performed by the receiving device 12, on the signal supplied from the acquisition unit 1101, and supplies the resulting signal to the information source decoding processing unit 1103.

The information source decoding processing unit 1103 performs an information source decoding process such as MPEG decoding on the signal supplied from the transmission path decoding processing unit 1102, and outputs the resulting images or audio.

The receiving system illustrated in FIG. 127 as described above may be applied to, for example, a television tuner or the like that receives television broadcasting as digital broadcasting.

Note that the acquisition unit 1101, the transmission path decoding processing unit 1102, and the information source decoding processing unit 1103 may be constructed as single independent devices (hardware (such as ICs (Integrated Circuits)) or software modules).

In addition, the acquisition unit 1101, the transmission path decoding processing unit 1102, and the information source decoding processing unit 1103 may be configured such that the combination of the acquisition unit 1101 and the transmission path decoding processing unit 1102, the combination of the transmission path decoding processing unit 1102 and the information source decoding processing unit 1103, or the combination of the acquisition unit 1101, the transmission path decoding processing unit 1102, and the information source decoding processing unit 1103 is constructed as a single independent device.

FIG. 128 is a block diagram illustrating a second example configuration of the receiving system to which the receiving device 12 is applicable.

Note that, in FIG. 128, portions corresponding to those illustrated in FIG. 127 are assigned the same reference numerals, and a description thereof will be omitted hereinafter, as appropriate.

The receiving system illustrated in FIG. 128 is common to that illustrated in FIG. 127 in that the acquisition unit 1101, the transmission path decoding processing unit 1102, and the information source decoding processing unit 1103 are included, and is different from that illustrated in FIG. 127 in that an output unit 1111 is further included.

The output unit 1111 may be, for example, a display device configured to display an image or a speaker configured to output audio, and outputs images, audio, or the like as signals output from the information source decoding processing unit 1103. In other words, the output unit 1111 displays images or outputs audio.

The receiving system illustrated in FIG. 128 as described above may be applied to, for example, a TV set (television receiver) that receives television broadcasting as digital broadcasting or a radio receiver that receives radio broadcasting.

Note that, if the signal acquired by the acquisition unit 1101 has not been subjected to compression encoding, a signal output from the transmission path decoding processing unit 1102 is supplied to the output unit 1111.

FIG. 129 is a block diagram illustrating a third example configuration of the receiving system to which the receiving device 12 is applicable.

Note that, in FIG. 129, portions corresponding to those illustrated in FIG. 127 are assigned the same reference numerals, and a description thereof will be omitted hereinafter, as appropriate.

The receiving system illustrated in FIG. 129 is common to that illustrated in FIG. 127 in that the acquisition unit 1101 and the transmission path decoding processing unit 1102 are included.

However, the receiving system illustrated in FIG. 129 is different from that illustrated in FIG. 127 in that the information source decoding processing unit 1103 is not included and a recording unit 1121 is further included.

The recording unit 1121 records (or stores) the signal (e.g., TS packets of an MPEG TS stream) output from the transmission path decoding processing unit 1102 on (or in) a recording (or storage) medium such as an optical disk, a hard disk (magnetic disk), or a flash memory.

The receiving system illustrated in FIG. 129 as described above may be applied to, for example, a recorder that records television broadcasting.

Note that, in FIG. 129, the receiving system may include the information source decoding processing unit 1103, and the recording unit 1121 is capable of recording a signal that has been subjected to an information source decoding process by the information source decoding processing unit 1103, that is, an image or audio obtained by decoding.

[Embodiment of Computer]

Next, the series of processes described above may be performed by hardware or software. If the series of processes is performed by software, a program constituting the software is installed into a general-purpose computer or the like.

Thus, FIG. 130 illustrates an example configuration of an embodiment of a computer into which a program for executing the series of processes described above is installed.

The program may be recorded in advance on a hard disk 705 or a ROM 703 serving as a recording medium incorporated in the computer.

Alternatively, the program may be temporarily or persistently stored in (or recorded on) a removable recording medium 711 such as a flexible disc, a CD-ROM (Compact Disc Read Only Memory), an MO (Magneto Optical) disc, a DVD (Digital Versatile Disc), a magnetic disk, or a semiconductor memory. The removable recording medium 711 may be provided as packaged software.

The program may be installed into the computer from the removable recording medium 711 described above, or may be wirelessly transferred to the computer from a download site via an artificial satellite for digital satellite broadcasting or transferred to the computer via a network such as a LAN (Local Area Network) or the Internet by wired connection. In the computer, the program transferred in the way described above may be received by a communication unit 708, and installed into the hard disk 705 incorporated in the computer.

The computer has a CPU (Central Processing Unit) 702 incorporated therein. An input/output interface 710 is connected to the CPU 702 via a bus 701. When an instruction is input by a user by, for example, operating an input unit 707 including a keyboard, a mouse, a microphone, and so forth via the input/output interface 710, the CPU 702 executes a program stored in the ROM (Read Only Memory) 703 in accordance with the instruction. Alternatively, the CPU 702 loads a program stored in the hard disk 705, a program transferred from a satellite or a network, received by the communication unit 708, and installed into the hard disk 705, or a program read from the removable recording medium 711 set in a drive 709 and installed into the hard disk 705 into a RAM (Random Access Memory) 704, and executes the loaded program. Accordingly, the CPU 702 performs processing according to the flowcharts described above or processing performed with the configurations in the block diagrams described above. Then, the CPU 702 outputs a result of the processing, if necessary, for example, from an output unit 706 including an LCD (Liquid Crystal Display), a speaker, and so forth via the input/output interface 710, transmits the result from the communication unit 708, or records the result on the hard disk 705.

It should be noted herein that processing steps describing a program for causing a computer to perform various kinds of processing may not necessarily be processed in a time-series manner in accordance with the order described herein in the flowcharts, and may also include processes executed in parallel or individually (for example, parallel processing or object-based processing).

In addition, a program may be processed by a single computer, or may be processed by a plurality of computers in a distributed manner. Furthermore, a program may also be transferred to and executed by a remote computer.

Note that embodiments of the present technology are not limited to the embodiments described above, and a variety of changes can be made without departing from the scope of the present technology.

More specifically, for example, the (parity check matrix initial value tables of) new LDPC codes described above may be used regardless of whether the communication path 13 (FIG. 7) is a satellite link, a terrestrial link, a cable (wired line), or any other unit. In addition, the new LDPC codes may also be used for data transmission other than digital broadcasting.

REFERENCE SIGNS LIST

11 transmitting device, 12 receiving device, 23 parity interleaver, 24 column twist interleaver, 25 demultiplexer, 31 memory, 32 permutation unit, 54 multiplexer, 55 column twist interleaver, 111 mode adaptation/multiplexer, 112 padder, 113 BB scrambler, 114 BCH encoder, 115 LDPC encoder, 116 bit interleaver, 117 QAM encoder, 118 time interleaver, 119 MISO/MIMO encoder, 120 frequency interleaver, 121 BCH encoder, 122 LDPC encoder, 123 QAM encoder, 124 frequency interleaver, 131 frame builder & resource allocation unit, 132 OFDM generation unit, 151 OFDM processing unit, 152 frame management unit, 153 frequency deinterleaver, 154 QAM decoder, 155 LDPC decoder, 156 BCH decoder, 161 frequency deinterleaver, 162 MISO/MIMO decoder, 163 time deinterleaver, 164 QAM decoder, 165 bit deinterleaver, 166 LDPC decoder, 167 BCH decoder, 168 BB descrambler, 169 null deletion unit, 170 demultiplexer, 300 edge data storage memory, 301 selector, 302 check node calculation unit, 303 cyclic shift circuit, 304 edge data storage memory, 305 selector, 306 received data memory, 307 variable node calculation unit, 308 cyclic shift circuit, 309 decoded word calculation unit, 310 received data reordering unit, 311 decoded data reordering unit, 601 encoding processing unit, 602 storage unit, 611 code rate setting unit, 612 initial value table read unit, 613 parity check matrix generation unit, 614 information bit read unit, 615 encoding parity computation unit, 616 control unit, 701 bus, 702 CPU, 703 ROM, 704 RAM, 705 hard disk, 706 output unit, 707 input unit, 708 communication unit, 709 drive, 710 input/output interface, 711 removable recording medium, 1001 inverse permutation unit, 1002 memory, 1011 parity deinterleaver, 1101 acquisition unit, 1101 transmission path decoding processing unit, 1103 information source decoding processing unit, 1111 output unit, 1121 recording unit

The invention claimed is:

1. A data processing apparatus for using an LDPC (Low Density Parity Check) code to enable error correction processing to correct errors generated in a transmission path of a television broadcast, the data processing apparatus comprising:

a receiver configured to select a code rate of 13/15 from a plurality of code rates and configured to receive, from a television broadcast, an LDPC code word based on an LDPC code having a code length of 64800 bits and the code rate of 13/15; and a decoder configured to decode the LDPC code word on the basis of a parity check matrix of the LDPC code, wherein the decoded LDPC code word comprising image data of the television broadcast for display, the LDPC code word includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, wherein, in response to the selection of the code rate of 13/15, the parity check matrix initial value table includes 142 2307 2598 2650 4028 4434 5781 5881 6016 6323 6681 6698 8125
2932 4928 5248 5256 5983 6773 6828 7789 8426 8494 8534 8539 8583
899 3295 3833 5399 6820 7400 7753 7890 8109 8451 8529 8564 8602
21 3060 4720 5429 5636 5927 6966 8110 8170 8247 8355 8365 8616
20 1745 2838 3799 4380 4418 4646 5059 7343 8161 8302 8456 8631
9 6274 6725 6792 7195 7333 8027 8186 8209 8273 8442 8548 8632
494 1365 2405 3799 5188 5291 7644 7926 8139 8458 8504 8594 8625
192 574 1179 4387 4695 5089 5831 7673 7789 8298 8301 8612 8632
11 20 1406 6111 6176 6256 6708 6834 7828 8232 8457 8495 8602
6 2654 3554 4483 4966 5866 6795 8069 8249 8301 8497 8509 8623
21 1144 2355 3124 6773 6805 6887 7742 7994 8358 8374 8580 8611
335 4473 4883 5528 6096 7543 7586 7921 8197 8319 8394 8489 8636
2919 4331 4419 4735 6366 6393 6844 7193 8165 8205 8544 8586 8617
12 19 742 930 3009 4330 6213 6224 7292 7430 7792 7922 8137
710 1439 1588 2434 3516 5239 6248 6827 8230 8448 8515 8581 8619

-continued 200 1075 1868 5581 7349 7642 7698 8037 8201 8210 8320 8391 8526
3 2501 4252 5256 5292 5567 6136 6321 6430 6486 7571 8521 8636
3062 4599 5885 6529 6616 7314 7319 7567 8024 8153 8302 8372 8598
105 381 1574 4351 5452 5603 5943 7467 7788 7933 8362 8513 8587
787 1857 3386 3659 6550 7131 7965 8015 8040 8312 8484 8525 8537
15 1118 4226 5197 5575 5761 6762 7038 8260 8338 8444 8512 8568
36 5216 5368 5616 6029 6591 8038 8067 8299 8351 8565 8578 8585
1 23 4300 4530 5426 5532 5817 6967 7124 7979 8022 8270 8437
629 2133 4828 5475 5875 5890 7194 8042 8345 8385 8518 8598 8612
11 1065 3782 4237 4993 7104 7863 7904 8104 8228 8321 8383 8565
2131 2274 3168 3215 3220 5597 6347 7812 8238 8354 8527 8557 8614
5600 6591 7491 7696
1766 8281 8626
1725 2280 5120
1650 3445 7652
4312 6911 8626
15 1013 5892
2263 2546 2979
1545 5873 7406
67 726 3697
2860 6443 8542
17 911 2820
1561 4580 6052
79 5269 7134
22 2410 2424
3501 5642 8627
808 6950 8571
4099 6389 7482
4023 5000 7833
5476 5765 7917
1008 3194 7207
20 495 5411
1703 8388 8635
6 4395 4921
200 2053 8206
1089 5126 5562
10 4193 7720
1967 2151 4608
22 738 3513
3385 5066 8152
440 1118 8537
3429 6058 7716
5213 7519 8382
5564 8365 8620
43 3219 8603
4 5409 5815
5 6376 7654
4091 5724 5953
5348 6754 8613
1634 6398 6632
72 2058 8605
3497 5811 7579
3846 6743 8559
15 5933 8629
2133 5859 7068
4151 4617 8566
2960 8270 8410
2059 3617 8210
544 1441 6895
4043 7482 8592
294 2180 8524
3058 8227 8373
364 5756 8617
5383 8555 8619
1704 2480 4181
7338 7929 7990
2615 3905 7981
4298 4548 8296
8262 8319 8630
892 1893 8028
5694 7237 8595
1487 5012 5810
4335 8593 8624
3509 4531 5273
10 22 830
4161 5208 6280
275 7063 8634
4 2725 3113
2279 7403 8174
1637 3328 3930
2810 4939 5624
3 1234 7687
2799 7740 8616
22 7701 8636
4302 7857 7993
7477 7794 8592
9 6111 8591
5 8606 8628
347 3497 4033
1747 2613 8636
1827 5600 7042
580 1822 6842
232 7134 7783
4629 5000 7231
951 2806 4947
571 3474 8577
2437 2496 7945
23 5873 8162
12 1168 7686
8315 8540 8596
1766 2506 4733
929 1516 3338
21 1216 6555
782 1452 8617
8 6083 6087
667 3240 4583
4030 4661 5790
559 7122 8553
3202 4388 4909
2533 3673 8594
1991 3954 6206
6835 7900 7980
189 5722 8573
2680 4928 4998
243 2579 7735
4281 8132 8566
7656 7671 8609
1116 2291 4166
21 388 8021
6 1123 8369
311 4918 8511
0 3248 6290
13 6762 7172
4209 5632 7563
49 127 8074
581 1735 4075
0 2235 5470
2178 5820 6179
16 3575 6054
1095 4564 6458
9 1581 5953
2537 6469 8552
14 3874 4844
0 3269 3551
2114 7372 7926
1875 2388 4057
3232 4042 6663
9 401 583
13 4100 6584
2299 4190 4410
21 3670 4979.

2. The data processing apparatus according to claim 1, wherein the receiver is configured to select a code rate of 10/15 from the plurality of code rates and configured to receive, from the television broadcast, an LDPC code word based on an LDPC code having a code length of 64800 bits and the code rate of 10/15; and wherein, in response to the selection of the code rate of 10/15, the parity check matrix initial value table includes 692 1779 1973 2726 5151 6088 7921 9618 11804 13043 15975 16214 16889 16980 18585 18648
13 4090 4319 5288 8102 10110 10481 10527 10953 11185 12069 13177 14217 15963 17661 20959
2330 2516 2902 4087 6338 8015 8638 9436 10294 10843 11802 12304 12371 14095 18486 18996
125 586 5137 5701 6432 6500 8131 8327 10488 11032 11334 11449 12504 16000 20753 21317
30 480 2681 3635 3898 4058 12803 14734 20252 20306 20680 21329 21333 21466 21562 21568
20 44 738 4965 5516 7659 8464 8759 12216 14630 18241 18711 19093 20217 21316 21490
31 43 3554 5289 5667 8687 14885 16579 17883 18384 18486 19142 20785 20932 21131 21308
7054 9276 10435 12324 12354 13849 14285 16482 19212 19217 19221 20499 20831 20925 21195 21247
9 13 4099 10353 10747 14884 15492 17650 19291 19394 20356 20658 21068 21117 21183 21586
28 2250 2980 8988 10282 12503 13301 18351 20546 20622 21006 21293 21344 21472 21530 21542
17 32 2521 4374 5098 7525 13035 14437 15283 18635 19136 20240 21147 21179 21300 21349
57 4735 5657 7649 8807 12375 16092 16178 16379 17545 19461 19489 20321 20530 21453 21457
35 55 5333 14423 14670 15438 19468 19667 20823 21084 21241 21344 21447 21520 21554 21586
13 20 2025 11854 12516 14938 15929 18081 19730 19929 20408 21338 21391 21425 21468 21546
54 7451 8176 10136 15240 16442 16482 19431 19483 19762 20647 20839 20966 21512 21579 21592
26 465 3604 4233 9831 11741 13692 18953 18974 21021 21039 21133 21282 21488 21532 21558
1 7 16 59 6979 7675 7717 9791 12370 13050 18534 18729 19846 19864 20127 20165
15 31 11089 12360 13640 14237 17937 18043 18410 19443 21107 21444 21449 21528 21576 21584
32 51 9768 17848 18095 19326 19594 19618 19765 20440 20482 20582 21236 21338 21563 21587
44 55 4864 10253 11306 12117 13076 13901 15610 17057 18205 19794 20939 21132 21267 21573
3436 11304 15361 16511 16860 18238 18639 19341 20106 20123 20407 21200 21280 21452 21526 21569
679 8822 11045 14403 16588 17838 19117 19453 20265 20558 21374 21396 21428 21442 21529 21590
391 13002 13140 14314 17169 17175 17846 18122 19447 20075 20212 20436 20583 21330 21359 21403
7601 10257 20060 21285
4419 9150 18097 20315
4675 13376 21435
610 1238 16704
5732 7096 21104
5690 13531 14545
4334 14839 17357
8 2814 17674
2392 8128 18369
502 7403 15133
343 13624 20673
13188 15687 21593
321 16866 21347
1242 4261 17449
4691 8086 8691
8500 11538 20278
6269 12905 18192
5984 15452 17111
11541 18717 21534
16 10780 16107
12310 12959 20390
1365 18306 19634
6125 19132 20242
3012 17233 21533
5816 13021 21440
13207 17811 18798
2762 7586 12139
3949 5545 13584
11374 18279 19241
2736 10989 21209
4095 20677 21395
8251 10084 20498
7628 8875 21406
2743 8943 9090
1817 7788 15767

-continued

| |
|---|
| 9333 9838 21268 |
| 6203 9480 12042 |
| 5747 21187 21468 |
| 2553 18281 21500 |
| 3179 9155 15222 |
| 12498 18109 20326 |
| 14106 21209 21592 |
| 7454 17484 20791 |
| 20804 21120 21574 |
| 5754 18178 20935 |
| 30 4322 21381 |
| 11905 20416 21397 |
| 12452 19899 21497 |
| 1917 6028 16868 |
| 9891 18710 18953 |
| 912 21083 21446 |
| 370 14355 18069 |
| 16519 19003 20902 |
| 11163 17558 18424 |
| 8427 14396 21405 |
| 8885 11796 21361 |
| 4960 15431 20653 |
| 11944 16839 21236 |
| 9967 14529 17208 |
| 14144 19354 19745 |
| 7986 12680 21396 |
| 6097 11501 13028 |
| 33 13803 21038 |
| 3177 20124 20803 |
| 2692 6841 18655 |
| 971 5892 14354 |
| 3887 19455 21271 |
| 17214 17315 21148 |
| 6539 13910 21526 |
| 3809 5153 15793 |
| 3865 21438 21510 |
| 7129 17787 19636 |
| 5972 13150 14182 |
| 7078 14906 16911 |
| 15705 21160 21482 |
| 5479 13860 19763 |
| 16817 19722 20001 |
| 14649 16147 18886 |
| 15138 18578 21502 |
| 2096 2534 17760 |
| 11920 13460 19783 |
| 19876 20071 20583 |
| 6241 14230 20775 |
| 16138 16386 21371 |
| 8616 15624 18453 |
| 6013 8015 21599 |
| 9184 10688 20792 |
| 18122 21141 21469 |
| 10706 13177 20957 |
| 15148 15584 20959 |
| 9114 9432 16467 |
| 5483 14687 14705 |
| 8325 21161 21410 |
| 2328 17670 19834 |
| 7015 20802 21385 |
| 52 5451 20379 |
| 9689 15537 19733. |

3. The data processing apparatus according to claim 1, wherein the receiver is configured to select a code rate of 11/15 from the plurality of code rates and configured to receive, from the television broadcast, an LDPC code word based on an LDPC code having a code length of 64800 bits and the code rate of 11/15; and wherein, in response to the selection of the code rate of 11/15, the parity check matrix initial value table includes

| |
|---|
| 696 989 1238 3091 3116 3738 4269 6406 7033 8048 9157 10254 12033 16456 16912 |
| 444 1488 6541 8626 10735 12447 13111 13706 14135 15195 15947 16453 16916 17137 17268 |
| 401 460 992 1145 1576 1678 2238 2320 4280 6770 10027 12486 15363 16714 17157 |
| 1161 3108 3727 4508 5092 5348 5582 7727 11793 12515 12917 13362 14247 16717 17205 |

-continued 542 1190 6883 7911 8349 8835 10489 11631 14195 15009 15454 15482 16632 17040 17063
17 487 776 880 5077 6172 9771 11446 12798 16016 16109 16171 17087 17132 17226
1337 3275 3462 4229 9246 10180 10845 10866 12250 13633 14482 16024 16812 17186 17241
15 980 2305 3674 5971 8224 11499 11752 11770 12897 14082 14836 15311 16391 17209
0 3926 5869 8696 9351 9391 11371 14052 14172 14636 14974 16619 16961 17033 17237
3033 5317 6501 8579 10698 12168 12966 14019 15392 15806 15991 16493 16690 17062 17090
981 1205 4400 6410 11003 13319 13405 14695 15846 16297 16492 16563 16616 16862 16953
1725 4276 8869 9588 14062 14486 15474 15548 16300 16432 17042 17050 17060 17175 17273
1807 5921 9960 10011 14305 14490 14872 15852 16054 16061 16306 16799 16833 17136 17262
2826 4752 6017 6540 7016 8201 14245 14419 14716 15983 16569 16652 17171 1717917247
1662 2516 3345 5229 8086 9686 11456 12210 14595 15808 16011 16421 16825 17112 17195
2890 4821 5987 7226 8823 9869 12468 14694 15352 15805 16075 16462 17102 17251 17263
3751 3890 4382 5720 10281 10411 11350 12721 13121 14127 14980 15202 15335 16735 17123
26 30 2805 5457 6630 7188 7477 7556 11065 16608 16859 16909 16943 17030 17103
40 4524 5043 5566 9645 10204 10282 11696 13080 14837 15607 16274 17034 17225 17266
904 3157 6284 7151 7984 11712 12887 13767 15547 16099 16753 16829 17044 17250 17259
7 311 4876 8334 9249 11267 14072 14559 15003 15235 15686 16331 17177 17238 17253
4410 8066 8596 9631 10369 11249 12610 15769 16791 16960 17018 17037 17062 17165 17204
24 8261 9691 10138 11607 12782 12786 13424 13933 15262 15795 16476 17084 17193 17220
88 11622 14705 15890
304 2026 2638 6018
1163 4268 11620 17232
9701 11785 14463 17260
4118 10952 12224 17006
3647 10823 11521 12060
1717 3753 9199 11642
2187 14280 17220
14787 16903 17061
381 3534 4294
3149 6947 8323
12562 16724 16881
7289 9997 15306
5615 13152 17260
5666 16926 17027
4190 7798 16831
4778 10629 17180
10001 13884 15453
6 2237 8203
7831 15144 15160
9186 17204 17243
9435 17168 17237
42 5701 17159
7812 14259 15715
39 4513 6658
38 9368 11273
1119 4785 17182
5620 16521 16729
16 6685 17242
210 3452 12383
466 14462 16250
10548 12633 13962
1452 6005 16453
22 4120 13684
5195 11563 16522
5518 16705 17201
12233 14552 15471
6067 13440 17248
8660 8967 17061
8673 12176 15051
5959 15767 16541

-continued

| |
|---|
| 3244 12109 12414 |
| 31 15913 16323 |
| 3270 15686 16653 |
| 24 7346 14675 |
| 12 1531 8740 |
| 6228 7565 16667 |
| 16936 17122 17162 |
| 4868 8451 13183 |
| 3714 4451 16919 |
| 11313 13801 17132 |
| 17070 17191 17242 |
| 1911 11201 17186 |
| 14 17190 17254 |
| 11760 16008 16832 |
| 14543 17033 17278 |
| 16129 16765 17155 |
| 6891 15561 17007 |
| 12741 14744 17116 |
| 8992 16661 17277 |
| 1861 11130 16742 |
| 4822 13331 16192 |
| 13281 14027 14989 |
| 38 14887 17141 |
| 10698 13452 15674 |
| 4 2539 16877 |
| 857 17170 17249 |
| 11449 11906 12867 |
| 285 14118 16831 |
| 15191 17214 17242 |
| 39 728 16915 |
| 2469 12969 15579 |
| 16644 17151 17164 |
| 2592 8280 10448 |
| 9236 12431 17173 |
| 9064 16892 17233 |
| 4526 16146 17038 |
| 31 2116 16083 |
| 15837 16951 17031 |
| 5362 8382 16618 |
| 6137 13199 17221 |
| 2841 15068 17068 |
| 24 3620 17003 |
| 9880 15718 16764 |
| 1784 10240 17209 |
| 2731 10293 10846 |
| 3121 8723 16598 |
| 8563 15662 17088 |
| 13 1167 14676 |
| 29 13850 15963 |
| 3654 7553 8114 |
| 23 4362 14865 |
| 4434 14741 16688 |
| 8362 13901 17244 |
| 13687 16736 17232 |
| 46 4229 13394 |
| 13169 16383 16972 |
| 16031 16681 16952 |
| 3384 9894 12580 |
| 9841 14414 16165 |
| 5013 17099 17115 |
| 2130 8941 17266 |
| 6907 15428 17241 |
| 16 1860 17235 |
| 2151 16014 16643 |
| 14954 15958 17222 |
| 3969 8419 15116 |
| 31 15593 16984 |
| 11514 16605 17255. |

4. The data processing apparatus according to claim 1, wherein a row of the parity check matrix initial value table is represented by i and a parity length of the LDPC code is represented by M, a $\{2+360\times(i-1)\}$-th column of the parity check matrix is a column obtained by cyclically shifting a $\{1+360\times(i-1)\}$-th column of the parity check matrix, in which positions of elements of 1 are represented in the parity check matrix initial value table, downward by q, where q is equal to M/360.

5. The data processing apparatus according to claim 1, wherein for the $\{1+360\times(i-1)\}$-th column of the parity check matrix, an i-th row of the parity check matrix initial value table represents a row number of an element of 1 in the {1+360×(i−1)}-th column of the parity check matrix, and for each of the {2+360×(i−1)}-th to (360×i)-th columns, which are columns other than the {1+360×(i−1)}-th column of the parity check matrix, a row number of an element of 1 in a w-th column of the parity check matrix, which is a column other than the {1+360×(i−1)}-th column of the parity check matrix, is represented by equation $H_{w-j}$=mod {$h_{i,j}$+mod((w−1), 360)×M/360, M), where $h_{i,j}$ denotes a value in the i-th row and a j-th column of the parity check matrix initial value table, and $H_{w-j}$ denotes a row number of a j-th element of 1 in the w-th column of the parity check matrix H.

6. A television receiver comprising the data processing apparatus according to claim 1.

7. The television receiver according to claim 6, wherein the television receiver comprises an information source decoding processor and a display, the decoder being configured to supply the image data after decoding of the LDPC code word to the information source decoding processor, the information source decoding processor being configured to perform an information source decoding of the image data and to output images to the display.

8. The television receiver according to claim 6, wherein the information bits include television broadcast program data.

9. The television receiver according to claim 6, wherein the receiver is configured to receive the LDPC code word via a terrestrial link.

10. The television receiver according to claim 6, wherein the receiver is configured to receive the LDPC code word via a satellite link.

11. A data processing method for using an LDPC (Low Density Parity Check) code to enable error correction processing to correct errors generated in a transmission path of a television broadcast, the method comprising:

receiving, from a television broadcast, an LDPC code word based on an LDPC code having a code length of 64800 bits and a code rate of 13/15, the receiving including selecting the code rate of 13/15 from a plurality of code rates; and decoding the LDPC code word on the basis of a parity check matrix of the LDPC code, wherein the decoded LDPC code word comprising image data of the television broadcast for display, the LDPC code word includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, wherein, in response to the selection of the code rate of 13/15, the parity check matrix initial value table includes 142 2307 2598 2650 4028 4434 5781 5881 6016 6323 6681 6698 8125
2932 4928 5248 5256 5983 6773 6828 7789 8426 8494 8534 8539 8583

-continued 899 3295 3833 5399 6820 7400 7753 7890 8109 8451 8529 8564 8602
21 3060 4720 5429 5636 5927 6966 8110 8170 8247 8355 8365 8616
20 1745 2838 3799 4380 4418 4646 5059 7343 8161 8302 8456 8631
9 6274 6725 6792 7195 7333 8027 8186 8209 8273 8442 8548 8632
494 1365 2405 3799 5188 5291 7644 7926 8139 8458 8504 8594 8625
192 574 1179 4387 4695 5089 5831 7673 7789 8298 8301 8612 8632
11 20 1406 6111 6176 6256 6708 6834 7828 8232 8457 8495 8602
6 2654 3554 4483 4966 5866 6795 8069 8249 8301 8497 8509 8623
21 1144 2355 3124 6773 6805 6887 7742 7994 8358 8374 8580 8611
335 4473 4883 5528 6096 7543 7586 7921 8197 8319 8394 8489 8636
2919 4331 4419 4735 6366 6393 6844 7193 8165 8205 8544 8586 8617
12 19 742 930 3009 4330 6213 6224 7292 7430 7792 7922 8137
710 1439 1588 2434 3516 5239 6248 6827 8230 8448 8515 8581 8619
200 1075 1868 5581 7349 7642 7698 8037 8201 8210 8320 8391 8526
3 2501 4252 5256 5292 5567 6136 6321 6430 6486 7571 8521 8636
3062 4599 5885 6529 6616 7314 7319 7567 8024 8153 8302 8372 8598
105 381 1574 4351 5452 5603 5943 7467 7788 7933 8362 8513 8587
787 1857 3386 3659 6550 7131 7965 8015 8040 8312 8484 8525 8537
15 1118 4226 5197 5575 5761 6762 7038 8260 8338 8444 8512 8568
36 5216 5368 5616 6029 6591 8038 8067 8299 8351 8565 8578 8585
1 23 4300 4530 5426 5532 5817 6967 7124 7979 8022 8270 8437
629 2133 4828 5475 5875 5890 7194 8042 8345 8385 8518 8598 8612
11 1065 3782 4237 4993 7104 7863 7904 8104 8228 8321 8383 8565
2131 2274 3168 3215 3220 5597 6347 7812 8238 8354 8527 8557 8614
5600 6591 7491 7696
1766 8281 8626
1725 2280 5120
1650 3445 7652
4312 6911 8626
15 1013 5892
2263 2546 2979
1545 5873 7406
67 726 3697
2860 6443 8542
17 911 2820
1561 4580 6052
79 5269 7134
22 2410 2424
3501 5642 8627
808 6950 8571
4099 6389 7482
4023 5000 7833
5476 5765 7917
1008 3194 7207
20 495 5411
1703 8388 8635
6 4395 4921
200 2053 8206
1089 5126 5562
10 4193 7720
1967 2151 4608
22 738 3513
3385 5066 8152
440 1118 8537
3429 6058 7716
5213 7519 8382
5564 8365 8620
43 3219 8603
4 5409 5815
5 6376 7654
4091 5724 5953
5348 6754 8613
1634 6398 6632
72 2058 8605
3497 5811 7579
3846 6743 8559
15 5933 8629
2133 5859 7068
4151 4617 8566
2960 8270 8410
2059 3617 8210
544 1441 6895
4043 7482 8592
294 2180 8524
3058 8227 8373
364 5756 8617
5383 8555 8619
1704 2480 4181
7338 7929 7990

-continued

| |
|---|
| 2615 3905 7981 |
| 4298 4548 8296 |
| 8262 8319 8630 |
| 892 1893 8028 |
| 5694 7237 8595 |
| 1487 5012 5810 |
| 4335 8593 8624 |
| 3509 4531 5273 |
| 10 22 830 |
| 4161 5208 6280 |
| 275 7063 8634 |
| 4 2725 3113 |
| 2279 7403 8174 |
| 1637 3328 3930 |
| 2810 4939 5624 |
| 3 1234 7687 |
| 2799 7740 8616 |
| 22 7701 8636 |
| 4302 7857 7993 |
| 7477 7794 8592 |
| 9 6111 8591 |
| 5 8606 8628 |
| 347 3497 4033 |
| 1747 2613 8636 |
| 1827 5600 7042 |
| 580 1822 6842 |
| 232 7134 7783 |
| 4629 5000 7231 |
| 951 2806 4947 |
| 571 3474 8577 |
| 2437 2496 7945 |
| 23 5873 8162 |
| 12 1168 7686 |
| 8315 8540 8596 |
| 1766 2506 4733 |
| 929 1516 3338 |
| 21 1216 6555 |
| 782 1452 8617 |
| 8 6083 6087 |
| 667 3240 4583 |
| 4030 4661 5790 |
| 559 7122 8553 |
| 3202 4388 4909 |
| 2533 3673 8594 |

-continued

| |
|---|
| 1991 3954 6206 |
| 6835 7900 7980 |
| 189 5722 8573 |
| 2680 4928 4998 |
| 243 2579 7735 |
| 4281 8132 8566 |
| 7656 7671 8609 |
| 1116 2291 4166 |
| 21 388 8021 |
| 6 1123 8369 |
| 311 4918 8511 |
| 0 3248 6290 |
| 13 6762 7172 |
| 4209 5632 7563 |
| 49 127 8074 |
| 581 1735 4075 |
| 0 2235 5470 |
| 2178 5820 6179 |
| 16 3575 6054 |
| 1095 4564 6458 |
| 9 1581 5953 |
| 2537 6469 8552 |
| 14 3874 4844 |
| 0 3269 3551 |
| 2114 7372 7926 |
| 1875 2388 4057 |
| 3232 4042 6663 |
| 9 401 583 |
| 13 4100 6584 |
| 2299 4190 4410 |
| 21 3670 4979. |

12. The data processing method according to claim 11, further comprising:

receiving, from the television broadcast, an LDPC code word based on an LDPC code having a code length of 64800 bits and a code rate of 10/15, the code rate of 10/15 having been selected from the plurality of code rates;

wherein, in response to the selection of the code rate of 10/15, the parity check matrix initial value table includes

| |
|---|
| 692 1779 1973 2726 5151 6088 7921 9618 11804 13043 15975 16214 16889 16980 18585 18648 |
| 13 4090 4319 5288 8102 10110 10481 10527 10953 11185 12069 13177 14217 15963 17661 20959 |
| 2330 2516 2902 4087 6338 8015 8638 9436 10294 10843 11802 12304 12371 14095 18486 18996 |
| 125 586 5137 5701 6432 6500 8131 8327 10488 11032 11334 11449 12504 16000 20753 21317 |
| 30 480 2681 3635 3898 4058 12803 14734 20252 20306 20680 21329 21333 21466 21562 21568 |
| 20 44 738 4965 5516 7659 8464 8759 12216 14630 18241 18711 19093 20217 21316 21490 |
| 31 43 3554 5289 5667 8687 14885 16579 17883 18384 18486 19142 20785 20932 21131 21308 |
| 7054 9276 10435 12324 12354 13849 14285 16482 19212 19217 19221 20499 20831 20925 21195 21247 |
| 9 13 4099 10353 10747 14884 15492 17650 19291 19394 20356 20658 21068 21117 21183 21586 |
| 28 2250 2980 8988 10282 12503 13301 18351 20546 20622 21006 21293 21344 21472 21530 21542 |
| 17 32 2521 4374 5098 7525 13035 14437 15283 18635 19136 20240 21147 21179 21300 21349 |
| 57 4735 5657 7649 8807 12375 16092 16178 16379 17545 19461 19489 20321 20530 21453 21457 |
| 35 55 5333 14423 14670 15438 19468 19667 20823 21084 21241 21344 21447 21520 21554 21586 |
| 13 20 2025 11854 12516 14938 15929 18081 19730 19929 20408 21338 21391 21425 21468 21546 |
| 54 7451 8176 10136 15240 16442 16482 19431 19483 19762 20647 20839 20966 21512 21579 21592 |
| 26 465 3604 4233 9831 11741 13692 18953 18974 21021 21039 21133 21282 21488 21532 21558 |

-continued 1 7 16 59 6979 7675 7717 9791 12370 13050 18534 18729 19846 19864 20127 20165
15 31 11089 12360 13640 14237 17937 18043 18410 19443 21107 21444 21449 21528 21576 21584
32 51 9768 17848 18095 19326 19594 19618 19765 20440 20482 20582 21236 21338 21563 21587
44 55 4864 10253 11306 12117 13076 13901 15610 17057 18205 19794 20939 21132 21267 21573
3436 11304 15361 16511 16860 18238 18639 19341 20106 20123 20407 21200 21280 21452 21526 21569
679 8822 11045 14403 16588 17838 19117 19453 20265 20558 21374 21396 21428 21442 21529 21590
391 13002 13140 14314 17169 17175 17846 18122 19447 20075 20212 20436 20583 21330 21359 21403
7601 10257 20060 21285
4419 9150 18097 20315
4675 13376 21435
610 1238 16704
5732 7096 21104
5690 13531 14545
4334 14839 17357
8 2814 17674
2392 8128 18369
502 7403 15133
343 13624 20673
13188 15687 21593
321 16866 21347
1242 4261 17449
4691 8086 8691
8500 11538 20278
6269 12905 18192
5984 15452 17111
11541 18717 21534
16 10780 16107
12310 12959 20390
1365 18306 19634
6125 19132 20242
3012 17233 21533
5816 13021 21440
13207 17811 18798
2762 7586 12139
3949 5545 13584
11374 18279 19241
2736 10989 21209
4095 20677 21395
8251 10084 20498
7628 8875 21406
2743 8943 9090
1817 7788 15767
9333 9838 21268
6203 9480 12042
5747 21187 21468
2553 18281 21500
3179 9155 15222
12498 18109 20326
14106 21209 21592
7454 17484 20791
20804 21120 21574
5754 18178 20935
30 4322 21381
11905 20416 21397
12452 19899 21497
1917 6028 16868
9891 18710 18953
912 21083 21446
370 14355 18069
16519 19003 20902
11163 17558 18424
8427 14396 21405
8885 11796 21361
4960 15431 20653
11944 16839 21236
9967 14529 17208
14144 19354 19745
7986 12680 21396
6097 11501 13028
33 13803 21038
3177 20124 20803
2692 6841 18655

-continued 971 5892 14354
3887 19455 21271
17214 17315 21148
6539 13910 21526
3809 5153 15793
3865 21438 21510
7129 17787 19636
5972 13150 14182
7078 14906 16911
15705 21160 21482
5479 13860 19763
16817 19722 20001
14649 16147 18886
15138 18578 21502
2096 2534 17760
11920 13460 19783
19876 20071 20583
6241 14230 20775
16138 16386 21371
8616 15624 18453
6013 8015 21599
9184 10688 20792
18122 21141 21469
10706 13177 20957
15148 15584 20959
9114 9432 16467
5483 14687 14705
8325 21161 21410
2328 17670 19834
7015 20802 21385
52 5451 20379
9689 15537 19733.

13. The data processing method according to claim 11, further comprising receiving, from the television broadcast, an LDPC code word based on an LDPC code having a code length of 64800 bits and a code rate of 11/15, the code rate of 11/15 having been selected from the plurality of code rates;

wherein, in response to the selection of the code rate of 11/15, the parity check matrix initial value table includes 696 989 1238 3091 3116 3738 4269 6406 7033 8048 9157 10254 12033 16456 16912
444 1488 6541 8626 10735 12447 13111 13706 14135 15195 15947 16453 16916
17137 17268
401 460 992 1145 1576 1678 2238 2320 4280 6770 10027
12486 15363 16714 17157
1161 3108 3727 4508 5092 5348 5582 7727 11793 12515 12917 13362 14247 16717
17205
542 1190 6883 7911 8349 8835 10489 11631 14195 15009 15454 15482 16632
17040 17063
17 487 776 880 5077 6172 9771 11446 12798 16016 16109 16171 17087 17132
17226
1337 3275 3462 4229 9246 10180 10845 10866 12250 13633 14482 16024 16812 17186
17241
15 980 2305 3674 5971 8224 11499 11752 11770 12897 14082 14836 15311 16391
17209
0 3926 5869 8696 9351 9391 11371 14052 14172 14636 14974 16619 16961 17033
17237
3033 5317 6501 8579 10698 12168 12966 14019 15392 15806 15991 16493 16690
17062 17090
981 1205 4400 6410 11003 13319 13405 14695 15846 16297 16492 16563 16616 16862
16953
1725 4276 8869 9588 14062 14486 15474 15548 16300 16432 17042 17050 17060
17175 17273
1807 5921 9960 10011 14305 14490 14872 15852 16054 16061 16306 16799 16833
17136 17262
2826 4752 6017 6540 7016 8201 14245 14419 14716 15983 16569 16652 17171
17179 17247
1662 2516 3345 5229 8086 9686 11456 12210 14595 15808 16011 16421 16825
17112 17195
2890 4821 5987 7226 8823 9869 12468 14694 15352 15805 16075 16462 17102
17251 17263
3751 3890 4382 5720 10281 10411 11350 12721 13121 14127 14980 15202 15335
16735 17123
26 30 2805 5457 6630 7188 7477 7556 11065 16608 16859 16909 16943 17030
17103

-continued 40 4524 5043 5566 9645 10204 10282 11696 13080 14837 15607 16274 17034
17225 17266
904 3157 6284 7151 7984 11712 12887 13767 15547 16099 16753 16829 17044
17250 17259
7 311 4876 8334 9249 11267 14072 14559 15003 15235 15686 16331 17177 17238
17253
4410 8066 8596 9631 10369 11249 12610 15769 16791 16960 17018 17037 17062
17165 17204
24 8261 9691 10138 11607 12782 12786 13424 13933 15262 15795 16476 17084
17193 17220
88 11622 14705 15890
304 2026 2638 6018
1163 4268 11620 17232
9701 11785 14463 17260
4118 10952 12224 17006
3647 10823 11521 12060
1717 3753 9199 11642
2187 14280 17220
14787 16903 17061
381 3534 4294
3149 6947 8323
12562 16724 16881
7289 9997 15306
5615 13152 17260
5666 16926 17027
4190 7798 16831
4778 10629 17180
10001 13884 15453
6 2237 8203
7831 15144 15160
9186 17204 17243
9435 17168 17237
42 5701 17159
7812 14259 15715
39 4513 6658
38 9368 11273
1119 4785 17182
5620 16521 16729
16 6685 17242
210 3452 12383
466 14462 16250
10548 12633 13962
1452 6005 16453
22 4120 13684
5195 11563 16522
5518 16705 17201
12233 14552 15471
6067 13440 17248
8660 8967 17061
8673 12176 15051
5959 15767 16541
3244 12109 12414
31 15913 16323
3270 15686 16653
24 7346 14675
12 1531 8740
6228 7565 16667
16936 17122 17162
4868 8451 13183
3714 4451 16919
11313 13801 17132
17070 17191 17242
1911 11201 17186
14 17190 17254
11760 16008 16832
14543 17033 17278
16129 16765 17155
6891 15561 17007
12741 14744 17116
8992 16661 17277
1861 11130 16742
4822 13331 16192
13281 14027 14989
38 14887 17141
10698 13452 15674
4 2539 16877
857 17170 17249
11449 11906 12867
285 14118 16831

-continued

| |
|---|
| 15191 17214 17242 |
| 39 728 16915 |
| 2469 12969 15579 |
| 16644 17151 17164 |
| 2592 8280 10448 |
| 9236 12431 17173 |
| 9064 16892 17233 |
| 4526 16146 17038 |
| 31 2116 16083 |
| 15837 16951 17031 |
| 5362 8382 16618 |
| 6137 13199 17221 |
| 2841 15068 17068 |
| 24 3620 17003 |
| 9880 15718 16764 |
| 1784 10240 17209 |
| 2731 10293 10846 |
| 3121 8723 16598 |
| 8563 15662 17088 |
| 13 1167 14676 |
| 29 13850 15963 |
| 3654 7553 8114 |
| 23 4362 14865 |
| 4434 14741 16688 |
| 8362 13901 17244 |
| 13687 16736 17232 |
| 46 4229 13394 |
| 13169 16383 16972 |
| 16031 16681 16952 |
| 3384 9894 12580 |
| 9841 14414 16165 |
| 5013 17099 17115 |
| 2130 8941 17266 |
| 6907 15428 17241 |
| 16 1860 17235 |
| 2151 16014 16643 |
| 14954 15958 17222 |
| 3969 8419 15116 |
| 31 15593 16984 |
| 11514 16605 17255. |

14. The data processing method according to claim 11, wherein a row of the parity check matrix initial value table is represented by i and a parity length of the LDPC code is represented by M, a {2+360×(i−1)}-th column of the parity check matrix is a column obtained by cyclically shifting a {1+360×(i−1)}-th column of the parity check matrix, in which positions of elements of 1 are represented in the parity check matrix initial value table, downward by q, where q is equal to M/360.

15. The data processing method according to claim 11, wherein for the {1+360×(i−1)}-th column of the parity check matrix, an i-th row of the parity check matrix initial value table represents a row number of an element of 1 in the {1+360×(i−1)}-th column of the parity check matrix, and for each of the {2+360×(i−1)}-th to (360×i)-th columns, which are columns other than the {1±360×(i−1)}-th column of the parity check matrix, a row number $H_{w-j}$ of an element of 1 in a w-th column of the parity check matrix, which is a column other than the {1+360×(i−1)}-th column of the parity check matrix, is represented by equation $H_{w-j}$=mod {$h_{i,j}$+mod ((w−1),360)×M/360, M), where $h_{i,j}$ denotes a value in the i-th row and a j-th column of the parity check matrix initial value table, and $H_{w-j}$ denotes a row number of a j-th element of 1 in the w-th column of the parity check matrix H.

16. The data processing method according to claim 11, wherein the method further comprises:

information source decoding of the image data received after the decoding of the LDPC code word; and displaying images resulting from the information source decoding.

17. The data processing method according to claim 11, wherein the receiving includes receiving the LDPC code word via a link of at least one of terrestrial link and of satellite link.

18. A non-transitory computer-readable storage medium storing computer-readable instructions, which, when executed by a processing apparatus, cause the processing apparatus to perform a data processing method for using an LDPC (Low Density Parity Check) code to enable error correction processing to correct errors generated in a transmission path of a television broadcast, the method comprising:

receiving, from a television broadcast, an LDPC code word based on an LDPC code having a code length of 64800 bits and a code rate of 13/15, the receiving including selecting the code rate of 13/15 from a plurality of code rates; and decoding the LDPC code word on the basis of a parity check matrix of the LDPC code, wherein the decoded LDPC code word comprising image data of the television broadcast for display, the LDPC code word includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, wherein, in response to the selection of the code rate of 13/15, the parity check matrix initial value table includes 142 2307 2598 2650 4028 4434 5781 5881 6016 6323 6681 6698 8125
2932 4928 5248 5256 5983 6773 6828 7789 8426 8494 8534 8539 8583
899 3295 3833 5399 6820 7400 7753 7890 8109 8451 8529 8564 8602
21 3060 4720 5429 5636 5927 6966 8110 8170 8247 8355 8365 8616
20 1745 2838 3799 4380 4418 4646 5059 7343 8161 8302 8456 8631
9 6274 6725 6792 7195 7333 8027 8186 8209 8273 8442 8548 8632
494 1365 2405 3799 5188 5291 7644 7926 8139 8458 8504 8594 8625
192 574 1179 4387 4695 5089 5831 7673 7789 8298 8301 8612 8632
11 20 1406 6111 6176 6256 6708 6834 7828 8232 8457 8495 8602
6 2654 3554 4483 4966 5866 6795 8069 8249 8301 8497 8509 8623
21 1144 2355 3124 6773 6805 6887 7742 7994 8358 8374 8580 8611
335 4473 4883 5528 6096 7543 7586 7921 8197 8319 8394 8489 8636
2919 4331 4419 4735 6366 6393 6844 7193 8165 8205 8544 8586 8617
12 19 742 930 3009 4330 6213 6224 7292 7430 7792 7922 8137
710 1439 1588 2434 3516 5239 6248 6827 8230 8448 8515 8581 8619
200 1075 1868 5581 7349 7642 7698 8037 8201 8210 8320 8391 8526
3 2501 4252 5256 5292 5567 6136 6321 6430 6486 7571 8521 8636
3062 4599 5885 6529 6616 7314 7319 7567 8024 8153 8302 8372 8598
105 381 1574 4351 5452 5603 5943 7467 7788 7933 8362 8513 8587
787 1857 3386 3659 6550 7131 7965 8015 8040 8312 8484 8525 8537
15 1118 4226 5197 5575 5761 6762 7038 8260 8338 8444 8512 8568
36 5216 5368 5616 6029 6591 8038 8067 8299 8351 8565 8578 8585
1 23 4300 4530 5426 5532 5817 6967 7124 7979 8022 8270 8437
629 2133 4828 5475 5875 5890 7194 8042 8345 8385 8518 8598 8612
11 1065 3782 4237 4993 7104 7863 7904 8104 8228 8321 8383 8565
2131 2274 3168 3215 3220 5597 6347 7812 8238 8354 8527 8557 8614
5600 6591 7491 7696
1766 8281 8626
1725 2280 5120
1650 3445 7652
4312 6911 8626
15 1013 5892
2263 2546 2979
1545 5873 7406
67 726 3697
2860 6443 8542
17 911 2820
1561 4580 6052
79 5269 7134
22 2410 2424
3501 5642 8627
808 6950 8571
4099 6389 7482
4023 5000 7833
5476 5765 7917
1008 3194 7207
20 495 5411
1703 8388 8635
6 4395 4921
200 2053 8206
1089 5126 5562
10 4193 7720
1967 2151 4608
22 738 3513
3385 5066 8152
440 1118 8537
3429 6058 7716
5213 7519 8382
5564 8365 8620
43 3219 8603
4 5409 5815
5 6376 7654
4091 5724 5953
5348 6754 8613
1634 6398 6632
72 2058 8605
3497 5811 7579
3846 6743 8559
15 5933 8629
2133 5859 7068

-continued 4151 4617 8566
2960 8270 8410
2059 3617 8210
544 1441 6895
4043 7482 8592
294 2180 8524
3058 8227 8373
364 5756 8617
5383 8555 8619
1704 2480 4181
7338 7929 7990
2615 3905 7981
4298 4548 8296
8262 8319 8630
892 1893 8028
5694 7237 8595
1487 5012 5810
4335 8593 8624
3509 4531 5273
10 22 830
4161 5208 6280
275 7063 8634
4 2725 3113
2279 7403 8174
1637 3328 3930
2810 4939 5624
3 1234 7687
2799 7740 8616
22 7701 8636
4302 7857 7993
7477 7794 8592
9 6111 8591
5 8606 8628
347 3497 4033
1747 2613 8636
1827 5600 7042
580 1822 6842
232 7134 7783
4629 5000 7231
951 2806 4947
571 3474 8577
2437 2496 7945
23 5873 8162
12 1168 7686
8315 8540 8596
1766 2506 4733
929 1516 3338
21 1216 6555
782 1452 8617
8 6083 6087
667 3240 4583
4030 4661 5790
559 7122 8553
3202 4388 4909
2533 3673 8594
1991 3954 6206
6835 7900 7980
189 5722 8573
2680 4928 4998
243 2579 7735
4281 8132 8566
7656 7671 8609
1116 2291 4166
21 388 8021
6 1123 8369
311 4918 8511
0 3248 6290
13 6762 7172
4209 5632 7563
49 127 8074
581 1735 4075
0 2235 5470
2178 5820 6179
16 3575 6054
1095 4564 6458
9 1581 5953
2537 6469 8552
14 3874 4844
0 3269 3551

-continued

| |
|---|
| 2114 7372 7926 |
| 1875 2388 4057 |
| 3232 4042 6663 |
| 9 401 583 |
| 13 4100 6584 |
| 2299 4190 4410 |
| 21 3670 4979. |

* * * * *